United States Patent [19]
Haruta et al.

[11] Patent Number: 6,110,291
[45] Date of Patent: Aug. 29, 2000

[54] THIN FILM FORMING APPARATUS USING LASER

[75] Inventors: Kenyu Haruta; Koichi Ono; Hitoshi Wakata; Mutsumi Tsuda; Yoshio Saito; Keisuke Nanba; Kazuyoshi Kojima; Tetsuya Takami; Akihiro Suzuki; Tomohiro Sasagawa; Kenichi Kuroda; Toshiyuki Oishi; Yukihiko Wada; Akihiko Furukawa; Yasuji Matsui; Akimasa Yuki; Takaaki Kawahara; Hideki Yabe; Taisuke Furukawa; Kouji Kise; Noboru Mikami; Tsuyoshi Horikawa; Tetsuo Makita; Kazuo Kuramoto; Naohiko Fujino; Hiroshi Kuroki; Tetsuo Ogama; Junji Tanimura, all of Hyogo, Japan

[73] Assignee: Mitsubishi Denki Kabushiki Kaisha, Tokyo, Japan

[21] Appl. No.: 08/689,313

[22] Filed: Aug. 7, 1996

Related U.S. Application Data

[62] Division of application No. 08/158,844, Nov. 29, 1993, Pat. No. 5,622,567.

[30] Foreign Application Priority Data

Nov. 30, 1992 [JP] Japan ................................. 4-345584

[51] Int. Cl.[7] ................................................. C23C 14/00
[52] U.S. Cl. ............................................ 118/726; 427/596
[58] Field of Search ............................. 427/596; 118/726

[56] References Cited

U.S. PATENT DOCUMENTS

| | | |
|---|---|---|
| 4,275,288 | 6/1981 | Makosch et al. . |
| 4,636,403 | 1/1987 | Fisanick et al. . |
| 4,664,769 | 5/1987 | Cuomo et al. . |
| 4,664,940 | 5/1987 | Bensoussan ............................. 427/596 |
| 4,701,592 | 10/1987 | Cheung . |
| 4,743,463 | 5/1988 | Ronn et al. . |
| 4,816,293 | 3/1989 | Hiramoto ................................. 427/596 |

(List continued on next page.)

FOREIGN PATENT DOCUMENTS

| | | |
|---|---|---|
| 0 278 643 A1 | 8/1980 | European Pat. Off. . |
| 0278643 | 8/1988 | European Pat. Off. . |
| 0341520 | 1/1989 | European Pat. Off. . |
| 0 341 520 | 11/1989 | European Pat. Off. . |
| 398375 | 11/1990 | European Pat. Off. . |

(List continued on next page.)

OTHER PUBLICATIONS

"Epitaxial growth of thin films of $BaTio_3$ Using Excimer Laser Ablation," G.M. Davies et al., Appl. Phys. Lett., vol. 55, No. 2, Jul. 1989, pp. 112–114.

"Pulsed–Laser Evaporation Technique for Deposition of Thin Films: Physics and Theoretical Model," R.K. Singh et al., Physical Review B, vol., 41, No. 13, pp. 8843–8859, May 1990.

Patent Abstracts of Japan No. 4–83866.
Patent Abstracts of Japan No. 3–188274.

(List continued on next page.)

*Primary Examiner*—Richard Bueker
*Attorney, Agent, or Firm*—McDermott, Will & Emery

[57] ABSTRACT

A thin film forming apparatus using laser includes a chamber (1), a target (5) placed therein, a laser light source (10) for emitting laser beam to target (5), and a substrate holder (3). When target (5) is irradiated with laser beam (16), a plume (15) is generated, and materials included in plume (15) are deposited on the surface of a substrate (2) held by substrate holder (3). The laser beam emitted from laser light source (10) has its cross section shaped to a desired shape when passed through a shielding plate (4804), for example, so that the surface of the target (5) is irradiated with the beam having uniform light intensity distribution. Therefore, a plume (15) having uniform density distribution of active particles is generated, and therefore a thin film of high quality can be formed over a wide area with uniform film quality, without damaging the substrate.

3 Claims, 106 Drawing Sheets

U.S. PATENT DOCUMENTS

| | | |
|---|---|---|
| 4,970,196 | 11/1990 | Kim et al. . |
| 5,015,492 | 5/1991 | Venkatesan et al. ............... 427/596 |
| 5,037,521 | 8/1991 | Nishikawa et al. . |
| 5,049,405 | 9/1991 | Cheung . |
| 5,084,300 | 1/1992 | Zander et al. . |
| 5,097,793 | 3/1992 | Shuhara et al. . |
| 5,126,165 | 6/1992 | Akihama et al. . |
| 5,128,214 | 7/1992 | Takayanagi et al. . |
| 5,153,773 | 10/1992 | Muraki et al. . |
| 5,159,169 | 10/1992 | Nishikawa et al. . |
| 5,212,148 | 5/1993 | Roas . |
| 5,236,545 | 8/1993 | Pryor ............................ 427/596 |
| 5,254,832 | 10/1993 | Gartner ......................... 427/596 |
| 5,405,659 | 4/1995 | Fernandez ..................... 427/596 |
| 5,415,901 | 5/1995 | Tanaka et al. .................. 427/596 |
| 5,426,092 | 6/1995 | Ovshinsky ..................... 427/596 |
| 5,432,151 | 7/1995 | Russo .......................... 427/596 |
| 5,534,071 | 7/1996 | Varshney ....................... 427/596 |
| 5,534,489 | 7/1996 | Hayashi ........................ 427/596 |

FOREIGN PATENT DOCUMENTS

| | | |
|---|---|---|
| 0 406 871 A2 | 1/1991 | European Pat. Off. . |
| 0406871 | 1/1991 | European Pat. Off. . |
| 0 429 243 A2 | 5/1991 | European Pat. Off. . |
| 0 431 160 A1 | 6/1991 | European Pat. Off. . |
| 0431160 | 6/1991 | European Pat. Off. . |
| 0 442 163 A1 | 8/1991 | European Pat. Off. . |
| 0442163 | 8/1991 | European Pat. Off. . |
| 0 461 050 A1 | 12/1991 | European Pat. Off. . |
| 0584562 A2 | 7/1993 | European Pat. Off. . |
| 4016352 A1 | 11/1990 | Germany . |
| 0 444 698 A2 | 9/1991 | Germany . |
| 295875 A5 | 11/1991 | Germany . |
| 4035073 C1 | 3/1992 | Germany . |
| 62-72022 | 4/1987 | Japan . |
| 2-104660 | 4/1990 | Japan . |
| 2-122069 | 5/1990 | Japan . |
| 3-054104 | 3/1991 | Japan . |
| 3-75362 | 3/1991 | Japan . |
| 4-114904 | of 1992 | Japan . |
| 4-45263 | of 1992 | Japan . |
| 4-318161 | 11/1992 | Japan . |
| 1 553 582 | 2/1976 | United Kingdom . |
| 1553582 | 10/1979 | United Kingdom . |
| 2244371 | 11/1991 | United Kingdom . |
| 2 250 751 | 6/1992 | United Kingdom . |
| 2250751 | 6/1992 | United Kingdom . |
| WO 89/1042 | 11/1989 | WIPO . |
| WO 89/10427 | 11/1989 | WIPO . |
| WO 91/04829 | 4/1991 | WIPO . |

OTHER PUBLICATIONS

Patent Abstracts of Japan No. 3–180466.
Patent Abstracts of Japan No. 3–68762.
Patent Abstracts of Japan No. 2–310363.
Patent Abstracts of Japan No. 2–298261.
Patent Abstracts of Japan No. 1–219155.
Patent Abstracts of Japan No. 1–208455.
Patent Abstracts of Japan 1–39371.
"Pulsed Laser Evaporation and Epitaxy of Thin Semiconductor Films," Dubowski, 1988, Butterworth & Co., Ltd.
"Superconductivity and crystallinity of $Ba_2Y_1Cu_3O_{7-\delta}$ thin films prepared by pulsed laser deposition with substrate bias voltage," Izumi, J. Appl. Phys. 68(12), Dec. 15, 1990, pp. 6331–6335.
Greer, Proceedings of the Third Annual Conf. on Superconductivity and Applications, Buffalo, NY, Sep. 1989.
Hiroo et al., English language Abstract for JP 620720022 A (Apr. 2, 1987), Japanese Patent Office, Patent Abstracts of Japan.
WPI Acc. No. 96–075426/08, Abstract for JP 07331422 A (Toshiba).
WPI Acc. No. 92–178985/22, Abstract for JP 04114904 (Sumitomo).
WPI Acc. No. 90–188473/25, Abstract for JP 2122069 (Nippon Teleg & Teleph).
WPI Acc. No. 90–161409/21, Abstract for JP 2104660 (Tohoku Elec Power Ltd), Tokyo Elec Power co., Inc., Dengen Kaihatsu KK.
WPI Acc. No. 89–296941/41, Abstract for JP 1219155 (Mitsubishi Denki KK).
WPI Acc. No. 91–137406/19, Abstract for JP 30753562 (Furukawa Electric Co.).
Greer, Proceedings of the Third Annual Conference on Superconductivity and Applications, Buffalo, NY 1989.
Miura, Appl. Phys. Lett. 52(12), Mar. 21, 1988 pp 1008–1010.
Chrissy, Pulsed Laser Deposition of Thin Films, John Wiley +Sons, N.Y., ©1994, pp 1–8.

FLAT PORTION OF PLUME INTENSITY

EVACUATION

⊕ : IONS
⊖ : ELECTRONS
Ⓝ : NEUTRAL PARTICLES

EVACUATION

EVACUATION

COMPONENT A
COMPONENT B
COMPONENT C
PORTION OF LASER BEAM IRRADIATION

THIN FILM FORMING APPARATUS USING LASER

This application is a division of application Ser. No. 08/158,844 filed Nov. 29, 1993, U.S. Pat. No. 5,622,567.

BACKGROUND OF THE INVENTION

1. Field of the Invention

The present invention relates to a thin film forming apparatus using laser and, more specifically, to a film forming apparatus using laser used for forming thin film having functions and to form thin films having large areas.

2. Description of the Background Art

FIG. 148 is a conventional thin film forming apparatus using laser disclosed, for example in, Japanese Patent Laying-Open No. 4-45263 which apparatus includes a chamber 1, a substrate 2, a substrate holder 3, a heater 4, a raw material target 5, a nozzle 6, an inlet window 7, a condenser lens 9, a laser unit 10, a turntable 11, an XY stage 12, a control apparatus 13, a motor 14, a plume 15 and an evacuating apparatus 17.

The operation will be described. Laser beam 16 emitted from laser unit 10 is condensed by condenser lens 9, passes through laser inlet window 7 of chamber 1, and irradiate raw material target 5 placed on turntable 11 in chamber 1. At this time, the turntable 11 can be rotated by means of motor 14. This is to make uniform laser irradiation by rotating raw material target 5 so as to prevent local generation of craters caused by sputtering of the same portion of raw material target 5.

At the portion of target 5 which is irradiated with the laser beam, plasma is generated abruptly, and in the process of cooling of the plasma in several ten ns, there are generated isolated excited atoms and ions. These groups of excited atoms and ions have the lives of at least several microseconds, which are emitted in this space to form a plume 15 which is like a candle flame. Meanwhile, a substrate 2 is placed fixed on a substrate holder 3 opposing to raw material target 5, and the excited atoms and ions in the plume 15 reach substrate 2 and are deposited thereon, forming a thin film.

In substrate holder 3, a heater 4 for heating the substrate is provided, so as to enable post annealing in which the film deposited at a low temperature is annealed at a temperature higher than the temperature for crystallization to provide a thin film of superior quality, and allowing as-deposition in which the substrate itself is held at a temperature higher than the temperature for crystallization at the time of deposition so as to form crystallized thin film at the site. In the as-deposition method, sometimes an active oxygen atmosphere is used as well. For example, as shown in the figure, a nozzle 6 for supplying gas including oxygen is provided so that the atmosphere around the substrate 2 is made an oxygen atmosphere in forming a high temperature superconductive thin film, whereby generation of oxide on substrate 2 is promoted.

In view of enlargement of the area of thin film formation, substrate holder 3 is mounted on XY stage 12, so that the position of forming the thin film can be moved. First, a control signal corresponding to an oscillation pulse of laser unit 10 is transmitted to XY stage 12 through control apparatus 13. The XY stage 12 is driven based on the control signal, and moves the position of forming the thin film on the substrate 2 at every laser pulse. Consequently, a uniform thin film can be formed on a wide area. In the conventional example, when XY stage 12 is not driven, the area of thin film formation is limited to 10 mm×10 mm (with the variation of film thickness distribution of ±10%), and when the XY stage is driven, the area can be expanded to 35 nm×35 nm.

However, in the semiconductor industry, formation of a uniform thin film over a wafer of 6 to 8 inches in diameter has been desired, and conventional thin film forming apparatuses using laser could not meet such demand.

FIG. 149 shows another prior art example disclosed, for example, in Japanese Patent Laying-Open No. 4-114904. Referring to the figure, 18 denotes an oxygen ion source, 19 denotes oxygen gas and 20 denotes oxygen ion beam. The process for forming a thin film in this example is the same as that of the above described prior art example. In such a thin film forming apparatus using laser, laser beam in the form of very short pulses of ten to about several ten ns is directed to the target, and the target material in the form of atoms, molecules or clusters are supplied onto the substrate only at the time of irradiation, so as to form a thin film. The excimer laser having extremely short pulse width and high energy has such advantage that (a) it allows generation of a large amount of target raw material to be deposited on the substrate so that the rate of thin film growth can be much increased, and that (b) a thin film of which composition is not very much changed from that of the raw material target can be obtained. However, the excimer laser may degrade the quality of the film due to insufficient crystallization. In order to promote crystallization of the raw material in the form of atoms, molecules or clusters deposited on substrate 2, heating of substrate 2 by a heater provided in substrate holder 3 so as to keep the substrate at a temperature higher than the temperature for crystallization has been proposed. However, if the substrate is kept at a high temperature during thin film formation, it may induce degradation of the substrate or undesirable reaction, which is inconvenient for the functional thin film from electronic or mechanic point of view. Therefore, in this prior art example, in order to reduce problems accompanying heating of the substrate, oxygen gas 19 is introduced to ion source 18 when raw material target 5 is irradiated with laser beam 16 so that substrate 2 is irradiated with the generated oxygen ion beam 20, whereby oxygen is supplied to the thin film and the temperature of crystal growth is lowered by the oxygen bombardment. Consequently, in this known example, a $Y_1Ba_2Cu_3O_{7-x}$ oxide superconductive thin film can be formed at the substrate temperature of 600° C.

However, the conventional thin film forming apparatus using laser has the following problems.

First, since the area of film formation which can be formed by one plume is limited, it has been impossible to form uniform thin film over a large area such as over a wafer having 6 to 8 inches in diameter required in the semiconductor industry.

In addition, there have been the problem of degradation of the substrate derived from high temperature of film formation and lower quality of the thin film caused by undesirable side reaction induced. In addition, when the film quality is to be improved by using active ion seeds, there has been possible damage of the substrate caused by ion beams, and therefore it has been difficult to improve the quality of the film.

Further, film formation parameters such as intensity of condensed beam incident on the target, condition for laser oscillation, position of the target, pressure for film formation and so on have been set initially and thereafter these parameters are not controlled. Therefore, delicate control of the film quality such as change in composition or orientation of the film which depends on composition of the surface of the target or on sudden change in energy of the particles incident on the substrate could not be done.

SUMMARY OF THE INVENTION

In order to solve the above described problems of the prior art, an object of the present invention is to provide a thin film forming apparatus using laser which allows formation of a thin film having high quality and large area with uniform film quality distribution, without damaging the substrate.

Another object of the present invention is to provide a thin forming apparatus using laser allowing delicate control of film quality, by controlling various conditions during the process for forming the thin film using laser.

The thin film forming apparatus using laser in accordance with the present invention includes, as basic components, a chamber having evacuating means, a target placed in the chamber, laser beam irradiating means for directing laser beams to the target, and substrate holding means holding a substrate on which a substance included in a plume generated from the target by laser beam irradiation is deposited.

In accordance with the first aspect of the present invention, the thin film forming apparatus using laser includes means for shaping cross sectional shape of the laser beams emitted from laser beam irradiating means.

Therefore, the laser beam can be changed to generate a plume suitable for forming a thin film having a high quality over larger area with the energy density distribution at the surface of the target irradiated with the laser beam made uniform.

In accordance with the second aspect of the present invention, in the thin film forming apparatus using laser, the light intensity distribution of the laser beam emitted from laser beam irradiating means at the target has a prescribed linear extension.

Therefore, the light intensity per unit area when the beam is directed to the target can be increased, and the plume generated from various points of light condensation can be overlapped with each other, so that the distribution of plume generation has flat portion over wider range.

The light intensity distribution preferably has angular, comb or curve extension.

In accordance with the third aspect of the present invention, the thin film forming apparatus using laser includes means for scanning the target with the laser beam emitted from laser beam irradiating means.

Therefore, the target can be irradiated with the laser beam uniformly over a wide range, and as a result, uniform plume can be generated over larger area.

Preferably, either means for changing direction of the laser beam by using a rotatable polygon mirror, or means for changing the direction of the laser beam by using an acoustic optical element controlling the direction of light by sound wave is included as the means for scanning with the laser beam in the present invention.

Alternatively, laser beam deflection means may be used as means for scanning with the laser beam. Preferably, means for vibrating or rotating a mirror, an electro optical deflection element, an acoustic optical deflection element, or a deflection element of a transparent body having a heater is included as the laser beam deflection means.

In accordance with a more preferred embodiment of the present invention, the target has a cylindrical shape, and the means for irradiating laser beam includes means for irradiating inner circumferential side surface of the target continuously with the laser beam. The inner peripheral side surface of the target has, for example, a prescribed taper toward the central axis. Further, it includes a reflection mirror having an inner circumferential side surface tapered in the reverse direction to the inner peripheral side surface of the target, which faces, with an O-shaped light transmitting window formed in the chamber interposed, the tapered inner circumferential side surface of the target.

In accordance with the fourth aspect of the present invention, in the thin film forming apparatus using laser, the laser beams irradiating means emits pulse laser beam, and it further includes means for moving position of laser irradiation emitted from the laser beam irradiating means on the target such that the position circulates in a prescribed period, and means for controlling relation between laser pulse frequency and the speed of moving the position of laser irradiation on the target such that the same position on the target may not be irradiated twice or more by a plurality of pulses of the laser beam.

Therefore, the plume are not generated concentrated at a specific portion, and therefore a thin film can be deposited over a wide area with uniform film thickness distribution.

In accordance with the fifth aspect of the present invention, in the thin film forming apparatus using laser, the laser beam irradiating means emits pulse laser beams, and it includes means for controlling the pulse laser such that one position on the target may not be irradiated with a plurality of pulses of the laser beam within one second.

Therefore, new substance is not deposited by the next laser pulse irradiation until the crystal has sufficiently grown, and therefore uniform film formation can be carried out with superior film quality.

In accordance with the sixth aspect of the present invention, the thin film forming apparatus using laser includes a plurality of targets each having an aperture through which laser beam passes, and means for changing positions of the targets, so that by changing positions of these targets, the laser beams can pass through an aperture of a target to be incident on another target.

Therefore, plumes can be generated from a plurality of targets, only by introducing one laser beam to the chamber. Consequently, a thin film can be formed on a substrate surface of a large area without the necessity of means for changing optical path of the laser beam.

As the means for changing the position of the targets, means for rotating the targets may be used.

In the present invention, preferably, the targets and the substrate, are positioned such that the distance between the position of laser beams irradiation at the target and the substrate, for each target is the same.

In accordance with the seventh aspect of the present invention, in the thin film forming apparatus using laser, the laser beam is directed to the target with an incident angle θ which satisfies the following condition: when film is formed over a length x on the target for a time period t of 0 to $t_0$ where the rate of elimination (dy/dt) of the target in the depth direction y is represented as b (t), the value provided by time integration of b (t) from t=0 to t=$t_0$ divided by tan (90°- θ) results in x or smaller.

In the thin film forming apparatus using laser, since the laser beam is directed to the target with an incident angle θ which satisfies the condition that the value obtained by time integral of d (t) from t=0 to t=$t_0$ divided by tan (90°- θ)

results in x or smaller, the plume can be generated from the target within the range of the length x only by introducing one laser beam into the chamber. As a result, a thin film can be formed on a substrate surface of a large area, without changing optical path of the laser beam.

According to an eighth aspect of the present invention, the thin film forming apparatus using laser includes means for irradiating a plurality of different positions on the target with a plurality of laser beams.

Therefore, film formation proceeds in parallel at a plurality of positions on the substrate, and therefore a thin film can be formed over a wide area without moving the substrate over a wide range.

The means for irradiating a plurality of laser beams preferably includes means for dividing one laser beam into a plurality of laser beams and for directing the laser beams to different positions on the target.

According to a ninth aspect of the present invention, in the thin film forming apparatus using laser, the surface of the target which is irradiated with the laser beam has prescribed unevenness.

Therefore, a plurality of plumes are generated in various directions because of such nature of the plume that it generates in the direction of the normal of the target surface. Consequently, a thin film can be formed over wider range.

In accordance with the tenth aspect of the present invention, the thin film forming apparatus using laser includes means for linearly moving the target in a direction perpendicular to that surface of the substrate holding means which holds the substrate.

Since the thin film forming apparatus using laser includes means for irradiating the target with a plurality of laser beams and means for linearly moving the target in a direction perpendicular to the substrate holding surface of the substrate holding means, a plurality of positions of laser beam irradiation on the target change on the target surface, and a plurality of plumes are generated at various positions on the substrate surface placed opposing to the target. Consequently, a thin film of high quality can be formed uniform on the substrate having large area.

In accordance with the eleventh aspect of the present invention, the thin film forming apparatus using laser includes a plurality of targets and means for moving the plurality of targets.

Since the thin film forming apparatus using laser includes means for moving a plurality of targets, plumes having a prescribed density distribution can be brought into contact uniformly with the substrate surface, and therefore a thin film having uniform film quality can be vapor-deposited over a wide area.

In accordance with the twelfth aspect of the present invention, the thin film forming apparatus using laser includes means for dividing one laser beam into a plurality of beams and for irradiating different positions of the target by respective ones of the divided laser beams.

Therefore, a plurality of portions of the target can be irradiated with the laser beam simultaneously and efficiently, without increasing the laser light source.

In accordance with the thirteenth aspect of the present invention, the thin film forming apparatus using laser includes film quality monitoring means which scans the substrate surface by laser beam irradiation and measuring the reflected light by means of a CCD camera for monitoring the state of the film deposited on the substrate surface on real time basis, and means for feeding back the result of monitoring by the film quality monitoring means to the film forming conditions.

Since the thin film forming apparatus using laser includes film quality monitoring means for measuring laser beam reflected from substrate surface by a CCD camera and for monitoring on real time basis the condition of the deposited film, and means for feeding back the result monitored by the film quality monitoring means to the film forming conditions, the film forming condition can be controlled to be optimized during the step of film formation as needed, and hence a thin film can be formed over a wide area with superior quality.

In accordance with the fourteenth aspect of the present invention, in the thin film forming apparatus using laser, the diameter and the incident angle of the laser beam are set such that the laser beam irradiates at least the foot of a common normal of the laser irradiation surface of the target and the surface of the substrate.

In the thin film forming apparatus using laser, since the target has circular or polygonal cross sectional shape and the incident angle and the diameter of the laser beam are set such that the laser beam irradiates at least the foot of the common normal of the laser irradiation surface of the target and the surface of the substrate, a number of normals of the target are included in the range of laser beam irradiation, and as a result, compared with a planar shaped target, plumes can be scattered in wider angles.

According to a fifteenth aspect, in the thin film forming apparatus using laser, the laser irradiation surface of the target is arranged parallel to and facing the substrate surface, and the laser beam irradiating means emits the laser beam approximately perpendicular to the target irradiation surface, with the beam passing through a light transmitting aperture provided approximately at the center of the substrate holding means.

In the thin film forming apparatus using laser, the laser irradiating surface of the target is placed parallel to and opposing to the substrate surface, and the laser beam irradiating means emits the laser beams approximately perpendicular to the surface of the target through an optical transmitting aperture provided approximately at the center of the substrates holding means, so that the extent of the plume generated from the target can be maximized. This is because the fact that the extent of a plume generated from the target becomes larger as the incident angle of the laser beam is smaller, that is, the angle of inclination from the direction of the normal of the target surface becomes smaller.

In accordance with the sixteenth aspect of the present invention, in the thin film forming apparatus using laser, the position of focus of the laser beam emitted from the laser beam irradiating means is set to be on laser irradiating surface of the target.

In the thin film forming apparatus using laser, the laser beams are condensed such that the point of focus of the laser beams is positioned just on the surface of the target, whereby the extent of the plume generated from the target can be made larger, so as to enable thin film formation over wider area efficiently.

In accordance with the seventeenth aspect of the present invention, the thin film forming apparatus using laser includes local evacuating means for locally evacuating gas near that position of the chamber at which the plume is generated. By this structure, the degree of vacuum can be maintained constant in wider region near the target, so that the region where the plume is generated can be enlarged.

Consequently, the area on the substrate surface where excited atoms and ions in the plume reach can be enlarged, so that the area on which uniform thin film can be formed, is enlarged.

In accordance with an eighteenth aspect of the present invention, the thin film forming apparatus using laser includes means for applying a magnetic field in the space between the target and the substrate.

In the thin film forming apparatus using laser, a cusp magnetic field is applied to the space between the target and the substrate, and therefore electrons and ions in the plume which have been generated and scattered at the portion of the target surface which is irradiated with the laser beam tend to extend along the magnetic lines of force. Consequently, the plume spreads in the radial direction, and accordingly, uniform thin film can be formed over wider area of the substrate surface by a single plume.

In accordance with the nineteenth aspect of the present invention, the thin film forming apparatus using laser includes means for supplying hydrogen ions and hydrogen radicals to the surface of the substrate.

In the thin film forming apparatus using laser, since hydrogen ions and hydrogen radicals are applied to the surface of the substrate, surface migration of atoms and molecules at the surface of the substrate where the film grows can be promoted, and therefore a thin film having superior crystal property with less point defects and less lattice defects can be formed.

In accordance with the twentieth aspect of the present invention, the thin film forming apparatus using laser includes a nozzle for blowing gas to the surface of the substrate, and means for directing the laser beams to the target through the nozzle.

Therefore, the gas in the nozzle is activated by the laser beam, and therefore activated gas can be supplied to the substrate surface. Different from ion beams of activated ion seeds which are accelerated by voltage, the gas activated by the laser beam do not cause damage to the substrate, and therefore a thin film having high quality can be formed.

In accordance with the twenty-first aspect of the present invention, the thin film forming apparatus using laser includes a mesh electrode positioned movable between the substrate and the target.

Therefore, it is possible to clean the substrate by causing discharge between the mesh electrode and the substrate surface before thin film formation.

In accordance with the twenty-second aspect of the present invention, the thin film forming apparatus using laser includes at least one of RF sputtering means, DC sputtering means and ion beam sputtering means.

Therefore, a DC voltage or a high frequency voltage can be applied as pre-processing of the substrate and the target or as an assistance to the laser beam. For example, by applying a high frequency voltage to the substrate or the target, the surface of the substrate or the target can be made clean. When a DC voltage or a high frequency voltage is applied or ion beam sputtering is used to assist the laser beam, the rate of film formation can be improved, and thin film can be formed uniform over wider area.

According to a twenty-third aspect of the present invention, the thin film forming apparatus using laser includes a high frequency indication coil for generating a high frequency induction field near the target.

Since the thin film forming apparatus using laser includes a high frequency induction coil near the target and a high frequency induction field is generated near the target for generating plasma caused by discharge near the target, some energy can be applied to the surface of the target. Consequently, even when the energy density of the laser beams is low, generation of plume is facilitated.

According to a twenty-fourth aspect of the present invention, the thin film forming apparatus using laser includes means for irradiating infrared laser or far infrared laser to the surface of the substrate, and means for cooling the substrate.

Therefore, it becomes possible to locally heat portions of the substrate as needed, and rise of temperature at portions where heating is unnecessary can be prevented.

According to a twenty-fifth aspect of the present invention, the thin film forming apparatus using laser includes means for irradiating radiation beam to the substrate surface.

In the thin film forming apparatus using laser, since radiation beam is applied to the surface of the substrate, the electronic state of the atoms near the substrate surface are resonantly excited in non-equilibrium, and they reached the substrate surface so that the atoms, molecules and clusters of the target raw material are resonantly excited in non-equilibrium, whereby crystallization of the target raw material in the form of atoms, molecules or clusters on the substrate surface can be promoted not in thermal equilibrium, so that thin film can be formed with high quality at lower temperature of film formation.

According to a twenty-sixth aspect of the present invention, the thin film forming apparatus using laser includes a movable mirror enabling the laser beam irradiating means to direct the laser beams for irradiating the target also to the surface of the substrate.

Since the thin film forming apparatus using laser includes means for enabling irradiation of the substrate surface with the laser beam which is for irradiating the target, the substrate surface can be heated by the laser beam and cleaned easily at low cost.

According to a twenty-seventh aspect of the present invention, the thin film forming apparatus using laser includes means for introducing activated oxidizing gas into the chamber.

Therefore, oxygen defect generated during film deposition can be repaired immediately by oxygen ions supplied from the activated oxidizing atmosphere. Therefore, at a relatively low substrate temperature, an oxide film with superior crystal property with less oxide defects can be obtained, and therefore degradation of the substrate derived from high temperature of film formation and degradation of thin film function caused by induced undesirable side reaction can be prevented. Further, since the activated oxidizing gas introduced in the chamber does not have such a high kinetic energy as ion beams, the damage to the substrate is negligible.

According to a twenty-eighth aspect of the present invention, the thin film forming apparatus using laser includes means for activating the oxidizing gas by silent discharge.

Since the thin film forming apparatus using laser includes means for introducing activated oxidizing gas in the chamber by silent discharge, ions are eliminated rapidly by impingement with the activated oxygen gas, and therefore active oxygen atoms having relatively low reactiveness are maintained at high concentration and applied to the substrate. Therefore, oxidation on the substrate surface is promoted.

In accordance with the twenty-ninth aspect of the present invention, the thin film forming apparatus using laser includes means for applying DC potential or RF potential to the substrate.

In the thin film forming apparatus using laser, since DC potential or RF potential is applied to the substrate, the oxidizing gas which have been ionized near the plume by the reaction with the radical seeds or the like in the plume reaches the substrate surface with appropriate energy. Such ion seeds repair oxygen defects generated during deposition of the film, and therefore an oxide film having superior property of crystal with less oxygen defect can be obtained even at a relatively low substrate temperature.

According to thirtieth aspect of the present invention, the thin film forming apparatus using laser includes means for detecting the state of the target surface by monitoring scattered light of the laser beams directed to the target.

Since the state of the surface of the target is detected by monitoring the scattered light of the laser beams with which the target is irradiated, the state of the target surface can be detected on real time basis during the process for forming the thin film, which can be fedback to optimize the film forming conditions.

In accordance with thirty-first aspect of the present invention, the thin film forming apparatus using laser includes means for detecting composition of the target by detecting characteristic x-ray generated by irradiating the portion of the target which is irradiated with the laser beam, with x-ray or electron ray.

In the thin film forming apparatus using laser, since the composition of the target is detected by detecting the characteristic x-ray generated by irradiating the region of the target which is irradiated with the laser beam, with x-ray or electron ray, the composition of the target in the laser beam sputtering region can be detected on real time basis during the process for forming the thin film.

According to a thirty-second aspect of the present invention, the thin film forming apparatus using laser includes means for detecting the laser beam reflected at the film forming surface of the substrate and for measuring film thickness by polarization analysis of the laser beam.

In the thin film forming apparatus using laser, since the laser beam reflected from the substrate surface is detected and the film thickness can be measured by polarization analysis of the laser beam, the distribution of the film thickness formed over the substrate surface can be monitored on real time basis during the process for forming the thin film.

According to a thirty-third aspect of the present invention, the thin film forming apparatus using laser includes measuring means for measuring component and nature of the plume, analyzing means for analyzing the information obtained by the measuring means, and control means for controlling film forming parameters based on the result of analysis obtained by the analyzing means.

In the thin film forming apparatus using laser, since the information obtained by measuring means for measuring nature and component of the plume generated from the target is analyzed and the film forming parameters are controlled based on the result of analysis, the film forming parameters can be monitored at the site during the process for film formation, and optimal conditions for film formation can be obtained by feedback control.

According a thirty-fourth aspect of the present invention, the thin film forming apparatus using laser includes plume monitoring means for monitoring position of the plume, control means for processing the data monitored by the plume monitoring means and for outputting a control signal, and means for adjusting position or size of the plume based on the output signal from the control means.

Since the thin film forming apparatus using laser includes control means for processing data monitored by the plume monitoring means and for outputting a control signal and means for adjusting position or size of the plume based on the output signal from the control means, the positional relation between the plume and the target can be checked optimally, and therefore uneven film quality caused by displacement of the plume can be prevented.

According to a thirty-fifth aspect of the present invention, in the thin film forming apparatus using laser, the target is arranged such that the central axis of the plume forms a prescribed angle of inclination with respect to the substrate surface and crosses near an end portion of the substrate surface.

Therefore, the area of contact between the substrate surface and the plume can be made larger, and, by rotating the surface in a plane parallel to its surface, the film deposition on the substrate surface can be made uniform.

According to a thirty-sixth aspect of the present invention, in the thin film forming apparatus using laser, the surface of the target which is to be irradiated with the laser beam and the substrate surface are arranged such that the surfaces are both substantially vertical and the surfaces oppose to each other with a prescribed angle of inclination.

In the thin film forming apparatus using laser, since the target and the substrate surfaces are arranged such that these two are substantially vertical and opposed to each other with a prescribed angle, foreign matters generated near the target and near the substrate surface fall downward, and therefore thin film can be formed with foreign matters not much adhered on the surface of the substrate.

According to a thirty-seventh aspect of the present invention, the thin film forming apparatus using laser includes means for emitting a plurality of laser beams having different wavelengths.

In the thin film forming apparatus using laser, since the laser beam irradiating means emit a plurality of laser beams having different wavelengths, it becomes possible to irradiate the surface of the target with laser beam having long wavelength so that the target surface is brought to melted or about to be melted state, which contributes to reduce surface roughness of the target.

According to a thirty-eighth aspect of the present invention, the thin film forming apparatus using laser includes first and second laser thin film forming means which can form thin films on the substrate surface independent from each other, and means for conveying the substrate between the first and second laser thin film forming means.

Therefore, it becomes possible to form respective layers in separate chambers when two-layered thin film having different conditions for film formation is to be formed, and therefore respective thin films can be formed successively, continuously and rapidly without changing the conditions for film formation in each of the laser thin film forming means. Consequently, the thin film can be formed without degrading the function of the finished thin film.

According to a thirty-ninth aspect of the present invention, the thin film forming apparatus using laser includes a first laser thin film forming means constituting a preliminary thin film forming means for forming a metal thin film, and a second thin film forming means constituting a primary thin film forming means for forming a thin film of metal oxide.

In the thin film forming apparatus using laser, since a metal thin film is preliminary formed in the first laser thin film forming means and a metal oxide is formed by the second laser thin film forming means, an underlaying layer having superior crystal structure can be provided by the preliminary formation of a metal thin film. Therefore, in the subsequent step of forming thin film of metal oxide, a prescribed good crystal structure can be obtained even at a relatively low temperature.

According to a fortieth aspect of the present invention, in the thin film forming apparatus using laser, the target has mutually opposing inner surfaces so that the incident laser beam can be reflected for a plurality of times.

Therefore, plumes can be generated at a plurality of portions of the target by one laser beam, and therefore thin film can be formed over wider area of the substrate without increasing the number of components.

According to a forty-first aspect of the present invention, the thin film forming apparatus using laser includes means for activating neutral particles in the plume between the target and the substrate.

Therefore, neutral particles in the form of atoms, molecules or clusters in the plume generated at the portion of the targets surface which is irradiated with laser can be ionized. By applying electric field to the particles serving as the raw material of the thin film thus ionized, the kinetic energy when the particles are directed to the substrate can be freely controlled, and therefore the damage to the substrate can be prevented and the temperature of the substrate necessary for crystallization of the thin film can be made lower.

According to a forty-second aspect of the present invention, the thin film forming apparatus using laser includes means for supplying electron beam and hydrogen radicals to the cluster of atoms and ions included in the plume.

Therefore, the cluster of atoms included in the plume can be removed and dissolved, and the ionic particles can be neutralized. As a result, a thin film having a stacked structure with shaft interface can be formed.

According to a forty-third aspect of the present invention, the thin film forming apparatus using laser includes means for applying magnetic field at least to the vicinity of the target.

In the thin film forming apparatus using laser, since a magnetic field is applied at least to the vicinity of the target, movement of charged particles such as ions and electrons in the plume are influenced by the magnetic field, so that the charged particles drift in the direction of the magnetic lines of force. Therefore, by applying a magnetic field such that the magnetic lines of force do not pass the surface of the substrate, the amount of ions in the plume incident on the substrate can be controlled and suppressed. Meanwhile, non-charged particles such as neutral atoms and clusters in the plume are not influenced by the magnetic field so that these particles reach the substrate and are deposited thereon.

According to a forty-fourth aspect of the present invention, the thin film forming apparatus using laser includes shielding means for partially shielding the plume between the target and the substrate.

Therefore, a portion of the plume can be arbitrarily shielded, and therefore spatial distribution of the density of particles constituting the plume in contact with the substrate can be made uniform.

According to a forty-fifth aspect of the present invention, the thin film forming apparatus using laser includes atom capturing means provided detachably, surrounding a point of laser irradiation and vicinity thereof on the laser radiation surface of the target.

Therefore, generation of dusts in the chamber can be suppressed, which allows continuous film forming processes for a long period of time, which in turn leads to improved production yield.

According to a forty-sixth aspect of the present invention, the thin film forming apparatus using laser includes a plurality of plates each having an opening through which a laser beam can pass, between the target and a window transmitting the laser beam.

Therefore, the transmitting window can be shielded by the plates against the substance scattered from the target, and therefore deposition on the window can be suppressed.

According to a forty-seventh aspect of the present invention, the thin film forming apparatus using laser provides another window transmitting the laser beam between the aforementioned window transmitting the laser and the target, and has means for moving the position of laser beam transmission at the said another window.

In the thin film forming apparatus using laser, since an additional window through which laser beam is transmitted is provided between the laser transmitting window and the target and the position of laser beam transmission of the additionally provided window is moved, the additional window prevents the dust scattered from the target from reaching the outer laser transmitting window, so that the deposition on the outer window can be prevented.

According to a forty-eighth aspect of the present invention, the thin film forming apparatus using laser includes a grid through which the laser beam can transmit between the laser transmitting window and the target.

Therefore, the substance scattered from the plume can be prevented from reaching the window, and therefore deposition on the window can be prevented.

According to a forty-ninth aspect of the present invention, the thin film forming apparatus using laser includes a nozzle having an opening through which the laser beam can pass, between the laser beam transmitting window and the target.

Therefore, dust and substances scattered from the plume can be prevented from reaching the window, and therefore deposition on the window can be prevented.

According to a fiftieth aspect of the present invention, the thin film forming apparatus using laser includes a shutter which is opened only during laser beam irradiation, provided between the laser transmitting window and the target.

Therefore, the dust scattered from the target which is generally generated after laser radiation can be shielded by the shutter before reaching the window. Therefore, deposition on the window can be prevented.

According to a fifty-first aspect of the present invention, the thin film forming apparatus using laser includes a gate for keeping airtight seal between the laser beam transmitting window and the target and means for supplying and exhausting gas to and from the space between the laser beam transmitting window and the target.

Since the thin film forming apparatus using laser includes a gate for keeping airtight seal between the laser beam transmitting window and the target and means for supplying and evacuating gas to and from the space between the laser beam transmitting window and the gate, the window can be changed without exposing most part of the chamber to the atmosphere.

According to fifty-second aspect of the present invention, the thin film forming apparatus using laser includes an optical transmission path the inside of which can be held airtight provided between the laser beam transmitting window and the laser beam irradiating means, and the inside of optical transmission path is filled with a prescribed gas or kept vacuum.

Since the inside of the optical transmission path is filled with a prescribed gas or kept vacuum in the thin film forming apparatus using laser, the laser beam can be passed without any attenuation during the passage through the optical transmission path, and the inner wall of the optical transmission path can be kept clean.

According to a fifty-third aspect of the present invention, in the thin film forming apparatus using laser, the incident angle of the laser beam directed to the target with respect to the target surface is set to be at least 30° with respect to the direction of the normal of the laser irradiation surface of the target.

Therefore, the direction of generation of the plume is off the direction of the laser transmitting window, and therefore deposition of substances included in the plume on the window can be suppressed, and thus deposition on the window can be prevented.

According to a fifty-fourth aspect of the present invention, the thin film forming apparatus using laser includes a mirror arranged to reflect the incident laser beam in the chamber to direct the laser beam toward the window.

In the thin film forming apparatus using laser, since the laser beam incident in the chamber is reflected to be directed to the window, the substance deposited on the window can be removed.

According to a fifty-fifth aspect of the present invention, the thin film forming apparatus using laser includes second laser beam irradiating means for irradiating the laser transmitting window with the laser beam, monitoring means for monitoring the frost on the window by the laser beam emitted from the second laser beam irradiating means, means for removing the frost of the window by blowing purging gas to the window, and control means for operating the means for removing the frost on the window based on the result of monitoring by the monitoring means for monitoring the frost on the window.

In the thin film forming apparatus using laser, since the frost on the window is monitored and the frost is removed by blowing purge gas when the window is frosted, the frost on the laser transmitting window is always prevented, and therefore the film can be formed under constant condition.

According to a fifty-sixth aspect of the present invention, in the thin film forming apparatus using laser, the target is divided into a plurality of targets, each divided target including metallurgical substance of different compositions, and the laser irradiating means includes means for adjusting position of laser beam irradiation on the divided target. Consequently, thin films of a plurality of metallurgical substances of different components can be formed.

In the thin film forming apparatus using laser, since laser beam is directed to a plurality of divided targets including metallurgical substances of different components, when thin films of a plurality of different compositions are to be formed on the substrate, the ratio of the components can be changed or adjusted relatively easily.

According to a fifty-seventh aspect of the present invention, in the thin film forming apparatus using laser, the target has a depressed portion on the surface which is to be irradiated with the laser beam.

Therefore, internal stress caused by the difference in thermal expansion coefficient or the difference in temperature can be dispersed, and generation and development of cracks caused by the pulse shock can be suppressed. Further, since the depressed portion is provided, the area of laser absorption on the laser irradiation surface can be increased.

As described above, by the thin film forming apparatus using laser in accordance with the present invention, a uniform thin film having superior quality can be formed efficiently over wider area without damaging the substrate.

Tarnish or deposition of the laser inlet window during the process for forming the thin film can be prevented, and therefore the laser beam can be directed to the target to generate the plumes under constant condition.

Further, the film forming conditions can be optimized by real time control during the process for forming the thin film, and therefore control of the composition of the thin film to be formed or the like can be surely and easily carried out.

Since the present invention has these effects, the production yield in forming a thin film on the substrate surface can be significantly improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 33A and 33B show loci of plumes generated at the time of pulse laser scanning at a prescribed period, in which FIG. 33A shows an example of circular scanning and FIG. 33B shows zigzag scanning.

FIGS. 53A to 53C show shapes of target surfaces, wherein FIG. 53A shows an example in which half columns are arranged irregularly, FIG. 53B shows an example in which triangular prisms or pyramids are arranged regularly, and FIG. 53C shows an example in which triangular prisms or pyramids are arranged at random.

FIG. 120 is a cross sectional view showing a schematic structure of the thin film forming apparatus using laser in accordance with the seventy-eighth embodiment of the present invention.

FIG. 121 is a cross sectional view showing a schematic structure of the thin film forming apparatus using laser in accordance with a seventy-ninth embodiment of the present invention.

FIG. 122 is a cross sectional view showing a schematic structure of the thin film forming apparatus using laser in accordance with an eightieth embodiment of the present invention.

FIG. 123 is a cross sectional view showing a schematic structure of one modification of the thin film forming apparatus using laser in accordance with an eightieth embodiment of the present invention.

FIG. 124 is a cross sectional view showing a schematic structure of the thin film forming apparatus using laser in accordance with an eighty-first embodiment of the present invention.

FIG. 125 is a cross sectional view showing a schematic structure of the thin film forming apparatus using laser in accordance with an eighty-second embodiment of the present invention.

FIG. 126 is a cross sectional view showing a schematic structure of the thin film forming apparatus using laser in accordance with an eighty-third embodiment of the present invention.

FIG. 127 is a cross sectional view showing a schematic structure of the thin film forming apparatus using laser in accordance with an eighty-fourth embodiment of the present invention.

FIG. 128 is a cross sectional view showing a schematic structure of the thin film forming apparatus using laser in accordance with an eighty-fifth embodiment of the present invention.

FIG. 129 is an illustration showing the manner of movement of charged particles in the plume near the surface of the target, in the thin film forming apparatus using laser in accordance with the eighty-fifth embodiment of the present invention.

FIG. 130 is a is a cross sectional view showing a schematic structure of the thin film forming apparatus using laser in accordance with an eighty-sixth embodiment of the present invention.

FIG. 131 is a cross sectional view showing a schematic structure of the thin film forming apparatus using laser in accordance with an eighty-seventh embodiment of the present invention.

Figure 132:
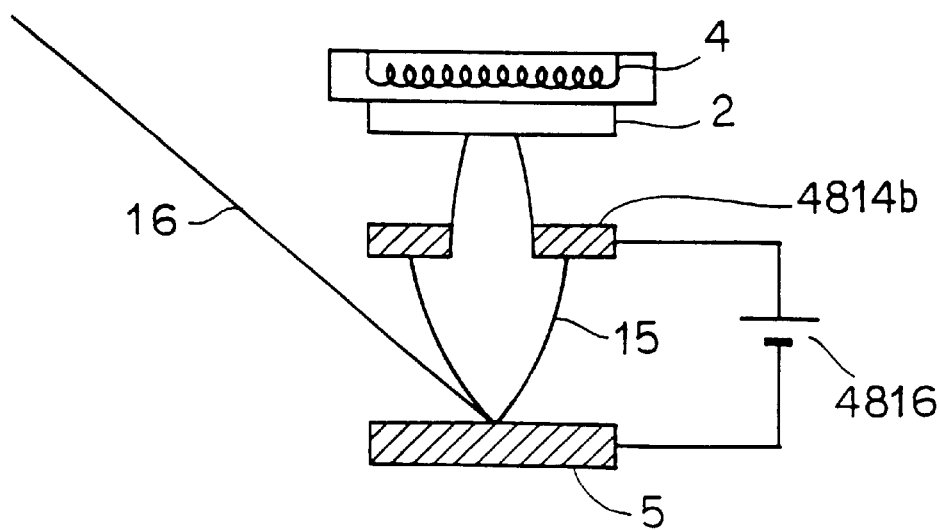

FIG. 132 is a cross sectional view showing a schematic structure of the main portion of one modification of the thin film forming apparatus using laser in accordance with the eighty-seventh embodiment of the present invention.

Figure 133:
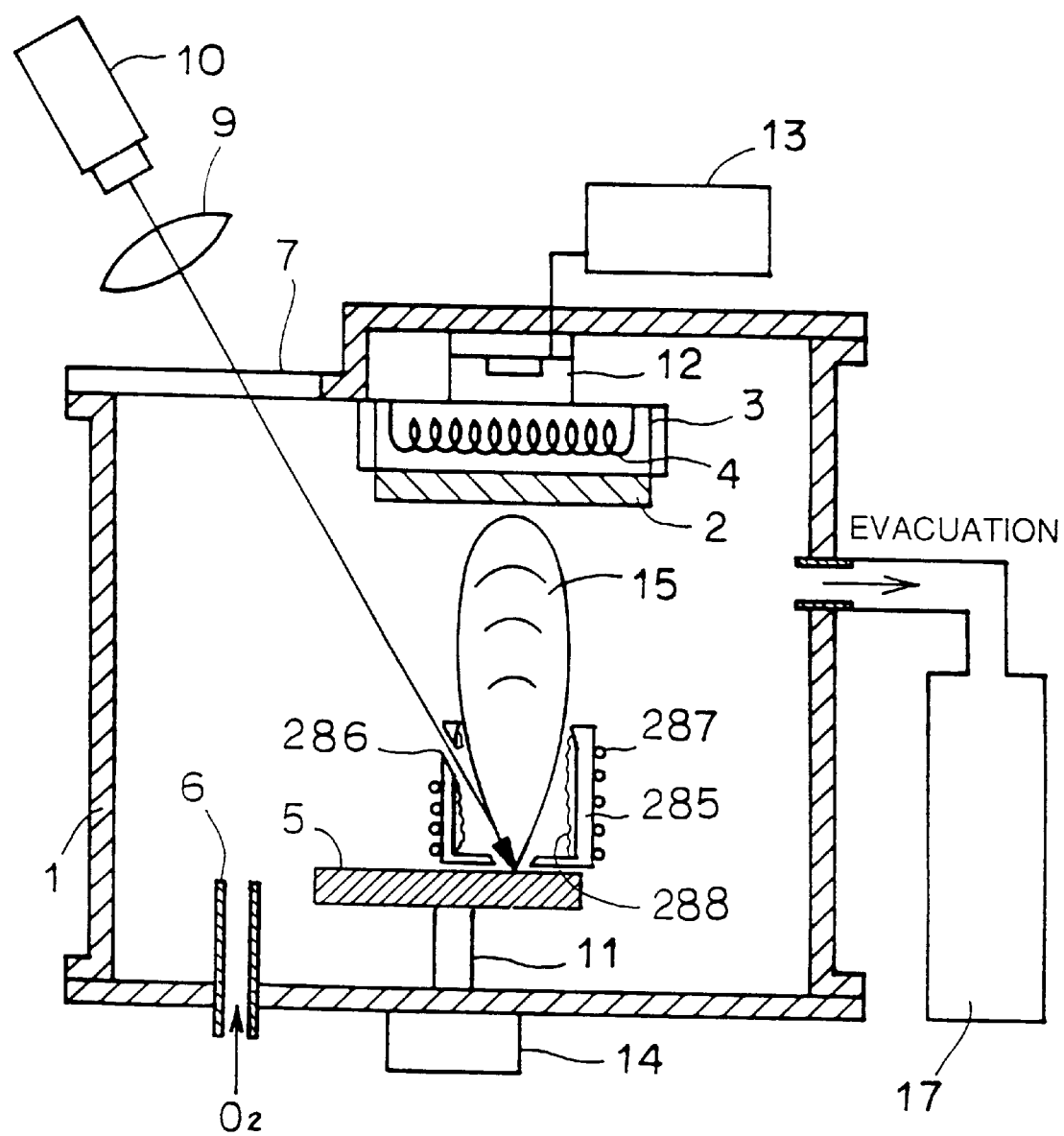

FIG. 133 is a cross sectional view showing a schematic structure of the thin film forming apparatus using laser in accordance with an eighty-eighth embodiment of the present invention.

Figure 134A:
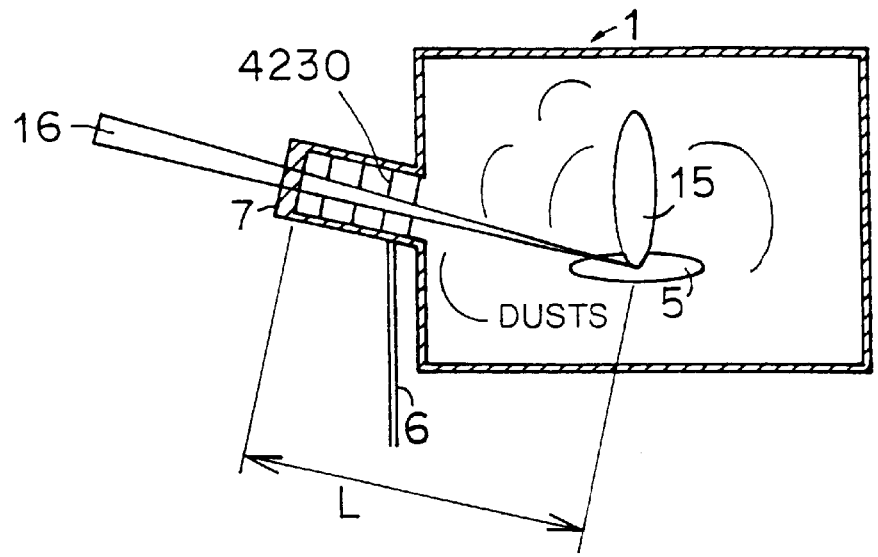
Figure 134B:
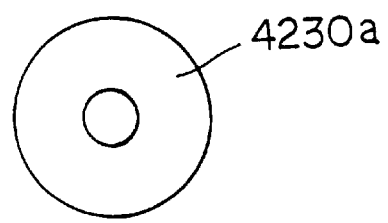
Figure 134C:
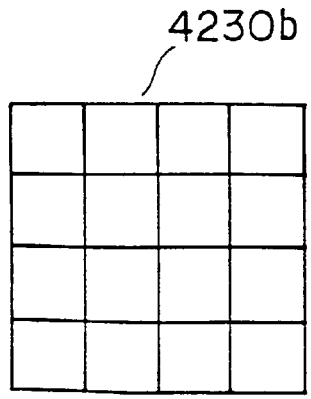
Figure 134D:
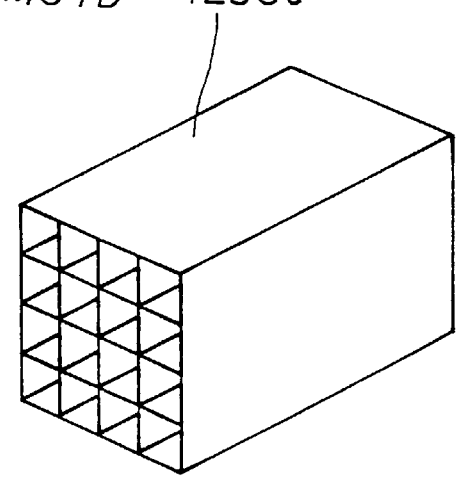

FIG. 134A is a cross sectional view showing a schematic structure of the main portion of the thin film forming apparatus using laser in accordance with an eighty-ninth embodiment of the present invention, FIG. 134B shows, in enlargement, an aperture used in the apparatus of FIG. 134A, FIG. 134C shows, in enlargement, a mesh grid used in the apparatus of FIG. 134A, and FIG. 134D is a perspective view showing, in enlargement, the shape of a lattice-like elongate grid used in the apparatus of FIG. 134A.

Figure 135:
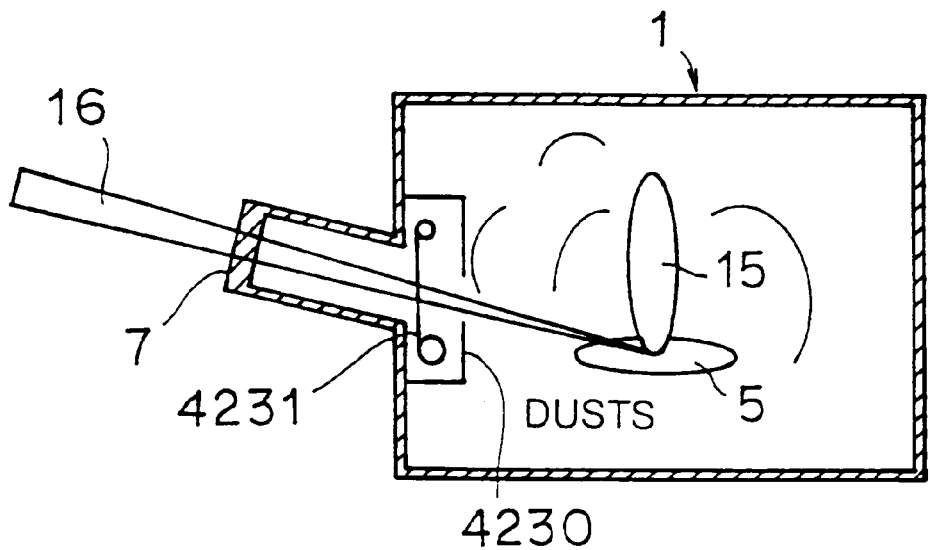

FIG. 135 is a cross sectional view showing a schematic structure of the main portion of one modification of the thin film forming apparatus using laser in accordance with the eighty-ninth embodiment of the present invention.

Figure 136:
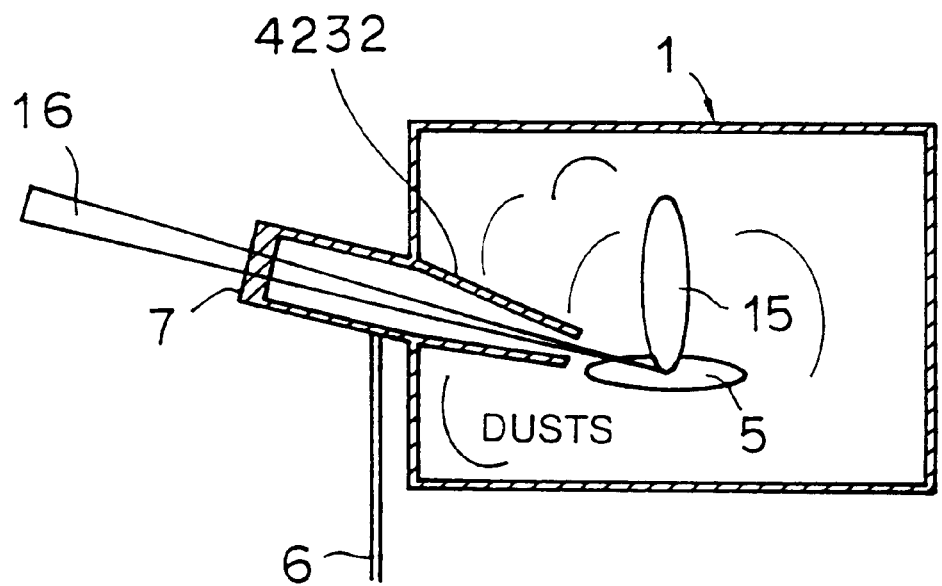

FIG. 136 is a cross sectional view showing a schematic structure of the main portion of another modification of the thin film forming apparatus using laser in accordance with the eighty-ninth embodiment of the present invention.

Figure 137:
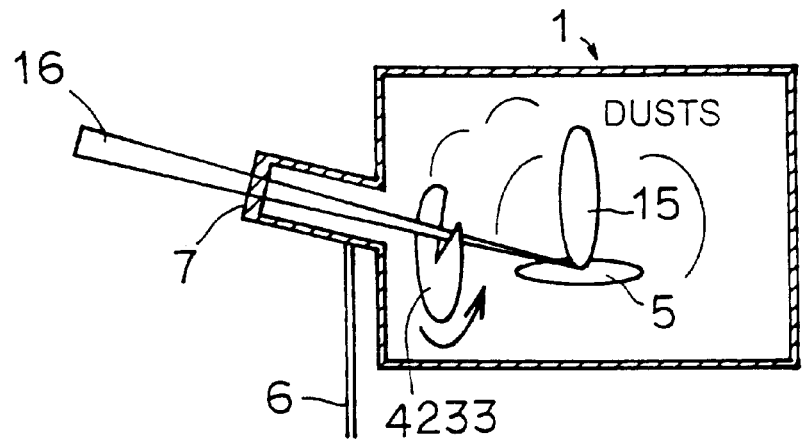

FIG. 137 is a cross sectional view showing a schematic structure of the main portion of a still another modification of the thin film forming apparatus using laser in accordance with the eighty-ninth embodiment of the present invention.

Figure 138:
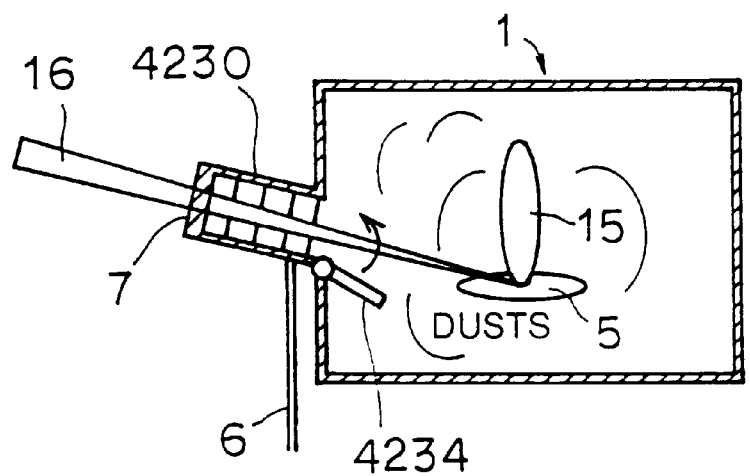

FIG. 138 is a cross sectional view showing a schematic structure of the main portion of a still further modification of the thin film forming apparatus using laser in accordance with the eighty-ninth embodiment of the present invention.

Figure 139:
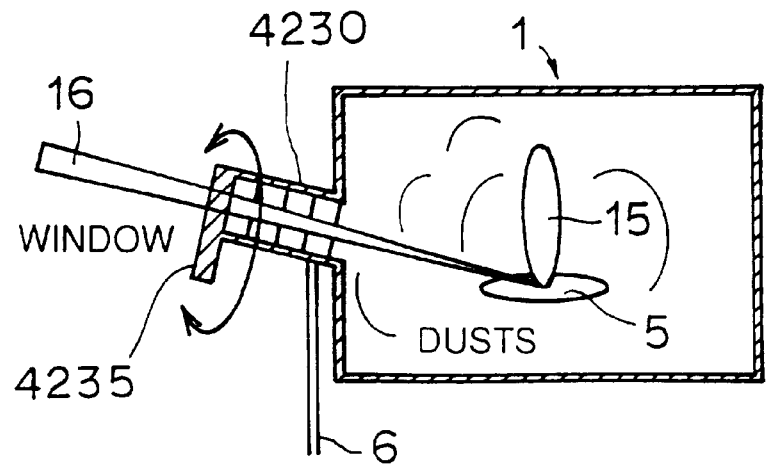

FIG. 139 is a cross sectional view showing a schematic structure of the main portion of a still further modification of the thin film forming apparatus using laser in accordance with the eighty-ninth embodiment of the present invention.

Figure 140:
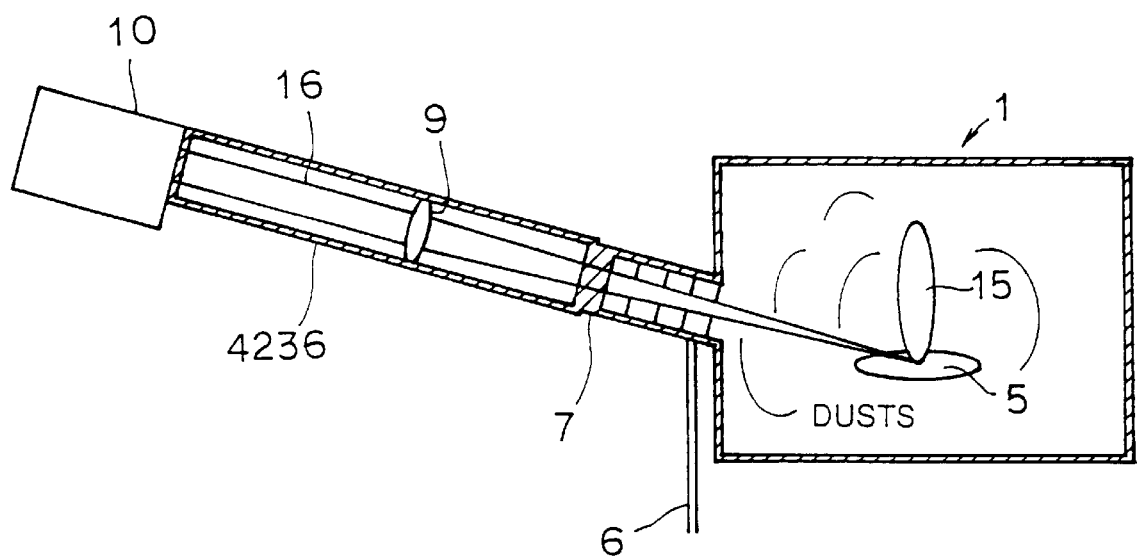

FIG. 140 is a cross sectional view showing a schematic structure of the main portion of a still further modification of the thin film forming apparatus using laser in accordance with the eighty-ninth embodiment of the present invention.

Figure 141:
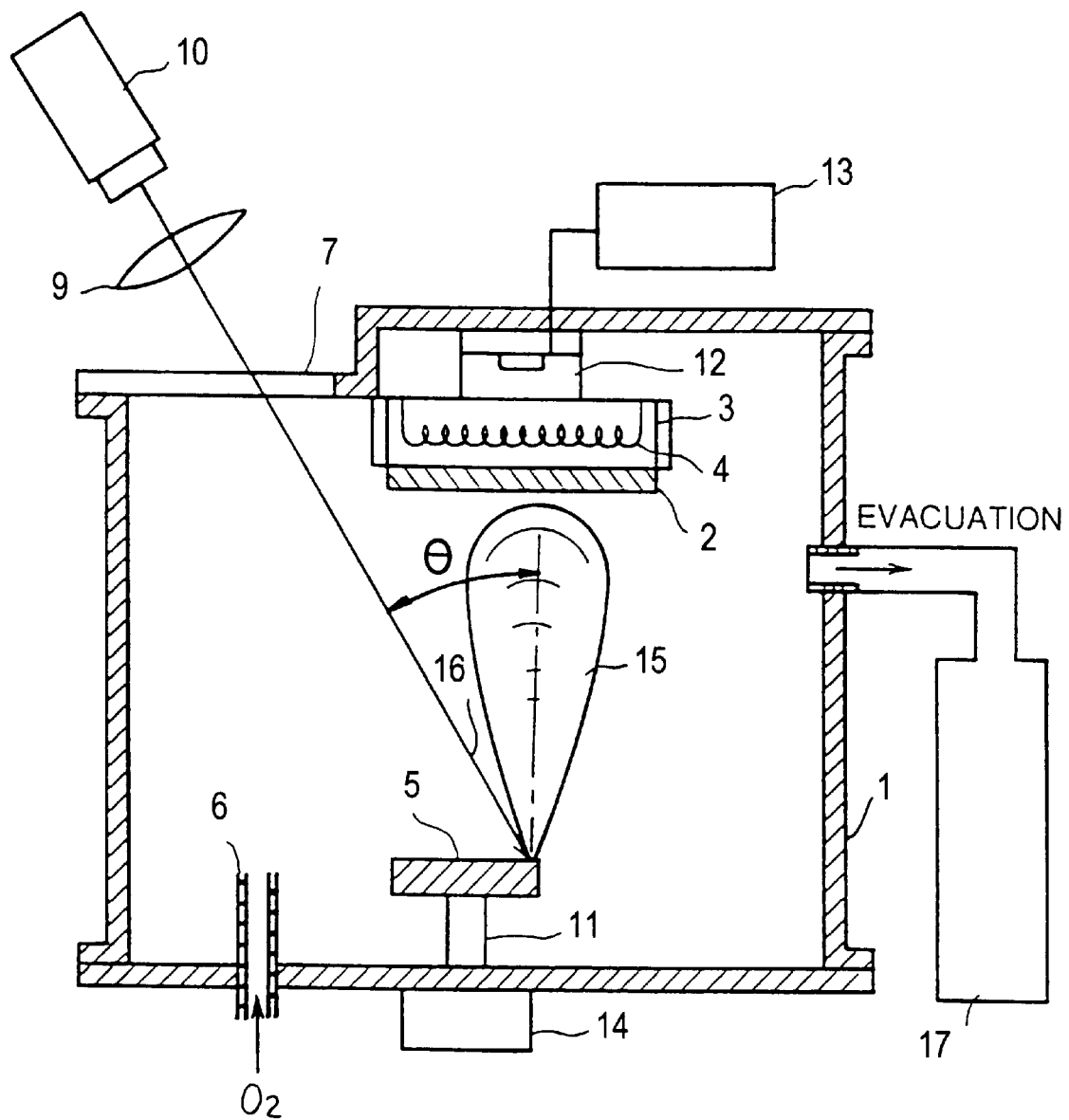

FIG. 141 is a cross sectional view showing, in enlargement, the shape of the vicinity of the target used in the thin film forming apparatus using laser in accordance with a ninetieth embodiment of the present invention.

Figure 142:
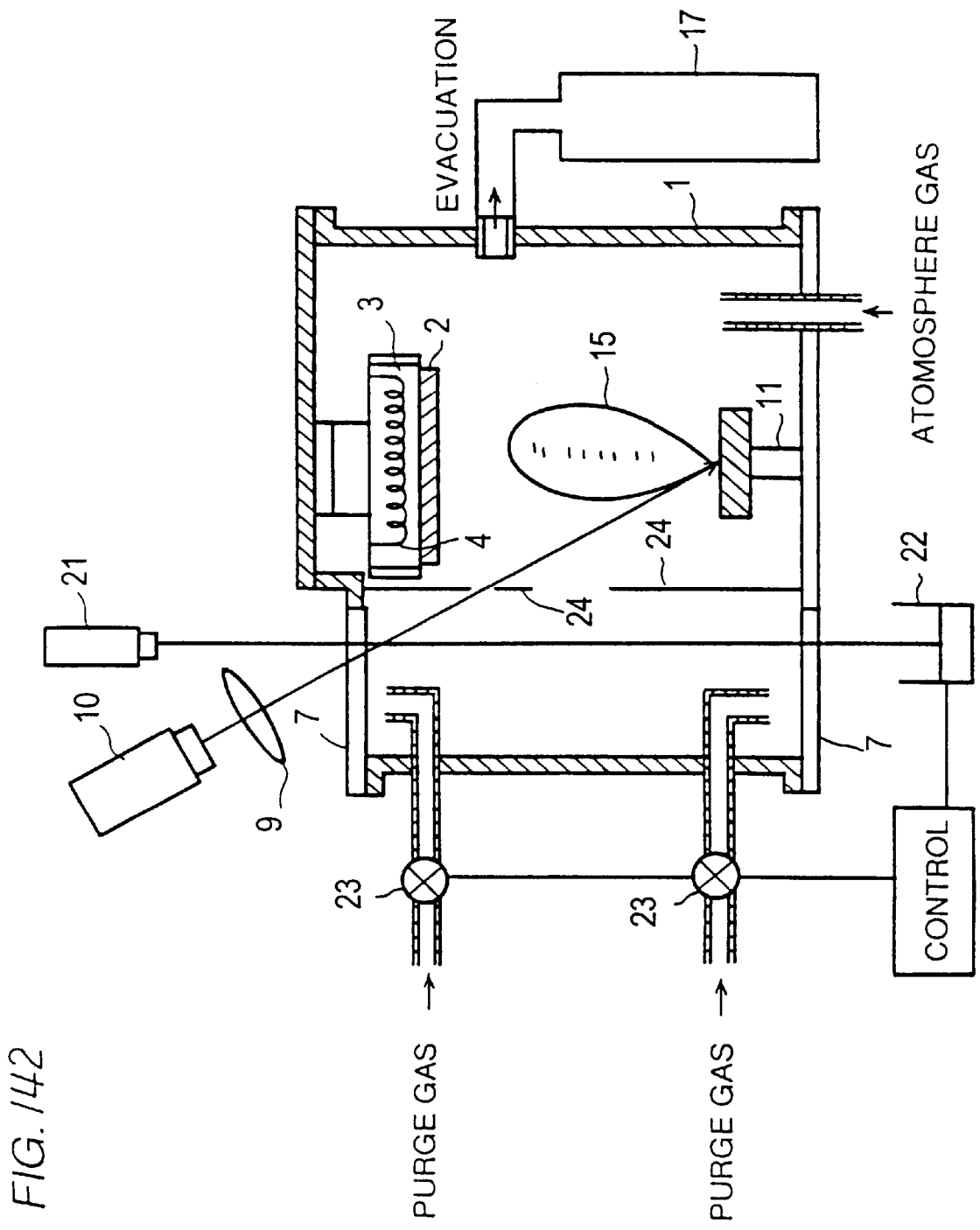

FIG. 142 is a cross sectional view showing a schematic structure of the thin film forming apparatus using laser in accordance with a ninety-first embodiment of the present invention.

Figure 143:
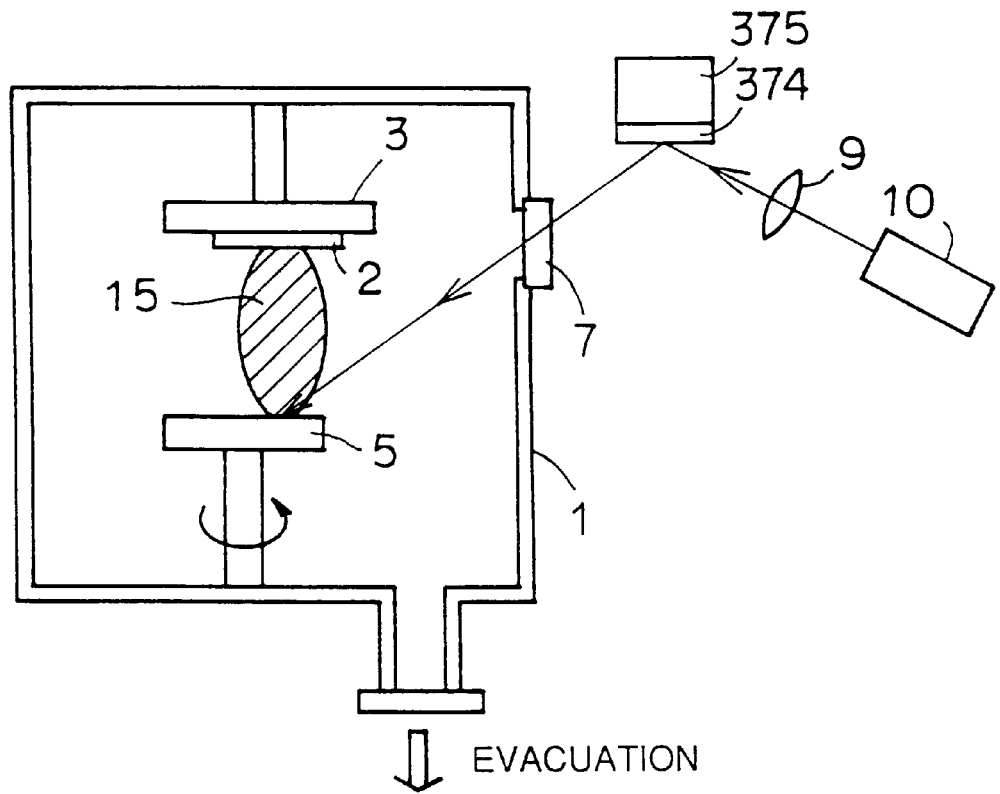

FIG. 143 is a cross sectional view showing a schematic structure of the thin film forming apparatus using laser in accordance with a ninety-second embodiment of the present invention.

Figure 144:
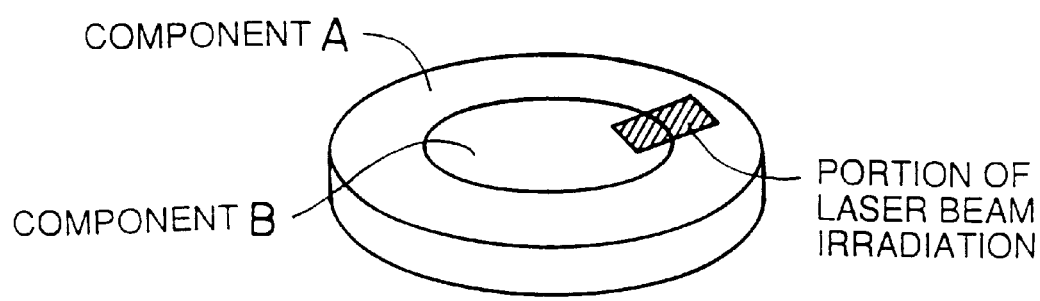

FIG. 144 is a perspective view showing irradiation of laser beam bridging two portions of a target which is divided into concentric two portions, in the thin film forming apparatus using laser in accordance with the ninety-second embodiment of the present invention.

Figure 145:
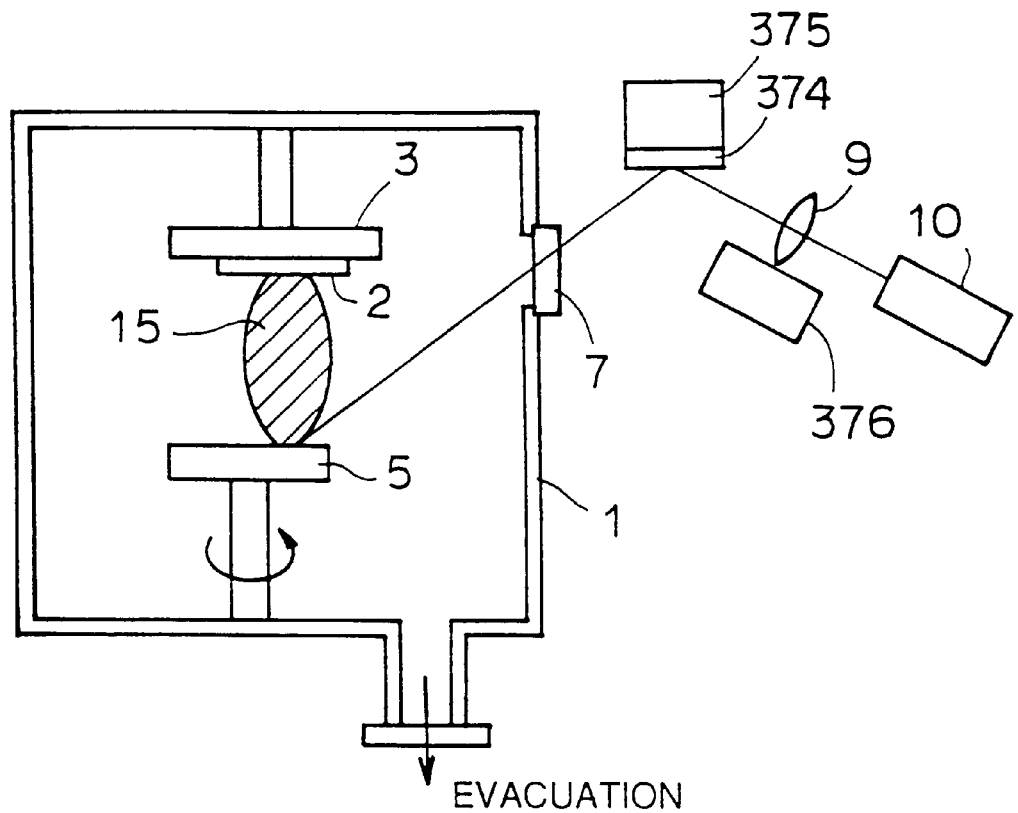

FIG. 145 is a cross sectional view showing a schematic structure of the thin film forming apparatus using laser in accordance with the ninety-third embodiment of the present invention.

Figure 146:
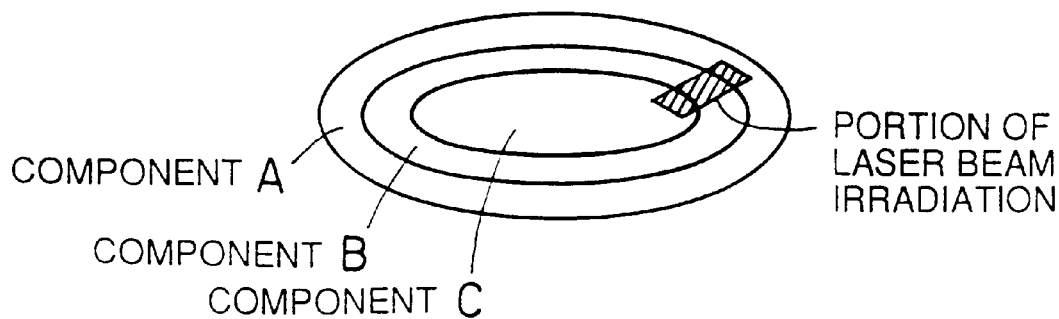

FIG. 146 is a perspective showing irradiation of laser beam reaching three portions of a target divided into concentric three portions, in the thin film forming apparatus using laser in accordance with the ninety-third embodiment of the present invention.

Figure 147:
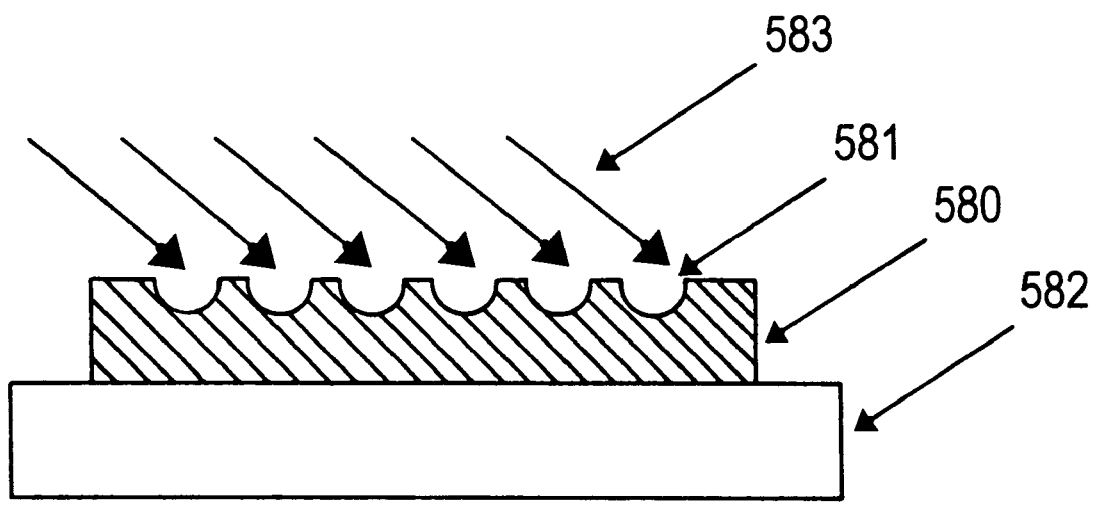

FIG. 147 is a cross sectional view showing a schematic structure of the thin film forming apparatus using laser in accordance with a ninety-fourth embodiment of the present invention.

Figure 148:
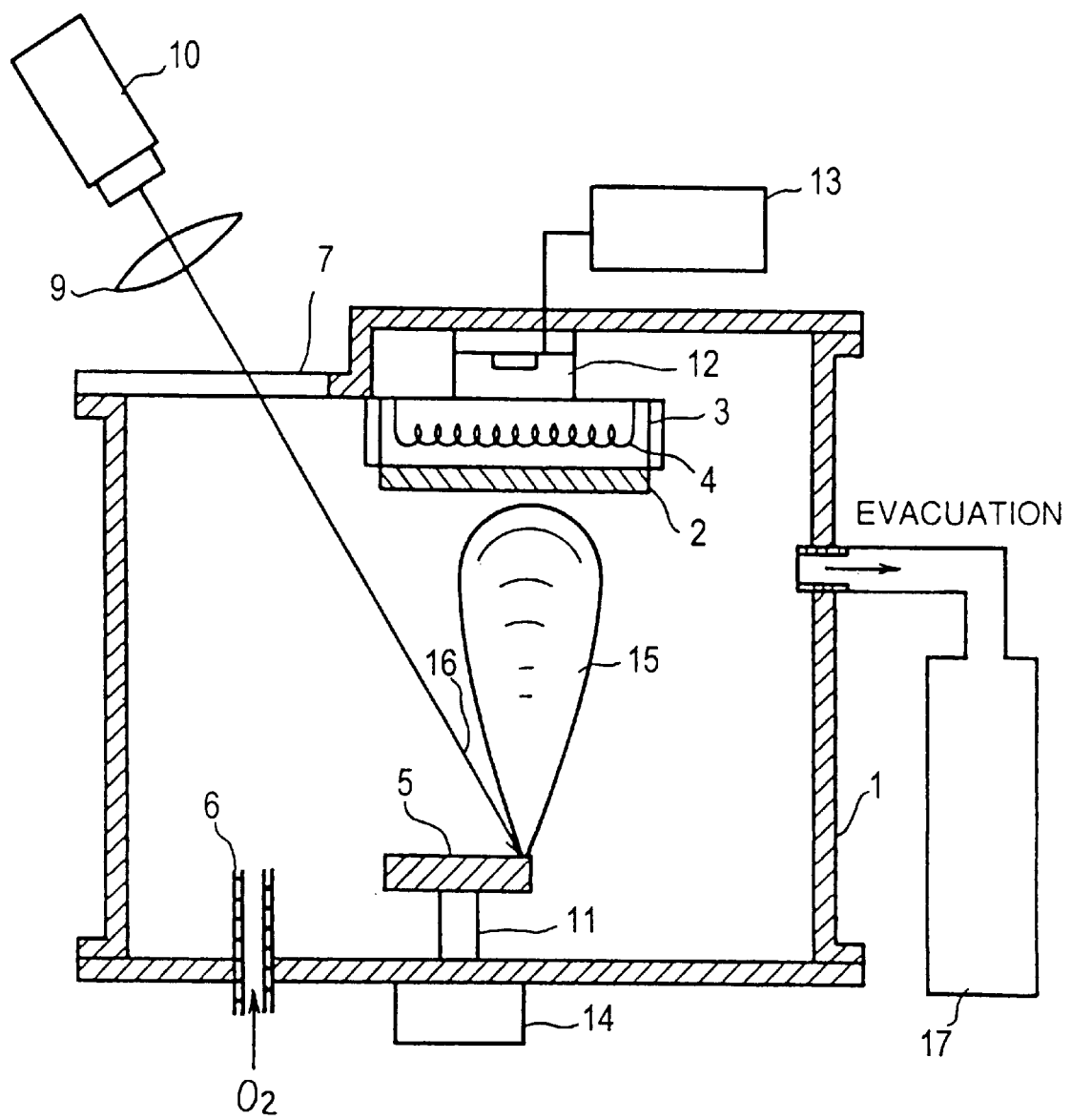

FIG. 148 is a cross sectional view showing a schematic structure of a conventional thin film forming apparatus using laser disclosed in Japanese Patent Laying-Open No. 4-452263.

Figure 149:
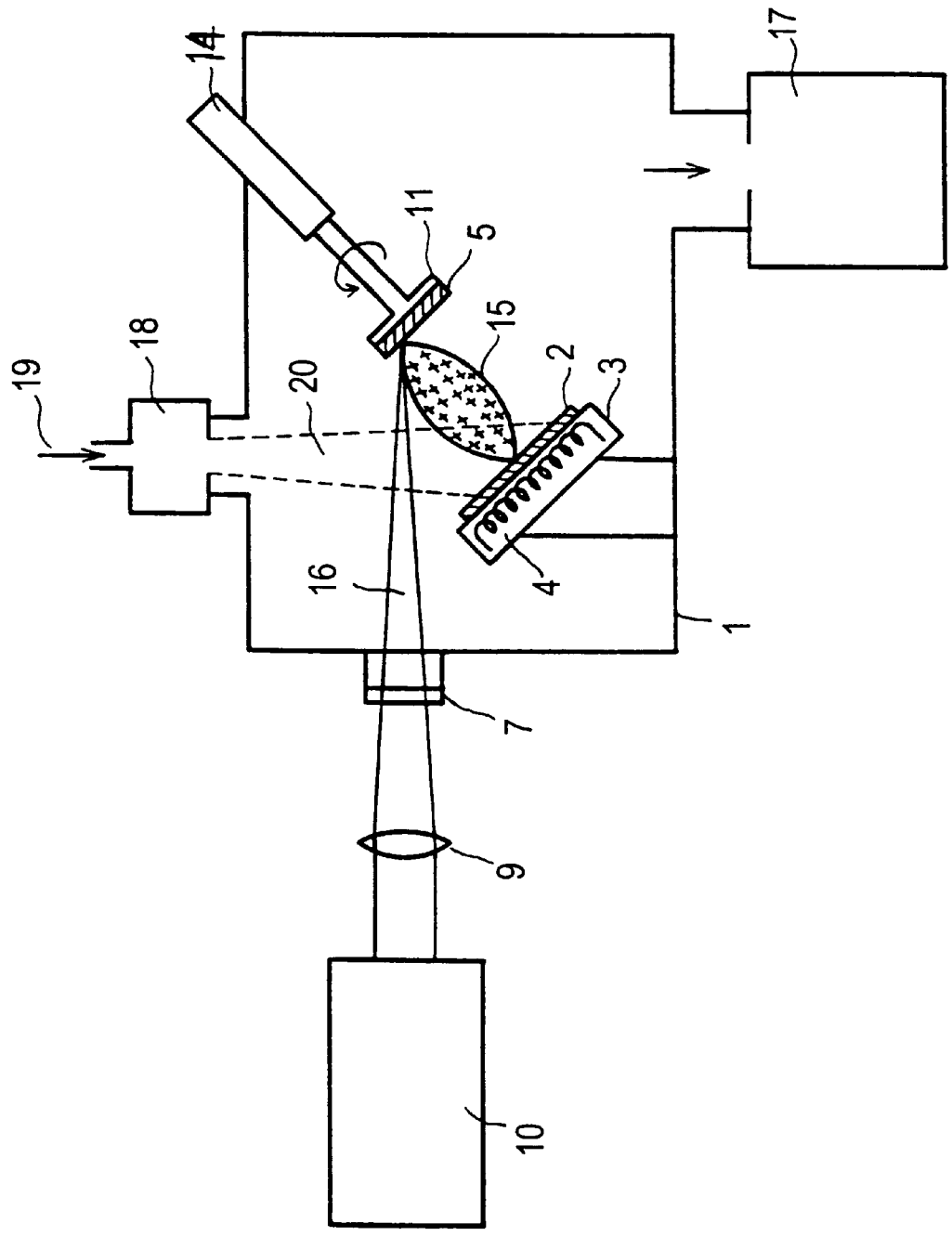

FIG. 149 is a cross sectional view showing a schematic structure of another conventional thin film forming apparatus using laser disclosed in Japanese Patent Laying-Open No. 4-114904.

DESCRIPTION OF THE PREFERRED EMBODIMENTS

Figure 1:
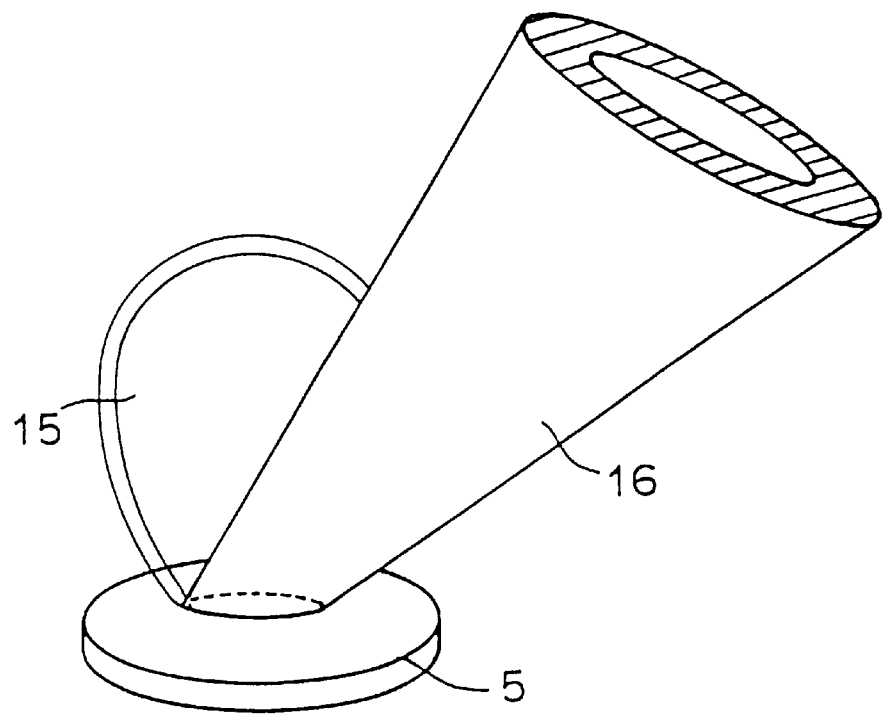
FIG. 1 is a perspective view showing the manner of laser beam irradiation on the target and generation of a plume in accordance with the first embodiment of the present invention.

A first embodiment of the present invention and a modification thereof will be described. Referring to FIG. 1, in the apparatus of this embodiment, when a target 5 is irradiated with a laser beam 16, molecules constituting the target are evaporated to generate a plume 15, which is like a frame of a candle. The plume is generated extending approximately in the direction of the normal of the target. However, the extension of the plume is small, and therefore when a film is formed by using this plume, the resulting film thickness distribution is in proportion to the intensity distribution of the plume.

Figure 2:
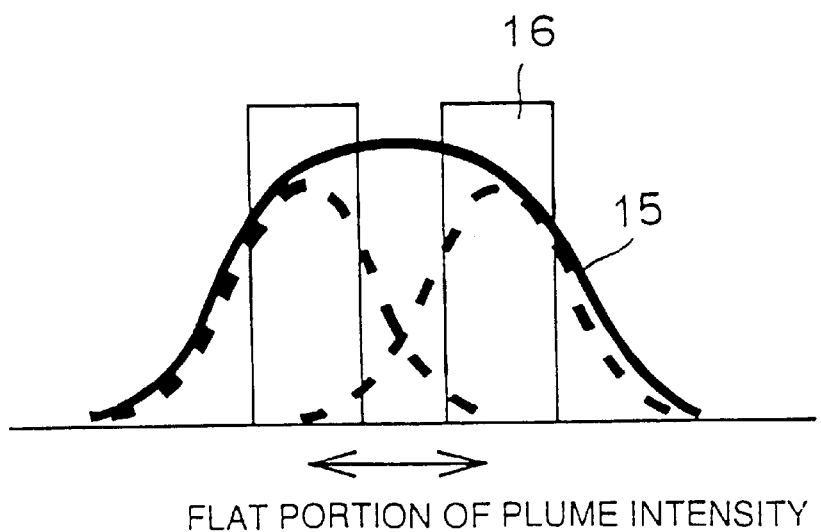
FIG. 2 is an illustration showing relation between intensity distribution of the laser beam and the intensity distribution of the plume in accordance with the embodiment shown in FIG. 1.

FIG. 2 is an illustration showing the relation between the intensity distribution of the laser beam and the intensity distribution of the plume. In the figure, the intensity distribution of the plumes represented by the dotted lines each corresponds to one annular beam, and when the two plumes represented by the two dotted lines are overlapped, a plume having a flat portion of the intensity distribution such as represented by the solid line in the figure can be obtained. The size of the plume differs dependent on the material of the target and on the energy of laser for irradiation. Therefore, it is necessary to adjust the diameter of the annular beam or to adjust in advance the laser output so that the flat portion become wide enough.

In FIG. 1, the intensity distribution of the beam is annular. The intensity distribution may be comb-shaped, a grid or a set of points. In any case, light intensity per unit area can be increased as compared with a case where the plume is enlarged by enlarging the diameter of the laser beam, and therefore the efficiency of plume generation can be increased. In addition, the flat portions of the intensity distribution of the plume can be widened, and therefore a film can be deposited on wider area with small variation in film thickness distribution.

Figure 3:
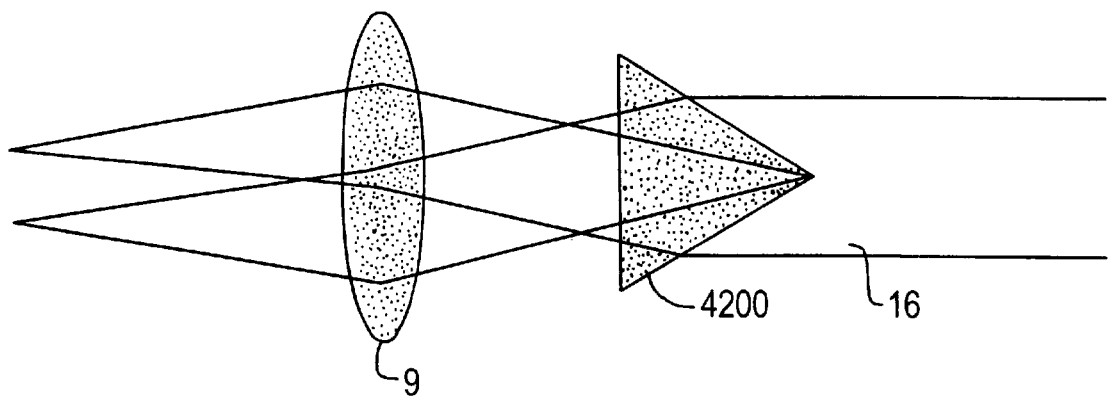
FIG. 3 shows an example of an optical system for obtaining a laser beam having annular light intensity distribution.

FIG. 3 shows an example of an optical system for obtaining a beam having appropriate distribution. The intensity distribution of a common laser beam 16 is of gauss type or has a top hat shaped. Therefore, at first, the laser beam 16 is passed through an element 4200 for changing the direction of the light. In this example, this element is a prism as shown in the figure. After passing through the element for changing the direction, the beam is divided into two and at the same time, the direction thereof is changed. When the light is condensed by using a spherical lens as a condenser lens 9, the light will be focused as two points at the point of focus. When a cylindrical lens is used as the condenser lens 9, the light provides two parallel lines. By utilizing the element for changing the direction of the light and the condenser lens, an arbitrary intensity distribution can be obtained. In order to obtain an appropriate distribution, part of the laser beam may be intercepted by providing an annular or linear aperture in a mask. However, use of the element for changing the direction of the mask is advantageous in that the loss of light caused by interception can be avoided.

Figure 4:
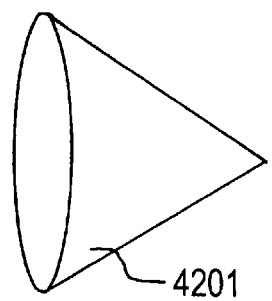
FIG. 4 is a perspective view of a conical axicone as an element for changing direction of the light beam.
Figure 5:
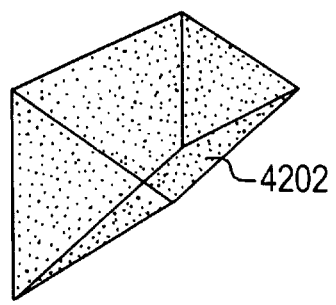
FIG. 5 is a perspective view showing an example of a prism as an optical system for obtaining a desired light intensity distribution.
Figure 6:
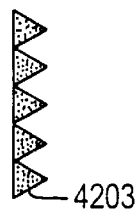
FIG. 6 shows a number of axicone or prisms aligned.
Figure 7:
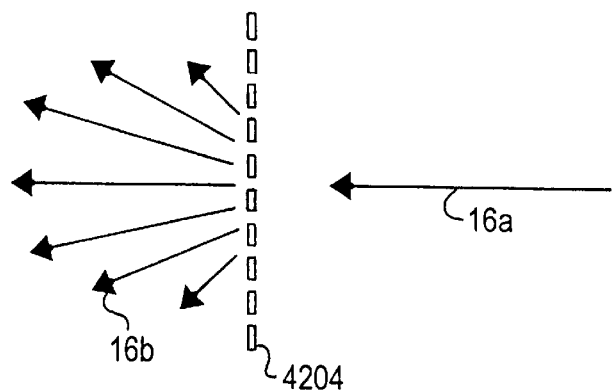
FIG. 7 shows a manner of dividing a laser beam into a number of specific directions by using a diffraction grating.
Figure 8:
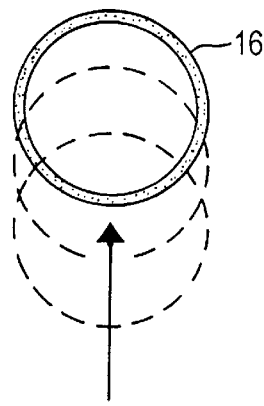
FIG. 8 shows a manner of scanning by a laser beam having annular or circular light intensity distribution.
Figure 9:
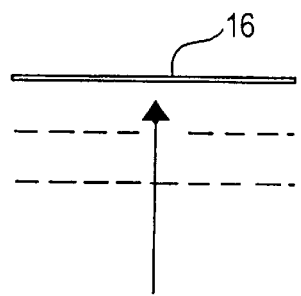
FIG. 9 shows a manner of scanning by a laser beam having linear light intensity distribution.
Figure 10:
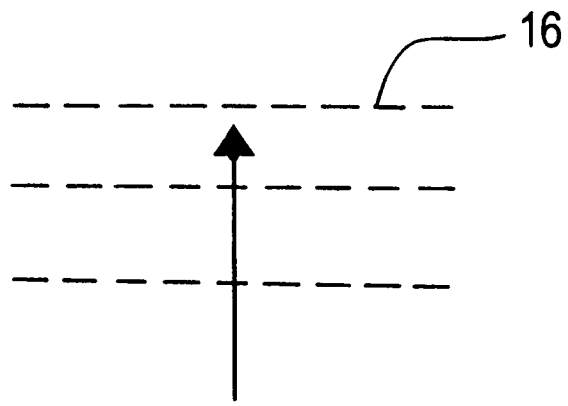
FIG. 10 shows a manner of scanning by the laser beam having dot-shaped light intensity distribution.

FIG. 4 shows a conical axicone 4201 used as the element 4200 for changing the directions of light. In this example, the direction of the beam is converted in axial symmetry, and therefore when focused, the beam will be annular. FIG. 5 shows an example employing a prism 4202. FIG. 6 shows a number of axicones 4201 or prisms 4202 aligned, which allows provision of a number of lines or annuli. FIG. 7 shows an example in which a diffraction grating 4204 is used, which can separate a laser beam 16a into a number of specific directions. A common diffraction grating having parallel groups or concentric groups may be used as the grating 4204. Though a transmitting type diffraction grating is used here, a reflecting type one may be used.

Figure 11:
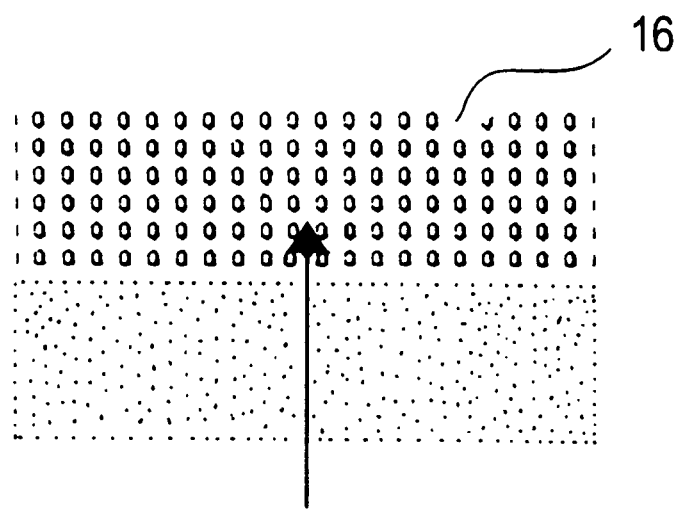
FIG. 11 shows a manner of scanning by the laser beam having light intensity distribution in the form of a set of points.
Figure 12:
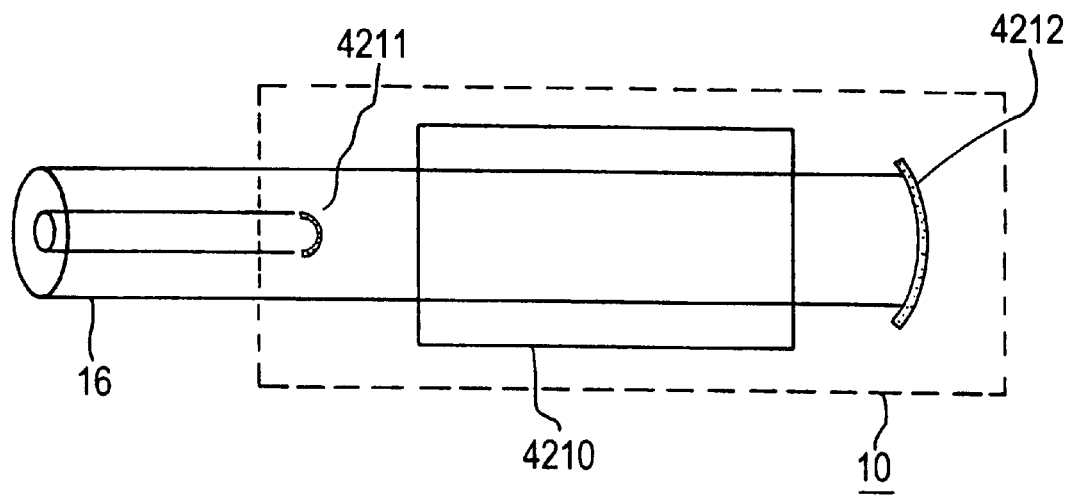
FIG. 12 shows an example of an instable type resonator for forming a light intensity distribution in advance in a laser unit.

FIGS. 8 to 11 show manners of scanning such of points of focus. When a thin film is to be formed uniform over wider area, scanning of the surface of substrate 2 by moving substrate 2 or laser beam 16 is necessary. Formation of a uniform thin film over a wide range is enabled by annular scanning (FIG. 8), linear scanning (FIG. 9), scanning in dotted lines (FIG. 10) and scanning of a set of points (FIG. 11).

Generally, intensity distribution of laser is of gauss type or has a top hat shape. However, a desirable light intensity distribution may be formed in advance in the laser unit 10. FIG. 2 shows an example which is called an instable type resonator in which a partial reflection mirror 4211 having a convex shape and a total reflection mirror 4212 having a concave shape with a gain portion 4210 interposed constitute a resonator. In this example, the laser output will be annular, as shown in the figure. However, though the distribution is annular, the direction of progress of the light is the same, and therefore when focused, the light is condensed to one point. Therefore, instead of a condenser lens, a lens unit forming images corresponding to the light intensity distribution just out of the laser unit must be incorporated.

Figure 13:
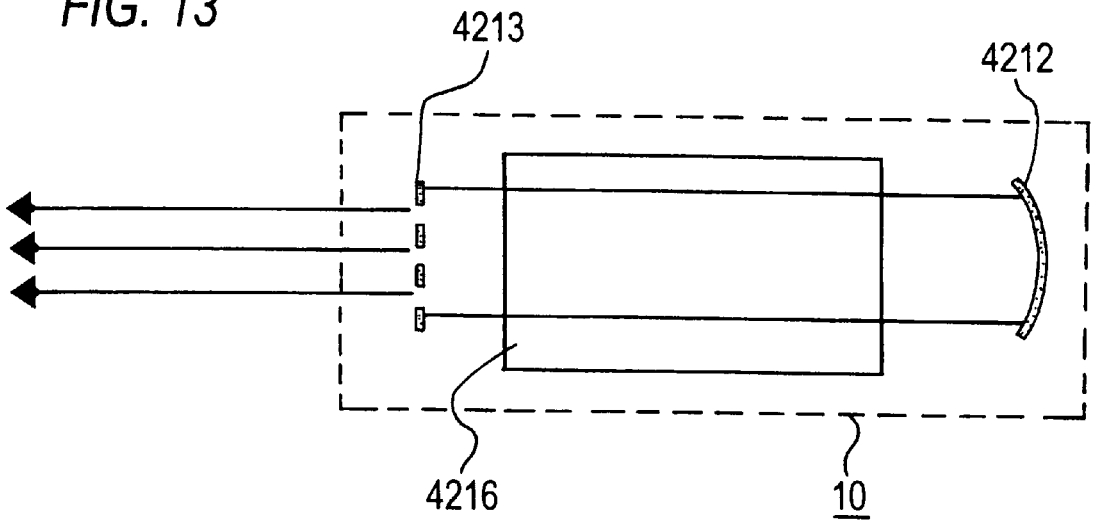
FIG. 13 shows an example in which an apertured reflection mirror is used as a partial reflection mirror of the laser unit.

FIG. 13 shows an example in which a reflection mirror 4213 having an aperture is used as the partial reflection mirror of the laser unit. If the light emitted from the laser unit is masked, the intercepted light is lost. However, in this case, the intercepted light is returned to the gain portion 4210 to be amplified once again.

A second embodiment of the present invention and its modification will be described with reference to FIGS. 14 and 19.

Figure 14:
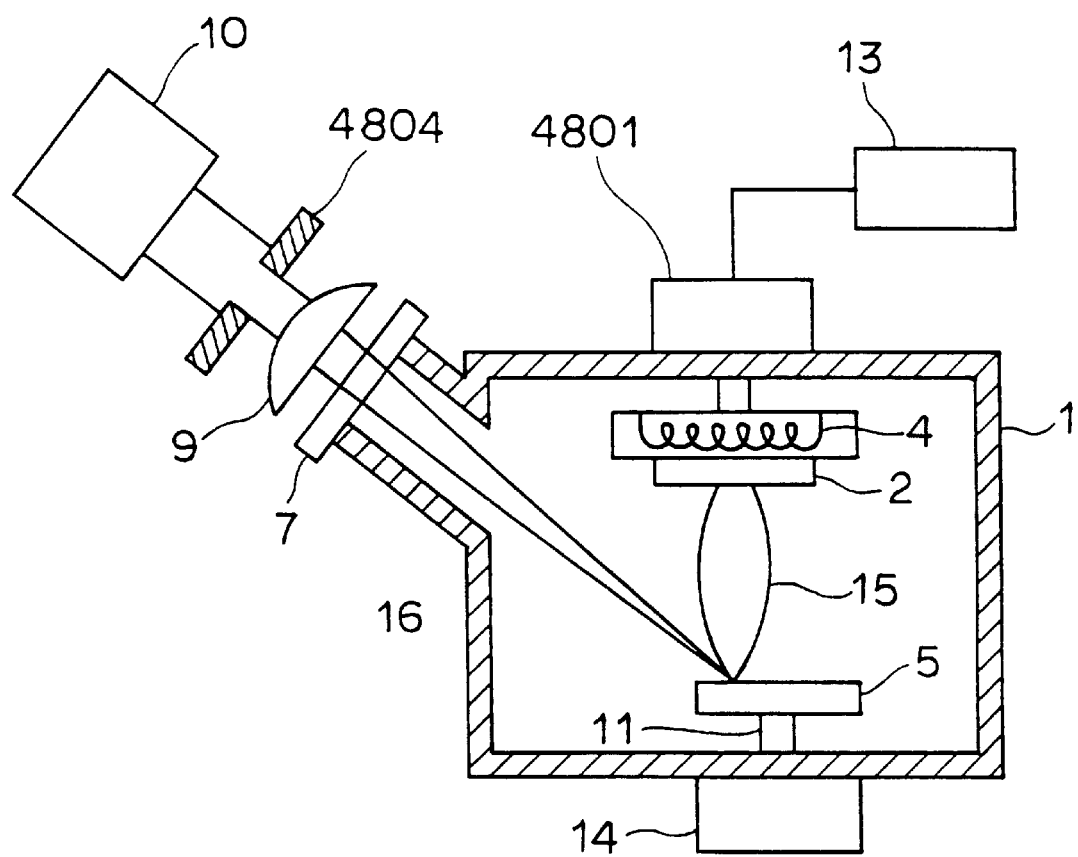
FIG. 14 is a cross section showing a schematic structure of a thin film forming apparatus using laser in accordance with the second embodiment of the present invention.

FIG. 14 is a schematic diagram of one example of the thin film forming apparatus using laser for implementing the present invention. In the thin film forming apparatus using laser shown in FIG. 14, laser beam 14 generated from laser unit 10 has portions having weak beam intensity at the periphery of the beam cross section cut by a laser beam shielding plate 4804 and only the central portion is condensed by condenser lens 9 and directed to target 5 placed in chamber 1. Chamber 1 can be evacuated to a high vacuum.

A substrate 2 is placed opposing to target 5. Laser beam 16 evaporates target 5 and generates a plume 15. Plume 15 is a plasma including particles of the same composition as the target, and a thin film is deposited on the contact surface between substrate 2 and plume 15.

The cross section of the excimer laser beam used in the method of forming thin film using laser generally has such an energy density distribution that is flat at the center and attenuated at the periphery. The target evaporated by the skirt of the beam cross section which is the portion having small laser energy density results in drops having the diameter of about 1 $\mu$m, which drops grow in the plume and are deposited on the substrate. Consequently, unevenness having the diameter of about 1 $\mu$m is generated on the substrate, degrading the film quality. In the method of the present invention, the laser beam is passed through a shielding plate which allows only the central portion of the laser beam to pass therethrough, in order to reduce the scope of the intensity distribution of the laser beam cross section, and the target is irradiated with this beam, evaporation of the target in the form of drops can be prevented.

Figure 15A:
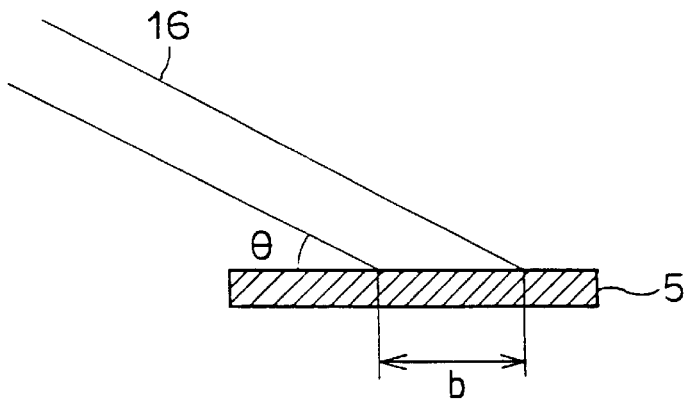
FIG. 15A shows a manner of converting cross section of a beam on the target to a square, by controlling incident angle of the laser beam with respect to the target.
Figure 15B:
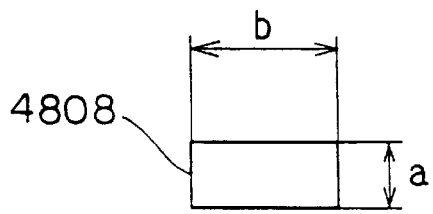
FIG. 15B shows cross sectional shape of the laser beam.

FIG. 15A shows the manner of converting the beam cross section on the target 5 to a square by controlling incident angle of laser beam 16 with respect to target 5. The incident angle θ of laser beam 16 with respect to target 5 is selected to satisfy a/b=sin θ, where a and b respectively represent lengths of shorter and longer sides of the shape of the beam in the vertical cross section with respect to the direction of progress of the laser beam as shown in FIG. 15B, and it is assumed that the longer side will be incident on the surface of target 5 in parallel. Accordingly, laser beam 16 on the surface of target 5 is converted into a square the side of which has the length of b.

Generally, the excimer laser has rectangular beam cross section, and therefore the cross sectional shape of the plume generated on the surface of the target irradiated with the laser beam also comes to have a rectangular shape. The initially generated plume having the rectangular cross section has different density gradient of plasma in the shorter side and the longer side. Accordingly, during the progress of the plume in the chamber to reach the substrate, the distribution of active particles constituting the plume in the cross section of the plume changes, degrading the film quality distribution of the deposited thin film. In the method of this embodiment, the incident angle of the laser beam with respect to the target is controlled, and a cylindrical lens is used so as to shape the laser beam cross section on the target to a square, whereby the distribution of the active particle density in the cross section of the generated plume can be made uniform.

Figure 16A:
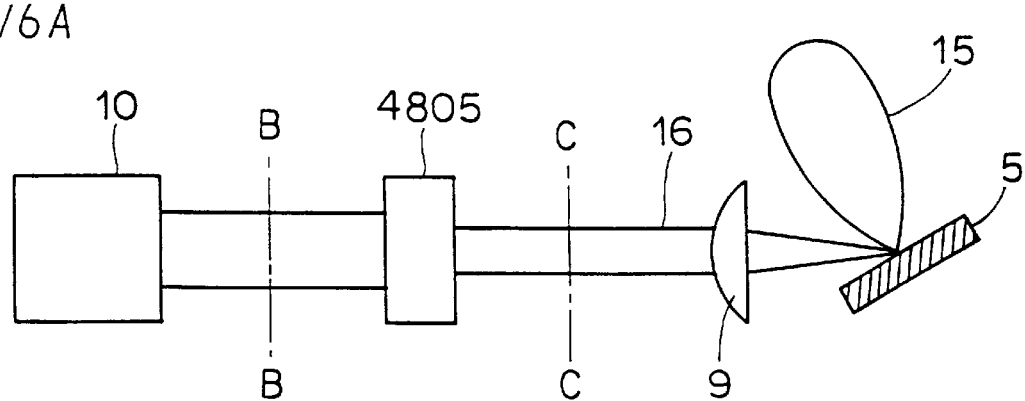
FIG. 16A is a schematic diagram of an apparatus for changing cross sectional shape of the laser beam by using a beam shape converting element.
Figure 16B:
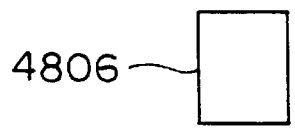
FIGS. 16B and 16C show cross sectional shapes of the laser beam in enlargement, at the cross section taken along the line B—B and C—C of FIG. 16A.
Figure 16C:
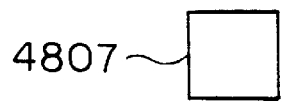

FIG. 16A is a schematic diagram showing an example of an apparatus for changing the shape of the cross section of laser beam 16 by using a beam shape converting element 4805. Laser beam 16 emitted from laser unit 10 has its rectangular cross section 4806 shown in FIG. 16B changed to a square beam cross section 4807 shown in FIG. 16C, the target 5 is irradiated with this beam, and plume 15 is generated.

Figure 17:
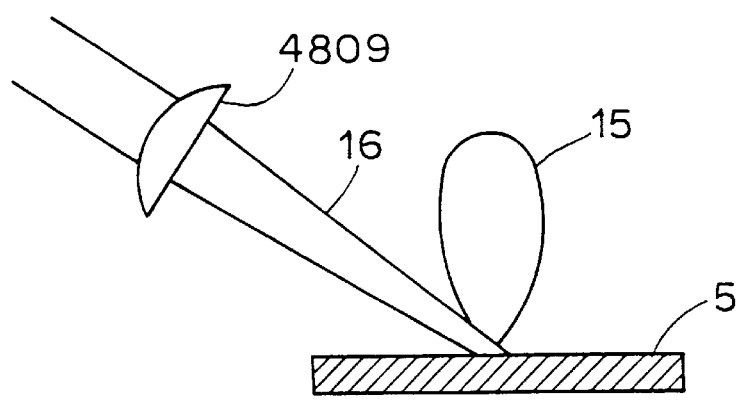
FIG. 17 is a schematic diagram of an apparatus for changing the cross section of the beam on the target to a square by using a cylindrical lens.

FIG. 17 is a schematic diagram showing an example of an apparatus for changing the cross section of the beam on target 5 to a square by using a cylindrical lens 4809. Only the long side direction of the rectangular cross section of laser beam 16 is selectively condensed by cylindrical lens 4809, and therefore when incident on target 5, the beam has its cross section converted to a square.

Figure 18:
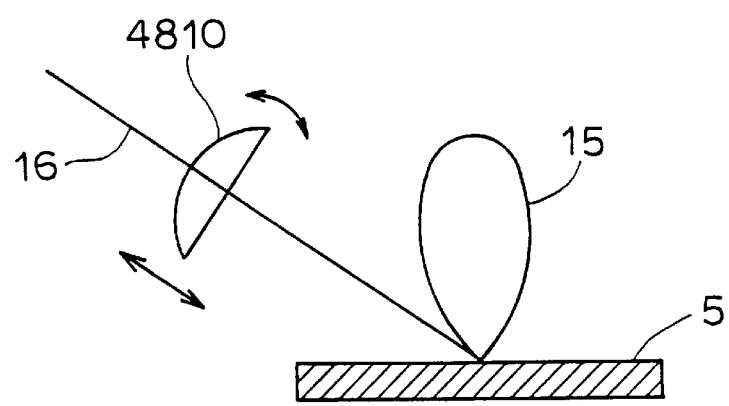
FIG. 18 is a schematic diagram of an apparatus for moving position of irradiation of the target with the laser beam, employing a movable condenser lens.

FIG. 18 is a schematic diagram showing an example of an apparatus for changing the position of irradiation of target 5 with laser beam 16 by using a movable condenser lens 4810. The movable condenser lens 4810 has its set inclination and position changed at every pulse of laser beam 16, so that the position of irradiation of target 5 with laser beam 16 can be changed.

When only one point of the target is irradiated with a laser beam, only a portion of the target is locally sputtered, and therefore a crater is generated, particle composition of the generated plume changes, and the film thickness distribution and the quality of the deposited thin film varies. In the method of the present invention, the lens for condensing laser beam is made movable and the condenser lens is moved at every laser pulse, and in addition, the partial reflection mirror of the optical resonator in the laser unit is moved a little by every pulse so as to change the mode of the laser beam, whereby the position of laser beam generation on the target can be changed.

Figure 19:
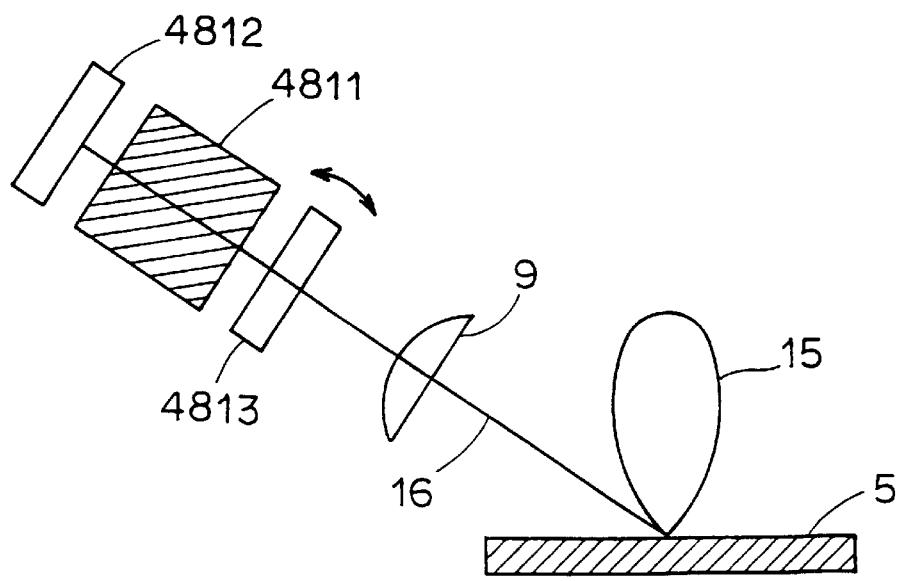
FIG. 19 is a schematic diagram of an apparatus for moving position of irradiation of the target with the laser beam employing a movable partial reflection mirror in an optical resonator in the laser unit.

FIG. 19 is a schematic diagram showing an example of an apparatus for changing position of irradiation of target 5 with laser beam 16 by making movable the partial reflection mirror 4813 of the optical resonator in laser unit 10. The movable partial reflection mirror 4813 has its set inclination changed at every pulse of laser beam 16, so that the position of irradiation of target 5 with laser beam 16 can be changed.

By using the apparatus of FIG. 14, a $Y_1Ba_2Cu_3O_{7-x}$ oxide superconductive thin film was fabricated in accordance with the method of the present embodiment. An $SrTiO_3$ single crystal substrate was used as the substrate 2, and the substrate temperature was 700° C. A sintered body of $Y_1Ba_2Cu_3O_{7-x}$ having the diameter of 2 cm was used as target 5. The distance between substrate 2 and target 5 was 5 cm. The inside of chamber 1 was evacuated to $1 \times 10^{-4}$ Torr, and then oxygen gas was introduced to 200 m Torr. A laser beam shielding plate having a rectangular aperture at the center was placed between laser unit 10 and condenser 9.

As excimer laser having the wavelength of 19 nm was used as the laser. The laser beam cross section of about 6×12 mm² had the peripheral portion cut by the beam shielding plate, resulting in the cross section of 4×10 mm².

The laser output was set to 3 J/cm², the area of laser beam irradiation was 1×2.5 mm², and the pulse frequency was set to 2 Hz. The target was rotated at 120 rpm.

Film formation was carried out for 40 minutes under the above described conditions, and the film thickness distribution and superconductive characteristics of the obtained oxide superconductive thin film were measured, and the surface of the thin film was observed by scanning electron microscope (SEM). Consequently, the variation in film thickness distribution in the oxide superconductive thin film fabricated in accordance with the method of the present invention was ±5% in a circle having the diameter of 25 mm. By SEM observation, about 5 spherical protrusions having the diameter of about 1 $\mu$m were observed per 10×10 $\mu$m² on the substrate surface. Meanwhile, the variation in film thickness distribution when the thin film was formed under the same conditions with similar laser energy density but not using the beam shielding plate was ±10% in the circle having the diameter of 25 mm, and about 10 spherical protrusions were observed per 10×10 $\mu$m² by SEM observation. The critical temperature of the oxide superconductive thin film fabricated in accordance with the method of the present invention was 87K and the average film thickness was about 3000 Å.

A $Y_1Ba_2Cu_3O_{7-x}$ oxide super conductive thin film was fabricated in accordance with the method of the present embodiment by using the apparatus of FIG. 15A. An $SrTiO_3$ single crystal substrate was used as substrate 2, and the temperature of the substrate was 700° C. A sintered body of $Y_1Ba_2Cu_3O_{7-x}$ having the diameter of 2 cm was used as target 5. The distance between substrate 2 and target 5 was 5 cm. The inside of chamber 1 was evacuated to 1×10−4 Torr, and then oxygen gas was introduced to 200 m Torr.

An excimer laser having the wavelength of 193 nm was used as the laser. The cross section of the laser beam was about 6×12 mm², and the incident angle θ of laser beam 16 with respect to target 5 was set to 30° C. The laser output was set to 3 J/cm², the area of laser beam irradiation was 2×2 mm², and the pulse frequency was 2 Hz. The target was rotated at 120 rpm.

Film formation was carried out for 25 minutes under the above described conditions, and film thickness distribution and superconductive characteristics of the obtained oxide superconductive thin film were measured. Consequently, the variation of film thickness distribution of the oxide superconductive thin film fabricated in accordance with the method of the present invention was ±5% in a circle having the diameter of 25 nm. The critical temperature was 93K. The variation in the film thickness distribution of the film formed under the same conditions except that the incident angle of the laser beam was 60° C. was ±10% in the circle having the diameter of 25 nm, and the critical temperature was 87K. The average film thickness of the oxide superconductive thin film fabricated in accordance with the method of the present invention was about 300 Å.

A $Y_1Ba_2Cu_3O_{7-x}$ oxide superconductive thin film was formed in accordance with the method of the present embodiment using the apparatus of FIGS. 16 and 17. An $SrTiO_3$ single crystal substrate was used as substrate 2, and the temperature of the substrate was 700° C. A sintered body of $Y_1Ba_2Cu_3O_{7-x}$ having the diameter of 2 cm was used as target 5. The distance between substrate 2 and target 5 as 5 cm. The inside of chamber 1 was evacuated to 1×10$^{-4}$ Torr, and then oxygen gas was introduced to 200 m Torr. A cylindrical lens 4809 was placed between laser unit 10 and condenser lens 9.

An excimer laser having the wavelength of 193 nm was used as the laser. The cross section of the laser beam was about 6×12 mm², the laser output was set to 3 J/cm², the area of laser beam irradiation was 2×2 mm², and pulse frequency was set to 2 Hz. The target was rotated at 120 rpm.

Film formation was carried out for 25 minutes, and film thickness distribution and the superconductive characteristics of the obtained oxide superconductive thin film were measured. Consequently, the variation in film thickness distribution of the superconductive thin film fabricated in accordance with the method of the present invention was ±5% in a circle having the diameter of 25 mm. The critical temperature was 93K. The variation in film thickness distribution of a film formed under the same conditions but not using cylindrical lens 4809 was ±10% in the circle having the diameter of 25 mm, and the critical temperature was 87K. The average film thickness of the oxide superconductive thin film fabricated in accordance with the method of the present invention was about 3000 Å.

A $Y_1Ba_2Cu_3O_{7-x}$ oxide superconductive thin film was formed in accordance with the method of the present embodiment by using the apparatus of FIG. 18. An $SrTiO_3$ single crystal substrate was used as substrate 2, and temperature of the substrate was set to 700° C. A sintered body of $Y_1Ba_2Cu_3O_{7-x}$ having the diameter of 2 cm was used as target 5. The distance between substrate 2 and target 5 was set to 5 cm. The inside of chamber 1 was evacuated to 1×10$^{-4}$ Torr, and then oxygen gas was introduced to 200 m Torr. Film formation was carried out while movable condenser lens 4810 was moved slightly at every laser pulse.

An excimer laser having the wavelength of 193 nm was used as the laser. The laser beam cross section was about 6×12 mm², the laser output was set to 3 J/cm², the area of laser beam irradiation was 1×2 mm² and the pulse frequency was 2 Hz. The target was rotated at 120 rpm.

Film formation was carried out for 50 minutes, and the film thickness distribution and the superconductive characteristics of the obtained oxide superconductive thin film were measured. As a result, variation in the film thickness distribution of the oxide superconductive thin film formed in accordance with the method of the present invention was ±10% in a circle having the diameter of 25 mm. The critical temperature was 93K. The variation in film thickness distribution of a film formed under the same conditions as described above with the movable condenser lens fixed was ±10% in the circle having the diameter of 25 mm, and the critical temperature was 87K.

The average film thickness of the oxide superconductive thin film fabricated in accordance with the method of the present invention was about 3000 Å.

A $Y_1Ba_2Cu_3O_{7-x}$ superconductive thin film was fabricated in accordance with the method of the present embodiment by using the apparatus of FIG. 19. An $SrTiO_3$ single crystal substrate was used as substrate 2, and the substrate temperature was 700° C. A sintered body of $Y_1Ba_2Cu_3O_{7-x}$ was used as the target. The distance between substrate 2 and target 5 was 5 cm. The inside of chamber 1 was evacuated to 1×10$^{-4}$ Torr, and then oxygen gas was introduced to 200 m Torr. The film was formed with the movable partial reflection mirror 4813 moved slightly at every laser pulse.

An excimer laser having the wavelength of 193 nm was used as the laser. The laser beam cross section was about 6×12 mm², the laser output was set to 3 J/cm², the area of laser beam irradiation was 1×2 mm², and the pulse frequency was 2 Hz. The target was rotated at 120 rpm.

Film formation was carried out for 50 minutes under the above described conditions, and the film thickness distribution and the superconductive characteristics of the obtained oxide superconductive thin film were measured. As a result, the variation in film thickness distribution of the oxide superconductive thin film fabricated in accordance with the method of the present invention was ±10% in a circle having the diameter of 25 mm. The critical temperature was 93K. The variation in film thickness distribution of a film formed under the same conditions except that the movable partial reflection mirror was fixed was ±10% in the circle having the diameter of 25 mm, and the critical temperature was 87K. The average film thickness of the oxide superconductive thin film fabricated in accordance with the method of the present invention was about 3000 Å.

Figure 20:
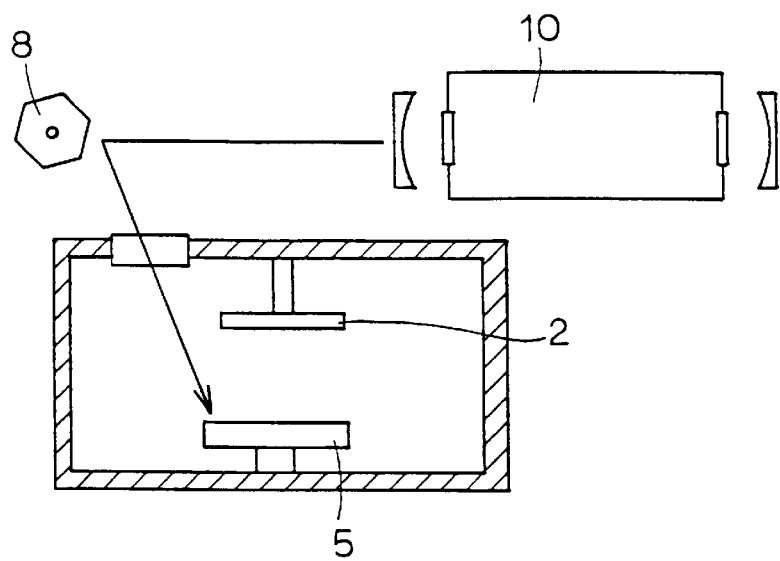
FIG. 20 is a cross sectional view showing schematic structure of a thin film forming apparatus using laser in accordance with the third embodiment of the present invention.

A third embodiment of the present invention will be described. FIG. 20 shows a structure of a film forming apparatus in accordance with the third embodiment of the present invention. Referring to FIG. 20, the apparatus of this embodiment includes a laser oscillator 10, a polygon mirror 8 for laser scanning, a target 5 and a substrate 2.

The functions of various portions of the apparatus shown in FIG. 20 are as follows. The beam emitted from the laser oscillator was condensed by a condenser lens to be incident on the target. Consequently, a plume is generated on the target, and the substances included in the plume are deposited on the substrate to form a thin film. Here, the area on which the film can be formed by one plume is limited. In order to form a film over wider area, a rotatable polygon mirror for laser beam scanning is inserted in the optical path of the laser beam so as to change the direction of the laser beam, whereby the position of plume generation on the target is moved, enabling film formation on wider area. Consequently, by such a simple mechanism as to rotate a polygon mirror only, a uniform thin film can be formed over a wide area.

Figure 21:
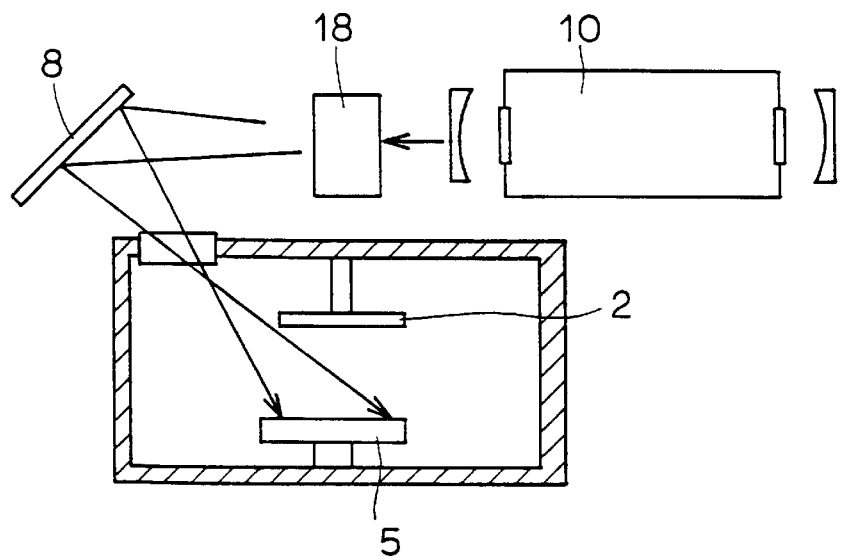
FIG. 21 is a cross section showing a schematic structure of a thin film forming apparatus using laser in accordance with the fourth embodiment of the present invention.

A fourth embodiment of the present invention will be described. FIG. 21 is a schematic diagram showing a structure of the film forming apparatus in accordance with the fourth embodiment of the present invention. Referring to FIG. 21, the apparatus of this embodiment includes a laser oscillator 10, a mirror 8 for guiding the laser beam to the target, an acoustic optical element 18, a target 5 and a substrate 2.

The functions of various portions of the apparatus shown in FIG. 21 are as follows. The light beam emitted from the laser oscillator is condensed by a condenser lens to be incident on the target. Consequently, a plume is generated on the target, and substances included in the plume are deposited on the substrate to form a thin film. Here, the area on which film can be formed by one plume is limited. In order to form a film over a wide area, an acoustic optical element controlling the direction of progress of the light beam by sonic deflection is inserted in the optical path of the laser beam, so as to change the direction of the laser beam. Thus the position of plume generation on the target is moved, enabling film formation over a wider area. Consequently, without any complicated mechanism for moving the optical element, a uniform thin film can be formed over a wide area.

Figure 22:
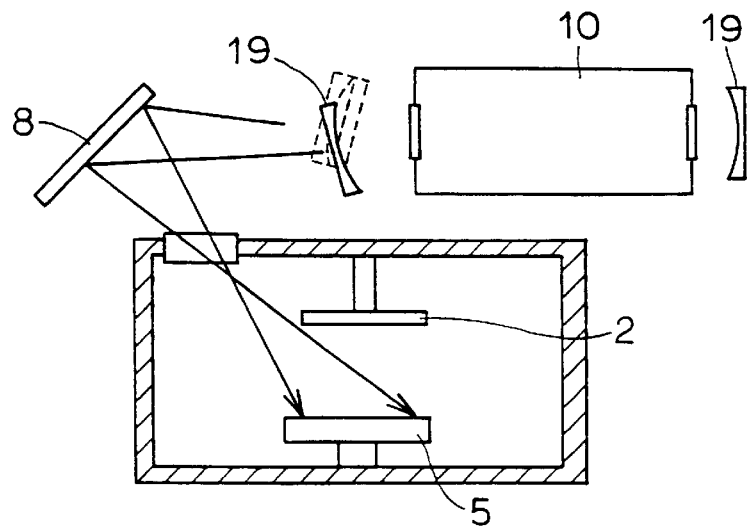
FIG. 22 is a cross sectional view showing schematic structure of a thin film forming apparatus in accordance with the fifth embodiment of the present invention.

A fifth embodiment of the present invention will be described. FIG. 22 is a schematic diagram showing the structure of the film forming apparatus in accordance with the fifth embodiment of the present invention. Referring to FIG. 22, the apparatus of the present embodiment includes a laser oscillator 10, a mirror 19 constituting a resonator of the laser oscillator, a mirror 8 for guiding the laser beam to the target, a target 5 and a substrate 2.

The functions of various portions of the apparatus shown in FIG. 22 are as follows. The beam emitted from the laser oscillator is incident on the target. Consequently, a plume is generated on the target, and the substances included in the plume are deposited on the substrate to form a thin film.

Here, the area on which the film can be formed by one plume is limited. In order to form a film over a wider area, the direction of laser beam emission from the laser oscillator is changed by moving the resonator mirror of the laser oscillator, so that the position of plume generation on the target is moved, enabling film formation over a wide range. Consequently, without inserting any special optical element for laser beam scanning, a uniform thin film can be formed over a wide area.

Figure 23:
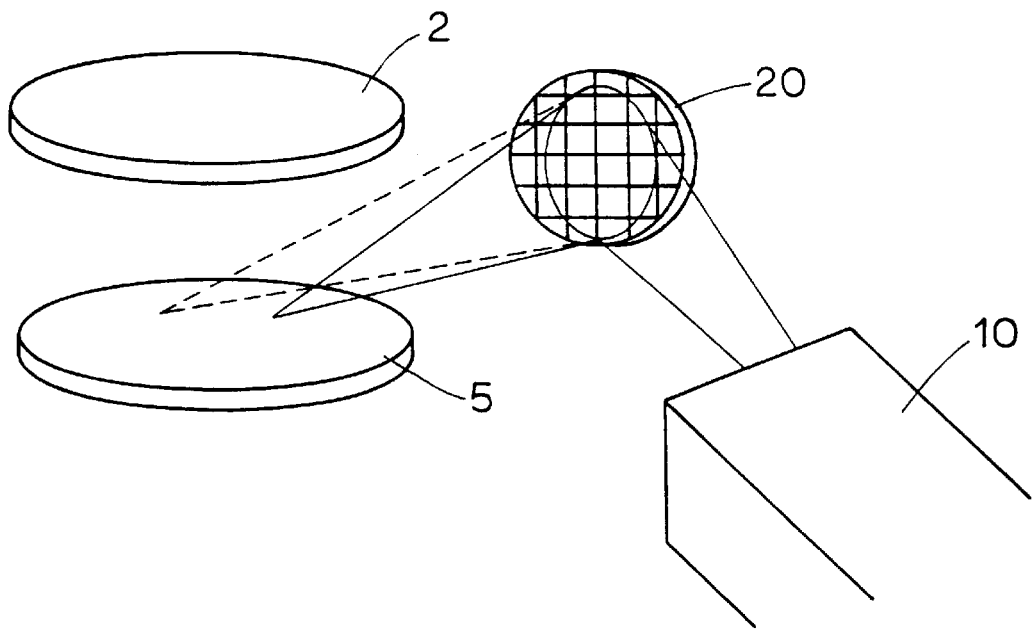
FIG. 23 is a perspective view showing schematic structure of the thin film forming apparatus using laser in accordance with the sixth embodiment of the present invention.

A sixth embodiment of the present invention will be described. FIG. 23 is a schematic diagram showing the structure of the film forming apparatus in accordance with this embodiment of the present invention. Referring to FIG. 23, the apparatus of the present embodiment includes a laser oscillator 10, a divided type adaptive mirror 25, a target 5 and a substrate 2.

Functions of the various portions of the apparatus shown in FIG. 23 are as follows. The beam emitted from the laser oscillator is condensed by the divided type adaptive mirror to be incident on the target. Consequently, a plume is generated on the target, and substances included in the plume are deposited on the substrate to form a thin film.

Figure 24A:
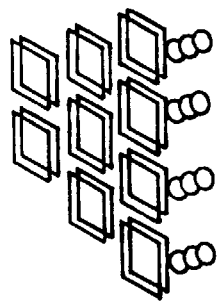
FIGS. 24A and 24B show two examples of divided type adaptive mirror used in the sixth embodiment of the present invention.
Figure 24B:
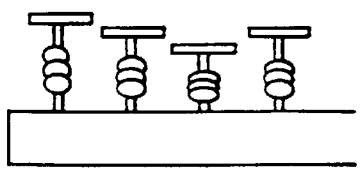

Here, the area on which the film can be formed by one plume is limited. In order to form a film over a wide area, a divided type adaptive mirror including a number of minute mirrors collectively serving as one mirror with the angle and position of each can be precisely controlled, such as shown in FIGS. 24A and 24B, is used. By changing the curvature and angle of the mirror as a whole by controlling each minute mirror, the point of focus of the laser beam is moved on the target so as to change the position of plume generation on the target, enabling film formation over a wide area. Consequently, since laser irradiation point having similar condensed pattern can be formed constantly at any position on the target, plumes having uniform nature can be generated at any position of the target, and therefore a uniform thin film can be formed over a wide area.

Figure 25:
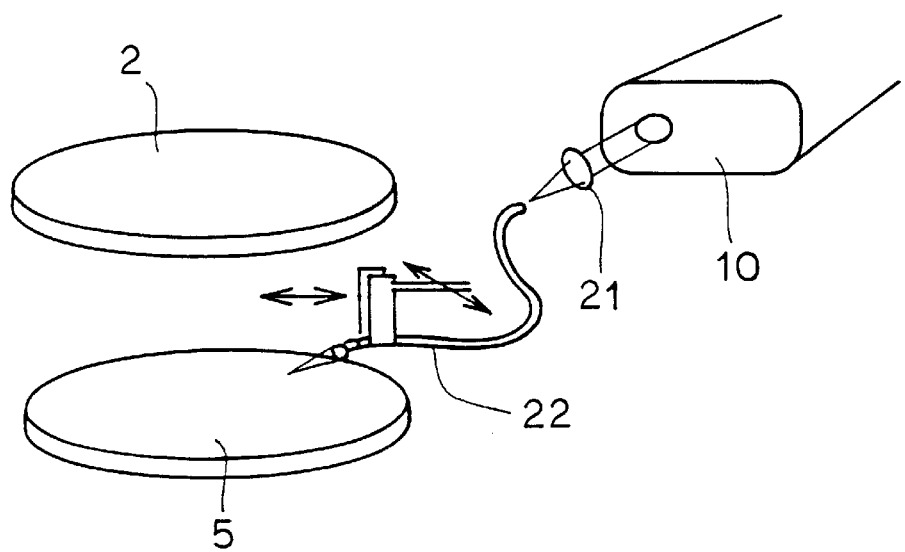
FIG. 25 is a perspective view showing a schematic structure of the thin film forming apparatus using laser in accordance with the seventh embodiment of the present invention.

A seventh embodiment of the present invention will be described. FIG. 25 is a schematic diagram showing a structure of the film forming apparatus in accordance with this embodiment of the present invention. Referring to FIG. 25, the apparatus of this embodiment includes a laser oscillator 10, a lens 21 for directing the laser beam to an optical fiber, an optical fiber 22, a target 5 and a substrate 2.

Functions of various portions of the apparatus shown in FIG. 25 are as follows. The beam emitted from the laser oscillator is guided near the target by using the optical fiber to be incident on the target. Consequently, a plume is generated on the target, and the substances included in the plume are deposited on the substrate to form a thin film.

Here, the area on which the thin film can be formed by one plume is limited. In order to form a film over a wide area, the laser beam emitting point of the optical fiber is moved near the target as shown in the figure so that the target is scanned with the point of focus of the laser beam. Consequently, the position of plume generation is changed on the target, enabling film formation over a wide range. Consequently, the laser beam irradiation point having similar pattern can be formed constantly at any position on the target, a plume having uniform nature can be generated at any position on the target, and therefore a uniform thin film can be formed over a wide area.

Figure 26:
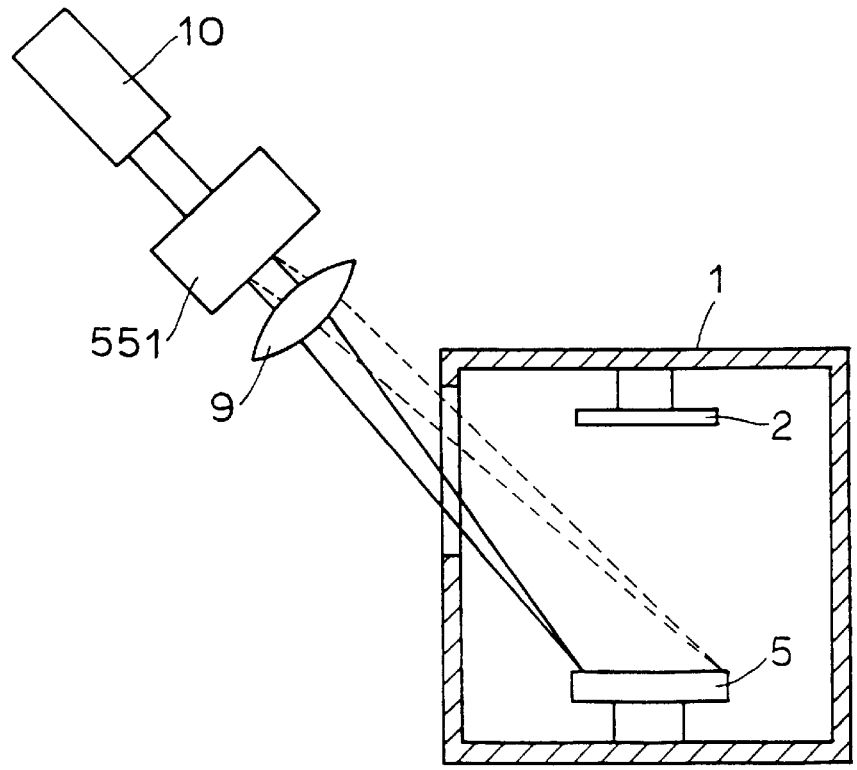
FIG. 26 is a cross section showing schematic structure of the thin forming apparatus using laser in accordance with the eighth embodiment of the present invention.

An eighth embodiment of the present invention will be described with reference to FIG. 26. Referring to FIG. 26, parallel laser beams 16 generated from laser unit 10 has the direction of the beams changed when they passed through laser beam deflection means 511. The laser beam are condensed by-condenser lens 9 to be incident on the raw material target placed on a turntable 11 in the chamber 1.

At this time, since the direction is changed by deflection means 551, different portions of raw material target 5 are sputtered to generate plumes 15. A substrate 2 is placed fixed on a substrate holder 3 opposing to raw material target 5, and excited atoms and ions in the plumes 15 reach the substrate 2 and are deposited thereon, forming a thin film.

The operation will be described. By using laser beam deflection mean 551, it becomes possible to generate plumes from the entire area of the target, and when a target having the same or larger area than the wafer is used, a uniform thin film can be formed over a wide area.

As for the deflection means, a mirror which rotates or vibrates in synchronization with the laser pulse may be used. An electro-optical deflector, or an acoustic optical deflector such as disclosed in *Optical Wave Electronics,* CORONA Publishing Co., Ltd. pp. 278–286 may be used to obtain the similar effect. Further, since these deflectors do not have any movable portions, they are highly reliable, and they allow high speed operation. A hologram scanner may be used as the deflection means.

Focal length of the condenser lens is long, and therefore the sizes of the laser beams focused on the entire surface of the target are approximately the same. However, when a lens having shorter focal length is used, the shape of the laser beam varies, which prevents formation of a uniform thin film, as the energy density of the laser beam varies. In that case, a condenser lens of which focal length can be changed in synchronization with the deflection means may be used to enable formation of a uniform thin film.

As for the condenser lens having variable focal length, an element formed by a liquid crystal having the shape of a lens with electrodes provided may be used. In such an element, refractive index changes due to the electro-optical effect of the liquid crystal when a voltage is applied to the electrodes, so that the focal length of the lens changes. By applying a voltage in synchronization with the deflection means to change the focal length, the entire area of the target can be irradiated with the laser beam having the same energy density.

A deflection condenser element having the function of both deflecting means 551 and condenser lens 9 may be used. As such deflection condenser element, an element including a number of holograms having different directions of deflection and different focal lens arranged in the shape of a rotatable disk, may be used. Various spatial optical modulator may be used to provide the similar effect.

Figure 27:
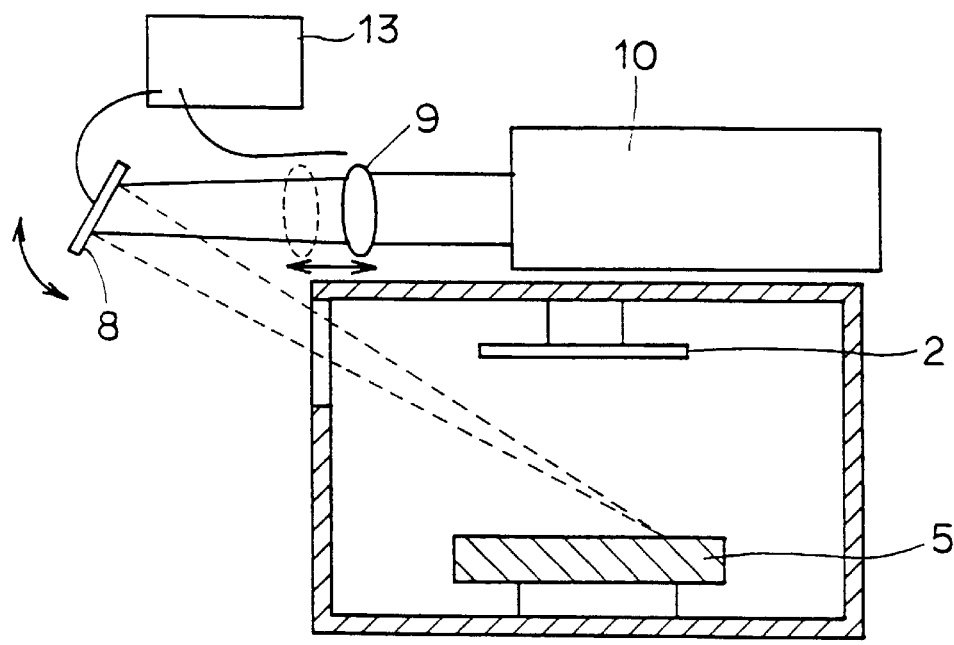
FIG. 27 is a cross section showing schematic structure of the thin film forming apparatus using laser in accordance with the ninth embodiment of the present invention.

A ninth embodiment of the present invention will be described. FIG. 27 is a schematic diagram showing the structure of the film forming apparatus in accordance with this embodiment of the present invention. Referring to FIG. 27, the apparatus of this embodiment includes laser oscillator 10, a condenser lens 9, a laser scanning mirror 8, a target 5, a substrate 2 and a control apparatus 13.

Functions of various portions of the apparatus shown in FIG. 27 are as follows.

The beam emitted from the laser oscillator is condensed by a condenser lens to be incident on the target. Consequently, a plume is generated on the target, and the substances included in the plume are deposited on the substrate to form a thin film. Here, the area on which the film can be formed by one plume is limited. In order to form a film over wide area, a laser scanning mirror is inserted in the optical path of the laser beam so as to move the position of plume generation on the target, enabling film formation over a wide range. However, at the time of laser beam scanning, the optical path length from the condenser lens to the target changes. Consequently, the condensed pattern of the beam on the target changes, causing change in the nature of the generated plume. This prevents formation of a uniform film. Therefore, in relation to the laser beam scanning, the position of the condenser lens is controlled so that the optical path length from the condenser lens to the target is kept constant. Consequently, even if laser beam scanning is carried out, the nature of the plume generated can be kept constant, so that a uniform thin film can be formed over a wide range.

Figure 28:
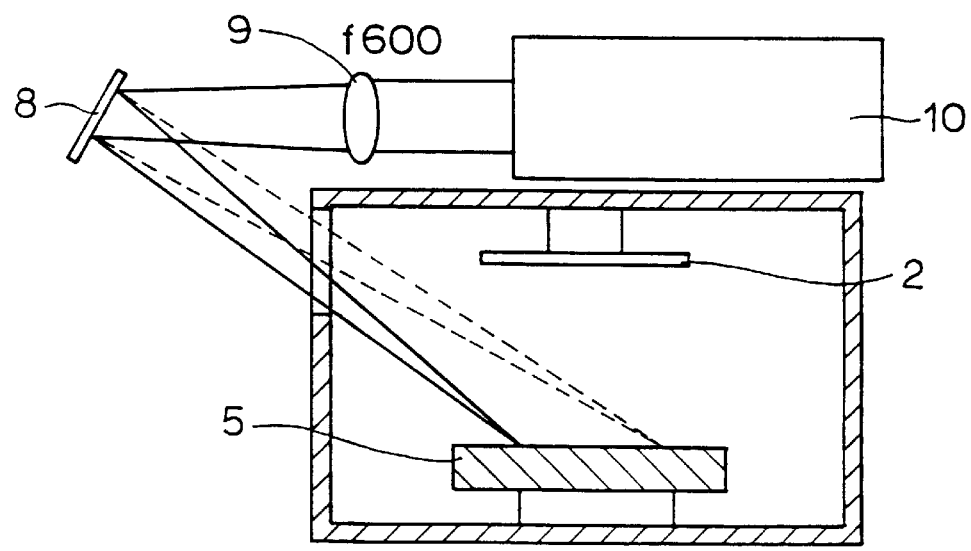
FIG. 28 is a cross section showing a schematic structure of the thin film forming apparatus using laser in accordance with the tenth embodiment of the present invention.

A tenth embodiment of the present invention will be described. FIG. 28 is a schematic diagram showing the structure of the film forming apparatus in accordance with this embodiment of the invention. In this embodiment, the focal length of the condenser lens 9 is set to 600 mm.

Figure 29:
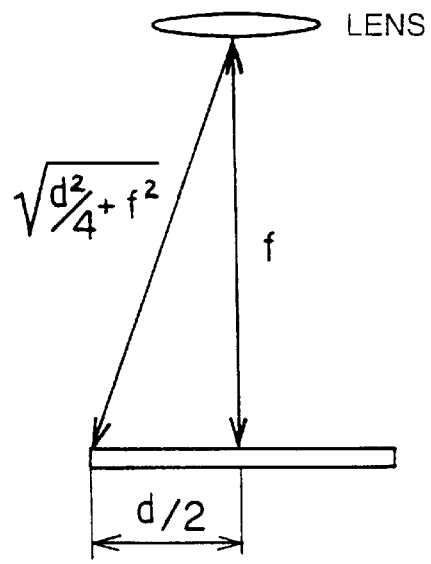
FIG. 29 is an illustration showing change in the optical path length during laser beam scanning.

The functions of various portions of the apparatus shown in FIG. 28 are as follows. The beam emitted from the laser oscillator is condensed by the condenser lens to be incident on the target. Consequently, a plume is generated on the target, and the substances included in the plume are deposited on the substrate, forming a thin film. Here, the area on which a film can be formed by one plume is limited. In order to form a film over a wide area, a mirror for laser beam scanning is inserted in the optical path of the laser beam so as to move the position of plume generation on the target, enabling film formation over a wide area. However, at the time of laser beam scanning, the optical path length from the condenser lens to the target changes, so that the condensed pattern of the beam on the target changes, causing change in the nature of the generated plume. This prevents formation of a uniform film. During the laser beam scanning, the optical path length changes at least by $$\sqrt{\frac{d^2}{4} + f^2} - f$$

where d represents the width of the substrate and f represents the focal length of the condenser lens, as shown in FIG. 29. When the beam diameter is measured near the point of focus when an excimer laser beam having the beam diameter of 10 mm is incident on the lens having the focal length of 600 mm, the diameter is 0.58 mm at the point of focus, while the beam diameter is changed to 0.62 mm at a position shifted by the above described amount of change in the optical path length. The change in the beam diameter is within 10% when a lens having the focal length of 600 mm is used, and therefore the change in the nature of the plume is not significant. Therefore, by setting the focal length of the condenser lens to be at least 600 mm, the nature of the plume generated can be kept constant even when laser beam scanning is carried out, and therefore uniform thin film can be formed over a wide range.

Figure 30:
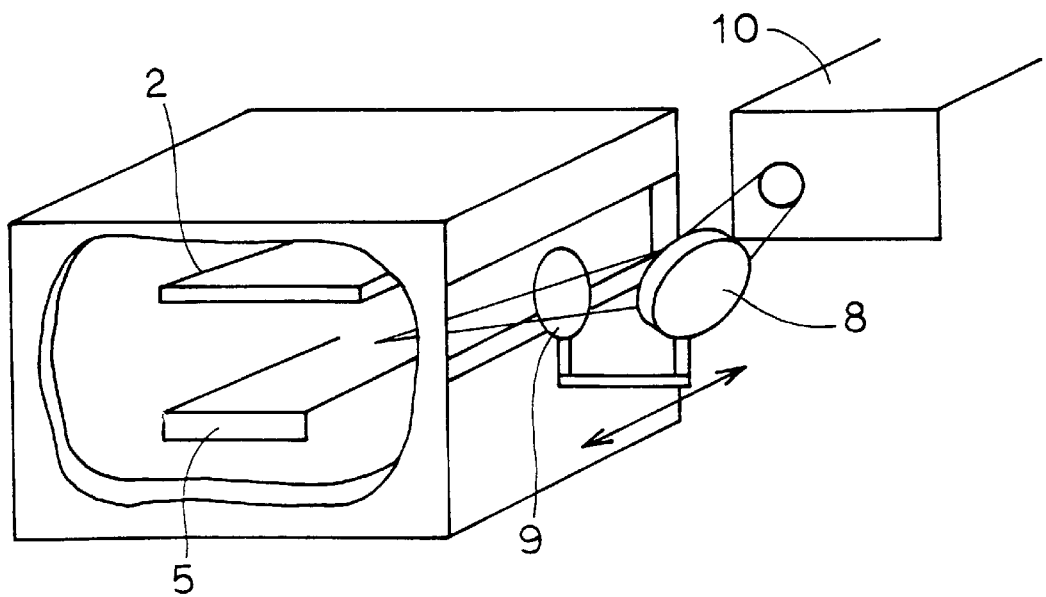
FIG. 30 is a partially exploded perspective view showing a schematic structure of the thin film forming apparatus using laser in accordance with the eleventh embodiment of the present invention.

An eleventh embodiment of the present invention will be described. FIG. 30 is a schematic diagram showing the structure of the film forming apparatus in accordance with this embodiment. Referring to FIG. 30, in this embodiment, the beam emitted from the laser oscillator is condensed by a condenser lens to be incident on the target. Consequently, a plume is generated on the target and the substances included in the plume are deposited on the substrate to form a thin film. Here, the area on which a film can be formed by one plume is limited. In order to form a film over a wide range, a method is known in which a mirror for laser beam scanning is inserted to the optical path of the laser beam to change the direction of the laser beam, so that the position of plume generation is moved on the target, enabling film formation over a wide area. However, at the time of laser beam scanning, the optical path length from the condenser lens to the target changes, causing change in the condensed pattern of the beam on the target. Consequently, the nature of the generated plume is changed, preventing formation of a uniform film. Therefore, in laser beam scanning, the mirror guiding the laser beam to the target and the condenser lens are moved parallel to the substrate so as to scan the plume generating points on the target without changing the distance between the condenser lens to the target. Consequently, even when plume generation points are scanned, the nature of the plumes generated are kept constant, so that a uniform thin film can be formed over a wide area.

Figure 31A:
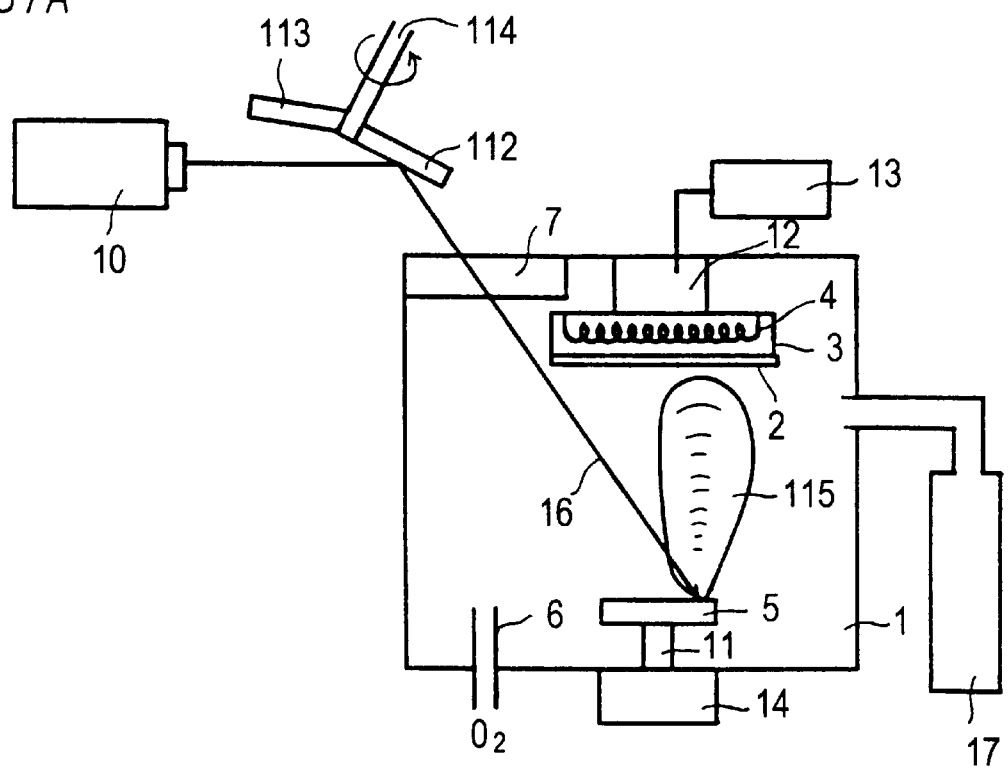
FIG. 31A is a cross sectional view showing schematic structure of the thin film forming apparatus using laser in accordance with the twelfth embodiment of the present invention in which laser beam 16 is reflected by a mirror 112.
Figure 31B:
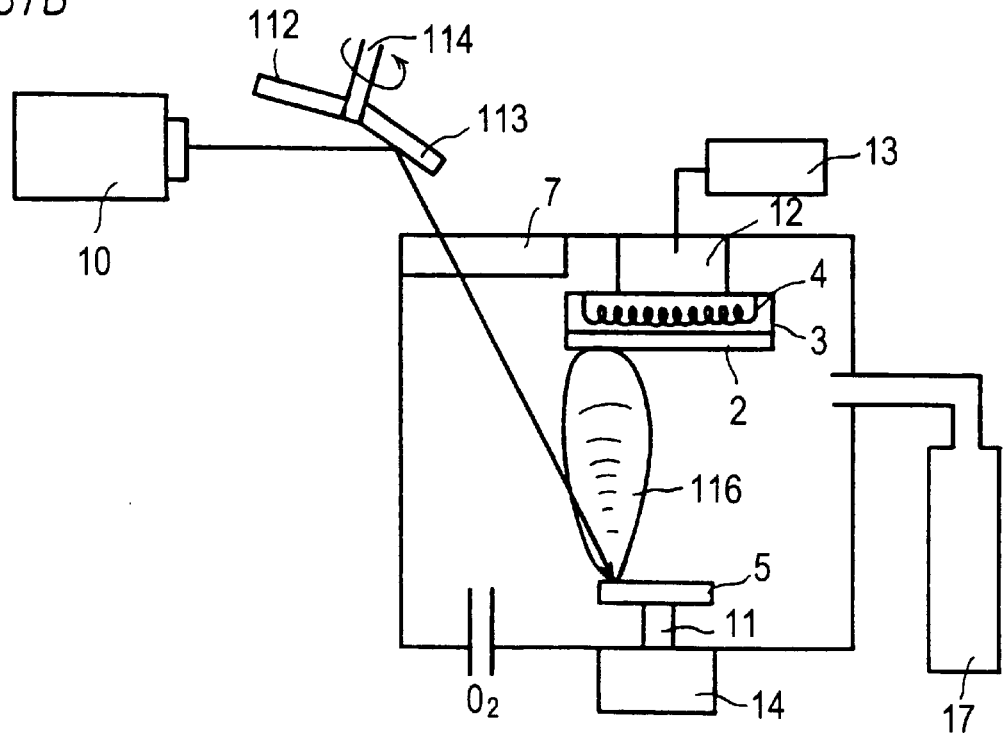
FIG. 31B is a cross section showing the schematic structure of the apparatus when the laser beam 16 is reflected by a mirror 113 having a reflection angle different from that of mirror 112.

A twelfth embodiment of the present invention will be described with reference to FIGS. 31A and 31B. Referring to FIGS. 31A and 31B, the apparatus of this embodiment includes a mirror 112 for directing the laser beam 16 to the raw material target 15, a mirror 113 having different angle of reflection from mirror 112, and a rotation axis 114 for rotating mirrors 112 and 113.

The operation will be described. The process of film formation is the same as in the prior art. In the prior art, laser beam 16 is incident on one point of target 15. In this invention, the laser beam 16 can be directed to different positions of target 5 alternately by mirrors 112 and 113. First, laser beam 16 impinges on the target 5 by means of the mirror 112 so as to generate plume 115, and a thin film is formed on the substrate. Then, the mirrors are rotated by rotation axis 114 and the laser beam 16 is reflected by mirror 113, whereby a plume 116 is generated at a position different from that of plume 115 (FIG. 31B). The thin film formed on the substrate 2 is formed at a position of the substrate where the plume reaches. In the prior art, thin film is formed by only one plume. In this embodiment, thin film is formed by two plumes. Therefore, compared with the prior art, the thin film can be formed over wider area in the present invention. Though two mirrors are employed in this embodiment, three or more mirrors may be used, and the larger the number of mirrors, the wider becomes the area of thin film formation.

A thirteenth embodiment of the present invention will be described with reference to FIGS. 32, 33A and 33B.

The main feature of the embodiment resides in that when a film is to be formed with the portion where the thin film is mainly deposited on the substrate is changed by moving the position of the substrate in the film forming chamber, the speed of movement of the substrate is selected so that the point of contact of the substrate and the central axis of the plume do not overlap any such point of contact in the previous periods, with the movement takes place in one period. Above a position of the target which is irradiated with the laser beam, there is generated a plasma which is a collection of active film forming particles called a plume, and the most efficient reaction occurs near the tip end thereof. In the method of forming a thin film using laser, generally the substrate is moved so that a thin film is deposited over a wide area, so that the position of the substrate which is brought into contact with the plume is changed for thin film deposition. In the method of the present invention, the speed of movement of the substrate is selected such that the intersection with the substrate and the central axis of the plume differs from the point of contact of the preceding periods in the movement of one period.

In a method of forming thin film using laser in which thin film is deposited with the substrate moved, about 30 minutes are necessary to form a film as thick as about 3000 Å. During this period, if the period of the pulse of the laser and the speed of rotation of the substrate are in synchronization, film is formed concentrated on the a specific portion of the substrate, resulting in uneven film thickness distribution. In the method of the present invention, in a period of movement of the substrate, the speed of movement of the substrate is selected in accordance with the frequency of the laser pulse such that the point of contact between the substrate and the central axis of the plume differs from the point of contact in the preceding movement of the substrate, and therefore a thin film having uniform film thickness distribution can be deposited over a wide area. This embodiment will be described in greater detail in the following.

Figure 32:
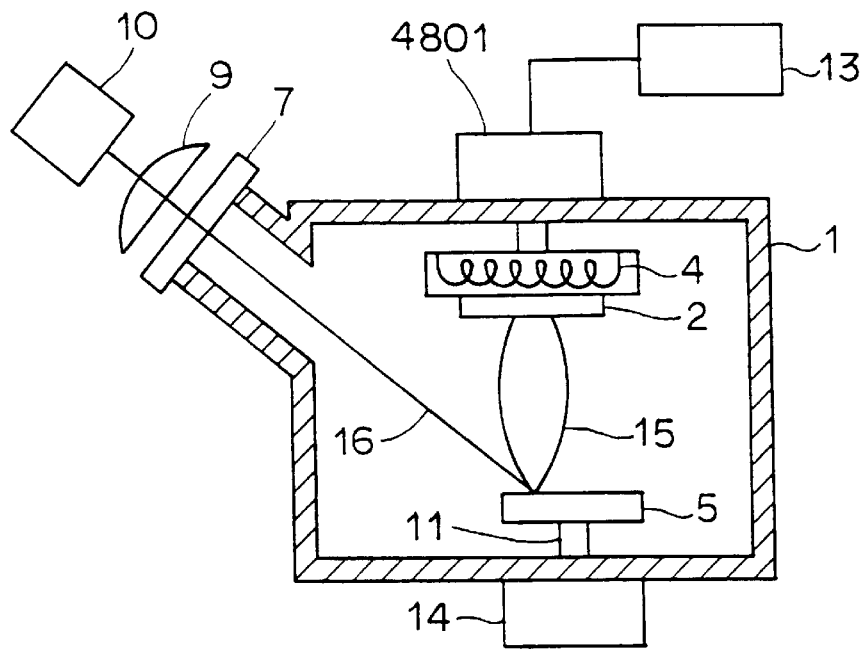
FIG. 32 is a cross sectional view showing schematic structure of the thin film forming apparatus using laser in accordance with the thirteenth embodiment of the present invention.
Figure 33A:
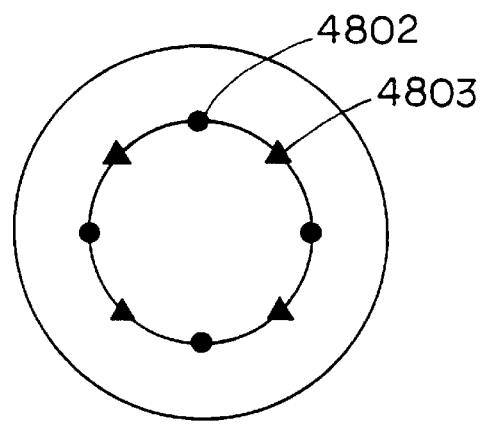
Figure 33B:
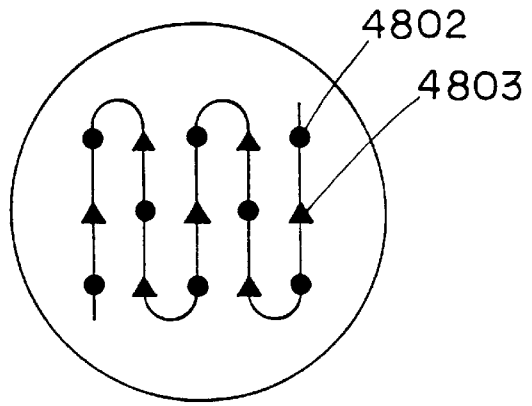

FIG. 32 shows an example of the thin film forming apparatus using laser carrying out the present embodiment. In the thin film forming apparatus using laser shown in FIG. 32, laser beam 16 emitted from laser unit 10 and passed through condenser lens 9 enters an inlet window 7 of chamber 1 to be incident on target 5 which is placed on a turntable 11 in chamber 1. Turntable 11 can be rotated at an arbitrary rate of rotation by means of a motor 14. The inside of the chamber 1 can be evacuated to a high vacuum. A substrate 2 is placed opposing to target 5. In the apparatus of this embodiment, laser unit 10 oscillates the pulse laser beam. When a thin film is to be deposited, substrate 2 rotates at an arbitrary rate by means of a motor 4801. The rate of rotation is set by a control apparatus 13 in accordance with the pulse frequency of the laser beam such that the point of contact with the substrate 2 and the plume 15 at one rotation of the substrate differs from the point of contact of preceding periods, as shown in FIGS. 33A and 33B. FIGS. 33A and 33B show loci of the points of contact between the central axis of plume 15 and the surface of substrate 2. In each of the figures, point of contact 4802 and point of contact 4803 are loci of contacts in different periods.

By using the thin film forming apparatus using laser described above, a $Y_1Ba_2Cu_3O_{7-x}$ oxide superconductive thin film was fabricated in accordance with this embodiment. An $SrTiO_3$ single crystal substrate was used as substrate 2, and the substrate temperature was set to 700° C. A sintered body of $Y_1Ba_2Cu_3O_{7-x}$ having the diameter of 2 cm was used as target 5. The distance between substrate 2 and the target 5 was set to 5 cm. The inside of chamber 1 was evacuated to $1 \times 10^{-4}$ Torr, and then oxygen gas was introduced to 200 m Torr.

An excimer laser having the wavelength of 193 nm was used as the laser, the laser output was set to 3 J/cm$^2$, the area of laser beam irradiation was 2×3.5 mm$^2$, and the pulse frequency was 2 Hz. The target was rotated at 120 rpm.

Film formation was carried out for 25 minutes, and the film thickness distribution and the superconductive characteristics of the obtained oxide superconductive thin film were measured. As a result, the variation in film thickness distribution of the oxide superconductive thin film fabricated in accordance with the method of the present invention was ±5% in a circle having the diameter of 30 mm. The variation in film thickness distribution of a film formed under the same condition except that the speed of rotation of the substrate was synchronized with the frequency of the pulse laser was ±10% within the circle having the diameter of 30 mm. The critical temperature of the oxide superconductive thin film fabricated in accordance with the method of the present invention was 87K, and the average film thickness was about 3000 Å.

The substrate 2 in FIG. 32 can be scanned by using an XY stage provided in place of the motor 4801. In this case, also, the speed of scanning is selected such that the point of contact of the plume 15 and the substrate 2 differs from the point of contact in the preceding periods.

The variation in film thickness distribution of an oxide superconductive thin film formed by deposition under the same condition as described above by using a XY stage for scanning was ±5% within the area of 30×30 mm$^2$. The variation in the film thickness distribution of a film formed under the same condition except that the speed of scanning of the substrate was synchronized with the frequency of the pulse laser was ±10% within the area of 30×30 mm$^2$, the critical temperature of the oxide superconductive thin film fabricated in accordance with the method of the present invention was 87K, and the average film thickness was about 3000 Å.

Figure 34A:
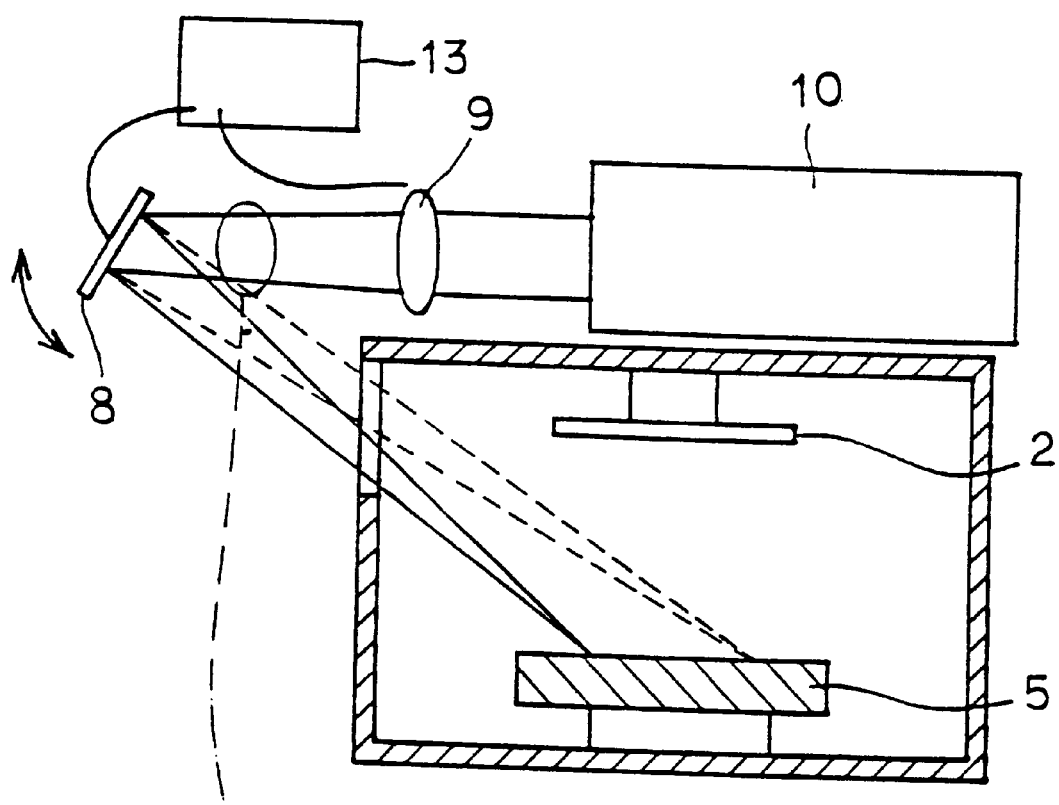
FIG. 34 is a cross sectional view showing a schematic structure of the thin film forming apparatus using laser in accordance with the fourteenth embodiment of the present invention.
Figure 34B:
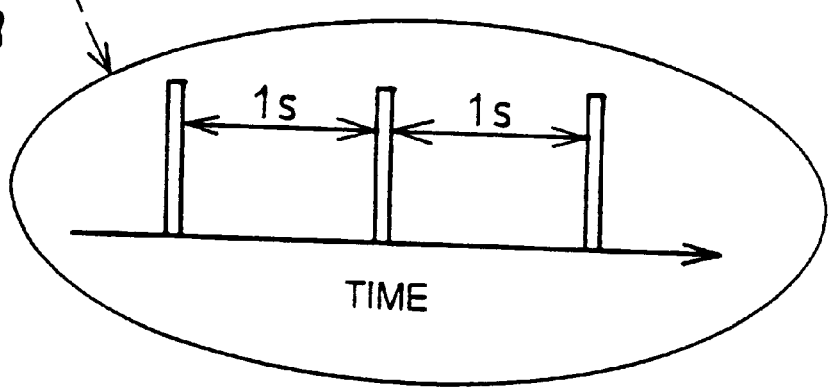

A fourteenth embodiment of the present invention will be described. FIG. 34 is a schematic diagram showing a structure of a film forming apparatus in accordance with the embodiment of the present invention. Referring to FIG. 34, in this embodiment, the beam emitted from the laser oscillator is condensed by the condenser lens to be incident on the target. Accordingly, a plume is generated on the target, and the substances included in the plume are deposited on the substrate to form a thin film. Here, the area and thickness of a film which can be formed by one plume are limited. Therefore, in order to form a film over a wide area with sufficient thickness, the laser beam is emitted repeatedly in a prescribed period, so that compositions of the thin film are successively deposited on the substrate. At this time, if the interval between the pulses is too short, new substances are deposited by the succeeding pulse before the substances deposited by the preceding pulse are crystallized, preventing formation of a uniform film. Generally, since it takes about 1 second for the crystal to grow. Therefore, when the laser pulses are repeated at 1 Hz, the substances deposited by the preceding pulse are crystallized sufficiently, and a uniform thin film can be generated.

Figure 35:
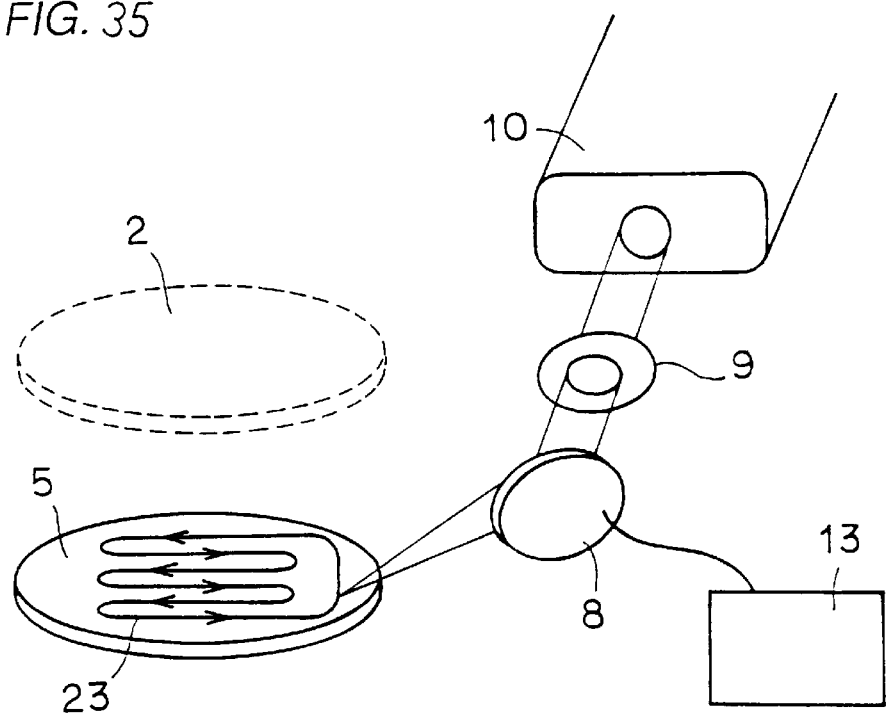
FIG. 35 is a perspective view showing a schematic structure of the thin film forming apparatus using laser in accordance with the fifteenth embodiment of the present invention.

A fifteenth embodiment of the present invention will be described. FIG. 35 is a schematic diagram showing the structure of the film forming apparatus in accordance with this embodiment of the present invention. In this embodiment, a path scanning the point of irradiation circulates once in one second and returns to the original position.

Function of various portions of the apparatus shown in FIG. 35 are as follows. The beam emitted from the laser oscillator is condensed by the condenser lens to be incident on the target. Consequently, a plume is generated on the target, and the substances included in the plume are deposited on the substrate to form a thin film. Here, the area and thickness of the film which can be formed by one plume are limited, and therefore in order to form a film over a wide area with sufficient thickness, the position of plume generation is moved on the target so as to enable formation of the film over a wide area. At this time, if the period of scanning is too short, new substances are deposited by the succeeding pulse before the substances deposited by the preceding pulse are crystallized, when the plume is generated again at the original position after one period of scanning. This prevents formation of a uniform film. Generally, it takes about 1 second for the crystal to grow. Therefore, when scanning is carried out with the period of at least 1 second, the substances deposited by the preceding pulse are sufficiently crystallized, enabling generation of a uniform thin film.

Figure 36:
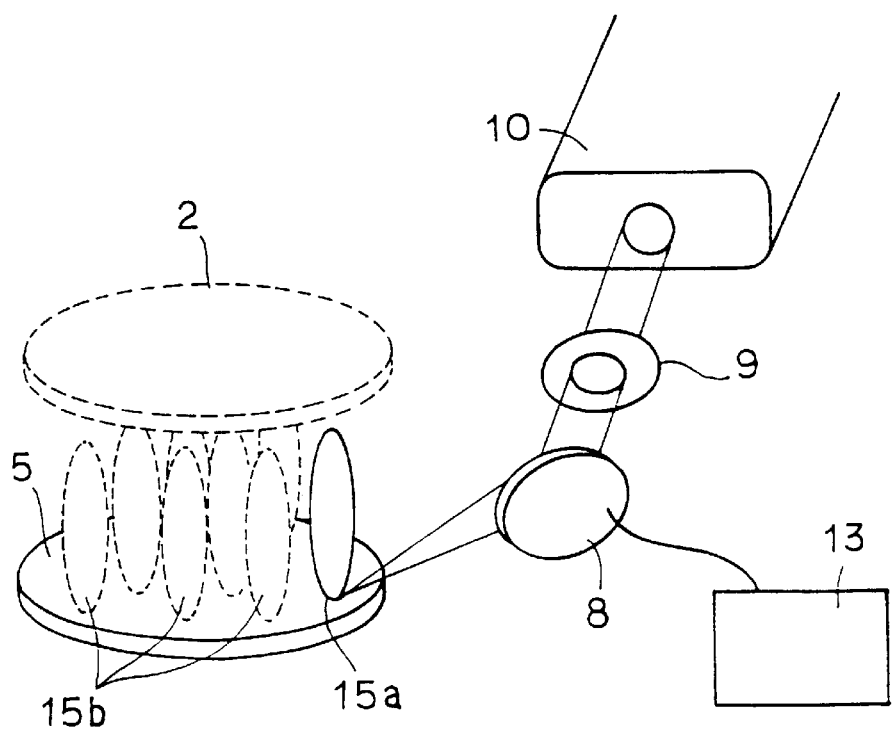
FIG. 36 is a perspective view showing schematic structure of the thin film forming apparatus using laser in accordance with the sixteenth embodiment of the present invention.

A sixteenth embodiment of the present invention will be described. FIG. 36 is a schematic diagram showing a structure of the film forming apparatus in accordance with the embodiment of the present invention. Referring to FIG. 36, the apparatus includes a laser oscillator 10, a condenser lens 9, a mirror for laser scanning 8, a target 5, a substrate 2 and a control apparatus 13. 15*a* denotes a newly generated plume, and 15*b* denotes a plume which has been generated within the last 1 second.

Functions of various portions of the apparatus shown in FIG. 36 are as follows. The beam emitted rom the laser oscillator is condensed by the condenser lens to be incident on the target. Consequently, a plume is generated on the target, and substances included in the plume are deposited on the substrate forming a thin film.

Now, the area and the thickness of a film which can be formed by one plume is limited. Therefore, in order to form a film over a wide area with sufficient film thickness, the position of plume generation is moved on the target, enabling film formation over a wide area. At this time, when the newly generated plume is overlapped with the plume generated immediately before, substances are newly deposited by the succeeding pulse before the substance deposited by the preceding pulse are crystallized, which prevents formation of a uniform film. Generally, since it takes about 1 second for a crystal to grow, when the point of plume generation is moved to such a point that the plume generated on the target is not overlapped with the plume which has been generated within last 1 second, the substances deposited by the preceding pulse can be crystallized sufficiently, allowing generation of a uniform thin film.

Figure 37:
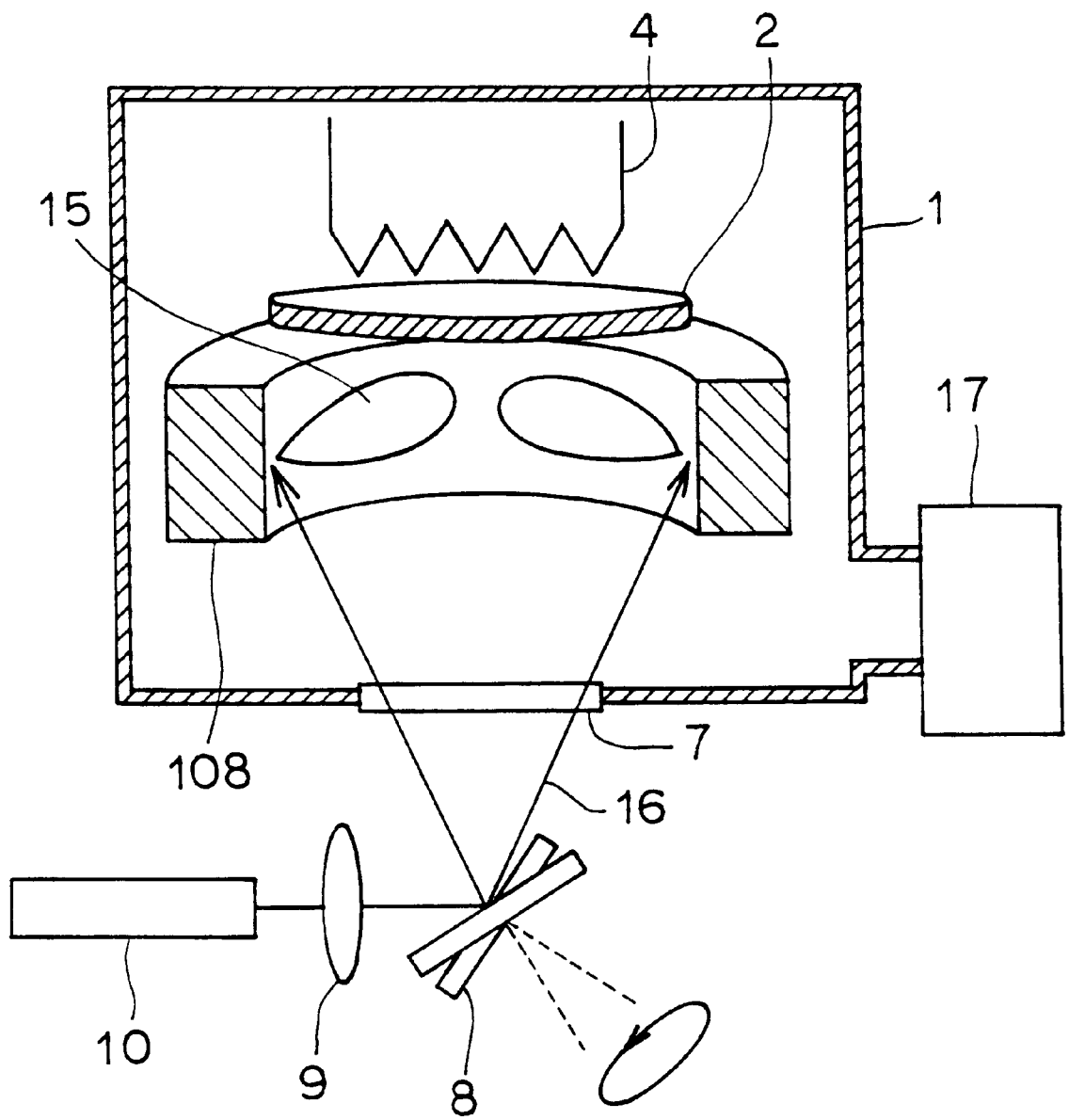
FIG. 37 is a cross section showing a schematic structure of the thin film forming apparatus using laser in accordance with the seventeenth embodiment of the present invention.

A seventeenth embodiment of the present invention will be described with reference to FIG. 37. Referring to FIG. 37, in this embodiment, a substrate 2 is placed at an opening of a raw material target 108 which has a cylindrical shape. Substrate 2 is heated by a heater 4. The laser beam 16 emitted from laser unit 10 is condensed by condenser lens 9. By continuously changing the relative angle between mirror 8 and laser beam 16, inner circumference of the raw material target 108 is irradiated through an inlet window 7. At the portion of the raw material target 108 which is irradiated with laser, plasma is generated abruptly forming a plume 15. At this time, the plumes are generated continuously on the inner periphery of the raw material target 108. Consequently, the distribution of the thin film on the substrate 2 is improved, allowing formation of the film over a wide area. Substrate 2 may be placed on either side of the opening of the target 8, and substrates may be placed on both sides.

Figure 38:
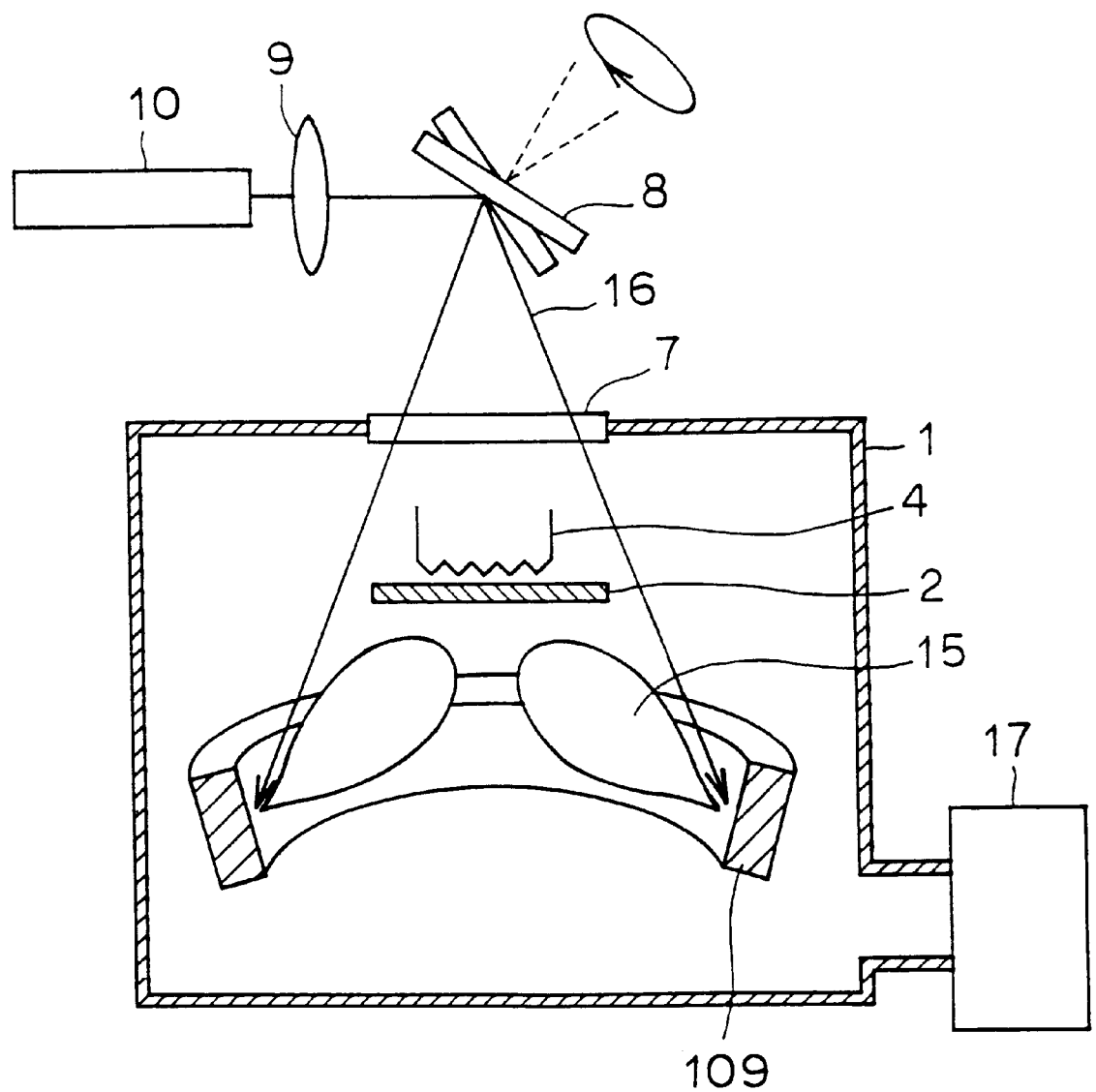
FIG. 38 is a cross sectional view showing a schematic structure of the thin film forming apparatus using laser in accordance with the eighteenth embodiment of the present invention.

An eighteenth embodiment of the present invention will be described with reference to FIG. 38. Referring to FIG. 38, in this embodiment, a raw material target 109 having a conical shaped with one portion cut away is placed such that the surface thereof faces the substrate 2. Substrate 2 is heated by heater 4. The laser beam 16 emitted from laser 10 is condensed by condenser lens 9. By continuously changing the relative angle between mirror 8 and laser beam 16, the circumferential surface of raw material target 109 is irradiated through inlet window 7. At the portion of raw material target 109 irradiated with the laser, a plasma is generated abruptly, forming a plume. At this time, plumes 15 are continuously generated on the circumference of raw material target 109. Therefore, particles emitted to the space by the laser beam 16 from entire circumferential directions of raw material target 109 reach the substrate 2 and are deposited thereon. Consequently, distribution of the thin film on the substrate 2 is improved, allowing formation of a thin film over a wide area. At this time, by changing the relative angle and distance between substrate 2 and raw material target 109, the distribution of the thin film deposited on the substrate 2 can be changed.

Figure 39:
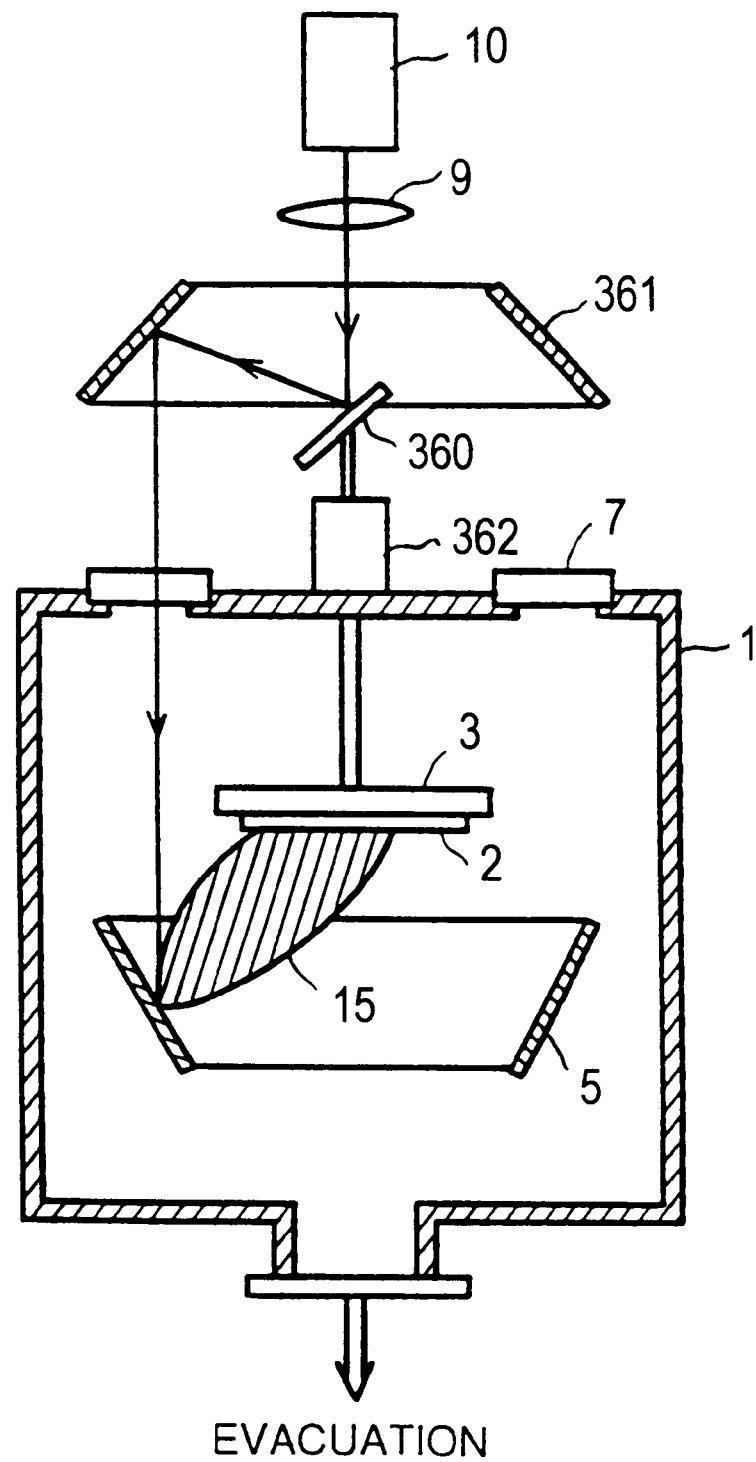
FIG. 39 is a cross sectional view showing a schematic structure of the thin film forming apparatus using laser in accordance with the nineteenth embodiment of the present invention.

A nineteenth embodiment of the present invention will be described with reference to FIG. 39. Referring to FIG. 39, the apparatus of the present embodiment includes a laser unit 10, a lens 9 for condensing the laser beam from laser unit 10 onto a target surface, a vacuum chamber 1, a substrate 2, a substrate holder 3, a target 5 of a truncated conical shape, an optical transmission window 7 having the shape of a dish or a doughnut, a rotary flat mirror 360, a mirror 361 having the truncated conical shape and a rotary driving apparatus 362.

The operation will be described. The laser beam emitted from laser unit 10 is condensed by lens 9 to be incident on a target 5 so that sufficient optical density can be obtained. The laser beam transmitted through lens 9 is reflected by a rotary flat mirror 360 which is rotated maintained at a prescribed angle of inclination with respect to the laser beam, by a rotary driving apparatus 362, and the beam is further reflected by the truncated conical mirror 361 placed opposing thereto, passes through the transmission window 7 at the upper portion of chamber 1 to be incident on the target. By the high density laser beam incident on the target, a plasma is generated abruptly. In the process of rapid cooling of the plasma, isolated excited atoms and ions are generated.

These excited atoms and ions have the lives of several microseconds, generating a plume 15 which is like a flame. Meanwhile, a substrate 2 is placed fixed on a substrate holder 3, opposing to the target 5. The excited atoms and ions in plume 15 reach the substrate 2, and are deposited thereon to form a thin film.

The thickness of the thin film deposited on the surface of the substrate 2 is distributed with the center being at the axis of the plume 15, and therefore at this state, uniform film thickness cannot be obtained.

Here, the rotary flat mirror 360 is driven to rotate. Therefore the path of the laser beam rotates and sweeps the concentrical circumference of the target 5, and the position of generation of the plume 15 moves in rotation on the target 5. Therefore, the point of contact between the central axis of plume 15 and the substrate 2 moves in rotation on substrate 2. Since the point of contact between the plume 15 and the substrate 2 is moved, the film thickness of the deposited film can be made uniform, and thus a thin film having uniform thickness can be formed. Further, in order to cope with a substrate having large area, a mechanism for automatically changing the angle of the rotary flat mirror 360 may be provided, so that the portion of the laser beam incident on the target 5 can be enlarged to a plane.

As shown in this embodiment, all driving mechanisms for sweeping the laser beam are positioned outside of the vacuum chamber 1, so as to facilitate maintenance thereof.

A twentieth embodiment of the present invention will be described with reference to FIGS. 40 to 42B.

Figure 40:
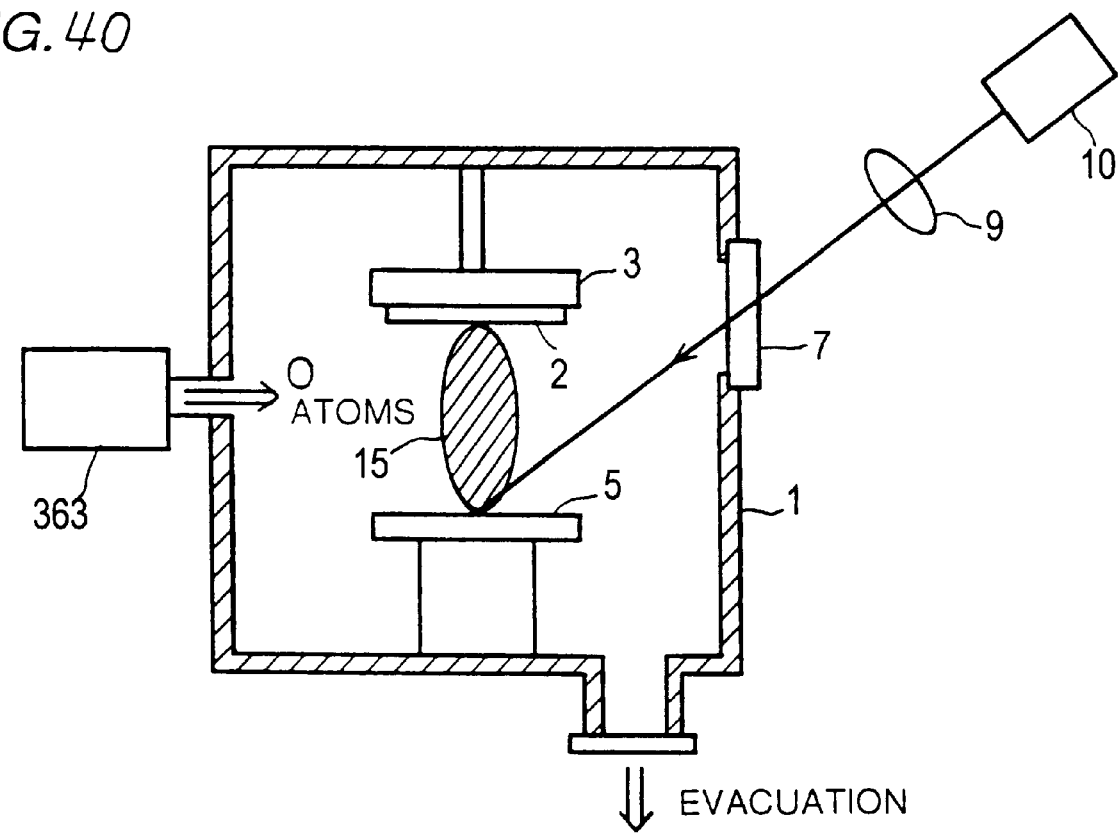
FIG. 40 is a cross sectional view showing a schematic structure of the thin film forming apparatus using laser in accordance with the twentieth embodiment of the present invention.
Figure 41A:
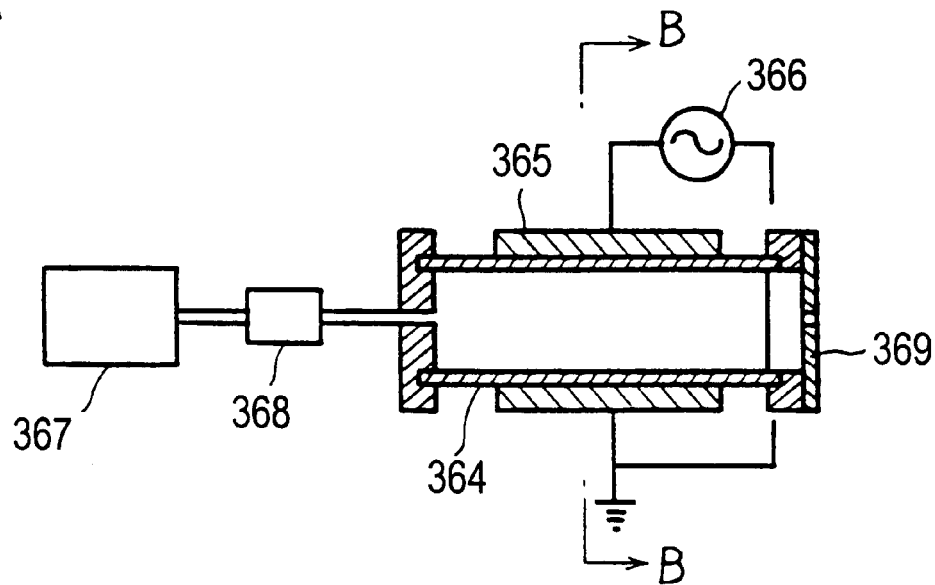
FIG. 41A is a cross sectional view showing one example of a silent discharge apparatus used in the twentieth embodiment of the present invention.
Figure 41B:
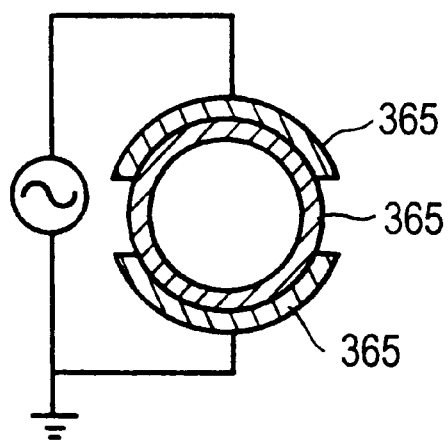
FIG. 41B is a cross section taken along the line B—B of FIG. 41A.

Referring to FIG. 40, the apparatus of this embodiment includes a laser unit 10, a lens 9 for condensing laser beam from laser unit 10 to the surface of a target, a vacuum chamber 1, a substrate 2, a substrate holder 3, a target 5, an optical transmission window 7, and a silent discharge apparatus 363. FIGS. 41A, 41B and FIGS. 42A and 42B show details of the silent discharge apparatus, which apparatus includes a dielectric cylinder 364 formed of quartz, ceramic or the like, an electrode 365 in contact with the outer portion of the dielectric cylinder, a high frequency power source 366, an oxygen gas cylinder 367, a gas flow rate adjusting valve 368 and an orifice 369.

The operation will be described. The laser beam emitted from laser unit 10 is condensed by lens 9 and focused on a target 5 so as to provide necessary light intensity. The laser beam passed through the lens 9 passes through transmission window 7 of the chamber 1 to be incident on target 5. By the high density laser beam incident on the target, a plasma is generated abruptly, and during the process of cooling the plasma rapidly, isolated excited atoms and ions are generated. These excited atoms and ions have the lives of several microseconds, forming a plume 15 which is like a flame. Meanwhile, a substrate 2 is placed fixed on a substrate holder 3, opposing to target 5. Excited atoms and ions in plume 15 reach the substrate 2, and are deposited thereon to form a thin film.

Meanwhile, the oxygen gas supplied from oxygen gas cylinder 367 is set to an arbitrary flow rate by gas flow rate adjusting valve 368, so that a prescribed amount of oxygen gas is introduced to silent discharge apparatus 363. The side opposing to the gas inlet of the silent discharge apparatus 363 is connected to chamber 1 by means of an orifice 369, and by the function of orifice 369, the inside of silent discharge apparatus 363 is kept at a pressure in the range from 0.1 to 50 Torr. Silent discharge apparatus 363 includes a dielectric cylinder 364 and a pair of electrodes 365. A high voltage high frequency potential in the range of from 60 to 10 kHz is applied from high frequency power supply 366, so that silent discharge occurs, and the supplied oxygen gas is excited to oxygen ions and oxygen atoms. However, if the gas pressure is in the range of 0.1 to 50 Torr, the life of the oxygen ions is short, so that most of the generated oxygen ions are eliminated, and the oxygen atoms are introduced to the chamber 3 through orifice 369 as the primary component of the excitation seeds. The oxygen atoms introduced in this manner oxidize the excited atoms and ions in plume 15 and, at the same time, oxidize the elements constituting the thin film deposited on the substrate 2, so that an oxide thin film is formed.

In this case, the excitation seeds for oxidation are mainly oxygen atoms, so that accumulation of charges on the surface and impact of high speed ions on the substrate surface can be avoided, and therefore the substrate is not damaged.

Figure 42A:
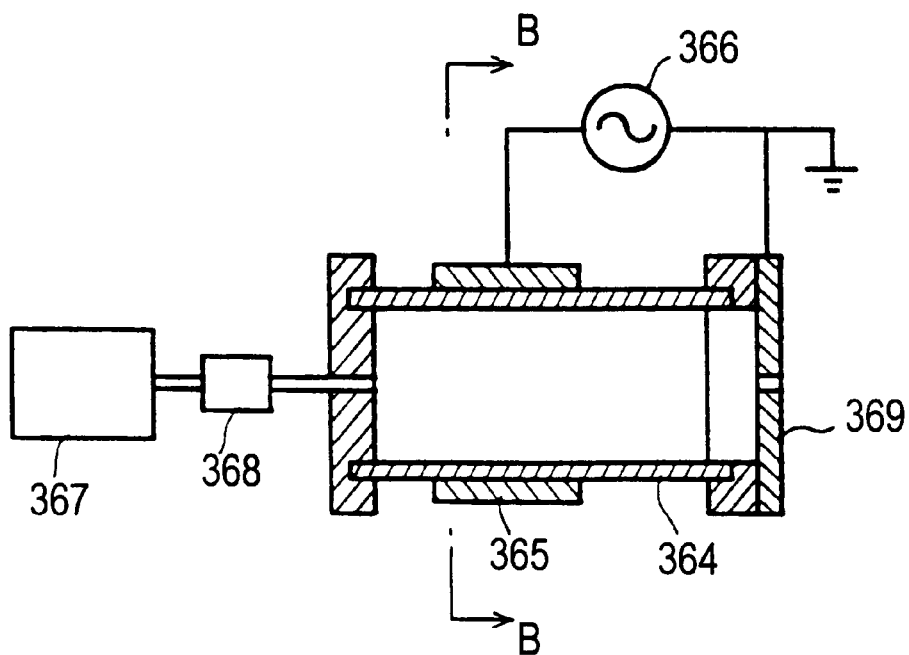
FIG. 42A is a cross sectional view showing another example of the silent discharge apparatus used in the twentieth embodiment of the present invention.
Figure 42B:
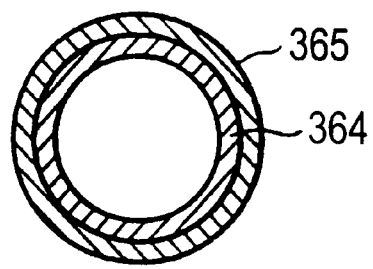
FIG. 42B is a cross section taken along the line B—B of FIG. 42A.

As for the structure of silent discharge apparatus 363, one electrode 365 may be provided outside the dielectric cylinder 364 to apply a high voltage high frequency potential, and the orifice 369 or chamber 1 may be used as the ground electrode as shown in FIGS. 42A and 42B to obtain similar effect.

Figure 43:
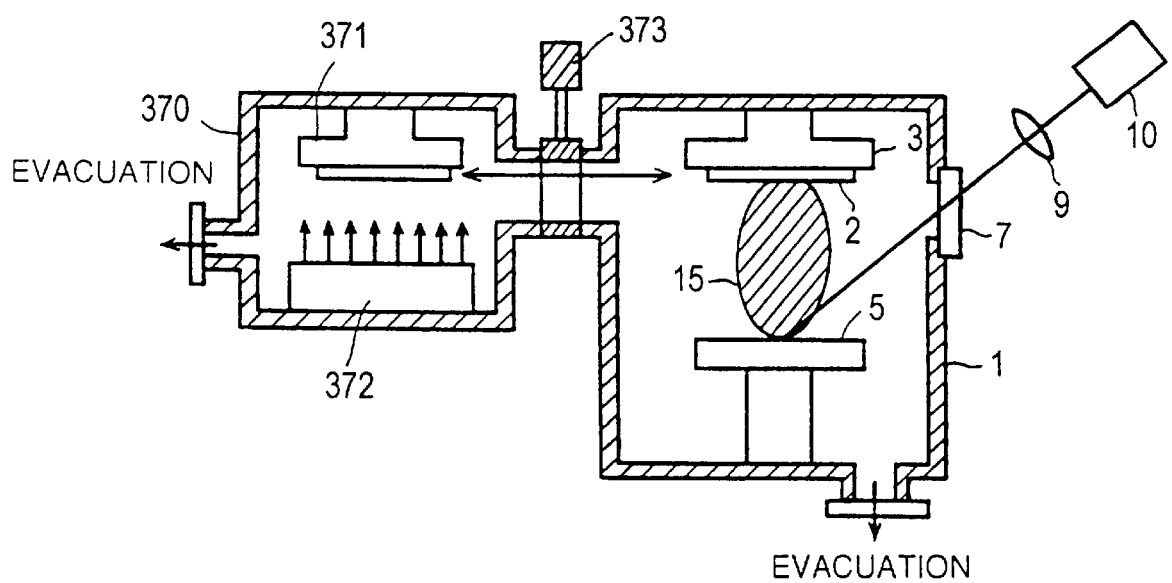
FIG. 43 is a cross sectional view showing a schematic structure of the thin film forming apparatus using laser in accordance with the twenty-first embodiment of the present invention.

A twenty-first embodiment of the present invention will be described with reference to FIG. 43. Referring to FIG. 43, the apparatus of this embodiment includes, on the side of a vacuum chamber 1, a pre-processing chamber 370, a substrate holder 371, a ultraviolet irradiating apparatus 372 and a vacuum shut valve 373. Vacuum chamber 3 and pre-processing chamber 370 are connected with each other with the vacuum shut valve 373 posed therebetween.

The operation will be described. The laser beam emitted from laser unit 10 is condensed by dense 9 and focused on target 5 so that necessary light intensity is obtained. The laser beam passes through lens 9 passes through the transmission window 7 of chamber 1 to be incident on target 5. By the high density laser beam incident on the target 5, a plasma is generated abruptly, and in the process of cooling the plasma rapidly, isolated excited atoms and ions are generated. These excited atoms and ions have lives of several microseconds, generating a plume 15 which is like a flame. Meanwhile, a substrate 2 is placed fixed on substrate holder 3, opposing to target 5. Excited atoms and ions in plume 15 reach the substrate 2 and are deposited thereon, to form a thin film.

The substrate 2 used for forming the thin film is pre-processed in the following manner. A substrate 4 subjected to etching for a short period of time by using hydrofluoric acid is washed by water, dried, and then placed on a substrate holder 371 in pre-processing chamber 370. Then, it is subjected to radiation of ultraviolet ray by ultraviolet irradiating apparatus 372 under vacuum. The substrate which has been subjected to ultraviolet radiation is fed to vacuum chamber 1 through vacuum shut valve 373.

The silicon substrate which has been pre-processed by hydrofluoric acid has its natural oxide which has been formed on the surface thereof removed, and because of the coupling between silicon atoms on the substrate surface and the fluorine in the processing solvent, the surface becomes very stable, so that an oxide film is not easily formed even if it is exposed to the atmosphere. However, since fluorine has been coupled to the surface, proper characteristics of the thin film cannot be obtained when a thin film is formed thereof. Therefore, it is necessary to remove fluorine. Though fluorine which has been coupled with silicon can be disconnected and removed when it is irradiated with ultraviolet ray under vacuum, it is readily oxidized when it is exposed to oxygen. If the substrate can be conveyed under vacuum to a chamber for thin film formation without exposing to the atmosphere, thin film can be formed on a clear surface.

A mercury lamp, a metal halide lamp or laser apparatus may be used as the ultraviolet ray generating apparatus, provided that light having the wavelength in the range of ultraviolet ray can be obtained, to provide similar effect.

Figure 44:
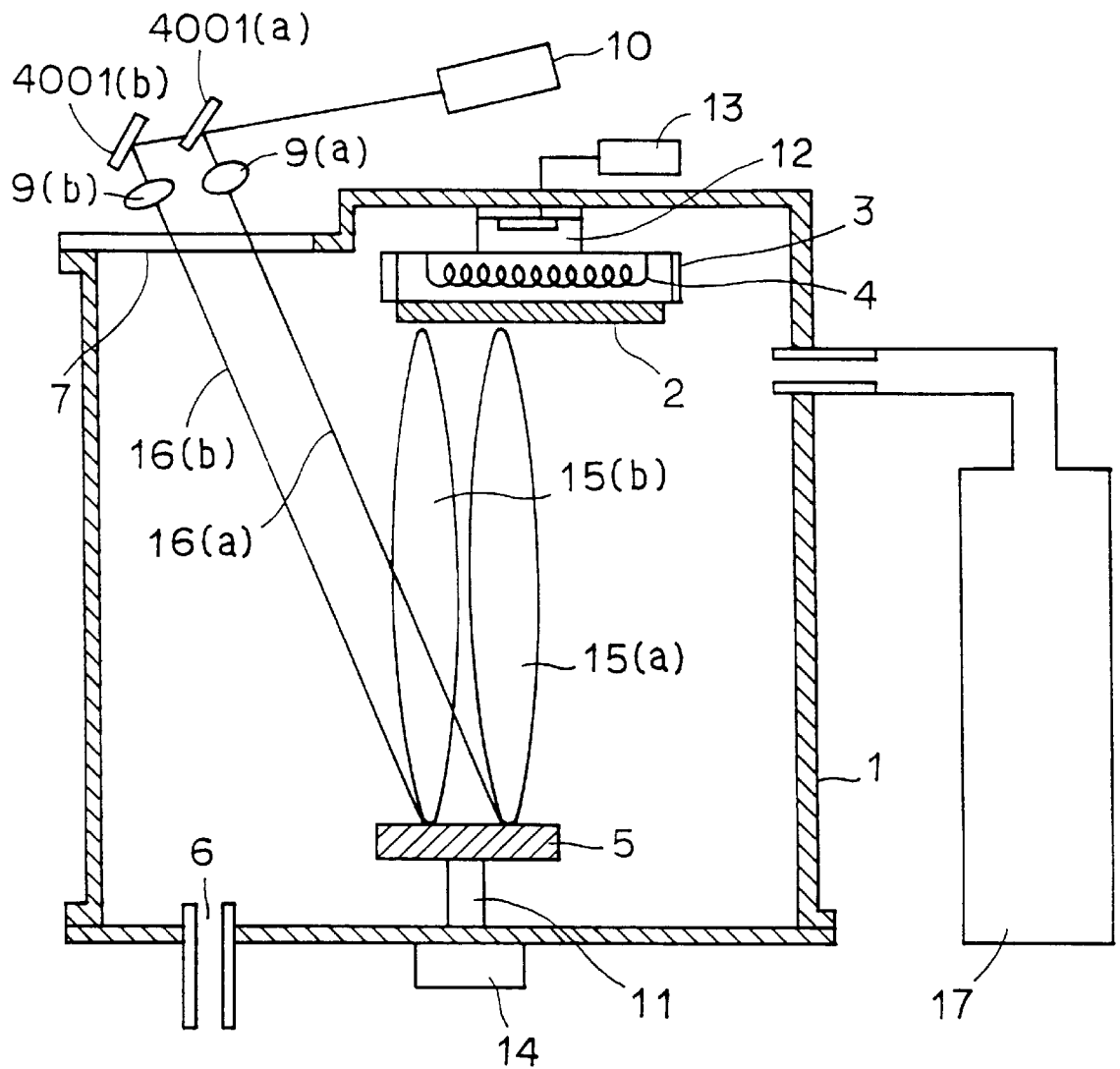
FIG. 44 is a cross sectional view showing a schematic structure of the thin film forming apparatus using laser in accordance with the twenty-second embodiment of the present invention.

Twenty-second embodiment of the present embodiment of the present embodiment will be described with reference to FIG. 44. Referring to FIG. 44, the apparatus of this embodiment includes a half mirror 4001*a* transmitting 50% of laser beam 16, a mirror 4001*b* totally reflecting laser beam 16, and lenses 9*a* and 9*b* for condensing laser beams 16*a* and 16*b*.

The operation will be described. The laser beam 16 emitted from laser unit 10 is partially reflected by half mirror 4001*a* to be laser beam 16*a*, while the remaining part is transmitted as it is. The transmitted light is reflected by mirror 4001*b* to be laser beam 16*b*. The laser beams are condensed on target 5 by corresponding lenses 9*a* and 9*b*. Consequently, two plumes 15*a* and 15*b* are generated parallel to each other. Consequently, on substrate 2, thin films are formed in parallel at areas corresponding to these two plumes.

The effect of this beam division is proved from the following fact. When laser beam 16 is condensed on the target 5 by lens 9, there is an optimal value of the intensity of laser beam at the condense surface per unit area, as described, for example, in G. M. Davis and M. C. Gower, Appl. Phys. Lett., Vol. 55, No. 2, pp. 112–114 Jul. 10, 1989. More specifically, sputtering does not occur and thin film is not formed until the intensity exceeds a certain threshold value. However, if the intensity becomes too strong, sputtered substances in the form of clusters are generated, and these substances are deposited as the thin film, which significantly degrades the quality of the thin film. From this fact, it is impossible to increase the rate of sputtering by increasing the laser beam intensity per unit area to increase the area of thin film formation stepwise.

Meanwhile, forming a thin film over a wide area by increasing the intensity of laser beam 16 and enlarging the cross section of the beam so that the area of laser beam irradiation is enlarged while maintaining the optimal laser intensity per unit area is impossible either, as described in, for example, R. K. Singh et al., Physical Review B, Vol. 41, No. 13, pp. 8843–8859 May 1, 1990.

In accordance with the description in this article, the higher the density of the generated plume becomes, the plume itself extends wider, and therefore even if the area of irradiation is enlarged to no purpose, it is apparent that a plume having larger cross section is not generated.

In view of these facts, in the present invention, a plurality of irradiation spots are provided by dividing the beam into a plurality of beam, rather than enlarging the cross section of the laser beam 16, to form a thin film having superior quality over large area rapidly at highest efficiency.

Though the beam is divided into two in the description of this embodiment, it is not limited thereto, and the beam may be divided into plural beams.

Therefore, reflectance (or transmittance) of the mirror used is not limited to the values of the embodiment above. When the nature or thickness of the thin film is to be controlled at various portions on the substrate, reflectance (or transmittance) of each of the mirrors for dividing the beam into a plurality beams may be positively changed, so as to generate plumes corresponding to the desired nature or thickness.

Figure 45:
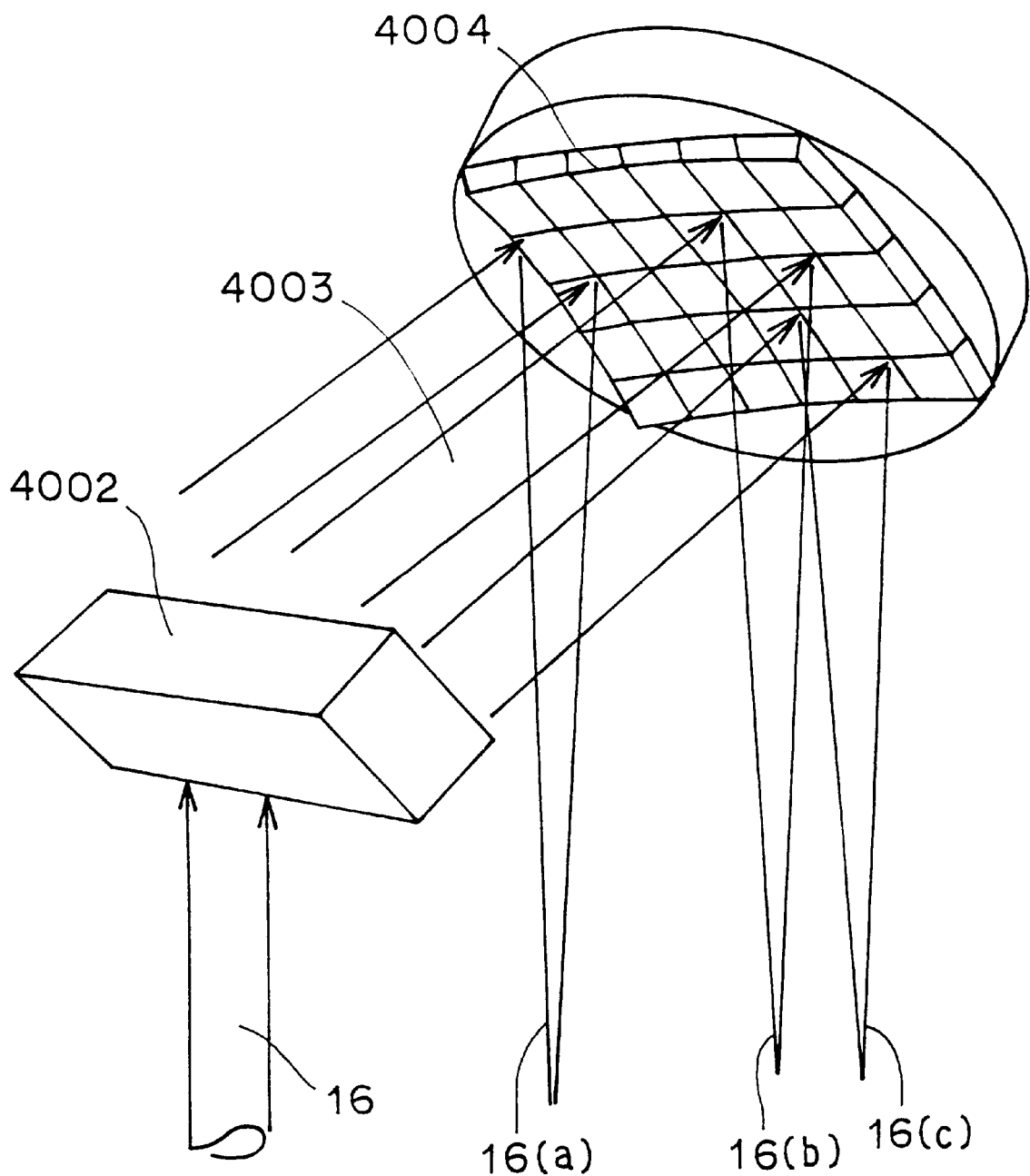
FIG. 45 is a cross sectional view showing a schematic structure of the thin film forming apparatus using laser in accordance with the twenty-third embodiment of the present invention.

A twenty-third embodiment of the present invention will be described with reference to FIG. 45. In this embodiment, referring to FIG. 45, the laser beam 16 is enlarged to the size corresponding to a condensing system 4004 at a beam enlarging portion 4002, and enters the condensing system 4004 as an enlarged laser beam 4003. The condensing system includes a plurality of concave mirrors, and corresponding to respective concave mirrors, laser beams 16*a*, 16*b*, 16*c* . . . are generated condensed by respective concave mirrors, which beams are generated to be incident on the target.

Though concave lenses are used for dividing the beam in this embodiment. A convex lens may be used, or concave and convex lenses may be used combined. Though division and condensing are both carried out by a single system, the division and condensing of the laser beam may be carried out by separate systems.

Figure 46:
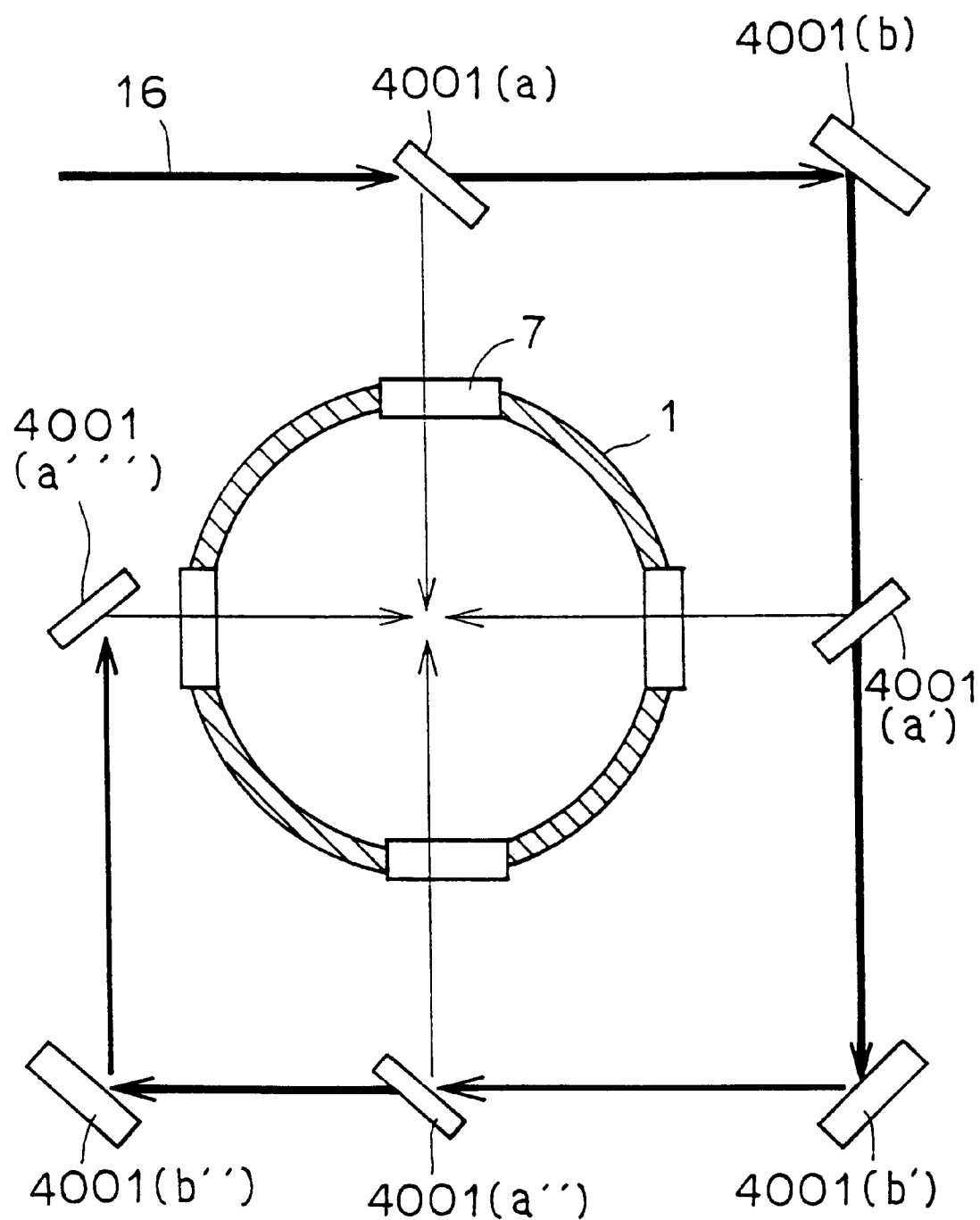
FIG. 46 is a section viewed from the top of a chamber of the thin film forming apparatus using laser in accordance with the twenty-third embodiment of the present invention.

FIG. 46 is a top view of the chamber of the thin film forming apparatus described above. The same numeral denote the same or corresponding portions. This embodiment is essentially the same as the twenty second embodiment described above. However, the divided beams are adapted to enter the chamber through separate windows. By this structure, the load of the laser beam inlet window 7 is reduced.

In the twenty-second and the twenty-third embodiment, one laser beam is divided. However, a plurality of laser units may be used so that a plurality of laser beams are emitted. However, as can be seen in the present embodiment, the advantage of the method using a laser beam divided into a number of beams is that all the resulting laser beams change commonly in accordance with the change of the characteristics of the laser beam. Therefore, as compared with a case in which a plurality of laser units are used, the reliability as the thin film forming apparatus is higher. From another view point, when the conditions of the laser beam are to be controlled in the step of forming a thin film, it has an advantage that all the divided beams can be controlled under the same condition.

Figure 47:
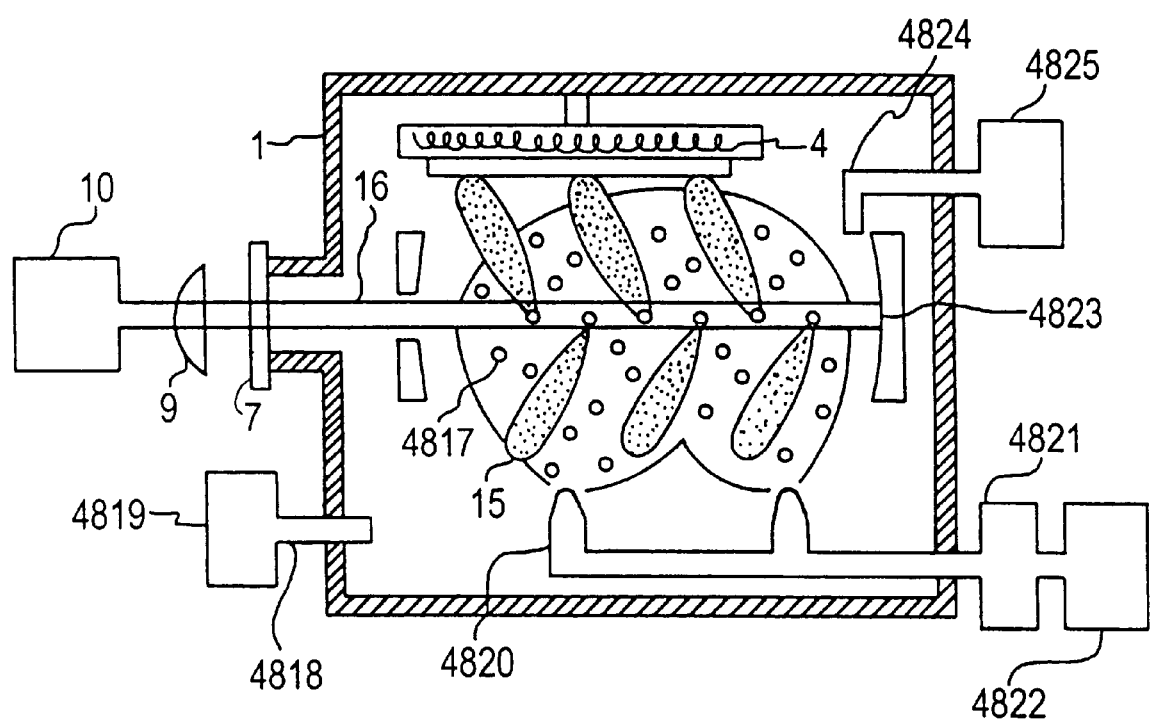
FIG. 47 is a cross sectional view showing a schematic structure of the thin film forming apparatus using laser in accordance with the twenty-fourth embodiment of the present invention.

A twenty-fourth embodiment of the present invention will be described with reference to FIG. 47. In this embodiment, referring to FIG. 47, a powder target 4817 accommodated in a powder target container 4821 is scattered in the space of the chamber 1 together with a buffer gas flow through a nozzle 4820 by means of an air blower pump. The laser beam emitted from laser unit 10 and passed through condenser lens 9 enters the inlet window 7 of chamber 1 and evaporates the powder target 4817 floating in the space of the chamber 1, generating a number of plumes 15. A substrate 2 is placed in the chamber 1, so that at the plane of contact of plume 15 and substrate 2, thin film is deposited. The laser beam transmitted through the atmosphere of the powder target 4817 is returned to the atmosphere of the powder target 4817 by means of a light confinement mirror 4823, so that it can evaporate the powder target 4817 efficiently. On the surface of light confinement mirror 4823, a buffer gas blow is applied by the air blower pump 4825 through nozzle 4824 so that the powder target 4817 is not deposited on the surface of the mirror. After laser beam irradiation, the powder target 15 floating in the chamber 1 are evacuated through an absorption opening 4818 rapidly by means of a pump 4819 to the outside of the chamber 1.

By using the thin film forming apparatus using laser described above, a $Y_1Ba_2Cu_3O_{7-x}$ oxide superconductive thin film was fabricated in accordance with the method of the present invention. An $SrTiO_3$ single crystal substrate was used as the substrate 2, and the substrate temperature was 700° C. A $Y_1Ba_2Cu_3O_{7-x}$ was used as the powder target 4817. The inside of chamber 1 was evacuated to $1\times10^{-4}$ Torr, and then oxygen gas was introduced as buffer gas to 200 m Torr. An excimer laser having the wavelength of 193 nm was used as the laser, the laser output was set to 2 J/cm$^2$, and the pulse frequency was set to 2 Hz.

Under the above described conditions, film formation was carried out for 30 minutes, and the thickness distribution and superconductive characteristics of the obtained oxide superconductive thin film were measured. As a result, the distribution of film thickness of the oxide superconductive thin film fabricated in accordance with the method of the present invention was ±10% in the range of 40×50 mm$^2$. The variation of the film thickness of a film formed under the same condition in accordance with the conventional method was ±10% in the scope of 35×35 mm$^2$. The critical temperature of the oxide superconductive thin film fabricated in accordance with the method of the present invention was 87K, and the average film thickness was about 2000 Å.

Figure 48:
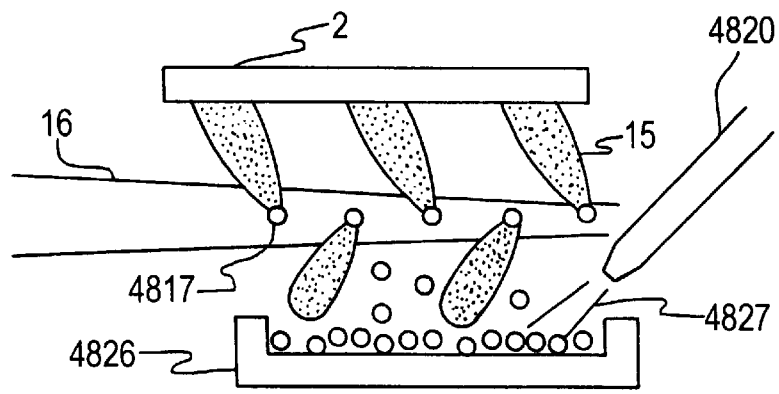
FIG. 48 is a cross section showing a schematic structure of a main portion of the thin film forming apparatus using laser in accordance with the twenty-fifth embodiment of the present invention.

A twenty-fifth embodiment of the present invention will be described with reference to FIG. 48. In this embodiment, referring to FIG. 48, powder target 4817 placed on a dish 4826 is blown by a buffer gas flow 4827 ejected from a nozzle 4820 and scattered in the space of chamber 1. Meanwhile, laser beam 16 emitted from laser unit 10 and passed through condenser lens 9 enters the inlet window 7 of the chamber 1, evaporates the powder target 4817 floating in the space of chamber 1, and a number of plumes 15 are generated. A substrate 2 is placed in the chamber 1, so that at the contact surface of plume 15 and substrate 2, a thin film is deposited. The laser beam 16 transmitted through the atmosphere of powder target 4817 during laser beam irradiation is returned to the atmosphere of powder target 4817 by means of light confinement mirror 4823, so that it can efficiently evaporate powder target 4817. On the surface of light confinement mirror 4823, the buffer gas flow is blown by means of the air blower pump 4825 through nozzle 4824, so that the powder target 4817 is not deposited on the surface of the mirror. After the laser irradiation, the powder target 15 floating in the chamber 1 is rapidly evacuated to the outside of the chamber 1 through an absorption opening 4818 by means of a pump 4819.

By using the thin film forming apparatus using laser described above, a $Y_1Ba_2Cu_3O_{7-x}$ oxide superconductive thin film was fabricated in accordance with the method of the present invention. An SrTiO$_3$ single crystal substrate was used as the substrate 2, and the substrate temperature was set to 700° C. $Y_1Ba_2Cu_3O_{7-x}$ was used as the powder target 4817. After the inside of chamber 1 was evacuated to $1\times10^{-4}$ Torr, oxygen gas was introduced as the buffer gas to 200 m Torr. An excimer laser having the wavelength of 193 nm was used as the laser, the laser output was set to 2 J/cm$^2$, and the pulse frequency was set to 2 Hz.

Film formation was carried out for 30 minutes under the above described conditions, and the thickness distribution and the superconductive characteristics of the obtained oxide superconductive thin film were measured. Consequently, the variation in film thickness distribution of the oxide superconductive thin film fabricated in accordance with the method of the present invention was ±10% in the scope of 40×50 mm$^2$. The variation of the film thickness distribution of a film formed under the same condition in accordance with the conventional method was ±10% in the scope of 35×35 mm$^2$. The critical temperature of the oxide superconductive thin film fabricated in accordance with the present invention was 87K, and the average film thickness was about 2000 Å.

Figure 49:
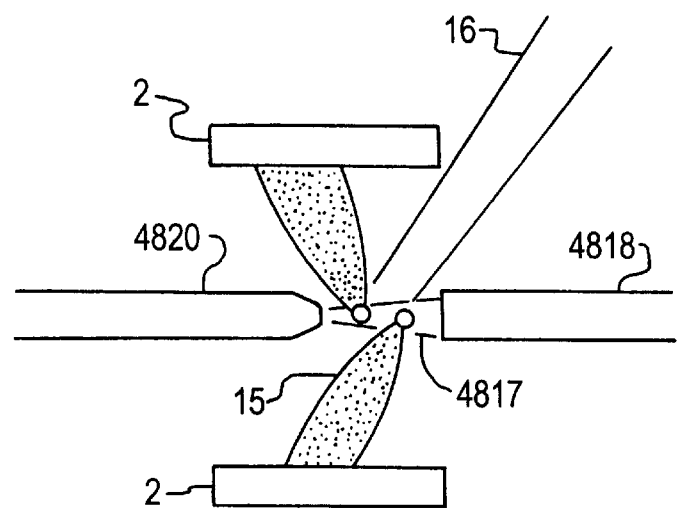
FIG. 49 is a cross sectional view showing a schematic structure of the main portion of the thin film forming apparatus using laser in accordance with the twenty-sixth embodiment of the present invention.

A twenty-sixth embodiment of present invention will be described with reference to FIG. 49. Referring to FIG. 49, in this embodiment, the powder target 4817 is, immediately after ejection into the chamber 1 by nozzle 4820, rapidly evacuated to the outside of chamber 1 by an absorption opening 4818 provided at a position opposing the tip of the nozzle 4820. The powder target 4817 emitted to chamber 1 is irradiated with laser beam 16, so that plumes 15 are generated.

In this embodiment, by using the thin film forming apparatus using laser described above, a $Y_1Ba_2Cu_3O_{7-x}$ oxide superconductive thin film was fabricated. An SrTiO$_3$ single crystal substrate was used as the substrate 2, and the substrate temperature was set to 700° C. A $Y_1Ba_2Cu_3O_{7-x}$ was used as the powder target 4817. After the inside of chamber 1 was evacuated to $1\times10^{-4}$ Torr, oxygen gas was introduced as the buffer gas to 200 m Torr. An excimer laser of the wavelength of 193 nm was used as the laser, the laser output was set to 2 J/cm$^2$, and the pulse frequency was set to 2 Hz.

Film formation was carried out for 30 minutes under the above described conditions, and the film thickness distribution and the superconductive characteristics of the obtained oxide superconductive thin film were measured. As a result, the variation in the film thickness distribution of the oxide superconductive thin film fabricated in accordance with the method of the present embodiment was ±10% in the scope of 40×40 mm$^2$. The variations of the film thickness distribution of a film formed under the same condition in accordance with the conventional method was ±10% in the scope of 35×35 mm$^2$. The crystal temperature of the oxide superconductive thin film fabricated in accordance with this embodiment was 87K, and the average film thickness was about 2000 Å.

Figure 50:
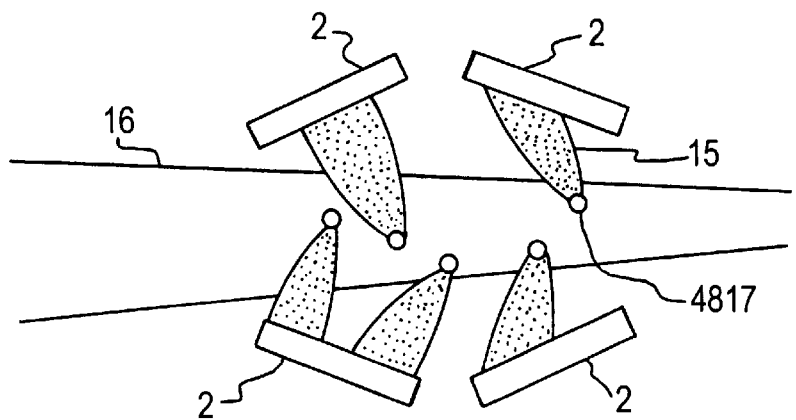
FIG. 50 is a cross sectional view showing a schematic structure of the main portion of the thin film forming apparatus using laser in accordance with the twenty-seventh embodiment of the present invention.

A twenty-seventh embodiment of the present invention will be described with reference to FIG. 50. In this embodiment, referring to FIG. 50, substrates 2 are placed to surround the atmosphere of the powder target 4817 floating in the space of chamber 1.

In this embodiment also, by using the thin film forming apparatus using laser, a $Y_1Ba_2Cu_3O_{7-x}$ oxide superconductive thin film was fabricated. An SrTiO$_3$ single crystal substrate was used as the substrate 2, and 12 substrates were placed to surround the powder target 4817. The substrate temperature was set to 700° C. $Y_1Ba_2Cu_3O_{7-x}$ was used as powder target 4817. After the inside of chamber 1 was evacuated to $1\times10^{-4}$ Torr, oxygen gas was introduced as buffer gas, to 200 m Torr. An excimer laser having the wavelength of 193 nm was used as the laser, the laser output was set to 2 J/cm$^2$, and pulse frequency was set to 2 Hz.

Film formation was carried out for 30 minutes under the above described conditions, and film thickness distribution and the superconductive characteristics of the obtained oxide superconductive thin film were measured. As a result, 6 superconductive thin films were obtained simultaneously, with the variation in film thickness distribution being ±10% in the scope of 35×35 mm$^2$, in accordance with the method of the present invention. When film is formed in the conventional method under the same conditions, only one film could be obtained with the variation in distribution of film thickness being ±10% in the scope of 35×35 mm$^2$. The critical temperature of the oxide superconductive thin film fabricated in accordance with the present invention was 87K, and the average film thickness was about 2000 Å.

Figure 51:
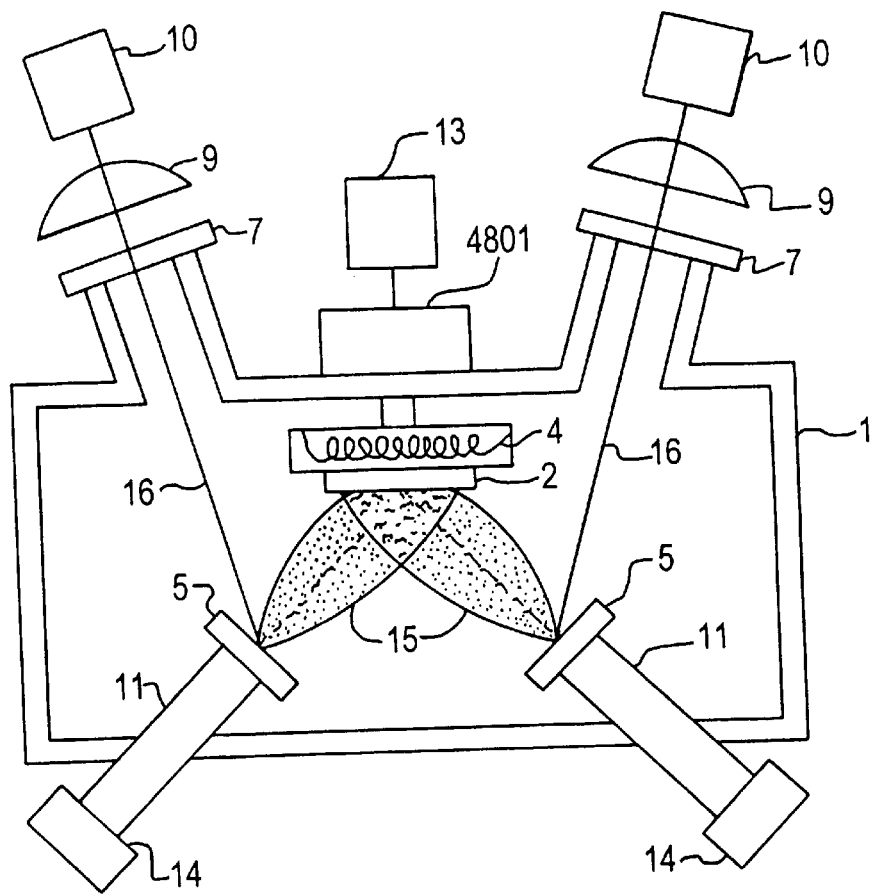
FIG. 51 is a cross sectional view showing a schematic structure of the thin film forming apparatus using laser in accordance with the twenty-eight embodiment of the present invention.

A twenty-eighth embodiment of the present invention will be described with reference to FIG. 51. In this embodiment, referring to FIG. 51, laser beam 16 emitted from laser unit 10 and passed through condenser lens 9 enters the laser inlet window 7 of chamber 1, to be incident on targets 5 placed on a pair of turntables 11 in chamber 1. Turntable 1 can be rotated at an arbitrary rate by means of a motor 14. The inside of chamber 11 can be evacuated to high vacuum. The substrate 2 is arranged oblique to the normal of the surface of target 5. In order to enable radiation of a plurality of plume onto the substrate 2, a plurality of targets 5 are placed with respect to the substrate 2.

In this embodiment also, by using the thin film forming apparatus using laser described above, a $Y_1Ba_2Cu_3O_{7-x}$ oxide superconductive thin film was fabricated. An $SrTiO_3$ single crystal substrate was used as the substrate 2, and the substrate temperature was set to 700° C. A sintered body of $Y_1Ba_2Cu_3O_{7-x}$ having the diameter of 2 cm was used as the target 5. The distance between the center of substrate 2 and the point of irradiation of target 5 was set to 5 cm. After the inside of chamber 1 was evacuated to $1 \times 10^{-4}$ Torr, oxygen gas was introduced to 200 m Torr.

An excimer laser having the wavelength of 193 nm was used as the laser, the laser output was set to 3 J/cm$^2$, the area of laser irradiation was 2×3.5 mm$^2$, and the pulse frequency was set to 2 Hz. The target was rotated at 120 rpm.

Film formation was carried out under the above described conditions for 25 minutes, and the film thickness distribution and the superconductive characteristics of the obtained oxide superconductive thin film were measured. Consequently, the variation in film thickness distribution of the oxide superconductive thin film fabricated in accordance with the method of the present invention was ±10% in a circle having the diameter of 35 mm. The variation in film thickness distribution of a film fabricated under the same conditions except that the substrate 2 is arranged so that the central axis of plume 15 and substrate 2 are vertical to each other and only one plume is used, was ±10% in a circle having the diameter of 10 mm. The critical temperature of the oxide superconductive thin film fabricated in accordance with the method of the present invention was 87K, and the average film thickness was about 3000 Å.

A twenty-ninth embodiment of the present invention will be described. This embodiment is characterized in that a target having unevenness on the surface which is to be irradiated with the laser beam is used in an apparatus for forming a thin film over a large area by using laser, in which a target is irradiated with laser beam and on a substrate placed opposing to the target, a thin film is deposited. The main feature of the embodiment resides in that a thin film is fabricated by using a target having unevenness on its surface which is to be irradiated with laser beam. In the film forming method using laser, generally, the target having flat surface is irradiated with a condensed laser beam, so that the target is evaporated to generate a plasma, which is a collection of active film forming particles generally called a plume. Thin film is deposited by placing a substrate near the tip end of the plume. However, in that case, the thin film is formed only in a small area around a portion of the substrate which is in contact with the tip end of the plume. By the method of this invention, the target has unevenness on its surface which is irradiated with laser beam, so that a plurality of plumes are generated from the protruding portions, allowing deposition of a thin film over a wide area.

Further, in this embodiment, by making the height of the protruding portions on the surface of the target increase successively from the direction of laser beam irradiation, the target can be evaporated efficiently to generate plumes.

Figure 52:
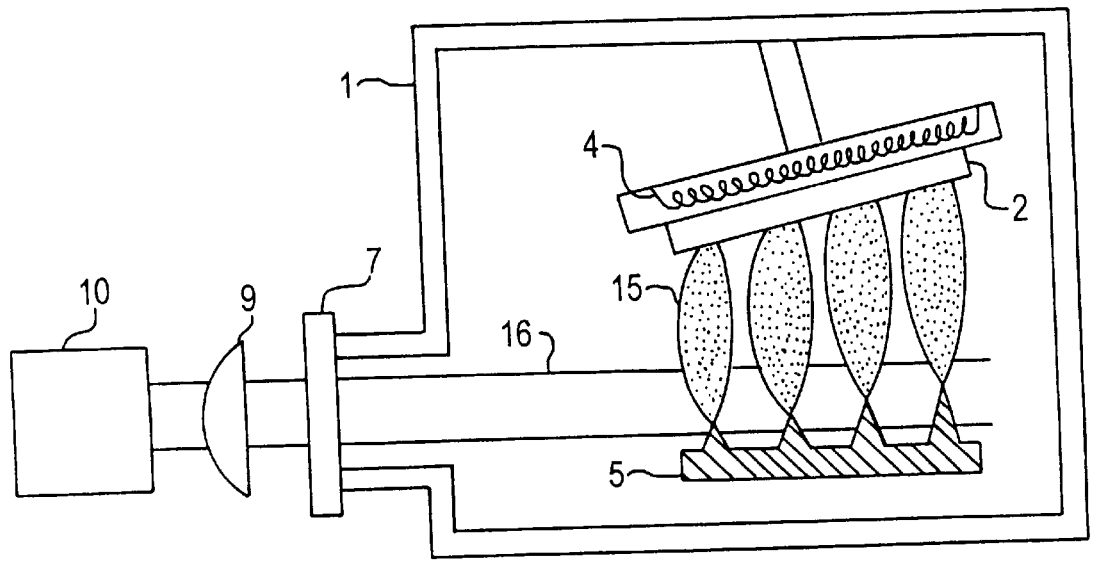
FIG. 52 is a cross sectional view showing a schematic structure of the thin film forming apparatus using laser in accordance with the twenty-ninth embodiment of the present invention.

FIG. 52 is a schematic diagram showing one example of the thin film forming apparatus using laser, for carrying out the present invention. In the thin film forming apparatus using laser shown in FIG. 52, the laser beam 16 emitted from laser unit 10 and passed through condenser lens 9 enters the laser inlet window 7 of the chamber 1 to be incident on the raw material target 5 in chamber 1. The chamber 1 can be evacuated to high vacuum. Substrate 2 is placed to be opposing to the target 5. Target 5 has protruding portions of which height is gradually increased from the direction of the laser beam irradiation on its surface.

In this embodiment also, by using the thin film forming apparatus using laser described above, a $Y_1Ba_2Cu_3O_{7-x}$ oxide superconductive thin film was fabricated. An $SrTiO_3$ single crystal substrate was used as the substrate 2, and the substrate temperature was set to 700° C. A sintered body of $Y_1Ba_2Cu_3O_{7-x}$ was used as target 5. The distance between the center of substrate 2 and the point of irradiation of target 5 was set to 5 cm. After the inside of chamber 1 was evacuated to $1 \times 10^{-4}$ Torr, oxygen gas was introduced to 200 m Torr. An excimer laser having the wavelength of 193 nm was used as the laser, the laser output was set to 3 J/cm$^2$, the area of laser beam irradiation was 2×3.5 mm$^2$, and the pulse frequency was set to 2 Hz.

Film formation was carried out under the above described conditions for 25 minutes, and the film thickness distribution and the superconductive characteristics of the obtained oxide superconductive thin film were measured. Consequently, the variation in the film thickness distribution of the oxide superconductive thin film fabricated in accordance with the method of the present invention was ±10% in the area of 40×50 mm$^2$. The variation in film thickness distribution of a film formed under the same conditions except that a target having flat surface was used, was ±10% in a circle having the diameter of 30 mm. The critical temperature of the oxide superconductive thin film fabricated in accordance with the present invention was 87K, and the average film thickness was 3000 Å.

A thirtieth embodiment of the present invention will be described with reference to FIGS. 53A to 53C and FIG. 54. The basic structure of FIG. 154 is the same as the prior art example shown in FIG. 149.

Figure 53A:
Figure 53B:
Figure 53C:
Figure 54:
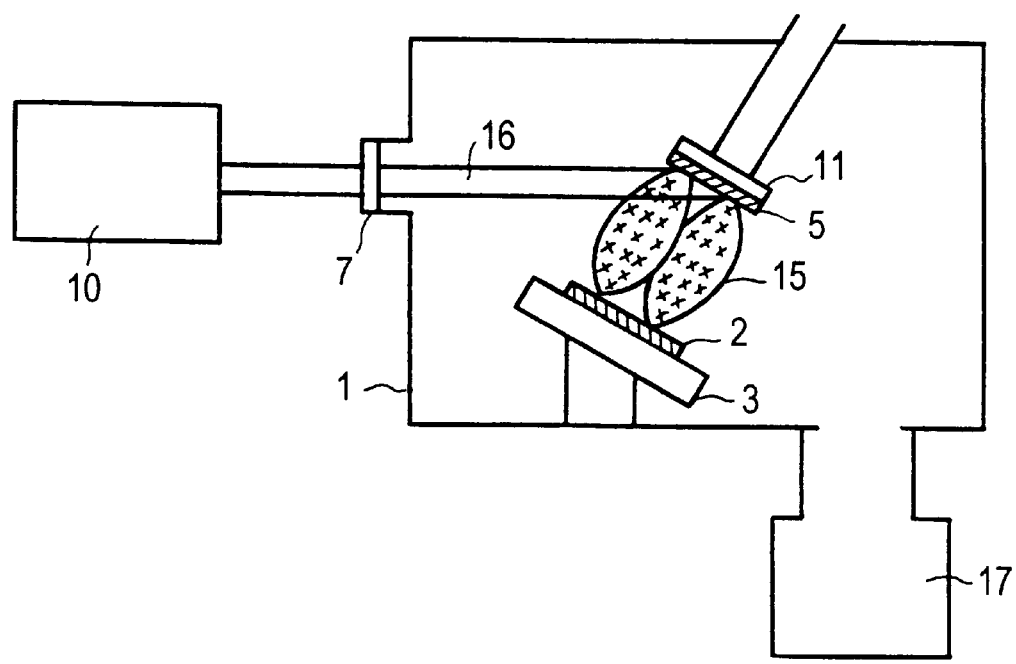
FIG. 54 is a cross sectional view showing a schematic structure of the thin film forming apparatus using laser in accordance with the thirtieth embodiment of the present invention.

The operation will be described. The laser beam 16 emitted from laser unit 10 is transmitted through the laser inlet window 7 of chamber 1 but not through condenser lens 9, to be nearly incident on raw material target 5 placed on turntable 11 in chamber 11 or to be incident on a wide range. The surface shape of the target may include half columns, triangular prisms, triangular pyramids, cones or hemispheres arranged regularly or at random as shown in FIGS. 53A to 53C, and the shapes are adapted such that the incident angle of the excimer laser with respect to the target will be random, and therefore a plurality of plumes 15 and plasmas having very close width to that of plumes are generated vertical to the respective surfaces. In order to prevent sputtering of the same portion, the target is supported by a rotary mechanism.

Opposing to the raw material target 5, substrate 2 is placed fixed on substrate holder 3. Excited atoms and ions in the plume 15 reache substrate 2 and are deposited thereon to form a thin film. Since a plurality of plumes are generated as described above, a thin film can be formed over a wide area relatively easily.

Figure 55:
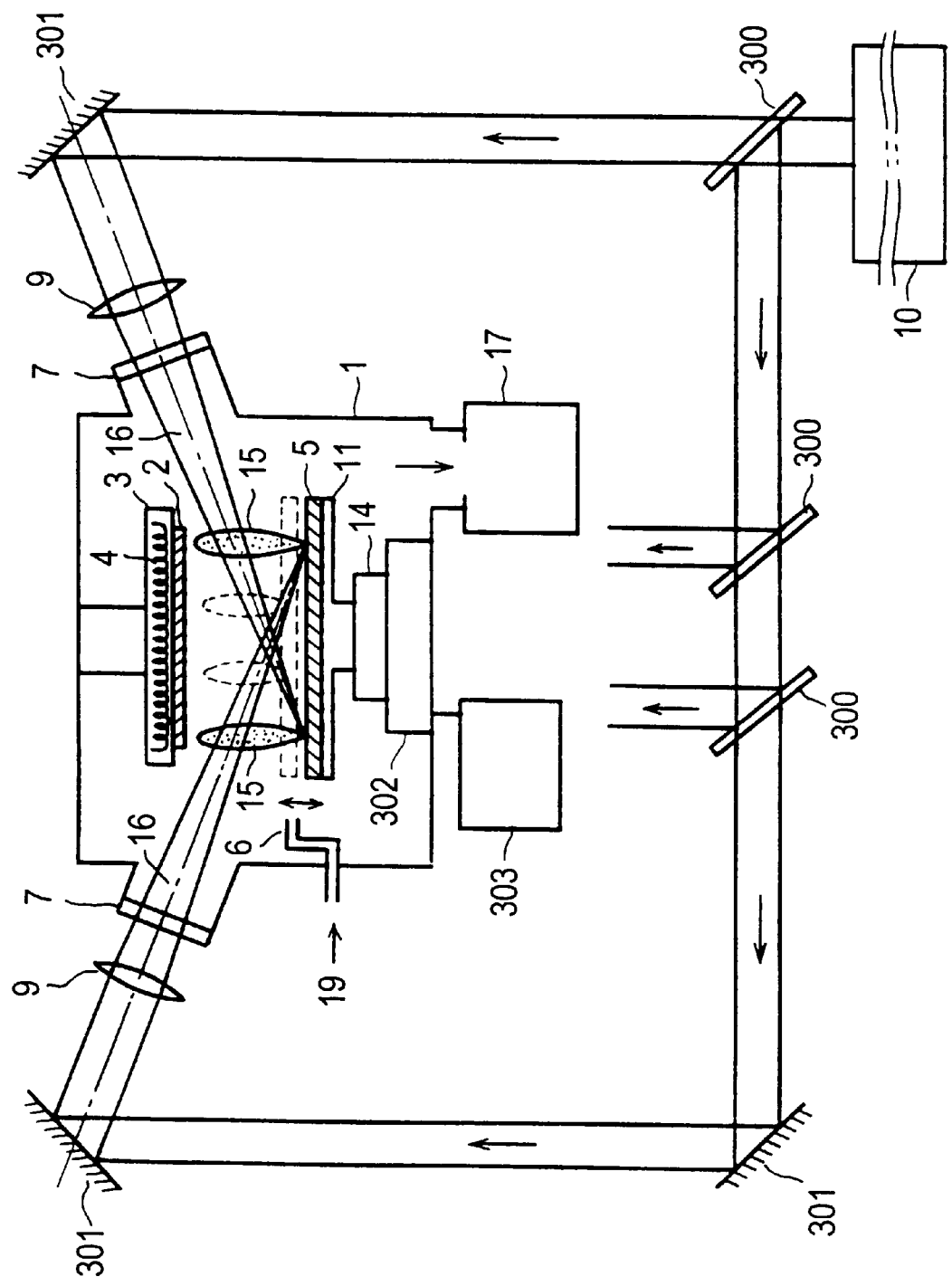
FIG. 55 is a cross sectional view showing a schematic structure of the thin film forming apparatus using laser in accordance with the thirty-first embodiment of the present invention.

A thirty-first embodiment of the present invention will be described with reference to FIGS. 55 and 56. Referring to FIG. 55, the apparatus of this embodiment includes a beam splitter 300, a mirror 301, a linear moving stage 302 and a linear moving stage controlling apparatus 303.

Portions denoted by the same reference numerals as in FIGS. 148 and 149 denote the same or corresponding components.

The operation will be described. The laser beam emitted from laser unit 10 is divided into a plurality of laser beam 16 by means of a plurality of beam splitter 300, directions thereof are adjusted by a plurality of mirror 301, and then the beams are condensed by a plurality of condenser lenses 9, passed through a plurality of laser inlet windows 7 of chamber 1 to be incident on a plurality of portions of the raw material target 5 placed on a turntable 11 in chamber 1. At this time, turntable 11 may be rotated by a motor 14, so that sputtering of one portion only of the raw material target 5 causing local generation of crater can be prevented.

At a plurality of portions of raw material target 5 irradiated with laser beams, plasma of the target material is generated abruptly at the time of laser irradiation. In the process of cooling the plasma in several ten ns, isolated atoms, molecules and ions are generated. The groups of excited atom molecules, ions and the like have lives of at least several microseconds, which are emitted in the stage to generate a plurality of plumes 15 which are like flames of candles.

A substrate 2 is placed fixed on substrate holder 3 opposing to raw material target 5. Excited atom molecules, ions and target material in the form of clusters which are combinations of such atoms and ions in the plurality of plumes 15 reach the substrate 2 and are deposited and crystallized thereon, forming a thin film.

Here, linear moving stage 302 is controlled by linear moving stage controlling apparatus 303 and when raw material target 5 is linearly moved in the direction of substrate 2, positions of irradiation on raw material target 5 with a plurality of laser beams 16 are changed in the radial direction, and therefore the positions of a plurality of plumes 15 generated on raw material target are changed in the radial direction. As a result, a plurality of plumes 15 are generated at various positions on substrate 2 placed opposite to raw material target 5. The target materials in plume 15 reach and are deposited on various positions on the surface of substrate 2. Accordingly, a uniform thin film having high quality can be formed on a large wafer having the diameter of 6 to 8 inches or larger.

A heater 4 for heating the substrate is provided in substrate holder 3 so as to enable post annealing in which a film deposited at a low temperature is annealed at a temperature higher than the temperature for crystallization to obtain a thin film of high quality, and enabling as-deposition in which, at the time of deposition, the substrate itself is held at a temperature higher than the temperature for crystallization so that a crystallized thin film is formed at the site. In the as-deposition method, active oxygen atmosphere is utilized as well. For example, when an oxide thin film is to be formed as shown in the figure, a nozzle 6 for supplying gas 19 containing oxygen is provided so as to provide oxygen atmosphere around the substrate 2 in order to promote generation of oxide on the substrate 2, as in the prior art.

In the embodiment, the laser beam is divided into a plurality of beams by means of beam splitters. However, the laser beam may be divided into a plurality of beams by using a total reflection mirror as shown in FIG. 56 to obtain similar effect as in the example employing the beam splitters. Compared with the beam splitters, when a total reflection mirror is used, there is an advantage that the beam can be divided into a plurality of beams with less attenuation of the laser beam intensity.

Though one laser beam is divided into a plurality of beams by means of beam splitters or a total reflection mirror in the above embodiment, a plurality of laser beams may be generated by using a plurality of laser units to provide the same effect.

Figure 57:
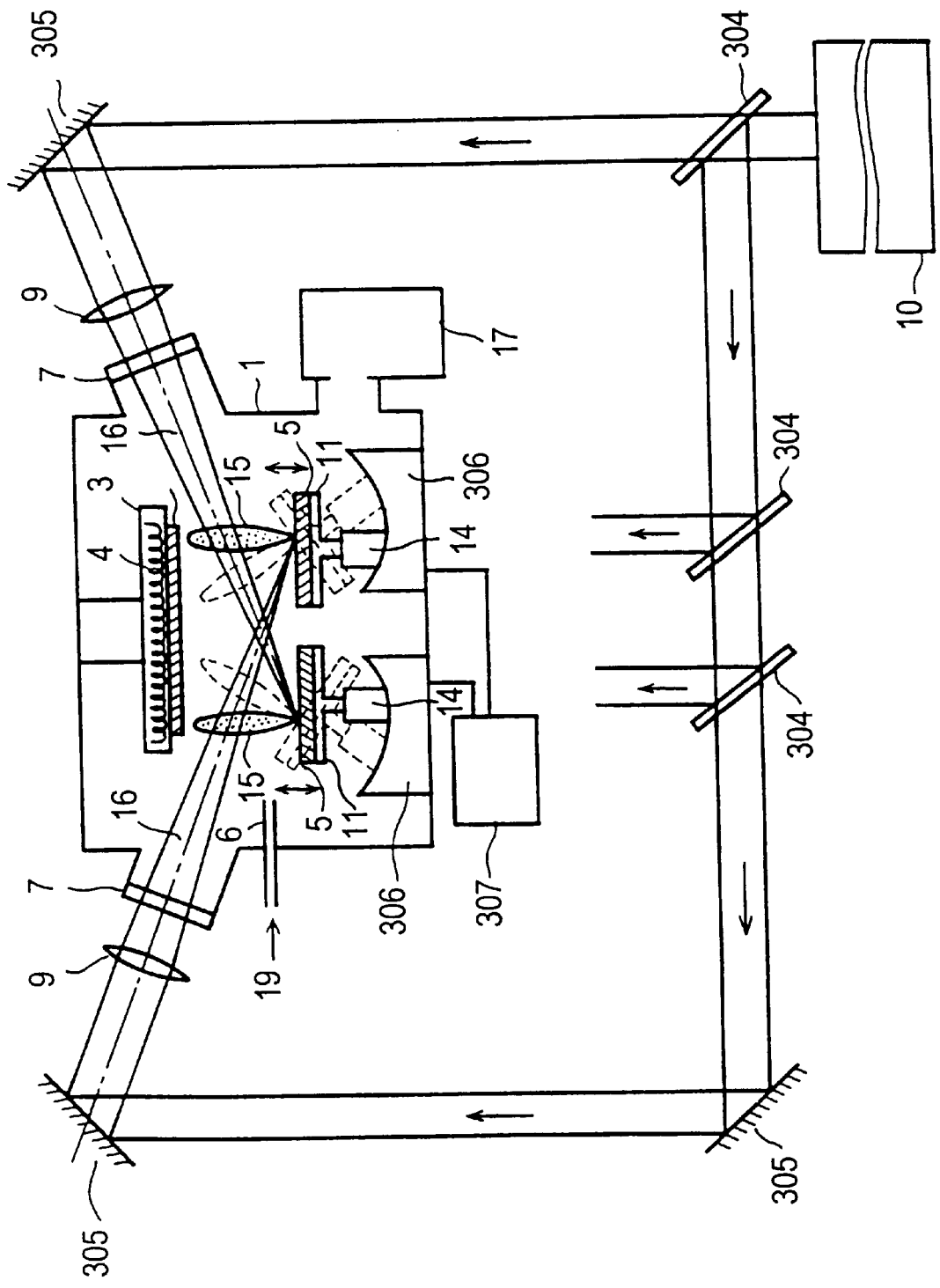
FIG. 57 is a cross sectional view showing a schematic structure of the thin film forming apparatus using laser in accordance with the thirty-second embodiment of the present invention.

A thirty-second embodiment of the present invention will be described with reference to FIG. 57. The apparatus of this embodiment includes, referring to FIG. 57, a beam splitter 304, a mirror 305, a variable angle stage 306, and a variable angle stage controlling apparatus 307.

In the figure, portions denoted by the same reference characters as in FIGS. 148 and 149 denote the same or corresponding portions.

The operation will be described. The laser beam emitted from laser unit 10 is divided into a plurality of laser beams 16 by means of a plurality of beam splitters 304, and their directions are adjusted by a plurality of mirrors 305. The beams are then condensed by a plurality of condenser lenses 9, and passed through a plurality of laser inlet windows 7 of chamber 1 to be incident on a plurality of raw material targets 5 placed on a plurality of turntables 11 in chamber 1.

At this time, the plurality of turntables 11 may be rotated by means of a plurality of motors 14 so as to prevent generation of local craters caused by sputtering of the same portion of each of the plurality of raw material targets 5.

At the portions of irradiation of the plurality of raw material targets with laser, plasmas of the target material are generated abruptly at the time of laser irradiation. In the process of cooling the plasma in several ten ns, isolated excited atom molecules, ions and the like are generated. These groups of excited atom molecules, ions and the like have lives of at least several microseconds, and they are emitted in the space to form a plurality of plumes 15 which are like flames of candles.

A substrate 2 is placed fixed on substrate holder 3 opposing to the plurality of raw material targets 5. The excited atom molecules and ions as well as the target material in the form of clusters which are the combination of these atoms and ions in the plurality of plumes 15 reach the substrate 2 and are deposited and crystallized to form a thin film.

Here, the plurality of variable angle stages 306 are controlled by variable angle stage controlling apparatus 307 and when, by this control, the angles of the plurality of raw material target 5 are changed with respect to the substrate 2, the directions of the plurality of plumes generated on the plurality of raw material targets 5 by the plurality of laser beams 16 are changed. Therefore, a plurality of plumes 15 come to be in contact with various positions on the substrate 2 placed opposing to the plurality of raw material targets 5. Accordingly the target material in the plume 15 reach and are deposited on various positions of the surface of substrate 2. Consequently, a uniform thin film having high quality can be formed on a large wafer having the diameter of 6 to 8 inches or larger.

A heater 4 for heating the substrate is provided in substrate holder 3 so as to enable post annealing in which a film deposited at a low temperature is annealed at a temperature higher than the temperature for crystallization to form a thin film of high quality and to enable as-deposition in which the substrate itself is held at a temperature higher than the temperature for crystallization at the time of deposition so as to form a crystallized thin film at the site. In the as-deposition method, an active oxygen atmosphere is utilized as well and, as shown in the figure, a nozzle 6 for supplying gas 19 containing oxygen is provided, for example, to provide oxygen atmosphere around the substrate 2, so as to promote generation of oxide on the substrate 2.

Figure 56:
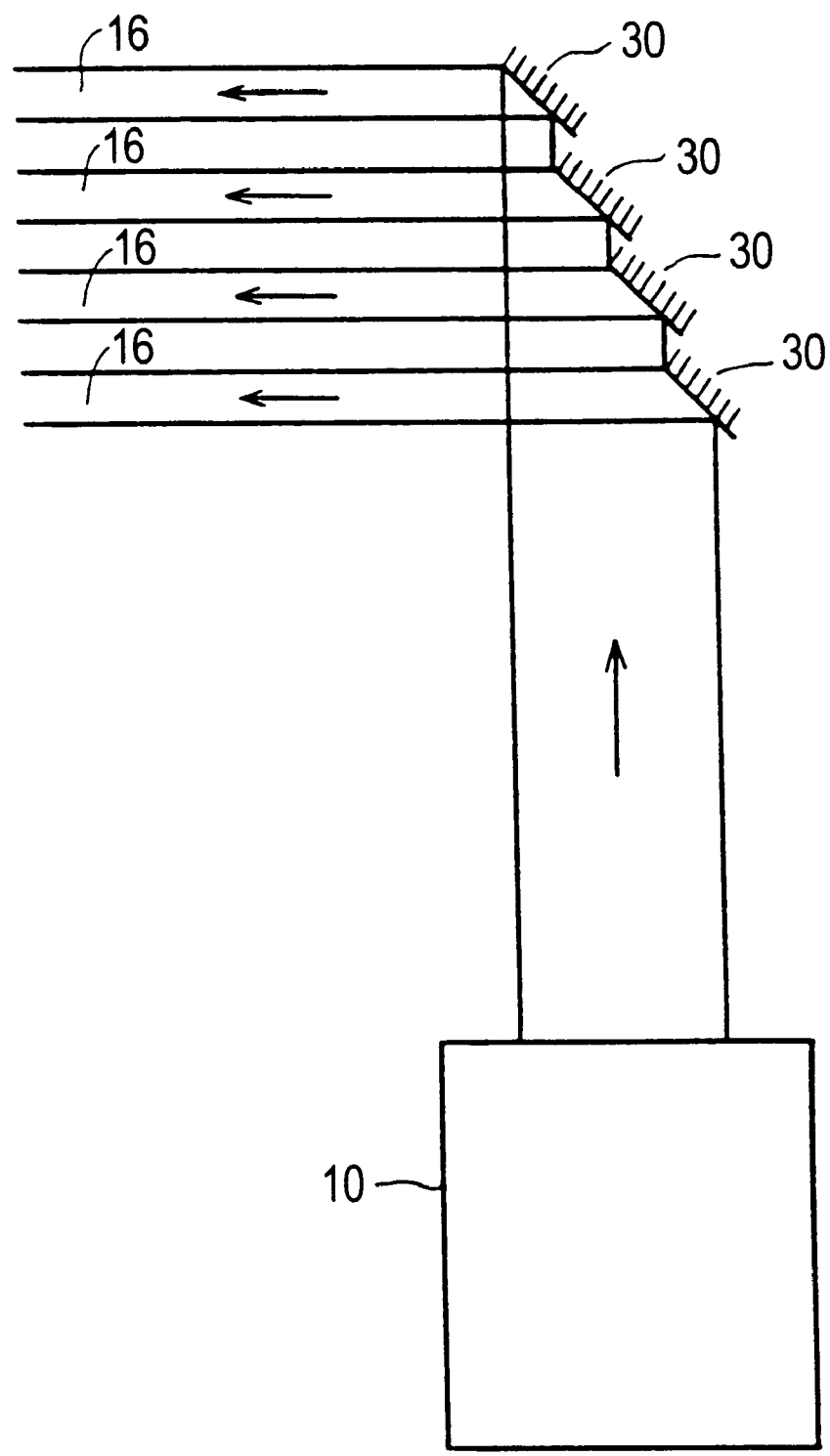
FIG. 56 shows a manner of dividing a laser beam into a plurality of beams by using a total reflection mirror which can be used in the-thirty-first embodiment of the present invention.

Though the laser beam is divided into a plurality of beams by means of a beam splitter in the present embodiment, the laser beam may be divided into a plurality of beams by using a total reflection mirror as shown in FIG. 56 to provide similar effect as in the example using the beam splitters. As compared with the beam splitters, when a total reflection mirror is used, there is an advantage that the beam can be divided into a plurality of beams with less attenuation in the laser beam intensity.

Though one laser beam is divided into a plurality of beams by using beam splitters or a total reflection mirror in the above described embodiment, a plurality of laser beams may be generated by using a plurality of laser units to provide the same effect.

Figure 58:
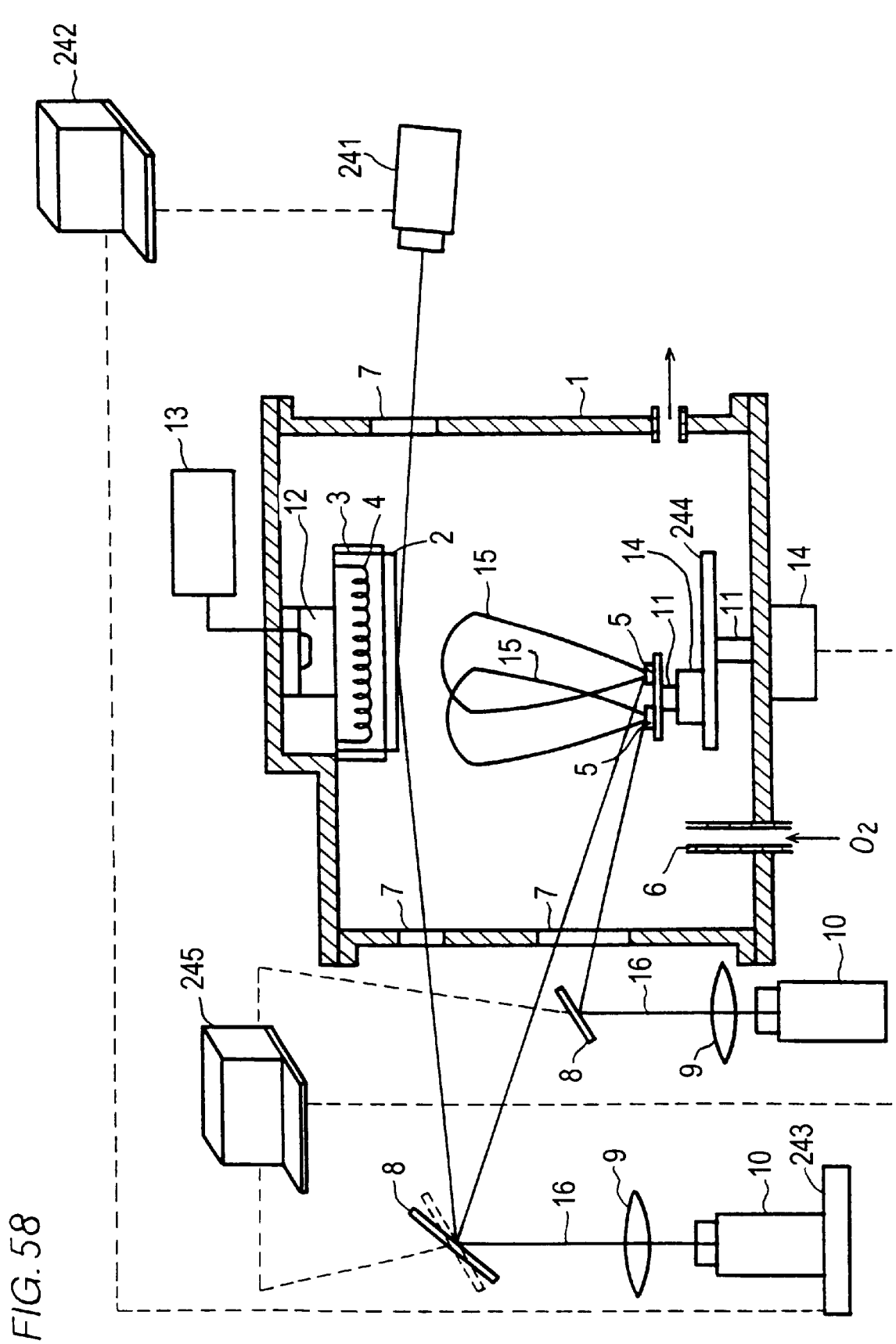
FIG. 58 is a cross sectional view showing a schematic structure of the thin film forming apparatus using laser in accordance with the thirty-third embodiment of the present invention.

A thirty-third embodiment of the present invention will be described with reference to FIG. 58. Referring to FIG. 58, the apparatus of this embodiment includes a CCD camera 241, a computer 242 for image distribution processing, an XY stage 243 for the laser, a support base 244 and a computer 245 for controlling a mirror.

The operation will be described. When targets 5 are further rotated on a rotating support base 244, plumes 15 having density distribution emitted from the targets are made uniform, enabling formation of a thin film of high quality over a large area. At this time, by making the rotation of the motor and the operation of mirror synchronous with each other by means of computer 245 for controlling the mirror, the laser is adapted to always be incident on the targets. Since there are a plurality of targets at this time, the rate of deposition is increased. As the wafer can be scanned with the laser incident on the target moved by moving the mirror and the reflected light is measured by the CCD camera, the state of the film on the surface can be monitored on real time basis, the result can be fedback to the film forming conditions so as to move the wafer or the targets, to change the shape of the beam, and to change the position of the beam and so on.

A thirty-fourth embodiment of the present invention will be described with reference to FIGS. 59 to 67.

Figure 59:
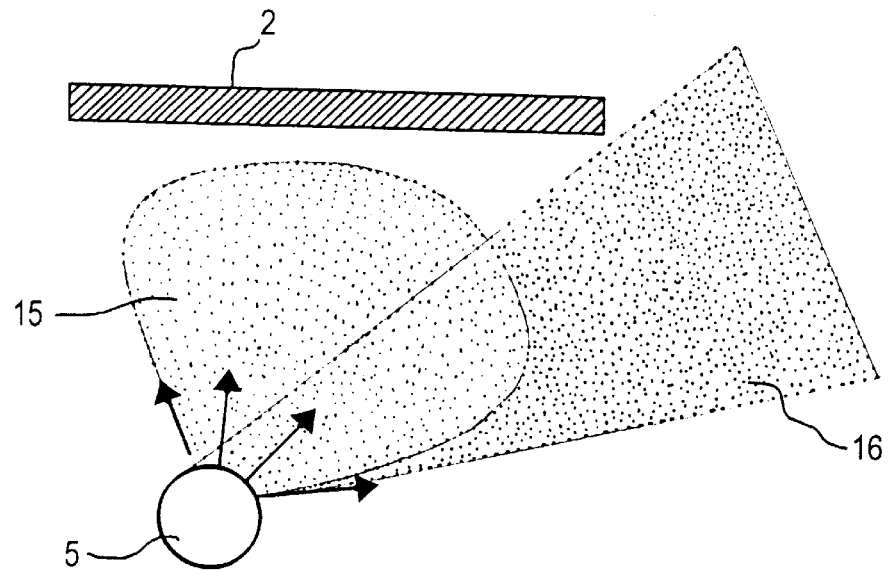
FIG. 59 is a cross sectional view showing a schematic structure of the main portion of the thin film forming apparatus using laser in accordance with the thirty-fourth embodiment of the present invention.

In this embodiment, referring to FIG. 59, when a target 5 is irradiated with a laser beam 16, compositions of target 5 are evaporated and scattered. When viewed as a whole, it seems like a flame of a candle, which is called a plume 15. When the plume is adjusted such that its tip end is in contact with the substrate 2, the compositions of the target 5 are deposited on substrate 2 to form a thin film.

It is known that the direction of scattering of plume 15 from target 5 is approximately the directions of the normal of the target. Since the target is generally a flat plate or a column having large diameter, plume 15 is mostly scattered in one direction. In that case, plume 15 turns to be a thin flame, preventing formation of a thin film over a wide area of the substrate. This problem can be solved when the target is adapted such that there are a number of normals of the target included in the scope which is irradiated with the laser beam. FIG. 59 shows an example in which a columnar target is used. As shown by the arrows in the figure, there are a number of normals. Since plumes are generated in the direction of these normals, a large plume can be generated when viewed as a whole.

Figure 60:
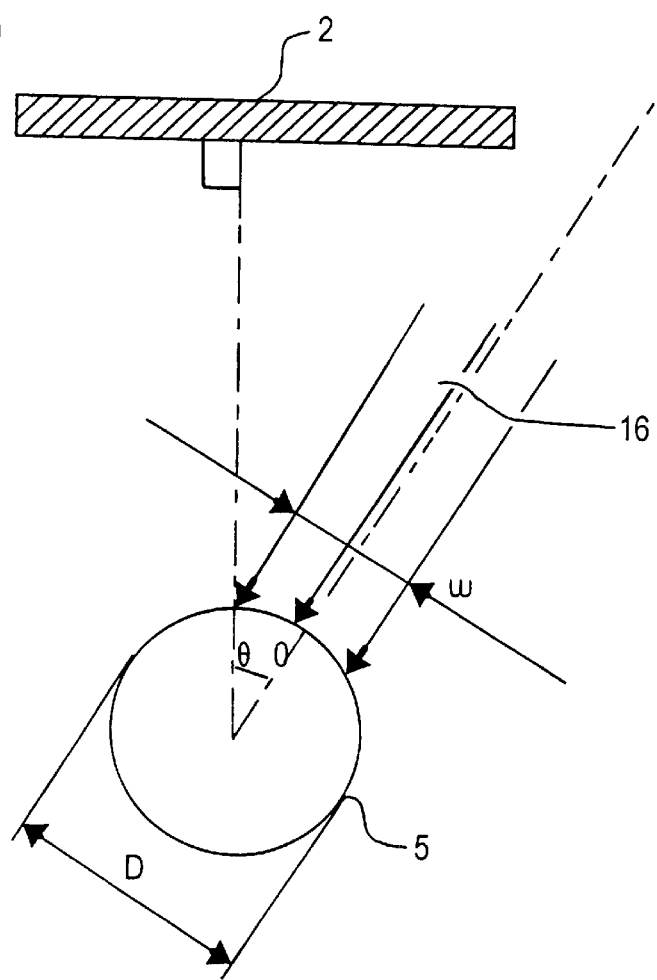
FIG. 60 is an illustration showing relation between diameter D of the target and diameter ω of the laser beam in the thirty-fourth embodiment of the present invention.
Figure 61:
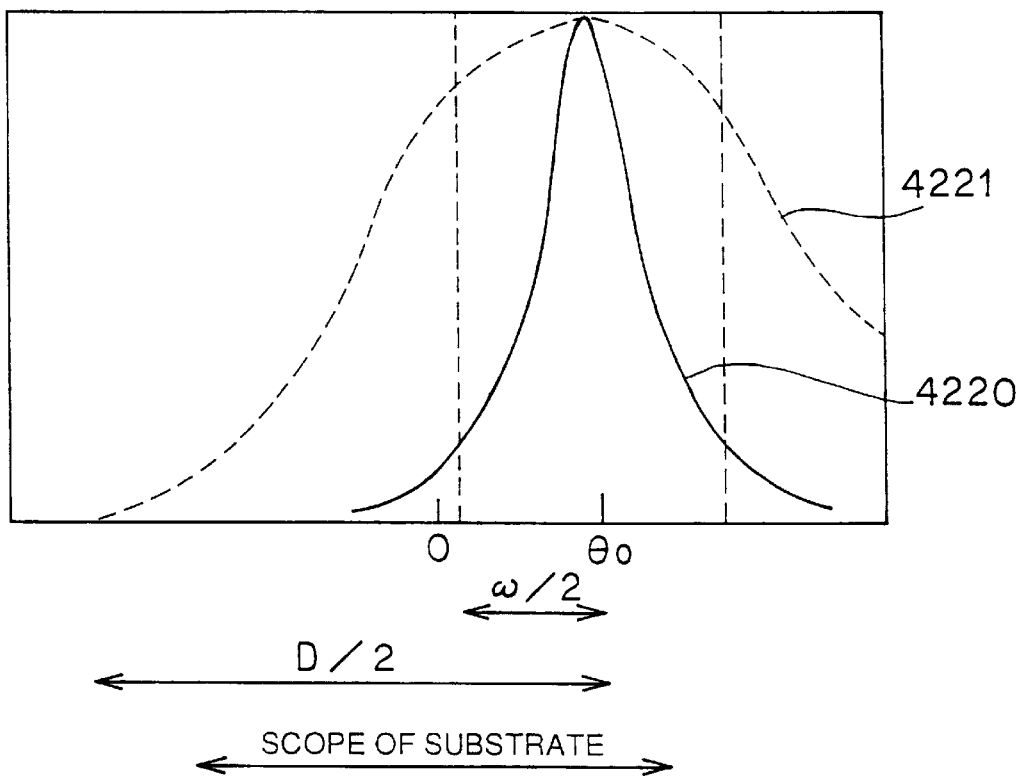
FIG. 61 is a graph showing the relation between the angle of plume extension, and the diameter D of the target and diameter ω of the laser beam in the thirty-fourth embodiment of the present invention.

FIGS. 60 and 61 show relation between the diameter D of the target and the diameter ω of the laser beam 16. Referring to FIG. 60, assume that laser beam 16 is incident at the angle of $\theta_0$ with respect to that one of the normals of the target 5 which is vertical to the substrate, the plume is generated to the annular direction which corresponds to the beam diameter with $\theta_0$ being the center. When the beam diameter ω is small with respect to the diameter D of the target, such a plume as shown by the solid line 4220 shown in FIG. 61 will be generated.

Referring to FIG. 61, the plume extends in the angle of about ±πω/2D. If ω/D is small, the plume is generated exclusively in the direction of $\theta_0$. The plume is not generated to the direction of the substrate unless at least the following relation is satisfied:

$\pi\omega/2D > \theta_0$.

In order to satisfy this condition, the diameter of the laser beam should be made larger with respect to the target, or the angle $\theta_0$ should be made smaller. The dotted line of FIG. 61 shows the intensity distribution of the plume when the beam diameter is larger than the diameter of the target and the beam intensity distribution is uniform. This distribution results from the fact that the beam reaches the target vertically as well as diagonally since the target is columnar in the example of FIG. 60. When the beam reaches diagonally, the beam intensity becomes weaker, so that the intensity of the plume is reduced accordingly. In order to prevent this problem and to provide a flat plume, the intensity of the beam should be made larger as the angle comes closer to 0 in FIG. 61.

Though a columnar target was used in the above example, the similar effect is expected even when a spherical or polygonal target is used, provided that a number of normals are included in the surface irradiated with the beam. Alternatively, a flat target may have surface roughness which is about the size of the beam diameter.

In a columnar target, a normal common to the substrate surface and the target surface can be defined. If it is defined that the intersection between the common normal and the target is the foot of the normal, a plume is hardly generated to the direction of the substrate unless the foot is irradiated with the part of the laser beam.

Figure 62:
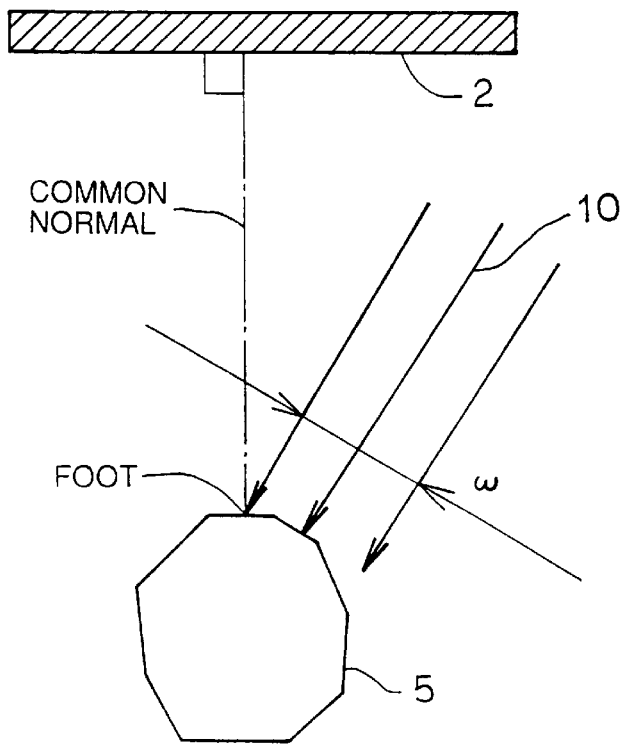
FIG. 62 is a cross sectional view showing a schematic structure of the main portion of the thin film forming apparatus using laser, when a target having polygonal cross sectional shape is used in the thirty-fourth embodiment of the present invention.

The same applies to a target having a polygonal cross section. FIG. 62 shows this state. When the target is polygonal, it is at first placed so that there is a common normal, and then it is set such that the foot of this normal is irradiated by a part of the laser beam, whereby a plume can be generated to the direction of the substrate.

Figure 63:
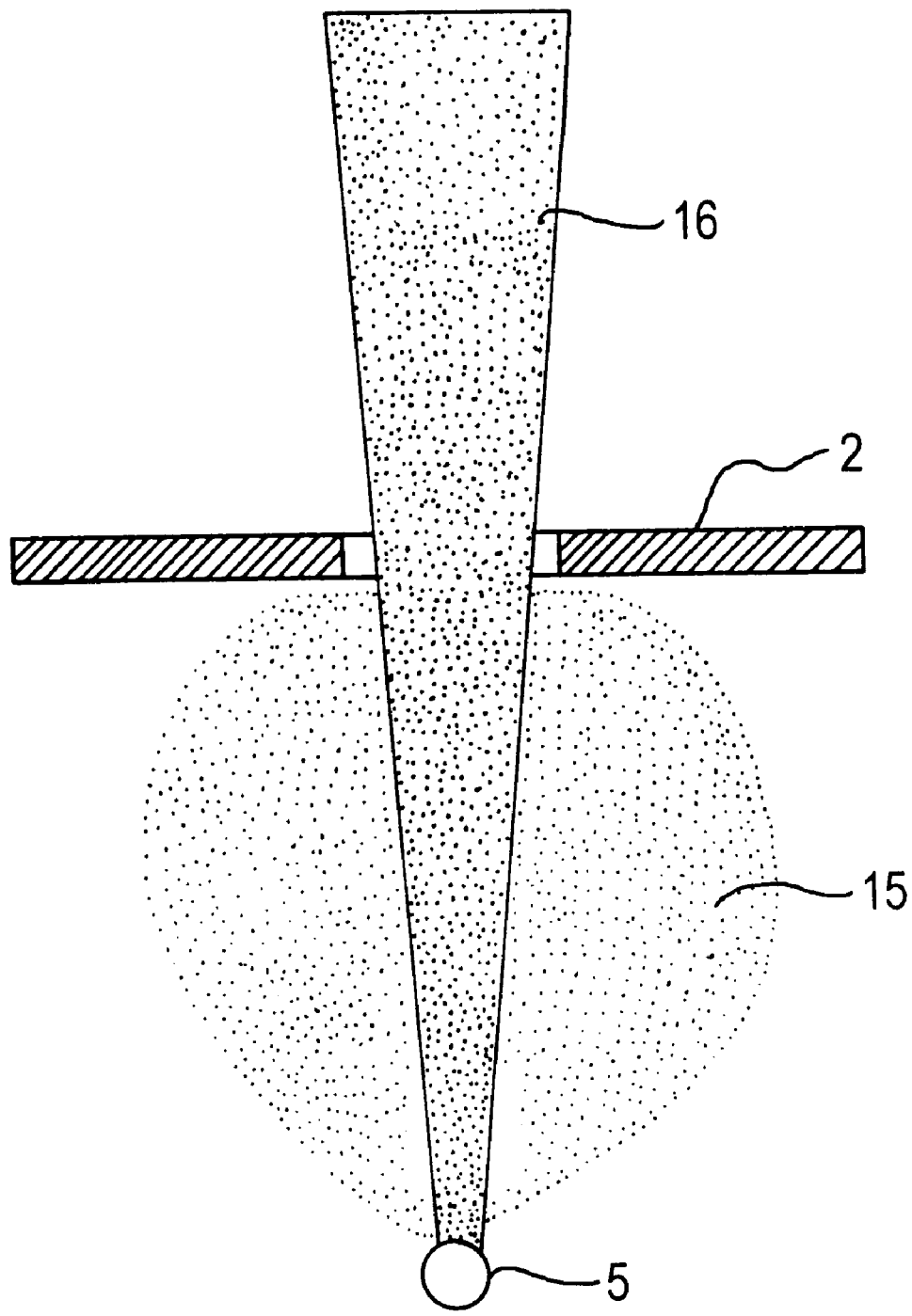
FIG. 63 is a cross sectional view showing the state when a laser beam is emitted in the direction of the normal of the target surface, in the thirty-fourth embodiment of the present invention.

FIG. 63 shows an example in which the incident angle $\theta_0$ of the beam is set to 0. It is described above that the incident angle should be made smaller. However, if it is made too small, substrate 2 and laser beam 16 interfere with each other. In order to prevent the interference, the target and the substrate 2 may be placed apart. However, depending on the target material, the plume is small and in such a case, the distance cannot be increased.

Figure 64:
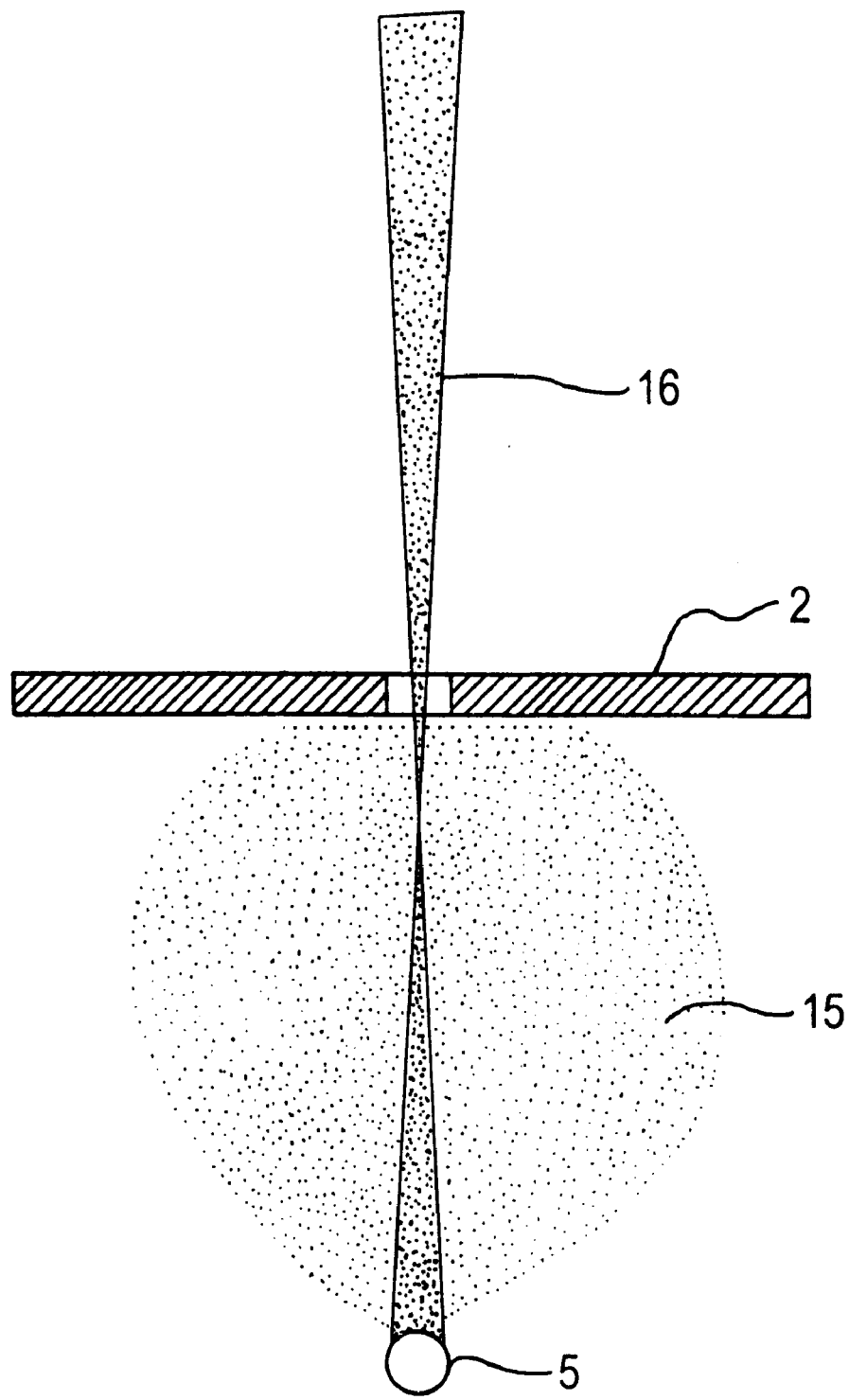
FIG. 64 is a cross sectional view showing the state when the laser beam is directed such that the point of focus of the beam is positioned near an opening of the substrate, in the thirty-fourth embodiment of the present invention.

Therefore, there is provided an aperture in substrate 2, so that laser beam 16 passes through the opening. FIG. 64 shows an example in which laser beam 16 is focused near the aperture, so that the diameter of the opening can be reduced. An aperture or a notch may be provided at an end of the substrate through which the beam passes. In either case, though the shape of the substrate is somewhat limited, a thin film can be formed uniformly over a wide area.

Figure 65:
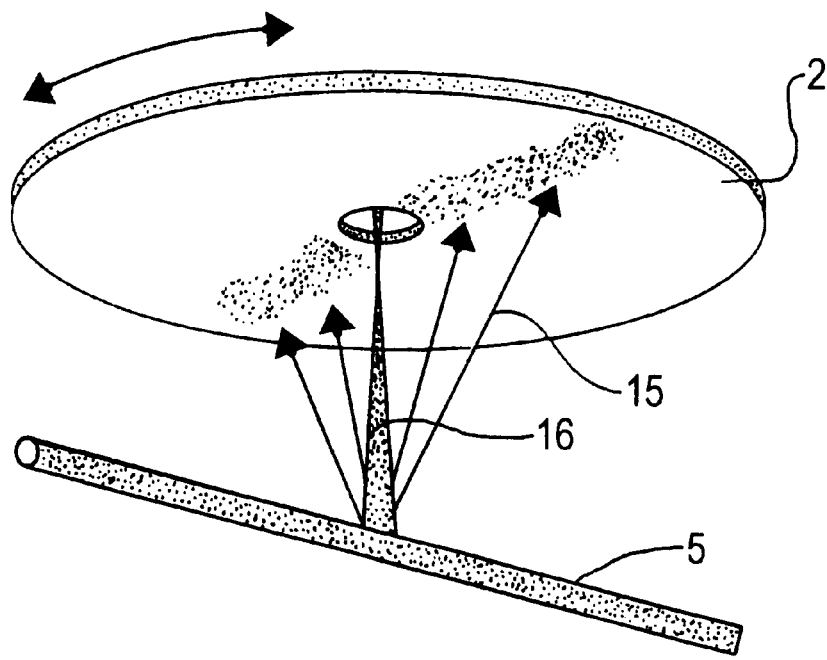
FIG. 65 is a perspective view showing the state when the laser beam is directed to a columnar target through an opening provided at the center of a dish shaped target, in the thirty-fourth embodiment of the present invention.

FIG. 65 shows the state of a columnar target irradiated with the beam. Plumes are generated in the form of a fan along the normals of the column. Therefore, a thin film is formed in the region shown by the dots in the figure. In order to form the thin film uniformly over the substrate, it is necessary to rotate the substrate or the target. Uniformity of the thin film is expected even when a spherical target is used, if its rotated.

Figure 66:
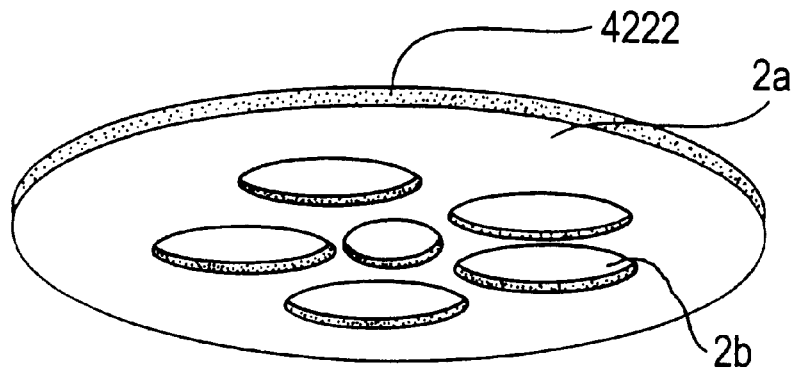
FIG. 66 is a perspective view showing a plurality of substrates fixed on the lower surface of a dish shaped substrate holder having an opening at the center, which can be used in the thirty-fourth embodiment of the present invention.

FIG. 66 shows an example in which substrates 2a and 2b are fixed on a holder 4222 having an aperture. Since a number of substrates are arranged, thin films can be formed efficiently.

Figure 67:
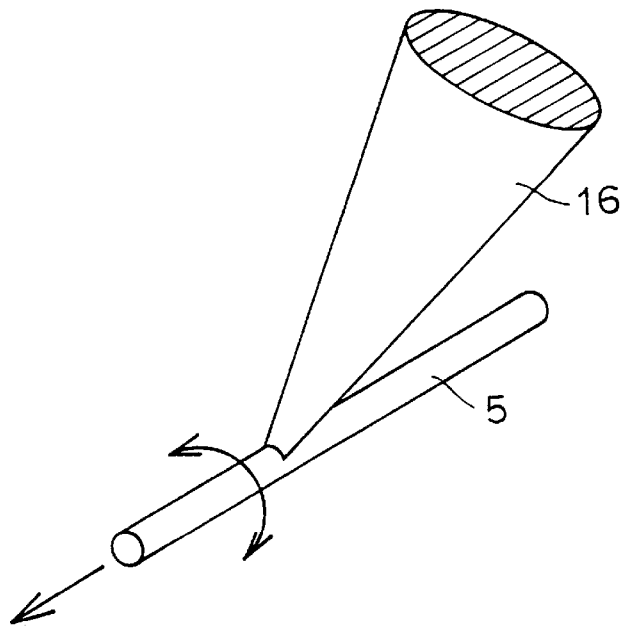
FIG. 67 is a perspective view showing an example of parallel movement of the target while rotating the same, in order to prevent reduction in extension angle of the plume caused by wear of the target, in the thirty-fourth embodiment of the present invention.

FIG. 67 shows an example in which the target is rotated while it is moved in parallel, in order to prevent reduction in the angle of extension of the plume caused by the wear of the target. The angle of extension of the plume can be kept constant by constantly renewing the surface of the target which is irradiated with a laser beam 16 by such an operation. The parallel movement can be carried out in the similar manner even when the target is a flat plate or a sheet.

A thirty-fifth embodiment of the present invention will be described with reference to FIG. 68. In the figure, the same reference characters as in FIG. 148 denote the same or corresponding portions.

Figure 68:
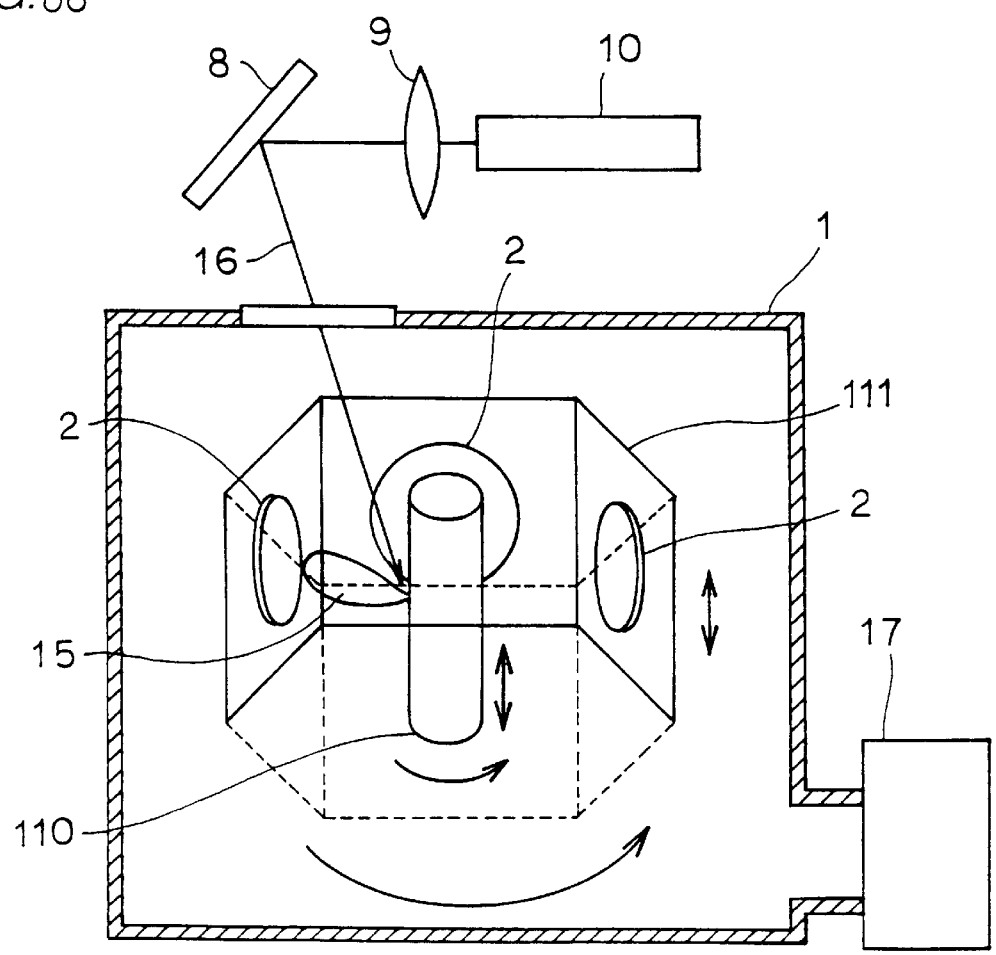
FIG. 68 is a cross sectional view showing a schematic structure of the thin film forming apparatus using laser in accordance with the thirty-fifth embodiment of the present invention.

In this embodiment, referring to FIG. 68, a substrate holder 111 which is a polygonal cylinder is placed around a raw material target 110 which has a cylindrical shape. At least two substrates 2 are placed on the inner side of the substrate holder 111, that is, the side opposing to the raw material target 110. Laser beam 16 emitted from laser unit 10 is condensed by a condenser lens 9, reflected by a mirror 8, passed through inlet window 7 and directed to raw material target 110. At a portion of raw material target 110 which is irradiated with the laser, a plasma is generated abruptly, forming a plume 15. At this time, raw material target 110 rotates and is moved parallel in the direction of the axis of rotation. Accordingly, raw material target 110 can be thoroughly irradiated with a laser beam 16. This prevents uneven wear of the raw material target 110. At the same time, substrate holder 111 is rotated and moved parallel to the direction of the axis of rotation. Consequently, the plume 15 generated from that portion of raw material target 110 which is irradiated with laser beam 16 sweeps the substrate 2 entirely. Consequently, distribution of thin film on substrate 2 can be improved, enabling formation of a thin film over a wide area. Since two or more substrate 2 are placed on substrate holder 111, throughput in thin film formation can be improved.

Figure 69:
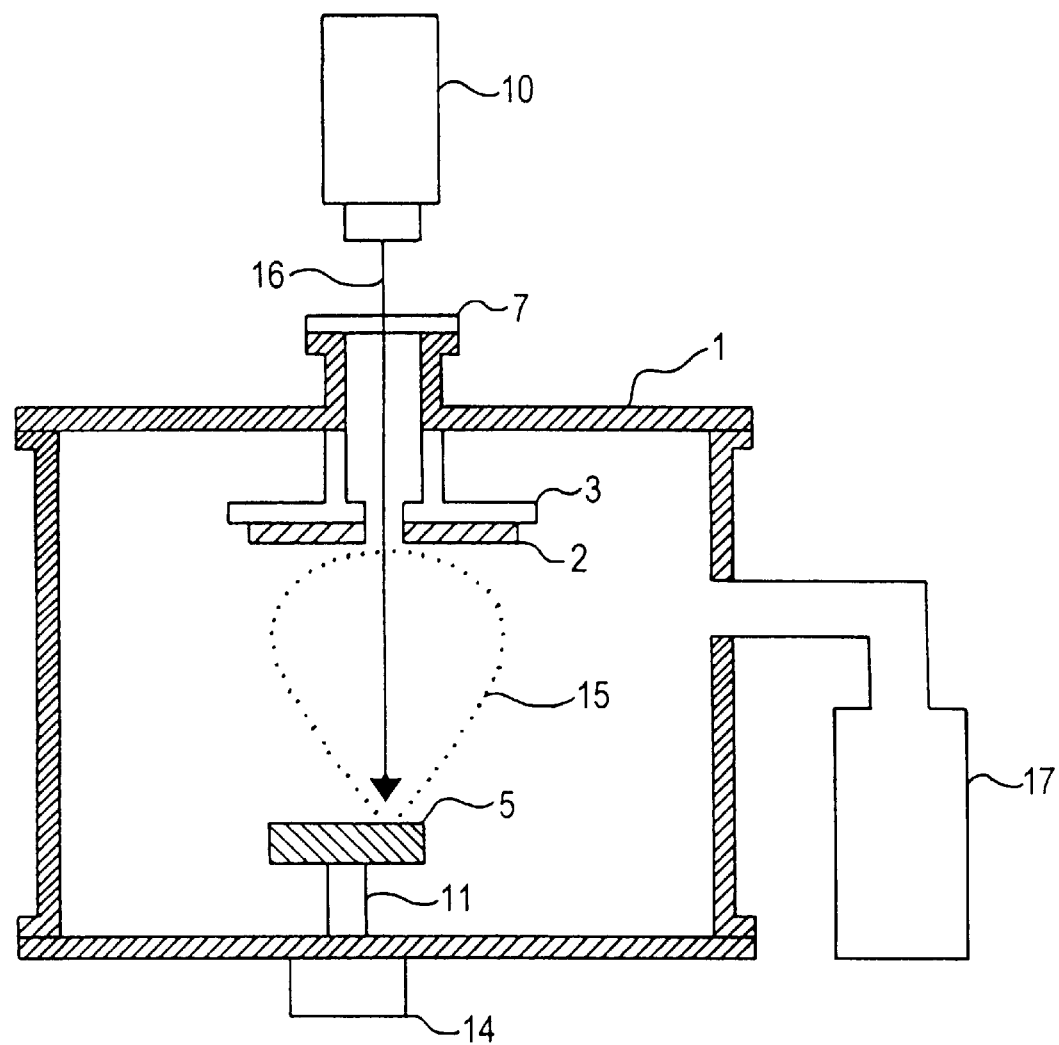
FIG. 69 is a cross sectional view showing a schematic structure of the thin film forming apparatus using laser in accordance with the thirty-sixth embodiment of the present invention.

A thirty-sixth embodiment of the present invention will be described with reference to FIG. 69. FIG. 69 is a schematic diagram showing the structure of the thin film forming apparatus using laser in accordance with one embodiment of the present invention. In the figure, reference characters 1 to 17 denote the same or corresponding portions in FIG. 148 of the prior art.

Referring to FIG. 69, in the present embodiment, laser beam 16 emitted from laser unit 10 passes through laser inlet window 7 of chamber 1, then it is introduced into chamber 1 through the center of substrate holder 3 in chamber 1 to be incident on raw material target 5 placed on turntable 11 in chamber 1.

Consequently, a plume is generated and a thin film is deposited on substrate 2, in the similar manner as in the above described prior art. However, in this embodiment, laser beam 16 is introduced through the center of substrate holder 3. Therefore, laser beam 16 is incident on target 5 vertically. The extension of plume generated from target 5 becomes larger as the incident angle of laser beam incident on the target becomes smaller. Therefore, according to this method, the extension of the plume can be maximized. Consequently, a thin film having large area can be obtained most efficiently. In this embodiment, a thin film can be formed over the area of 20 mm×20 mm (with the variation of film thickness distribution being ±10%) without effecting XY driving of the substrate. Thus, it is proved that by this method, a thin film having larger area than in the prior art can be formed.

Figure 70:
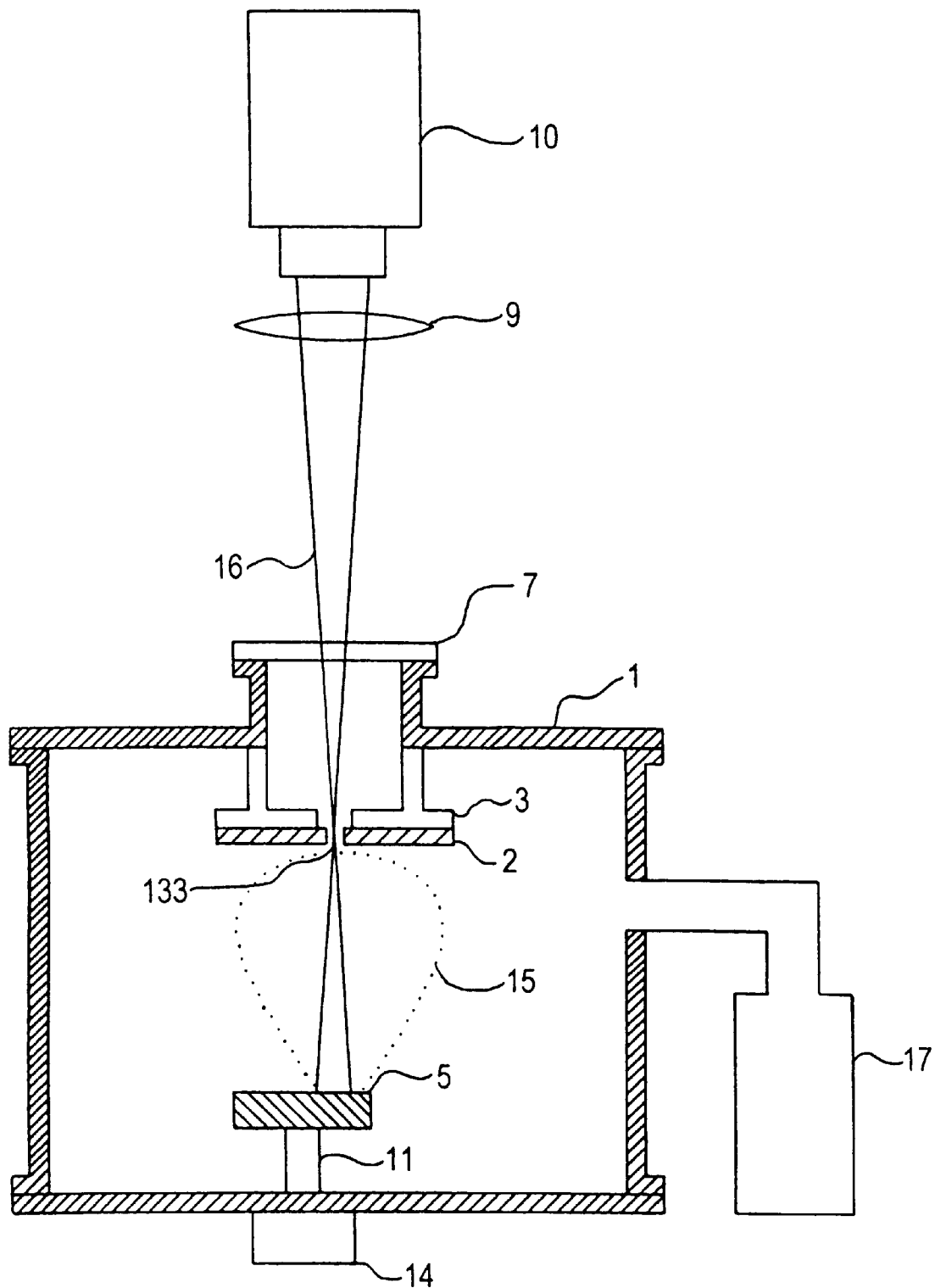
FIG. 70 is a cross sectional view showing a schematic structure of the thin film forming apparatus using laser in accordance with the thirty-seventh embodiment of the present invention.

A thirty-seventh embodiment of the present invention will be described with reference to FIG. 70. FIG. 70 is a schematic diagram showing the thin film forming apparatus using laser in accordance with one embodiment of the present invention. In the figure, reference characters 1 to 17 denote the same or corresponding components as in the prior art example of FIG. 148.

In this embodiment, referring to FIG. 70, laser beam 16 emitted from laser unit 10 is condensed by condenser lens 9 and passed through laser inlet window 7 of chamber 1 to be incident on raw material target 5 placed on turntable 11 in chamber 1.

Consequently, a plume is generated and a thin film is deposited on the substrate 2, in the similar manner as in the aforementioned prior art example. However, different from the prior art example, in this embodiment, the point of focus 133 of the condensed laser beam 16 is set in front of the surface of target 5. As shown in FIG. 70, when the substrate 2 is placed at this point of focus, the laser beam will be incident on target 5 vertically through substrate 2 and substrate holder 3, and the size of the hole provided in substrate 2 can be minimized. This enables deposition of a thin film over a wide area of substrate 2, realizing thin film formation over a wide area. In this embodiment, a thin film can be formed over the area of 20 mm×20 mm (with variation of film thickness distribution being ±10%) without effecting XY driving of the substrate. Therefore, it is proved that by this method, a thin film can be formed over wider area than in the prior art. Since the energy of the laser beam is concentrated on this point of focus, the introduced gas such as oxygen is activated, and therefore, active substances can be supplied without using high energy particles such as ion beams. Consequently, a thin film of high quality can be formed without using the ion beam.

In the above described embodiment, the beam is directed to target 5 through substrate holder 3 and substrate 2. However, even when the laser beam is emitted from different direction or when the point of focus 133 is not at the position of the substrate, the effect of improving quality of the thin film by activation of the introduced gas can be similarly obtained.

Figure 71:
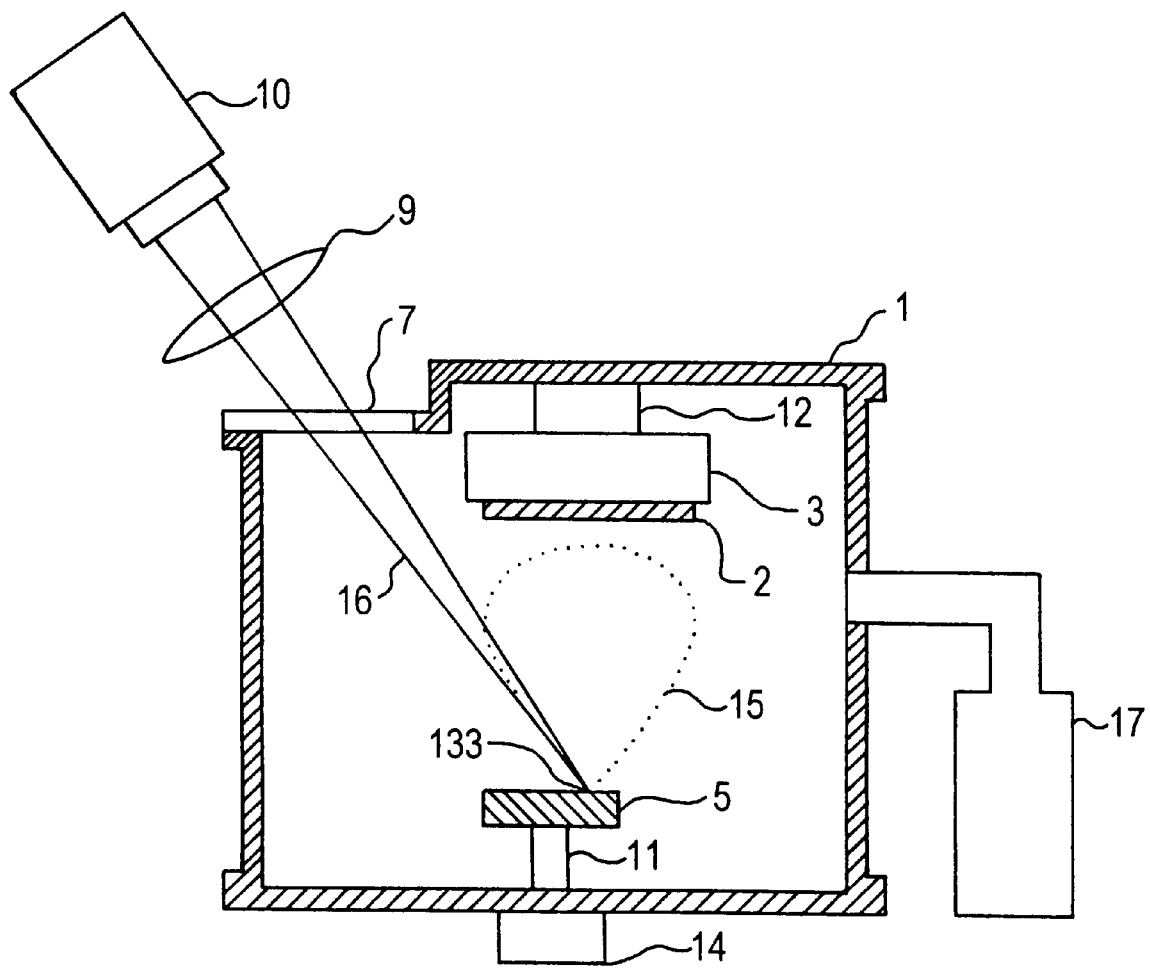
FIG. 71 is a cross sectional view showing a schematic structure of the thin film forming apparatus using laser in accordance with the thirty-eighth embodiment of the present invention.

A thirty-eighth embodiment of the present invention will be described with reference to FIG. 71. FIG. 71 is a schematic diagram showing the thin film forming apparatus using laser in accordance with one embodiment of the present invention. In the figure, reference numerals 1 to 17 denote the same or corresponding components as in the prior art example.

Referring to FIG. 71, in this embodiment, laser beam 16 emitted from laser unit 10 is condensed by condenser lens 9 and passed through laser inlet window 7 of chamber 1 to be incident on raw material target 5 placed on turntable 11 in chamber 1.

Consequently, a plume is generated and a thin film is deposited on substrate 2 in the similar manner as in the above described prior art example. However, different from the prior art example, in this embodiment, the point of focus 133 of the condensed laser beam 16 is placed on the surface of target 5. Then, plume 15 is generated from an extremely small region of target 5 so that energy density gradient on the target surface is large. Consequently, the direction of scattering of the particles included in the plume varies wider. Consequently, as compared in the example in which the point of focus of the laser beam is not on the target surface, the plume comes to have wider extension. Consequently, a thin film can be deposited on wider area of substrate 2, realizing formation of a thin film having large area. In this embodiment, a thin film can be formed over the area of 20 mm×20 mm (with variation of film thickness distribution being ±10%) without effecting XY driving of the substrate. Thus, it is proved that by this method, a thin film having larger area than the prior art can be formed.

Figure 72:
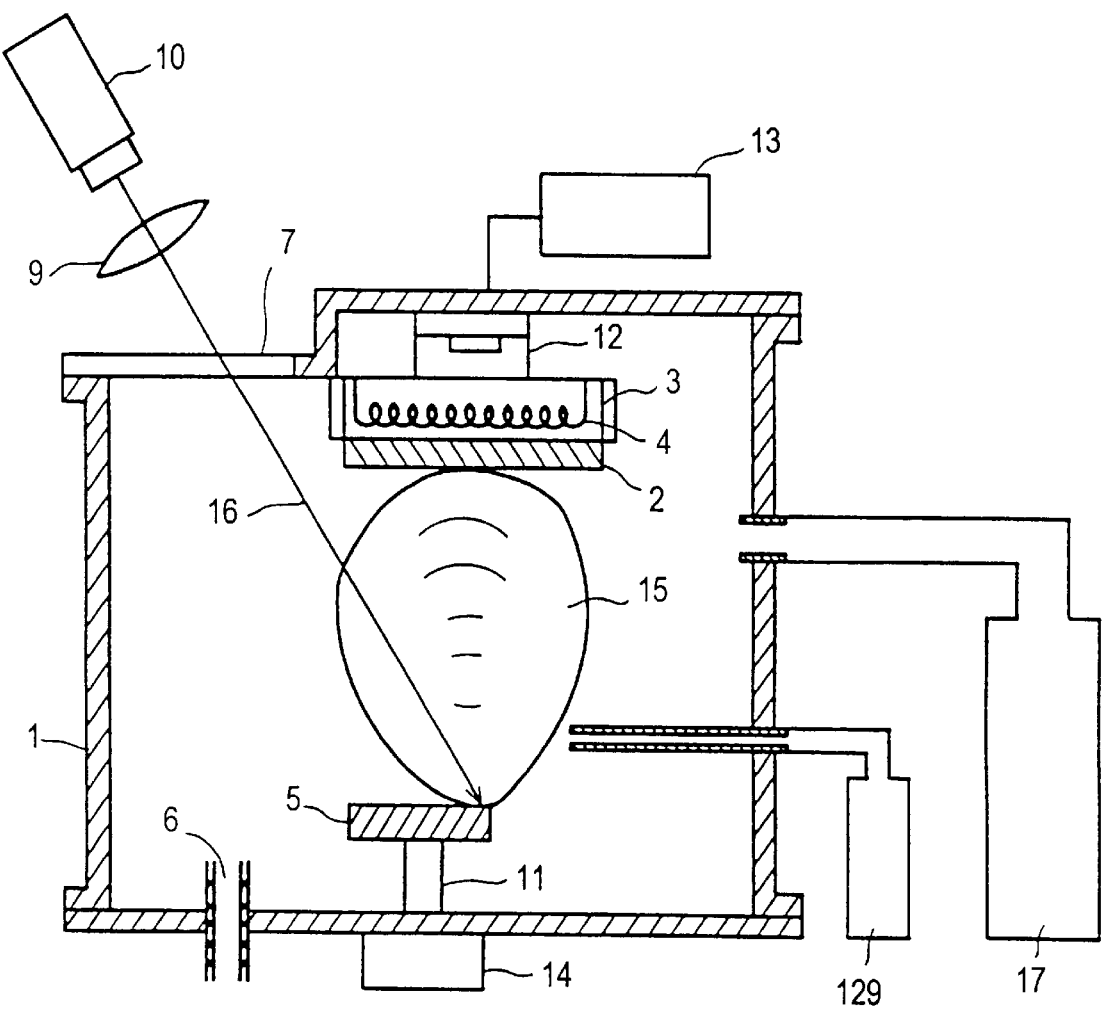
FIG. 72 is a cross sectional view showing a schematic structure of the thin film forming apparatus using laser in accordance with the thirty-ninth embodiment of the present invention.

A thirty-ninth embodiment of the present invention will be described with reference to FIG. 72. In this embodiment, referring to FIG. 72, not only an evacuating apparatus 17 but also an evacuating apparatus 179 for differential evacuation provided near target 5 are operated, and therefore the degree of vacuum is made uniform over wider area near the target 5. Therefore, when the target 5 is irradiated with laser beam 16, the scope of generation of the plume 15 can be enlarged. Since a thin film is formed on substrate 2 which is in contact with plume 15, a uniform thin film can be formed over wider area as the scope of generation of plume 15 becomes larger.

Figure 73:
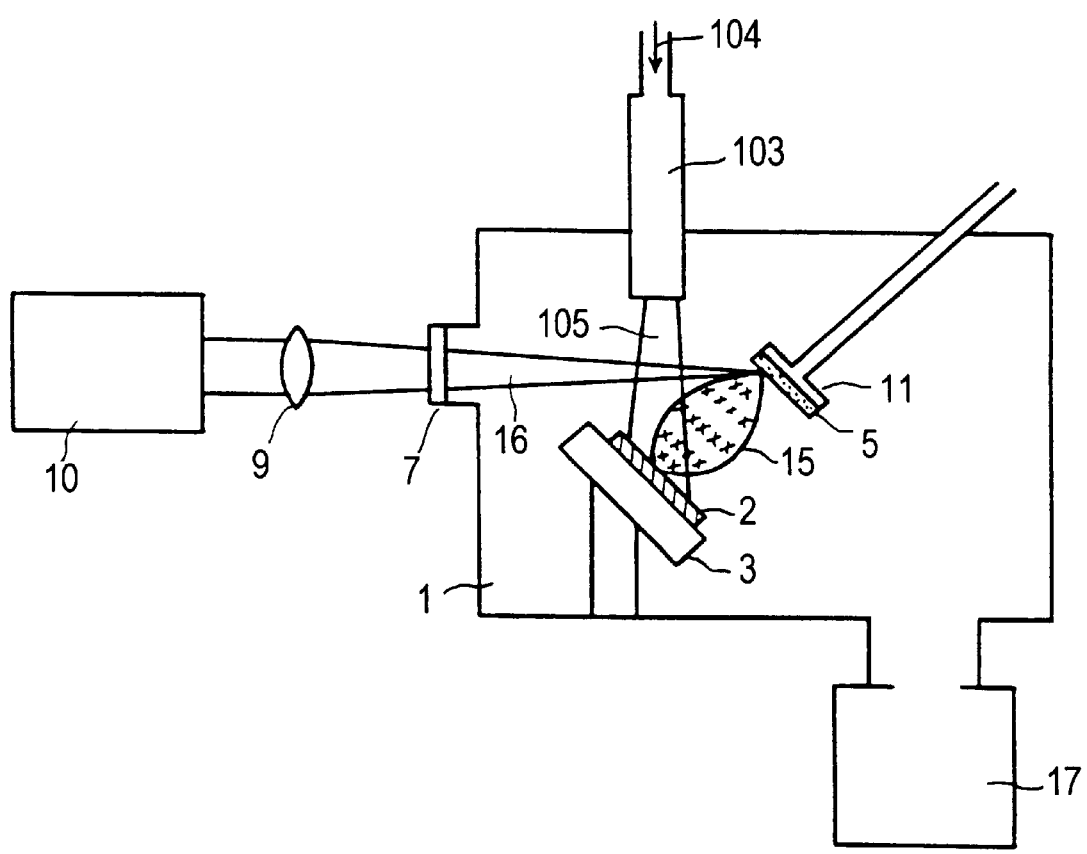
FIG. 73 is cross sectional view showing a schematic structure of the thin film forming apparatus using laser in accordance with the fortieth embodiment of the present invention.

A fortieth embodiment of the present invention will be described with reference to FIG. 73. In this embodiment, referring to FIG. 73, laser beam 16 emitted from laser unit 10 is condensed by condenser lens 9, and passed through laser inlet window 7 of chamber 1 to be incident on raw material target 5 placed on turntable 11 of chamber 1. Substrate 2 is placed fixed on substrate holder 3, opposing to raw material target 5. Excited atoms and ions of plume 15 reach the substrate 2. Meanwhile, hydrogen atoms are supplied from hydrogen ion source and hydrogen radical source 103 to the substrate, so that they are deposited on the surface of growth. Further, kinetic energy of hydrogen is applied to the atoms and molecules on the surface of growth. Consequently, surface migration of these growing particles is promoted. Therefore, a thin film is deposited and formed with superior property of crystals with less point defects and lattice defects even at a relatively low temperature.

Figure 74:
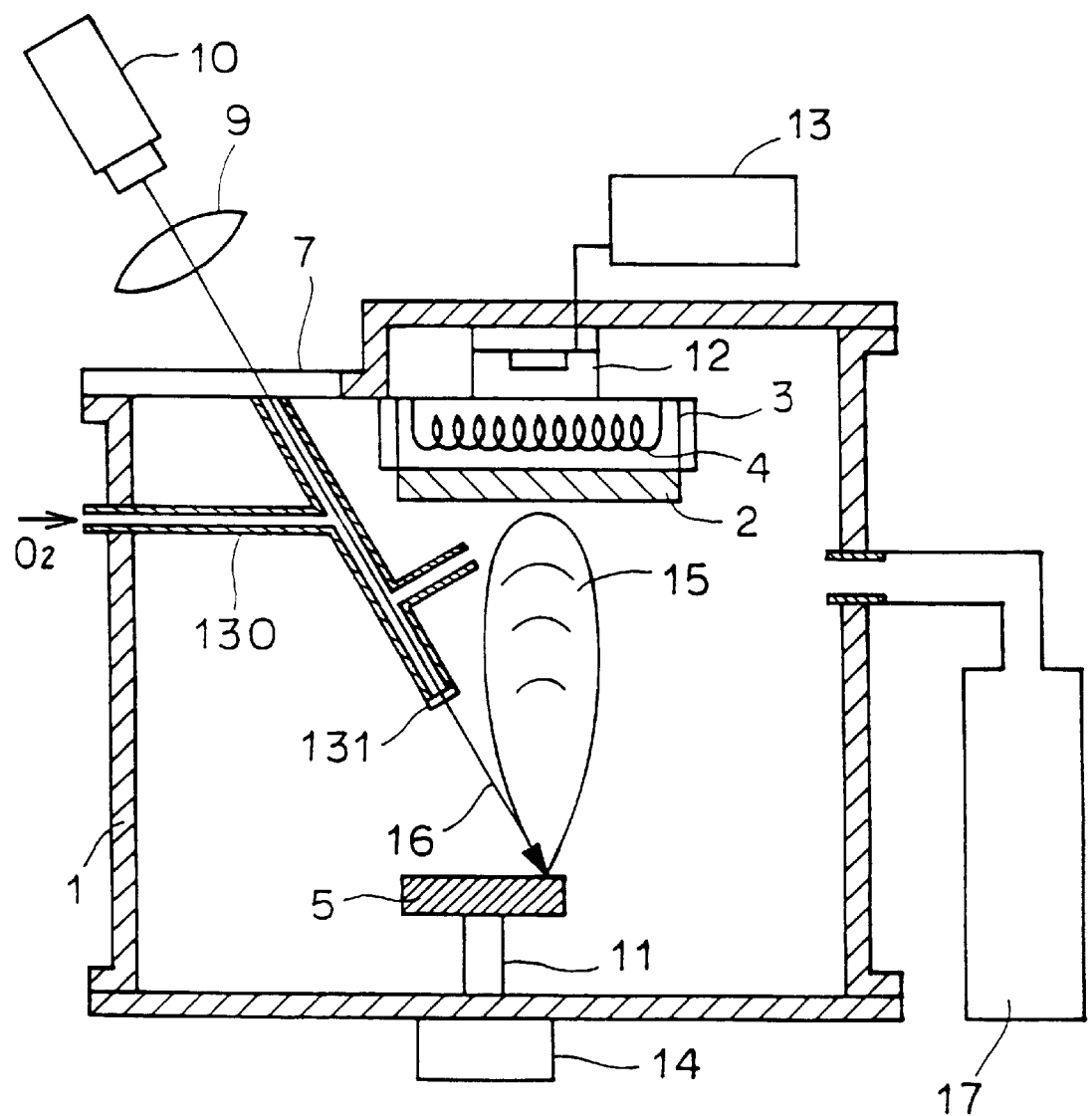
FIG. 74 is a cross sectional view showing a schematic structure of the thin film forming apparatus in accordance with the forty-first embodiment of the present invention.

A forty-first embodiment of the present invention will be described with reference to FIG. 74. In FIG. 74, laser beam 16 is transmitted to a portion of a conduit of a gas supply nozzle 130 and passed through a window 131 to be incident on target 5. Meanwhile, gas is supplied through gas supply nozzle 130 to be blown over substrate 2.

Operation will be described. The gas in gas supply nozzle 130 is activated by laser beam 16 and blown over substrate 2. Therefore, activated gas can be supplied to the vicinity of substrate 2 without acceleration by voltage. Accordingly, a thin film having high quality can be formed without damaging the substrate 2.

Figure 75:
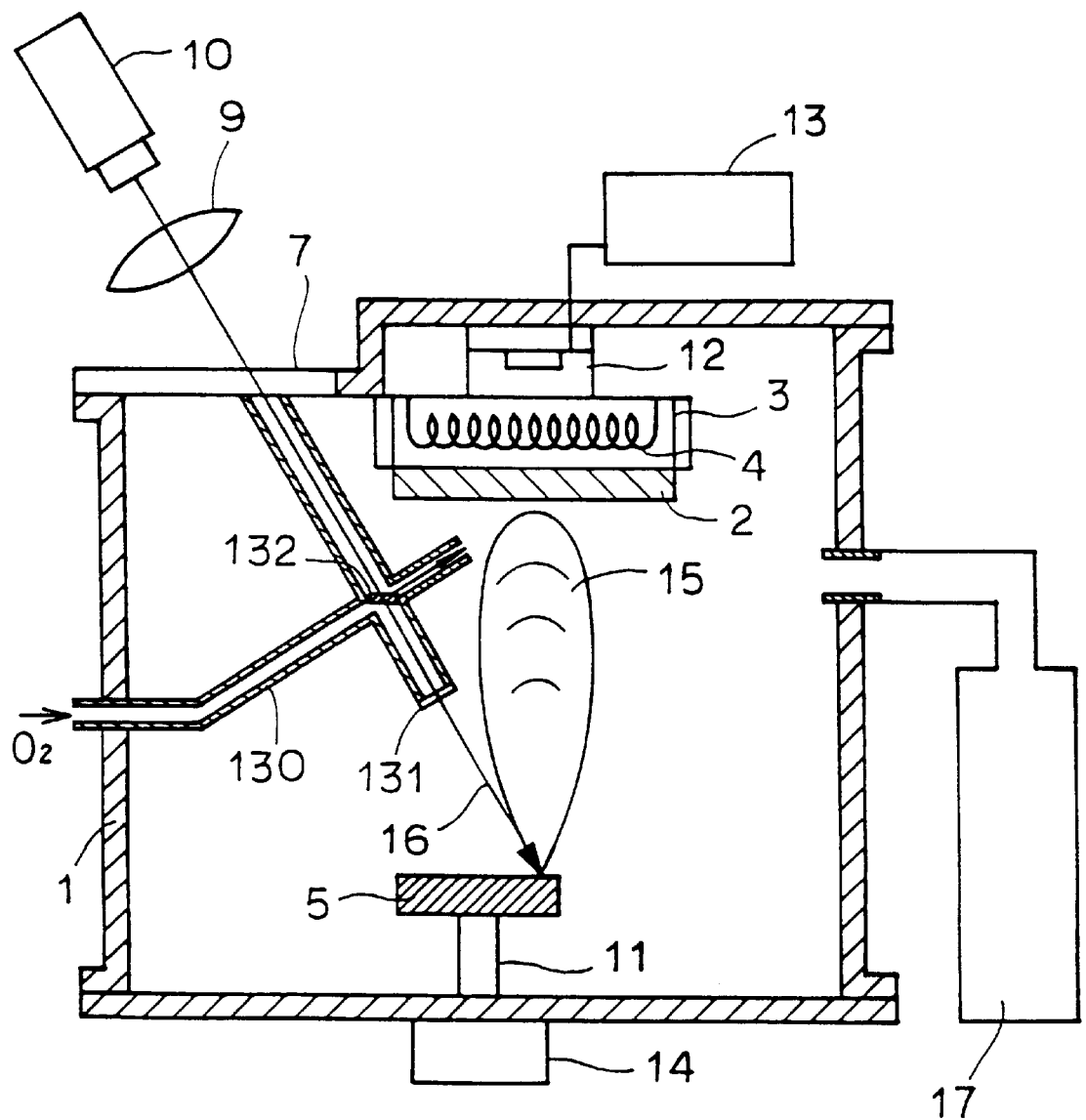
FIG. 75 is a cross sectional view showing a schematic structure of the thin film forming apparatus using laser in accordance with the forty-second embodiment of the present invention.

A forty-second embodiment of the present invention will be described with reference to FIG. 75. Referring to FIG. 75, a half mirror 132 is provided in gas supply nozzle 130. Most part of laser beam 16 is passed through half mirror 132 and through window 131 to be incident on target 5. Gas supply nozzle 130 is adapted such that a part of the laser beam 16 is reflected by half mirror 132.

The operation will be described. Laser beam 16 transmitted through half mirror 132 sputters the target 5, while laser beam 16 reflected from half mirror 132 activates the gas in gas supply nozzle 130. Since the gas activated by laser beam 16 blows over substrate 2 through gas supply nozzle 130, a thin film having high quality can be formed without damaging substrate 2.

Figure 76:
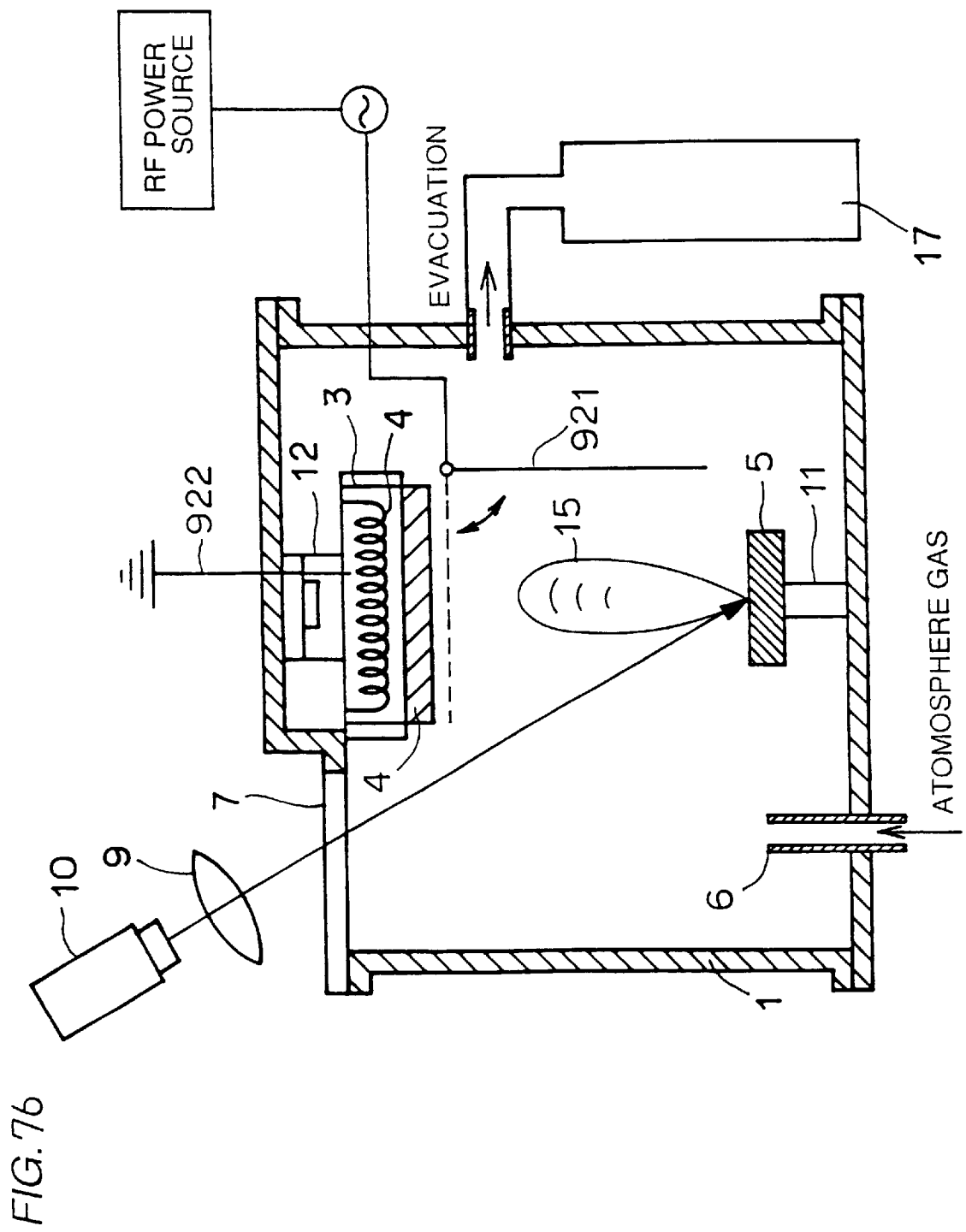
FIG. 76 is a cross sectional view showing a schematic structure of the thin film forming apparatus using laser in accordance with the forty-third embodiment of the present invention.

A forty-third embodiment of the present invention will be described with reference to FIG. 76. The apparatus of the present embodiment includes, referring to FIG. 76, a rotary mesh electrode 921 which can be placed parallel to the substrate, and a ground line 922 for grounding the substrate and the substrate holder.

The operation will be described. Before starting film formation, rotary mesh electrode 921 is rotated to be horizontally placed over a substrate which is grounded, and power is input from an RF power supply so as to generate plasma between the mesh and the substrate. By maintaining plasma for several minutes, the substrate is cleaned. Then, the power is stopped and the mesh electrode is rotated downward to be away from the substrate. Thereafter, the target is irradiated with laser to form a film on the cleaned substrate.

According to this embodiment, in an apparatus for forming, by irradiating a target with laser, a film on an opposing substrate, the substrate is cleaned by discharge before film formation. Therefore, a thin film forming apparatus using laser by which a thin film having superior film characteristics than in the prior art can be formed, is obtained.

A forty-fourth embodiment of the present invention will be described. In this embodiment, music is played instead of a chime or buzzer at the start or end of a process. The music may be a short phrase or a tune. The music may end after a while, or it may be continued. By providing an adjusting element for changing the sound volume, volume appropriate for each environment can be selected. Not only music but also message provided by synthetic voice may be given.

The music may be changed from process to process, and the message given by synthetic voice may be changed according to the process. For example, different tunes may be used when loading/unloading of a sample is completed or when the film formation is completed. When messages are used, clear and definite message may be used at important processes, and soft and short message may be given for other processes not so important so that the message would not be noisy.

Since one have his or her own favorite music, not the one specific music but several tunes or melodies may be selected as desired. The messages may also be selected similarly. For example, male or female voice, high or low tone, soft manner of speaking or strict manner of speaking may be selected.

A forty-fifth embodiment of the present invention will be described with reference to FIG. 77. The apparatus of this embodiment includes, referring to FIG. 77, a mirror moving apparatus 220, an XYθ stage 221 for moving the target, a sample moving apparatus 221, a DC sputtering apparatus 223, an RF sputtering apparatus 224, an RF reverse sputtering apparatus 225, a shutter 226, a movement controlling apparatus 227 and an ion beam sputtering apparatus 228.

The operation will be described. By setting the distance between target 5 and substrate 2 wider than the diameter of target 5, plume 15 comes to be extended more easily, so that the film can be made uniform over wider area. If this distance is shorter than the diameter of the target, the space in which the plume is generated becomes elongate in FIG. 120, and therefore the plume hardly extends. However, if the distance is longer than the diameter of the target, the space in which the plume is generated will be wide in the lateral direction in FIG. 220. Therefore, the plume expands easily, so that the film can be easily made uniformed over wider area.

Figure 77:
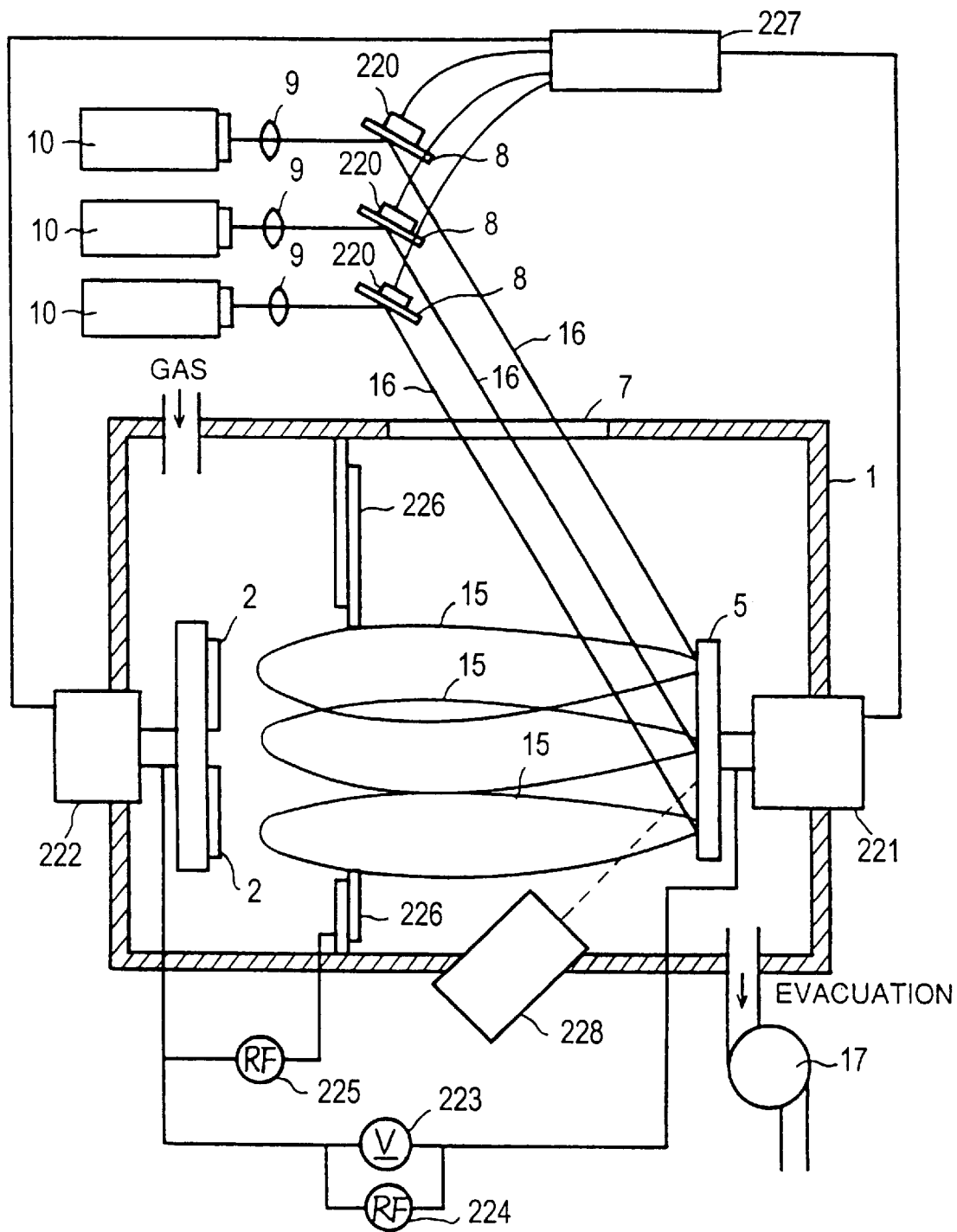
FIG. 77 is a cross sectional view showing a schematic structure of the thin film forming apparatus using laser in accordance with the forty-fifth embodiment of the present invention.

In FIG. 77, a plurality of lasers are used to increase the number of plumes generated at one time. This facilitates uniform film formation over wider area. Since the rate of film formation is increased as the number of lasers is increased, the throughput is improved.

In the structure of FIG. 77, the mirror, the target and the sample can be moved. By moving these, film can be formed uniformly. Such movement is controlled by movement control apparatus 227 which allows movement at random, simple rotation as well as rotation and revolution.

In the structure of FIG. 77, DC or RF can be applied so as to assist the laser or as the pre-processing of the substrate and the target. When RF is applied to the substrate with the shutter 226 closed, the substrate can be cleaned, and the surface of the target can be cleaned. By such operation, a highly pure thin film can be formed. When DC or RF is applied so as to assist the laser, or by utilizing ion beam sputtering as well, the rate of film formation can be improved, and the film can be made uniform over wider area.

Figure 78:
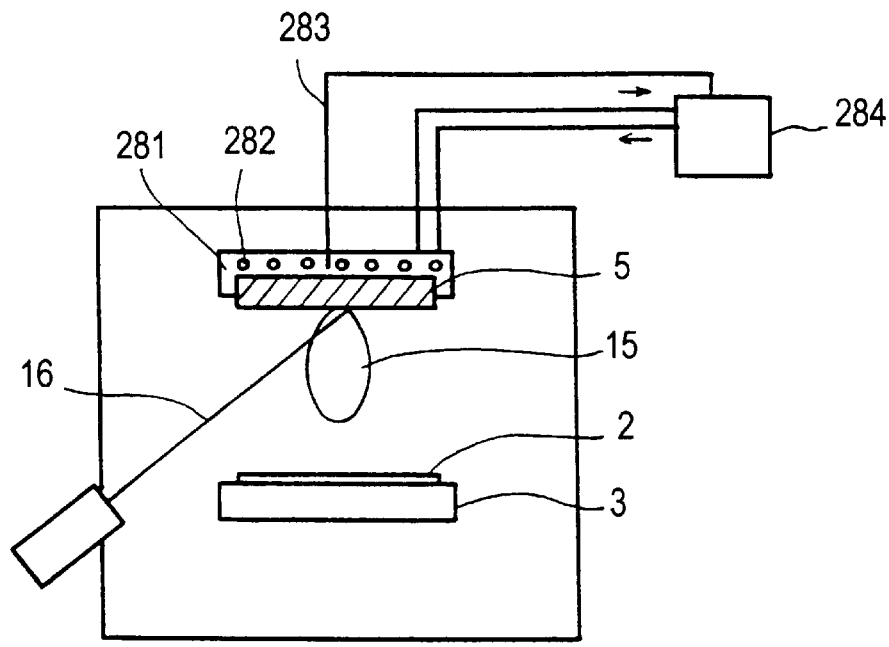
FIG. 78 is a cross sectional view showing a schematic structure of the thin film forming apparatus using laser in accordance with the forty-sixth embodiment of the present invention.
Figure 79:
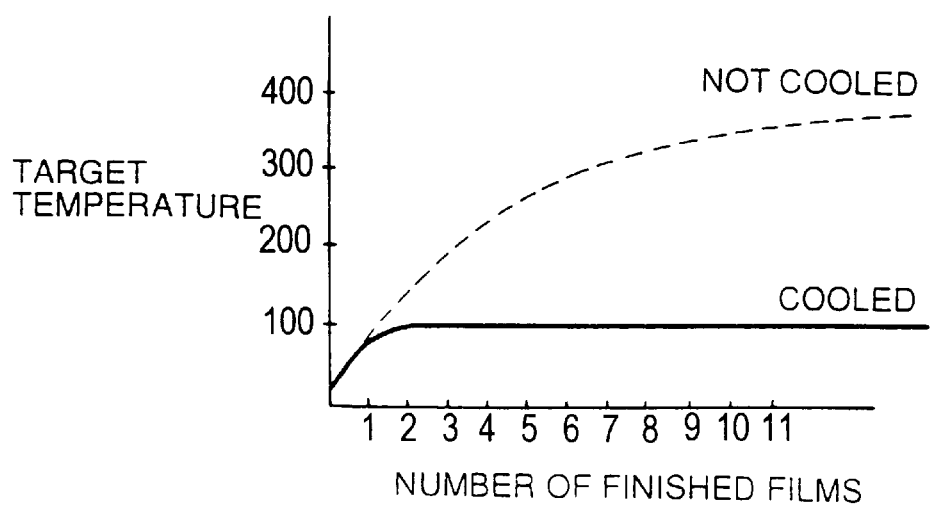
FIG. 79 is a graph showing relation between the number of films formed and the temperature of the targets, when the apparatus includes means for cooling the target and when it does not include such means, in the forty-sixth embodiment of the present invention.

A forty-sixth embodiment of this invention will be described with reference to FIGS. 78 and 79. The apparatus of this embodiment includes, referring to FIG. 78, a target holder 281 having a path 282 of cooling water, a thermocouple 283 for monitoring the temperature of the holder, and a chiller 284 for controlling the flow rate and the temperature of the cooling water. In the figure, the same reference characters as in FIG. 188 denote the same or corresponding portions.

The operation will be described. When a film is formed on an opposing substrate 2 by irradiating target 5 with laser beam 16, part of the optical energy of 16 laser incident on target 5 turns to heat. As the film formation is continued, the temperature of target 5 increases gradually as shown in FIG. 79. However, at this time, target holder 281 is maintained at a constant temperature, as cooling water, which has its temperature controlled by chiller 284, flows through cooling water path 282. Consequently, target 5 is cooled by target holder 281, and the increase of temperature stops after a prescribed period as shown in FIG. 79 and it can be kept at a constant state from relatively earlier period.

As described above, by this embodiment, time change of the temperature of the target can be suppressed, and therefore thin film forming apparatus using laser enabling continuous film formation at an optimal target temperature can be provided.

Figure 80:
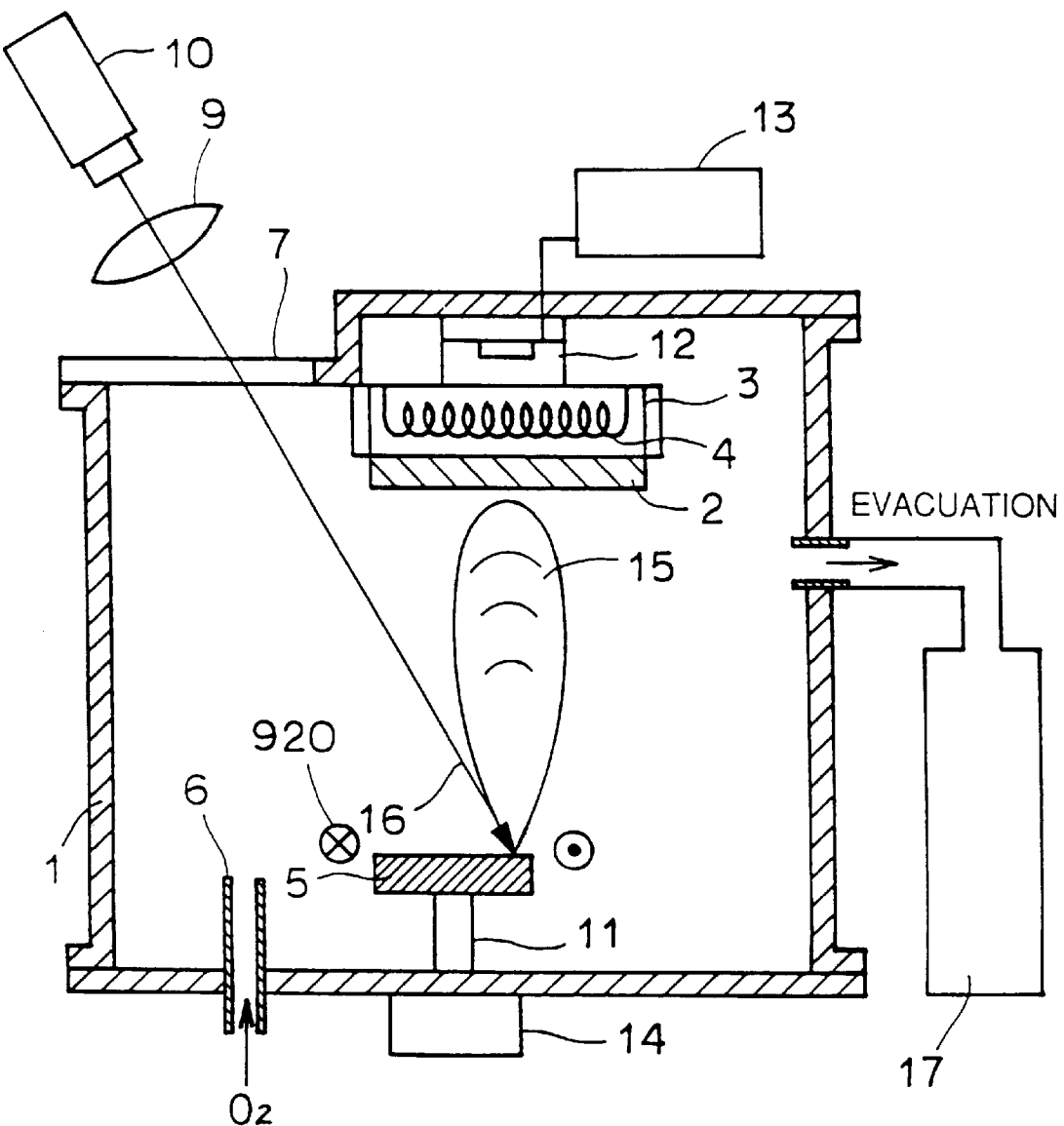
FIG. 80 is a cross sectional view showing a schematic structure of the thin film forming apparatus using laser in accordance with the forty-seventh embodiment of the present invention.

A forty-seventh embodiment of the present invention will be described with reference to FIG. 80. FIG. 80 is a schematic diagram showing the laser thin film forming apparatus in accordance with this embodiment. In this embodiment, referring to FIG. 82, in the vicinity of raw material target 5, a high frequency induction coil 920 for generating high frequency induction electric-magnetic field is provided. The point of focus of condenser lens 9 is set at a position shallower than in the conventional apparatus, and the diameter of the laser beam 16 formed on target 5 is ten times that of the prior art.

The function of the thin forming apparatus using laser will be described. The target used in this embodiment is a copper target 5 having the purity of 99.9%. First, substrate 2 is held by substrate holder 3, the chamber 1 is evacuated to vacuum ($1\times10^{-4}$ Torr), and then high frequency current of 10 MHz is applied for 0.5 sec to high frequency induction coil 920. And then laser beam is emitted. (Though frequency of 10 MHz is used here, frequency higher than 1 MHz is preferred since efficiency in heating is higher). Here, simultaneously with the laser beam irradiation, plume 15 is generated on target 5. After the laser beam is kept emitted for 30 seconds, the laser beam and the high frequency current are stopped and substrate 2 is taken out from the chamber 1 after substrate 2 is cooled sufficiently. A copper thin film formed on the surface of substrate 2 is observed.

In the above embodiment, when laser beam irradiation is carried out without conducting high frequency induction coil 920, plume 15 is not generated on target 5. A copper thin film is not formed on the surface of substrate 2 at this time.

In the above described embodiment, when laser beam is not emitted and high frequency induction coil 920 is kept conductive for 30.5 seconds, plume 15 is not generated on target 5. At this time, thin film of copper is not formed on the surface of substrate 2.

By using a conventional thin film forming apparatus using laser, laser beam irradiation is kept for 30 seconds, then laser beam is stopped and substrate 2 is taken out from chamber 1 after it is pulled. When observed, there is formed a copper thin film on the surface of substrate 2. However, the diameter of copper thin film formed is 1/15 that of the film formed in the above described embodiment.

As described above, according to this embodiment, since high frequency induction coil 920 for generating high frequency induction electric-magnetic field is provided near raw material target 5, some energy can be applied to the surface of raw material target 5. Therefore, plasma can be easily formed on raw material target 5 even with an energy density lower than the energy density of the laser beam used in the conventional thin film forming apparatus using laser. As a result, laser beam having large area can be directed to the surface of raw material target 5, and a thin film having large area can be easily formed.

Figure 81:
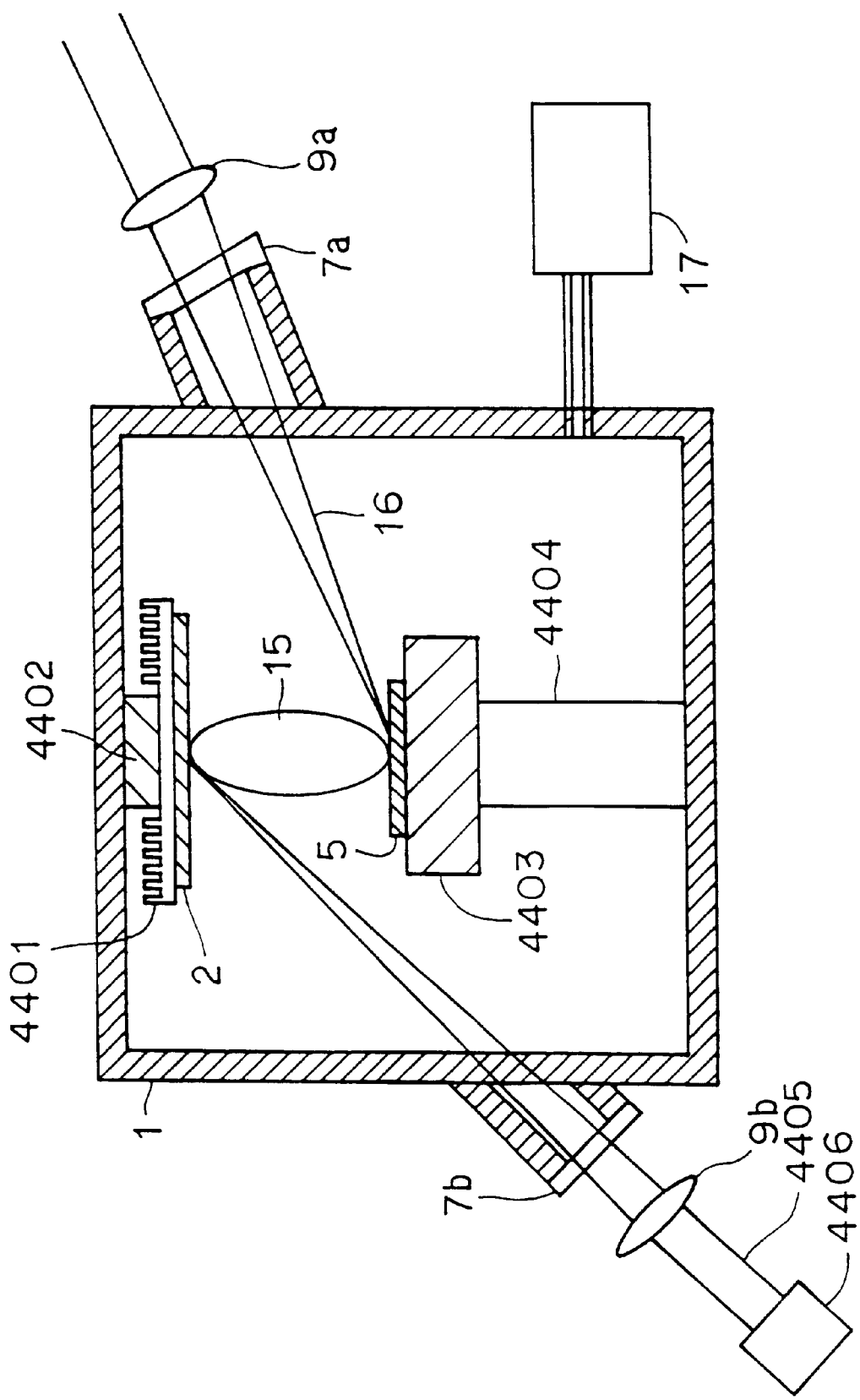
FIG. 81 is a cross sectional view showing a schematic structure of the thin film forming apparatus using laser in accordance with the forty-eighth embodiment of the present invention.

A forty-eighth embodiment of the present invention will be described with reference to FIG. 81. Referring to FIG. 81, the apparatus of the present embodiment includes a cooling fin 4401 as a mechanism for cooling substrate 2, a substrate support portion 4402 for supporting substrate 2 as well as cooling fin 4401, a target base 4403 on which target 5 is placed, a target support 4404 for supporting target 5 as well as target 4403, infrared laser beam or far infrared laser beam 4405 for heating substrate 2, lens 9b for condensing infrared laser beam or far infrared laser beam 4405, and infrared laser beam or far infrared laser beam 4406.

The operation is as follows. As described above, laser beam emitted from laser unit 10 is condensed by condenser lens 9 and passed through laser inlet window 7 of chamber 1 to be incident on raw material target 5 placed in chamber 1. At the portion of raw material target 5 which is irradiated with laser, plasma is generated abruptly, and in the process of cooling the plasma for several ten ns, isolated excited atoms and ions are generated. These excited atoms and ions have lives of at least several microseconds, and they are emitted to the space to form a plume 15 which is like a flame of a candle. A substrate 2 is placed fixed on substrate holder 3 opposing to raw material target 5. The excited atoms and ions in plume 15 reach the substrate 2 and are deposited thereon, forming a thin film.

In order to form a thin film of superior quality, it is necessary to heat the substrate 2 so as to anneal the film which has been deposited at a low temperature at a temperature higher than the temperature for crystallization, or to form crystallized thin film at the site by holding the substrate itself at a temperature higher than the temperature for crystallization at the time of deposition. In the conventional film forming apparatus, a heater is provided adjacent to the substrate as shown in FIG. 148 for heating the substrate. The substrate 2 as a whole is heated by this heater. Since the conventional apparatus has such a structure, portions not requiring heating of the substrate are also heated, which caused degradation of the substrate or degradation of the function of the thin film.

In this embodiment, as shown in FIG. 81, infrared laser or far infrared laser unit 4406 such as represented by carbon dioxide laser or YAG laser is provided. The infrared laser beam or far infrared laser beam 4405 emitted from the laser unit 4406 is condensed by lens 9b to be incident on substrate 2. Consequently, substrate 2 can be heated locally. By this heat, annealing of the film and formation of crystallized thin film can be carried out. When infrared laser or far infrared laser is used as the laser unit 4406, the heat can be well conducted in the depth direction of the substrate. When only the vicinity of the surface of the substrate 2 is to be heated, ultraviolet laser may be used as the laser unit 4406.

Further, in this embodiment, there is provided a cooling film 4401 as a mechanism for cooling substrate 2, provided adjacent to substrate 2, as shown in FIG. 81. Even if substrate 2 is heated by using condensed infrared laser or far infrared laser, generated heat may possibly reach portions which do not require heating on the substrate dependent on the time of laser beam irradiation or the like, which may cause degradation of substrate or the function of the thin film. In this embodiment, in order to solve this problem, the portion requiring heating of substrate 2 is heated by laser beam 4405, while portions not requiring heating of the substrate 2 are cooled by fin 4401. Consequently, the heat generated can be prevented from reaching portions which do not require heating of the substrate, and hence degradation of substrate or the function of thin film caused by heat can be prevented.

When only a minute pattern on substrate 2 is to be annealed, cooling mechanism 4401 may be provided at a portion other than the minute pattern so as to more effectively prevent the influence of heat. Though a fin is used as cooling mechanism 4401 in this embodiment, a Peltier element or the like may be used to provide the same effect.

A forty-ninth embodiment of the present invention will be described with reference to FIG. 82.

Figure 82:
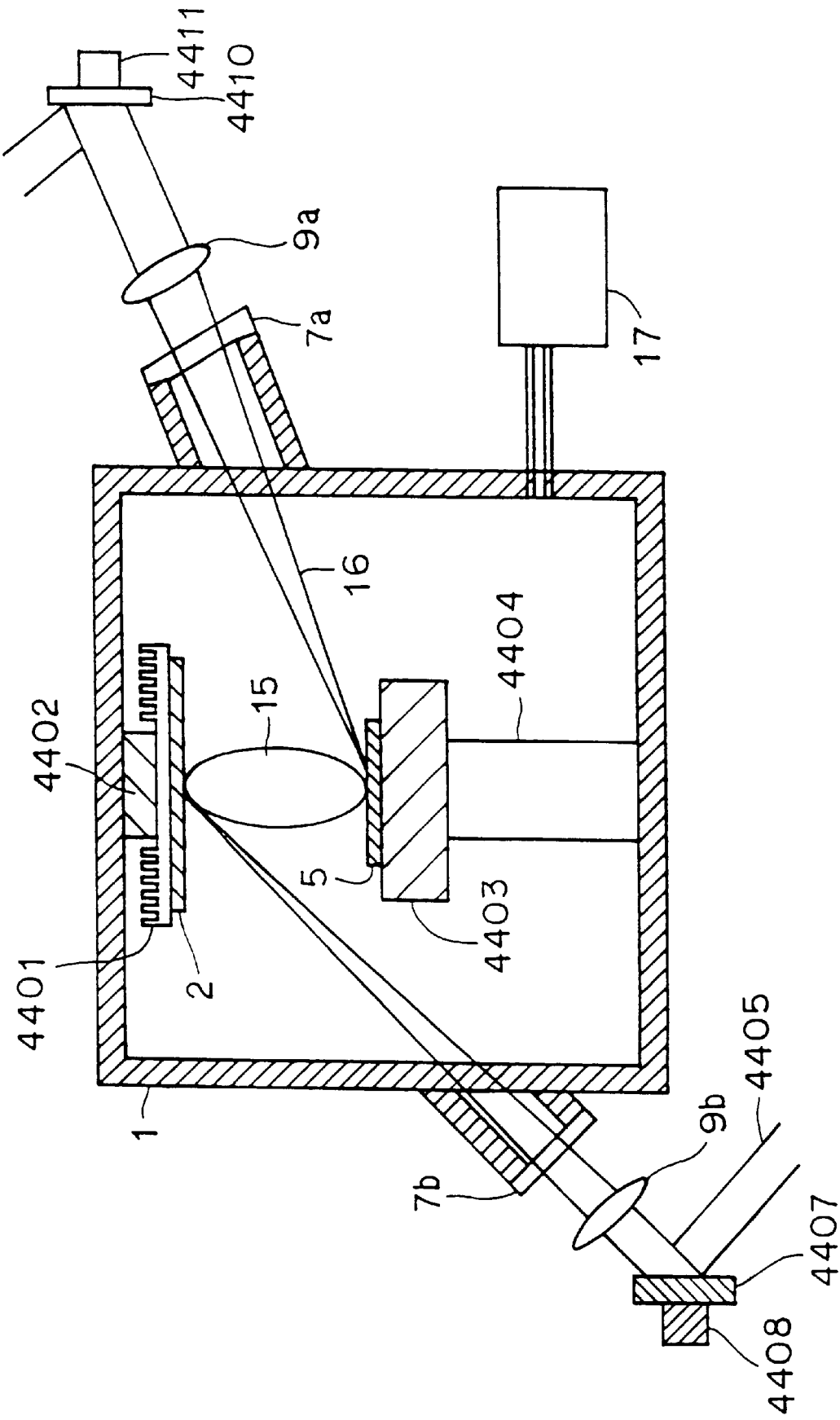
FIG. 82 is a cross sectional view showing a schematic structure of the thin film forming apparatus using laser in accordance with the forty-ninth embodiment of the present invention.

The apparatus of this embodiment includes, referring to FIG. 82, a mirror 4407 for changing optical path of infrared laser beam or far infrared laser beam 4405 for heating substrate 2, a mirror controlling portion 4408 for controlling orientation of mirror 4407, a mirror 4410 for changing optical path of laser beam 16 directed to target 5, and a mirror controlling portion 4411 for controlling orientation of mirror 4410.

The operation is as follows. As described above, by using mirror 4410, only a portion which should be heated to high temperature of substrate 2 can be heated. However, when there are a plurality of portions which are to be heated on the substrate, it is difficult to locally heat these portions requiring heat by a structure in which laser beam 4405 is directed to a certain point. This problem becomes more serious when the substrate 2 has an area as large as 6 to 8 inches in diameter.

In this embodiment, a mechanism for adjusting the position of irradiation of the substrate with infrared laser beam or far infrared laser beam is provided. FIG. 182 shows an example in which portion of irradiation of substrate 2 with infrared laser beam or far infrared laser beam is adjusted by changing the optical path of infrared laser beam or far infrared laser beam 4405.

When a film is to be formed on a wafer having large area, for example, having a diameter of 6 to 8 inches or larger, it is not possible to form the film entirely over the wafer when only one plume 15 is generated at one point of target 5. Therefore, plumes 15 must be generated at a plurality of portions of target 5. For example, in FIG. 82, a mirror 4410 for changing the optical path of laser beam 16 with which the target 5 is irradiated, and a mirror controlling portion 4410 for controlling the direction of mirror 4410 are provided. By changing the orientation of mirror 4410 so that the position of irradiation of the target 5 with the laser beam 16 is changed, plumes 15 are generated at a plurality of portions on target 5. Further, in the structure of FIG. 82, the position of irradiation of substrate 2 with infrared laser beam or far infrared laser beam can be adjusted by changing the optical path of infrared laser beam or far infrared laser beam 4405. Laser 4405 emitted from the infrared laser unit or the far infrared laser unit is reflected by mirror 4407 and condensed by lens 9b to be incident on substrate 2. Here, a mirror controlling portion 4408 is provided at mirror 4407 for controlling orientation of mirror 4407. By this mirror controlling portion 4408, the orientation of mirror 4007 can be changed. Therefore, position to be locally heated of substrate 2 can be changed in accordance with the change of position of irradiation of the target 5 with the laser beam 16.

As described above, in the present embodiment, the position of irradiation of the substrate with infrared laser beam or far infrared laser beam can be adjusted, and in addition, the substrate is cooled by cooling fin 4401. Therefore, increase of temperature at a portion which do not require heat on substrate can be effectively suppressed. Further, by arbitrarily moving infrared laser beam or far infrared laser beam on the substrate, a minute pattern on the surface of substrate 2 can be annealed.

Figure 84:
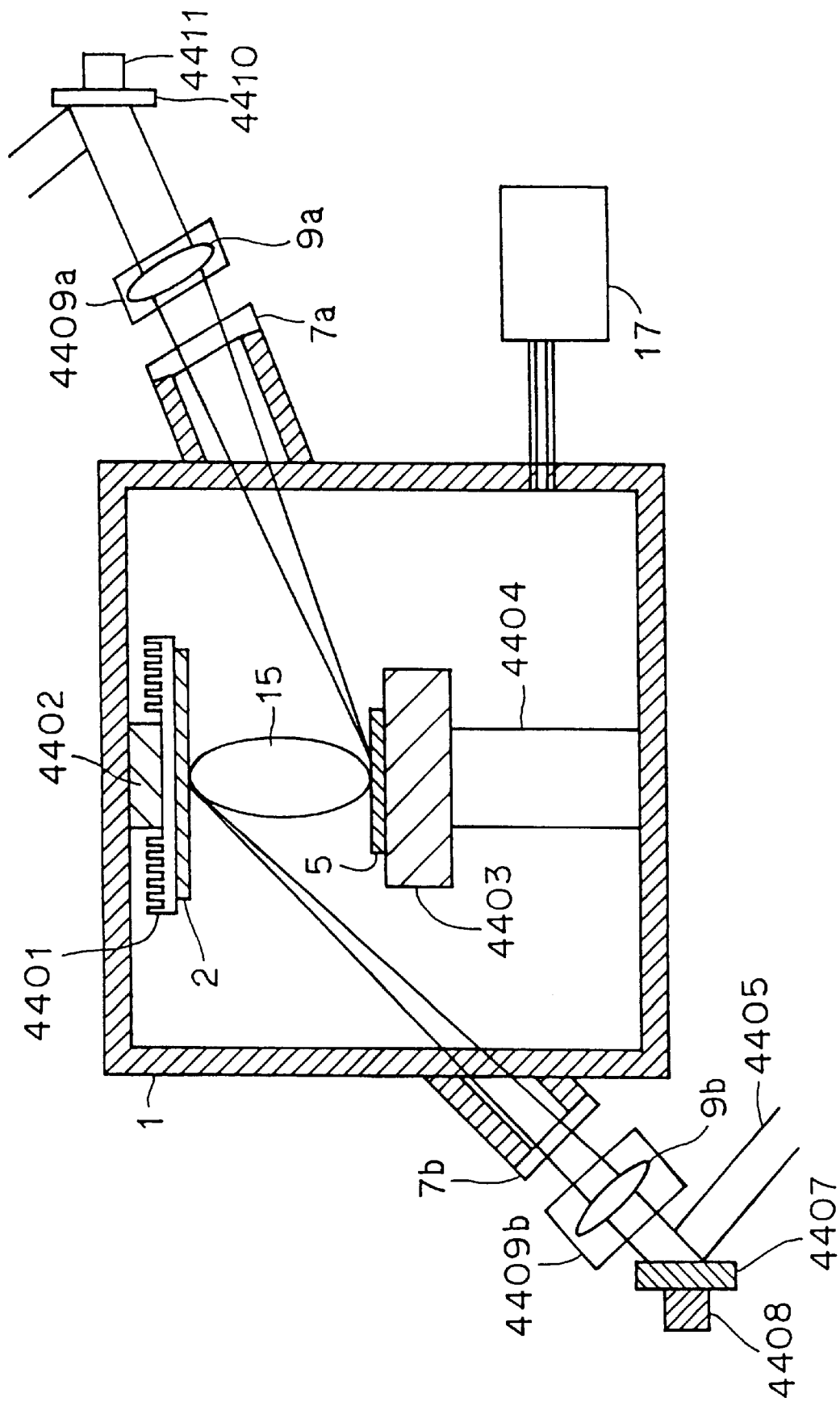
FIG. 84 is a cross sectional view showing another modification of the thin film forming apparatus using laser in accordance with the forty-ninth embodiment of the present invention.

When the range of adjustment of the position of irradiation of the substrate with the infrared laser beam or the far infrared laser beam is of innegligible size as compared with the focal length of lens 9b, the laser beam may be out of focus on the substrate when the position of laser irradiation is changed. This may cause unnecessary heating of portions of the surface of substrate 2 by laser beam 4405. In such a case, a lens position adjusting portion 4409b may be provided at lens 9b as shown in FIG. 84. The lens position adjusting portion 4409 adjusts the position of the lens or the angle with respect to laser beam 4405 in accordance with the change in position of irradiation of the substrate with infrared laser beam or far infrared laser beam 4405. Therefore, necessary area of the laser beam can be obtained on substrate 2. Such a lens position adjusting portion may be provided at condenser lens 9a for laser beam 16 which is directed to target 5. In that case, the laser beam can be prevented from being out of focus on target 5. Consequently, variation in conditions of generation of plume 15 caused by the change in laser power density per unit area can be prevented.

Figure 83:
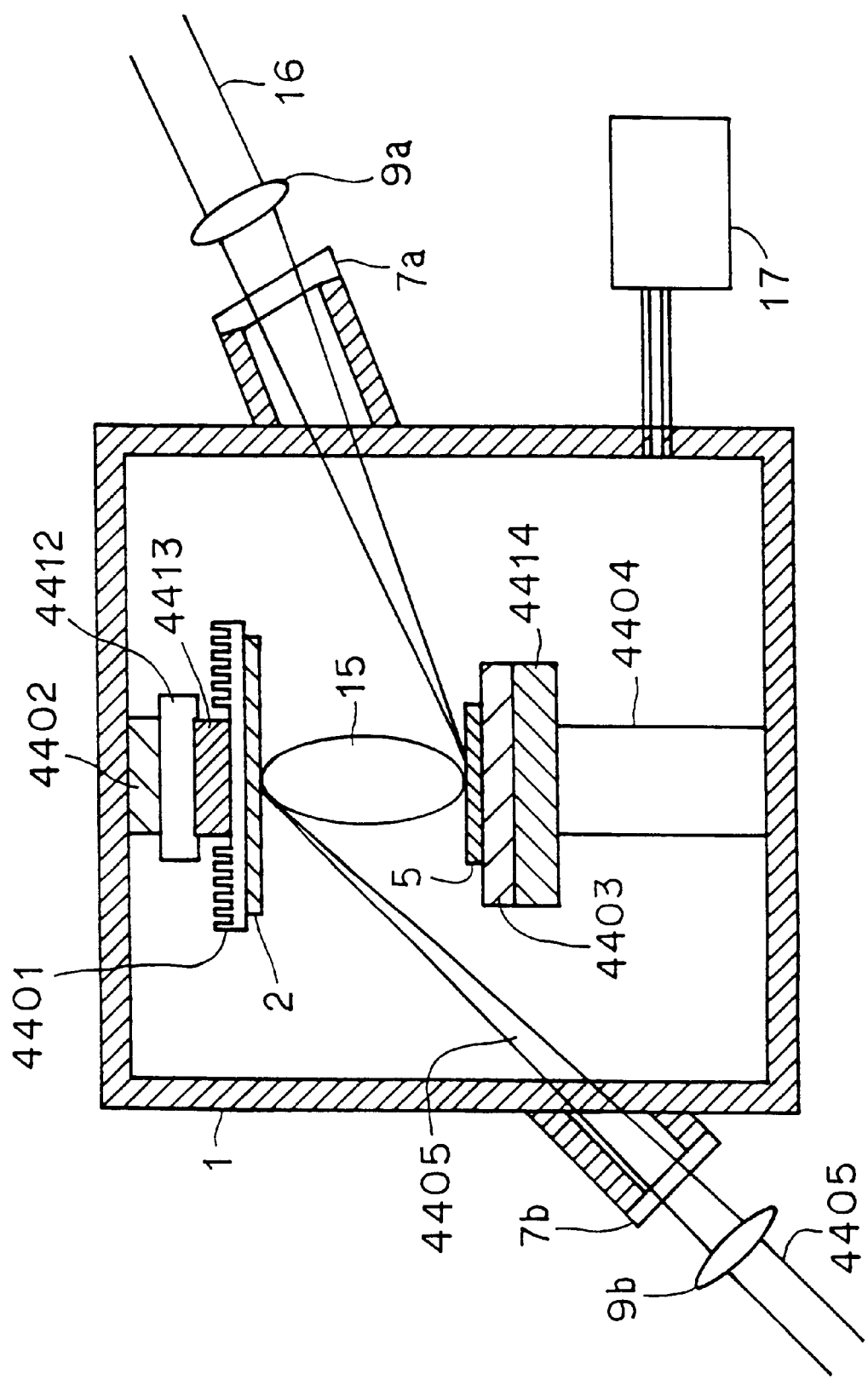
FIG. 83 is a cross sectional view showing a modification of the thin film forming apparatus using laser in accordance with the forty-ninth embodiment of the present invention.

In the above described embodiment, the optical path of infrared laser beam or far infrared laser beam 4405 is changed for adjusting the position of irradiation of substrate 2 with infrared laser beam or far infrared laser beam 4405. However, a mechanism for changing the position of substrate 2, such as shown in FIG. 83 may be provided. The apparatus shown in FIG. 83 includes a substrate driving portion 4412 for changing the position of substrate 2, a connecting plate 4413 for connecting substrate driving portion 4412 and cooling fin 4401, and a target driving portion 4414 provided between target base 4403 and target support 4404.

The operation will be described. In the example of FIG. 83, in order to generate plumes 15 at a plurality of portions of target 5, not the optical paths of laser beams 16 and 4405 but positions of target 5 and substrate 2 are changed. For example, laser beam 16 is condensed by the lens to be incident on target 5, a plume 15 is generated and a film is deposited on substrate 2. Then, target driving portion 4414 and substrate driving portion 4412 are driven to change positions of target 5 and substrate 2. Consequently, laser beam 4405 is directed to a different position from the last time of substrate 2 and heat that portion of substrate 2. Thereafter, by condensing laser beam 16 by the lens again to be incident on the target 5, plume 15 is generated, and film can be formed on a new position of substrate 2. In this manner, the position for local heating of substrate 2 can be changed in accordance with the change in position of irradiation of the target 5 with laser beam 16.

As described above, in this embodiment, by changing the position of substrate 2, the position of irradiation of the substrate with infrared laser beam of far infrared laser beam can be adjusted. In addition, since the substrate is cooled by cooling fin 4401, increase in temperature of portions which do not require heating on the substrate can be effectively suppressed. By arbitrarily scanning the substrate 2 and target 5, a pattern on the surface of substrate 2 can be annealed.

Figure 85:
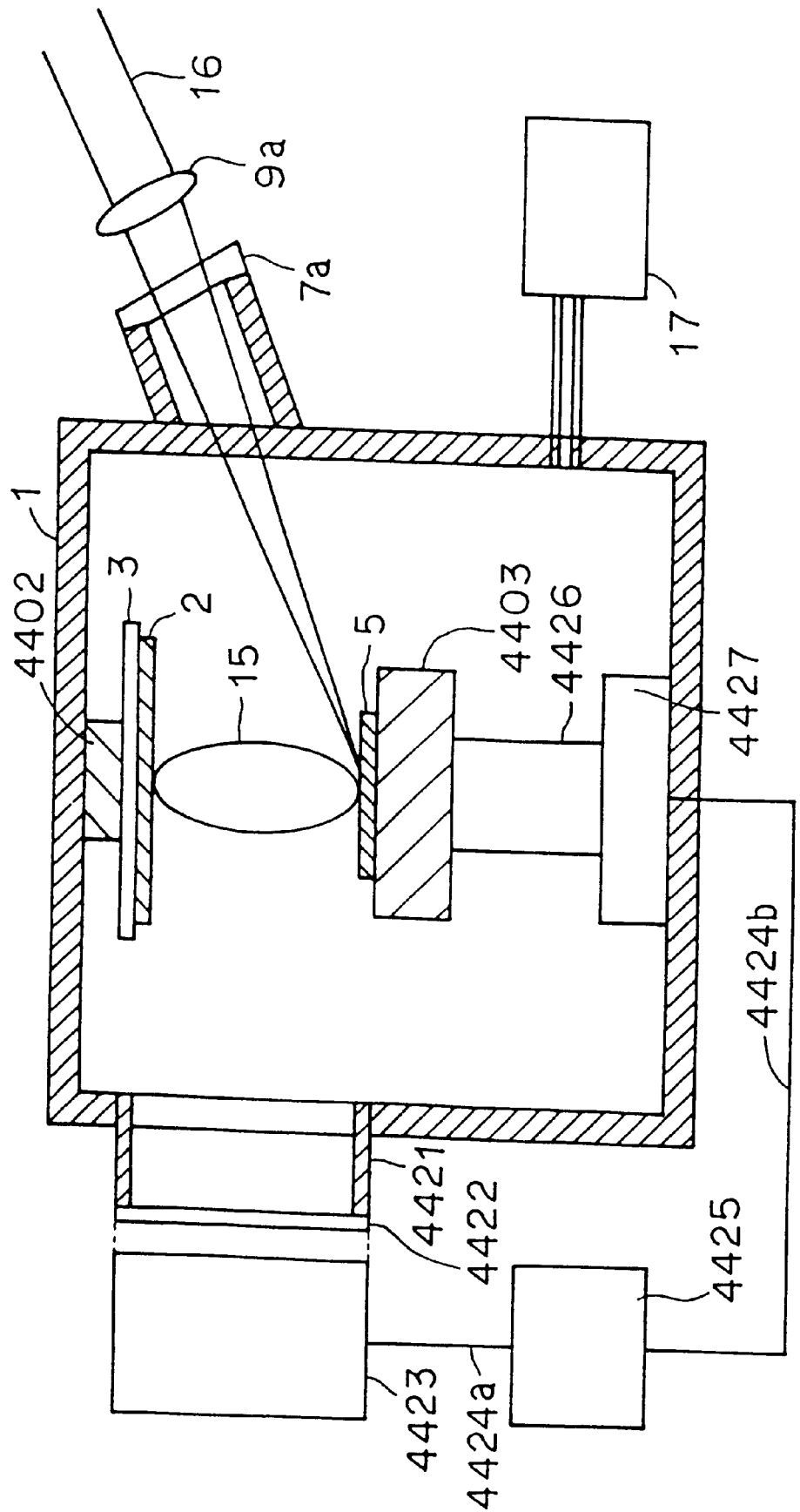
FIG. 85 is a cross sectional view showing a schematic structure of the thin film forming apparatus using laser in accordance with the fiftieth embodiment of the present invention.

A fiftieth embodiment of the present invention will be described with reference to FIG. 85. The apparatus of this embodiment includes, referring to FIG. 85, a plume monitoring port 4421 for monitoring plume 15 from outside of chamber 1, a plume monitoring window 4422 attached to plume monitoring port, a plume monitoring portion 4423 for monitoring plume 15, a control portion 4425 which receives information of the plume obtained from plume monitoring portion 4423 for outputting a signal for controlling position of substrate 2 or target 5, a signal line 4424a for transmitting the output signal from plume monitoring portion 4423 to controlling portion 4425, a signal line 4424b for transmitting the output signal from control portion 4425 to target position driving portion, a target position adjusting table 4426 for adjusting the position of target 5, and a target position driving portion 4427 receiving the signal from controlling portion 4425 for moving the target position adjusting table.

The operation is as follows. As described above, laser beam 16 emitted from laser unit 10 is condensed by condenser lens 9 and passed through laser inlet window 7 of chamber 1 to be incident on raw material target 5 placed in chamber 1. Thus a plume 15 is generated in a direction vertical to target 5. A substrate 2 is placed fixed on substrate holder 3, opposing to raw material target 5. Excited atoms and ions in plume 15 reach the substrate 2 and are deposited thereon to form a thin film.

Here, target 5 is irradiated with the laser beam repeatedly for a number of times. Therefore, the surface of the target 5 is gradually removed so that the surface becomes less planar. For this reason, when laser beam irradiation is repeated for a number of times, the position of generation of plume 15 may be displaced, or the plume 15 may be generated not to the direction of substrate 2. Further, as laser beam irradiation proceeds, there will be deposits on window 7a so that the transmittance of window 7a is reduced. In addition, the power of the laser beam incident on target 5 may be gradually lowered due to the characteristics of the laser unit and the like. In such a case, the size of the generated plume 15 is also reduced. Therefore, in the conventional film forming apparatus, the position and size of the plume generated may be changed as the laser beam irradiation proceeds, which leads to unevenness of film thickness of reduction in the late of film formation.

In order to solve the above described problem, in this embodiment, a mechanism for changing the position of the target or the substrate in accordance with the change in position of the plume is provided. In this embodiment, referring to FIG. 85, an image sensor, for example, is provided. Plume monitoring portion 4423 monitors position and size of the plume generated from target 5, and the information is transmitted through signal line 4424a to controlling portion 4425. Controlling portion 4425 determines whether the plume is generated at an appropriate position with an appropriate size, based on the information from plume monitoring portion 4423. If the position of the plume is not appropriate, it provides a signal to target 4427 through signal line 4424b so that the target driving portion 4427 is moved to realize appropriate relation between substrate 2 and the position of generation of the plume. In response, target position driving portion 4427 moves together with target position adjusting table 4426, target base 4403 and target 5, so that substrate 2 and the position of plume generation have appropriate relation. If the size of the plume is not appropriate, similar operation as above is carried out to adjust the distance between target 5 and substrate 2, so as to compensate for the change in distance between plume and the substrate caused by the changed in the size of the plume.

By the above described operation, positional relation between the plume and the target can be kept constant, and therefore deviation of the plume position and unevenness of the film quality caused by the change in the size of the plume can be prevented.

Figure 86:
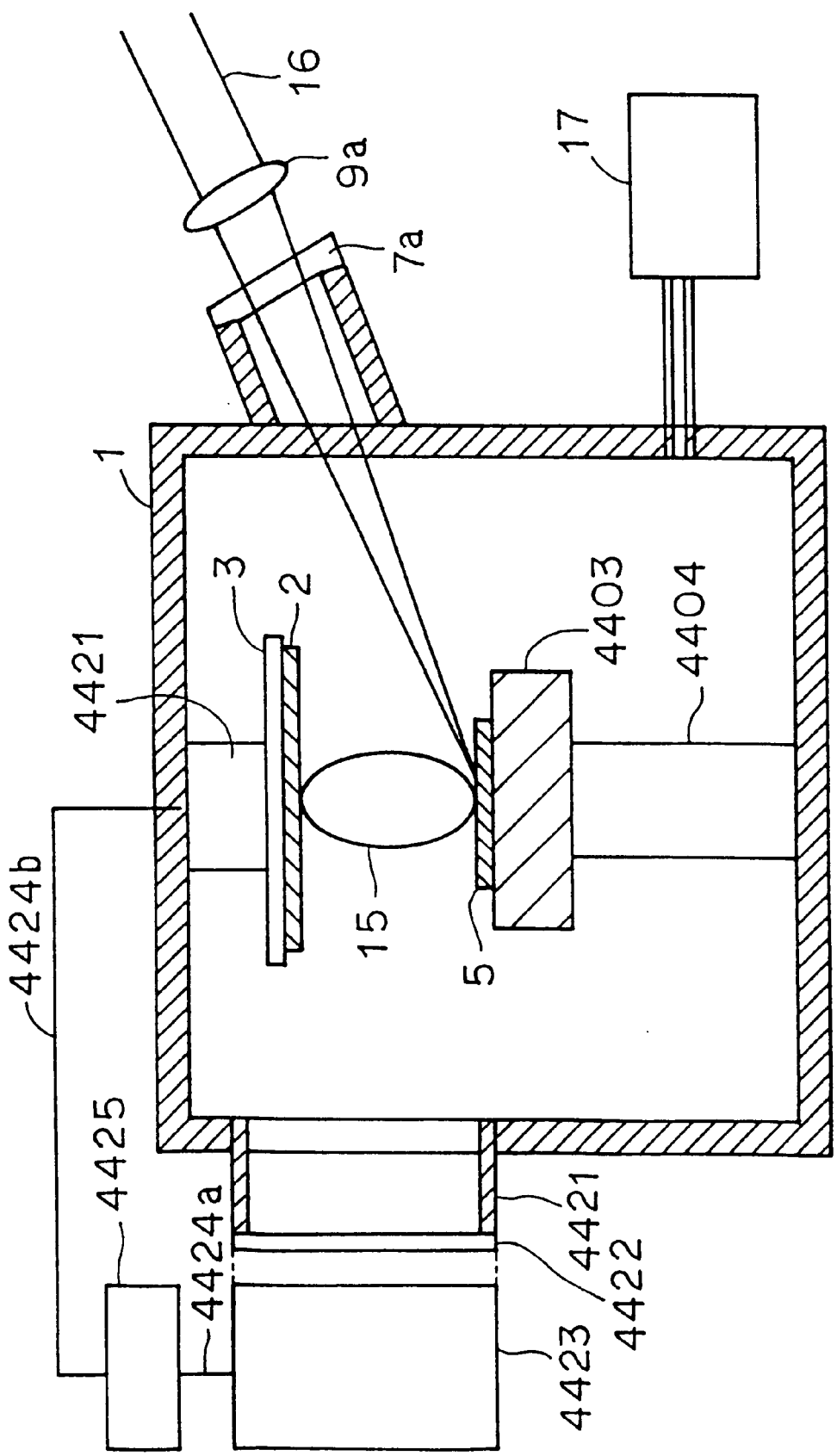
FIG. 86 is a cross sectional view showing a modification of the thin film forming apparatus using laser in accordance with the fiftieth embodiment of the present invention.

Although the position of target 5 is controlled in accordance with the change in position or size of the plume in the above described embodiment, the position of the substrate 2 may be controlled. FIG. 86 shows such an example. The apparatus shown in FIG. 86 includes a substrate position driving portion 4428 attached to substrate holder 3. In this example, control signal from controlling portion 4425 is transmitted to substrate position driving portion 4428 through signal line 4424b. In response, substrate position driving portion 4428 moves together with substrate holder 3 and substrate 2, so that the substrate 2 and the position of plume generation satisfy an appropriate relation. If the size of the plume is not appropriate, similar operation as described above is carried out to adjust the distance between target 5 and substrate 2, so as to compensate for the change in distance between the plume and the substrate caused by the change in the size of the plume.

As described above, in the example shown in FIG. 86 also, the positional relation between the plume and the target can be kept constant. Therefore, deviation in the position of the plume and unevenness of the film quality caused by the change in the size of the plume can be prevented.

Although an image sensor is used in plume monitoring portion 4423 in the above described embodiment, a camera, a video camera, a probe or the like may be used as the plume monitoring portion 4423 to provide the same effect.

Though a mechanism for changing the position of the target or the substrate in accordance with the change in position of the plume is provided in the above described embodiments, a mechanism for changing the optical path of the laser in accordance with the change in the position of the plume may be provided.

Figure 87:
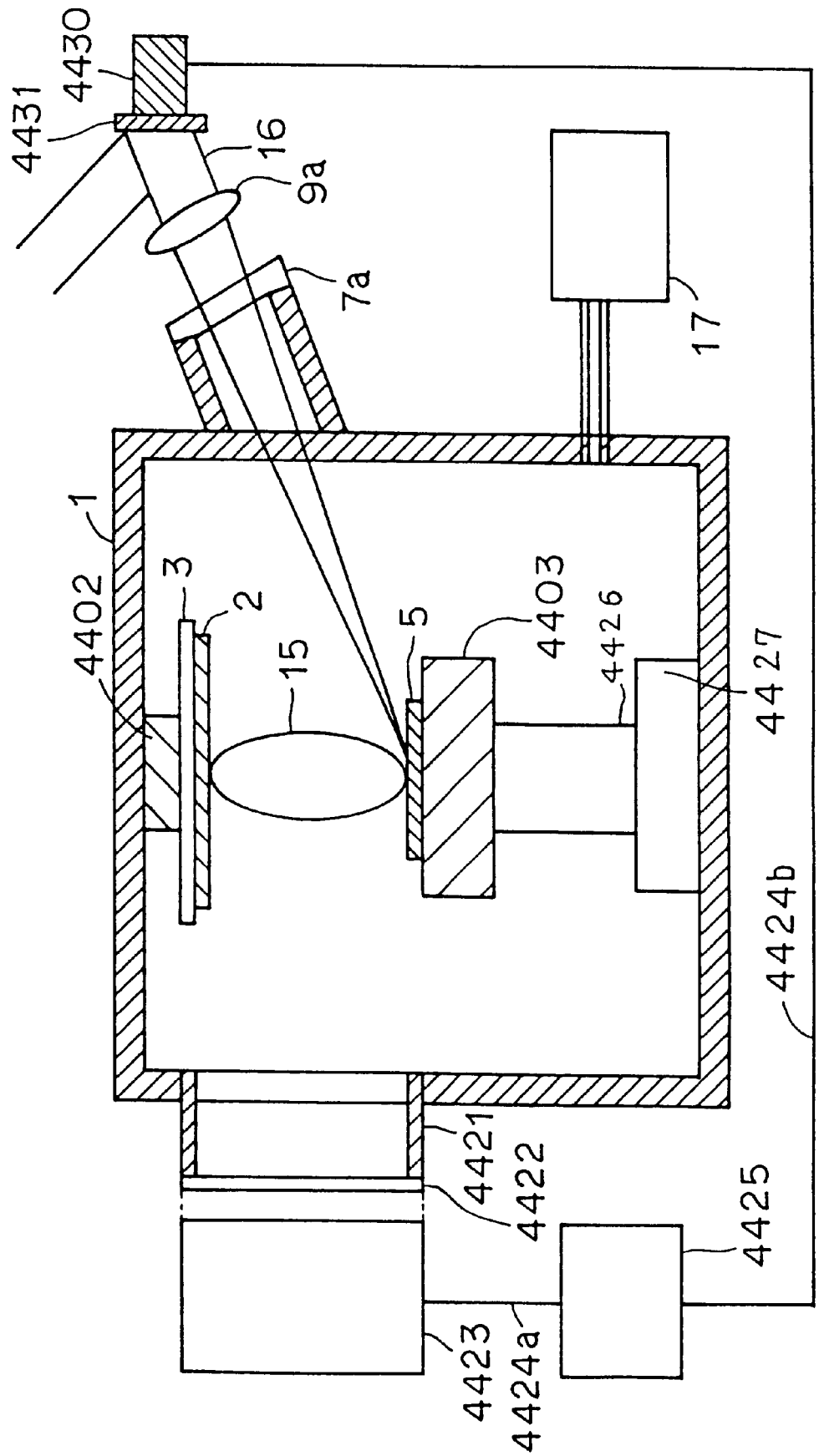
FIG. 87 is a cross sectional view showing a schematic structure of the thin film forming apparatus using laser in accordance with the fifty-first embodiment of the present invention.
Figure 88:
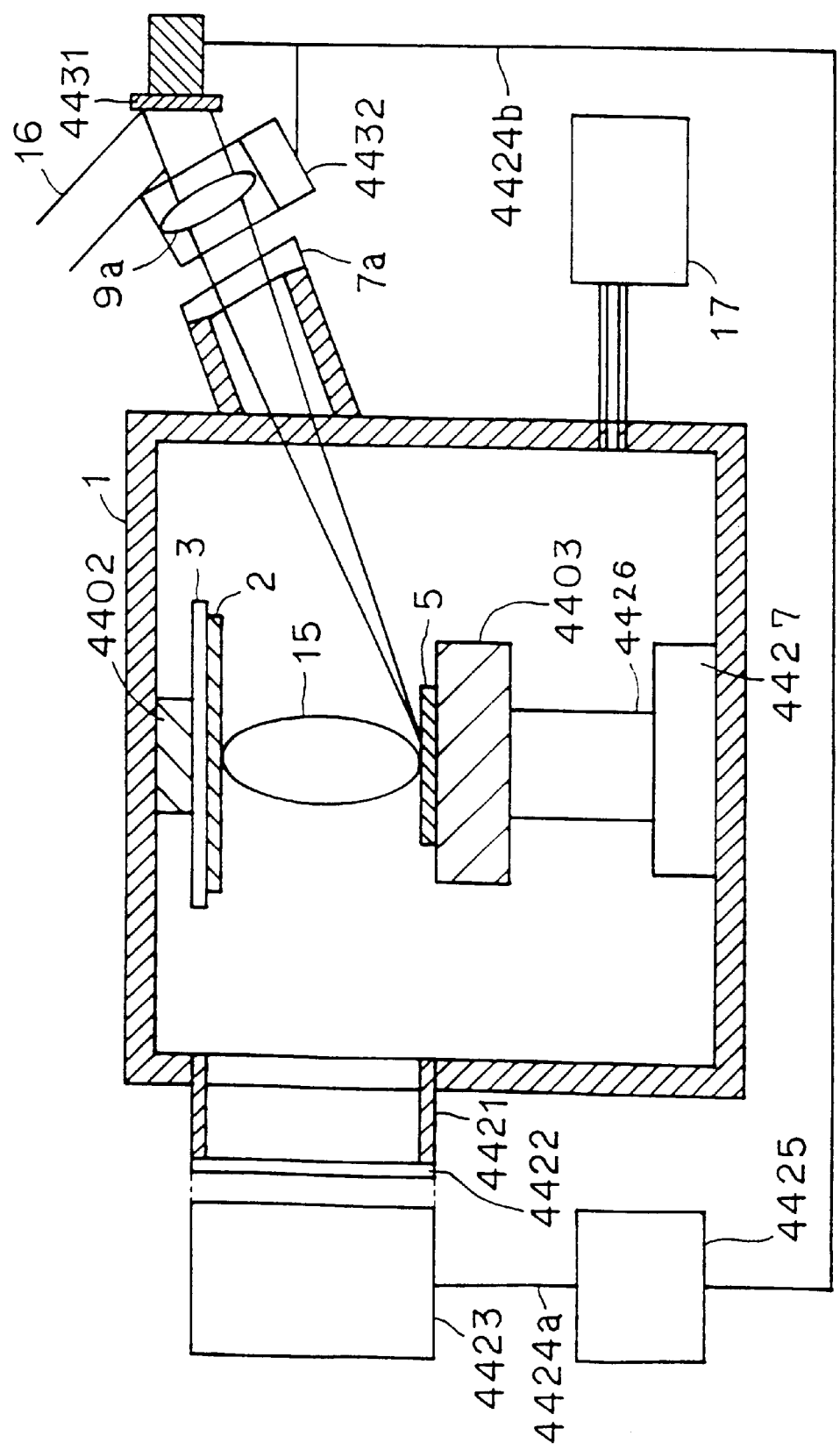
FIG. 88 is a cross sectional view showing a modification of the thin film forming apparatus using laser in accordance with the fifty-first embodiment of the present invention.

A fifty-first embodiment of the present embodiment will be described with reference to FIGS. 87 and 88. The apparatus of this embodiment includes a mirror 4431 provided in the optical path of the laser beam 16 emitted from laser unit 10, and a mirror angle adjusting portion 4430 attached to mirror 4431.

The operation is as follows. As described above, as the film forming operation is continued, the position of generation of the plume 15 may be displaced a little, or the plume 15 may be generated not to the direction of substrate 2. In this embodiment, the optical path of the laser is changed as the position of the plume changes, so as to compensate for the change in position of the plume. In this embodiment, referring to FIG. 88, an image sensor is provided, for example. Plume monitoring portion 4423 monitors the position of the plume generated from target 5, and the information is transmitted through signal line 4424a to controlling portion 4425. Controlling portion 4425 determines whether or not the plume is generated at an appropriate position, based on the information from plume monitoring portion 4423. If the position of the plume is not appropriate, it transmits a signal to mirror angle adjusting portion 4430 through signal line 4424b so that the laser beam incident on target 5 is positioned appropriately. In response, mirror angle adjusting portion 4430 adjusts the angle of mirror 4431 so that an appropriate position of target 5 is irradiated with laser beam 16. By this operation, plume can be generated at a prescribed position constantly, and unevenness of film quality caused by the change in the size of the plume can be prevented.

If the range of adjustment or the position of irradiation of target 5 with laser beam 16 is of innegligible size as compared with the focal length of lens 9b, the laser beam may be out of focus on target 5, when the position of laser irradiation is changed. Consequently, the laser beam intensity may possibly be reduced on the surface of target 5, resulting in the change of size of the generated plume. In such a case, a lens position adjusting portion 4432 may be provided at lens 9b as shown in FIG. 88. Lens position adjusting portion 4432 is controlled together with mirror angle adjusting portion 4430, so that the position of the lens and the angle of the lens with respect to laser beam 4405 can be adjusted in accordance with the change of position of irradiation of the target 5 with laser beam 16. Consequently, necessary area of laser beam can be obtained on target 5, whereby conditions for generating the plume 15 can be prevented from being uneven.

Figure 89:
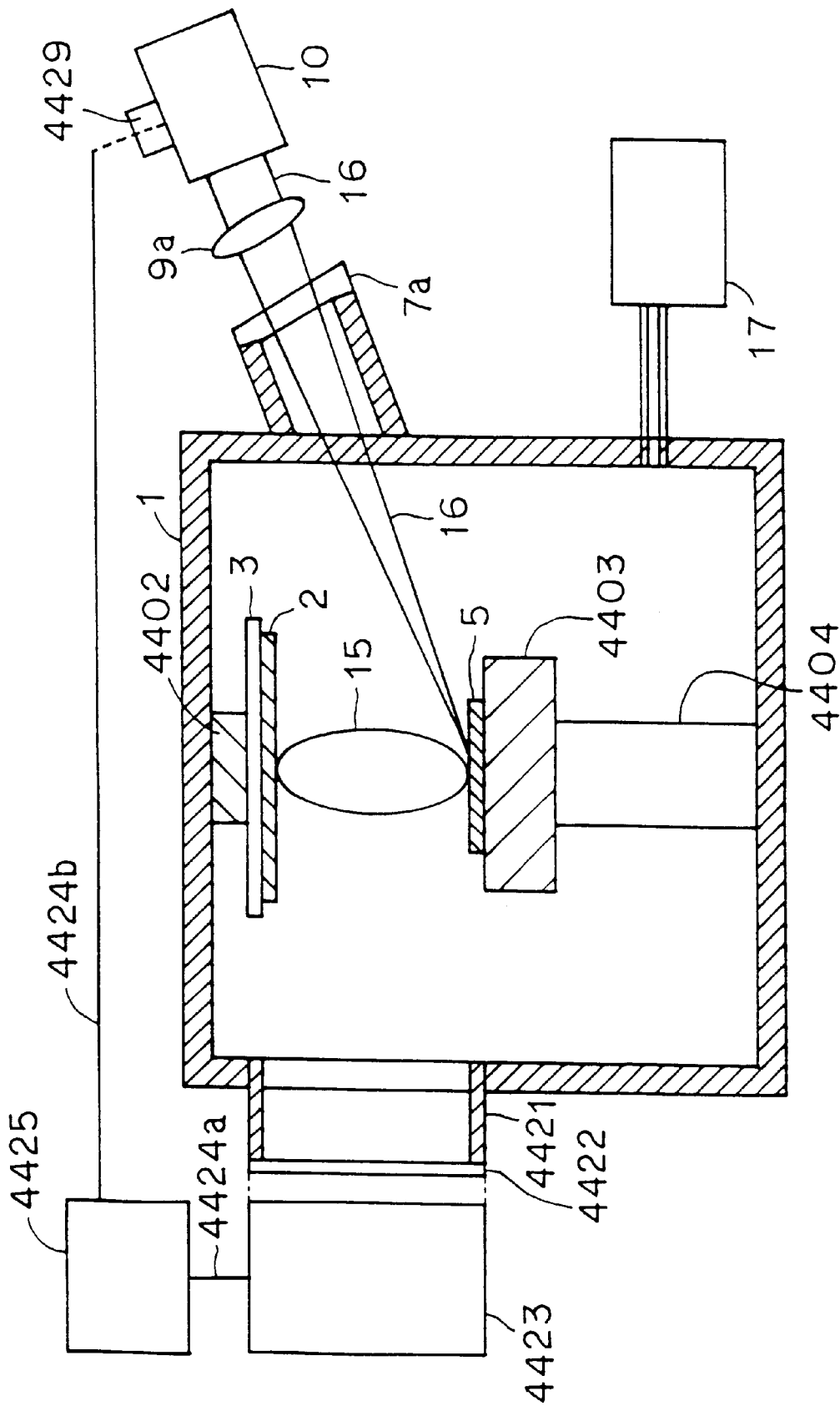
FIG. 89 is a cross sectional view showing a schematic structure of the thin film forming apparatus using laser in accordance with the fifty-second embodiment of the present invention.

A fifty-second embodiment of the present invention will be described with reference to FIG. 89. In this embodiment, referring to FIG. 89, a laser power adjusting portion 4429 is attached to laser unit 10.

The operation is as follows. As descried above, when film forming operation is continued, there will be deposits on window 7a causing lower transmittance of window 7a, and the power of the laser beam incident on the target 5 may be gradually lowered due to the characteristics of the laser unit and the like. In that case, the size of the plume 15 generated is also reduced. Therefore, in the conventional film forming apparatus, the size of the plume may be changed, causing unevenness of the film thickness and reduction in the rate of film formation.

In order to solve the above described problems, in this embodiment, a mechanism for changing the power of the laser beam in accordance with the change in the position of the plume is provided. Referring to FIG. 89, in this embodiment, a plume monitoring portion 4423 provided with an image sensor, for example, monitors the size of the plume generated from target 5, and the information is transmitted through signal line 4424a to control portion 4425. Control portion 4425 determines whether or not the plume is generated with an appropriate size based on the information from plume monitoring portion 4423. If the intensity of the laser beam incident on target 5 has been changed and the size of the plume is not appropriate, it transmits a signal to laser power adjusting portion 4429 through signal line 4424b, so that the intensity of the laser beam incident on target 5 is made appropriate. In response, laser power adjusting portion 4429 controls laser unit 10 such that the laser unit 10 emits the laser beam having appropriate intensity. As for the means for changing output intensity of laser unit by laser power adjusting portion, the voltage of discharge for laser excitation may be changed, or a part of the laser beam may be intercepted by an aperture. Alternatively, the number of repetition of the pulse laser may be changed.

By the above described operation, a plume having a constant size can be generated, and therefore unevenness of the film quality caused by the change in the size of the plume can be prevented.

Figure 90:
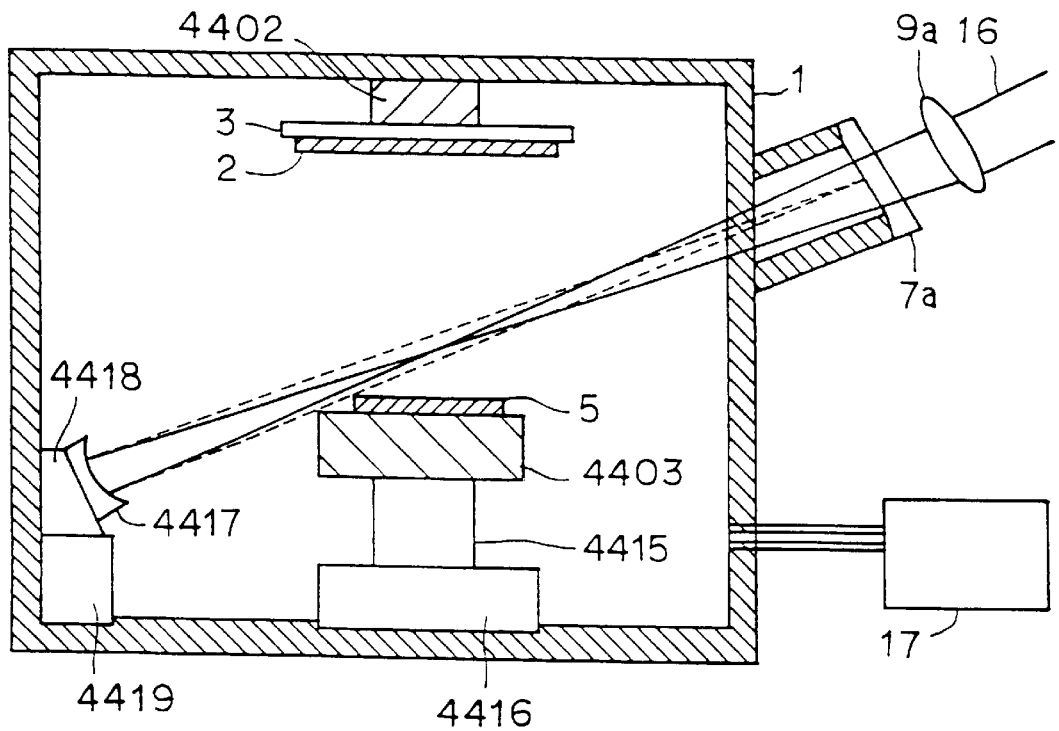
FIG. 90 is a cross sectional view showing a schematic structure of the thin film forming apparatus using laser in accordance with the fifty-third embodiment of the present invention.

A fifty-third embodiment of the present invention will be described with reference to FIG. 90. Referring to FIG. 90, the apparatus of this embodiment includes a target height adjusting table 4415 for adjusting the height of target 5, a target height adjusting driving portion 4416 for moving upward and downward the target height adjusting table 4415 for adjusting the height of target 5, a mirror 4417 for reflecting laser beam entering the chamber, a mirror attaching plate 4418 for attaching mirror 4417, and a mirror based 4419 supporting the mirror attaching plate.

The operation is as follows. As described above, laser beam 16 emitted from laser unit 10 is condensed by condenser lens 9, and passed through laser inlet window 7 of chamber 1 to be incident on raw material target 5 placed in chamber 1. At the portion of raw material target 5 irradiated with laser, a plasma is generated abruptly, and in the process of cooling the plasma in several ten ns, isolated excited atoms and ions are generated. These groups of excited atoms and ions have lives of at least several microseconds and they are emitted to the space to form a plume 15 which is like a flame of a candle. Substrate 2 is placed fixed on substrate holder 3, opposing to raw material target 5. Excited atoms and ions in plume 15 reached the substrate 2 and are deposited thereon to form a thin film.

Here, not all the excited atoms and ions emitted to the space from target 5 reach the substrate 2, and part thereof reach other portions of chamber 1. A part of excited atoms and a part of ions reach inner surface of window 7a provided at the chamber to be deposited thereon. Therefore, as the film forming apparatus is used, there will be deposits on inner surface of window 7a, decreasing transmittance of window 7a.

In this embodiment, as shown in FIG. 90, a mirror 4417 is provided for reflecting laser beam 16 which has entered the chamber 1 to direct the beam to window 7a of the chamber. In this structure, the position of target 5 can be changed by target height adjusting table 4415, and target height adjusting driving portion 4416. When a film is to be formed on substrate 2, generally, target 5 is placed at a position where target 5 can be irradiated with laser beam 16. When there is substances deposited on window 7a, target height adjusting table 4415 is lowered by target height adjusting driving portion 4416, so that laser beam 16 can reach mirror 4417. At this time, laser beam 16 reflected by mirror 4417 reaches inner surface of window 7a so as to turn the deposits on the inner surface of window 7a into plasma, so that the deposit is removed. Consequently, the transmittance of window 7a can be recovered without opening the chamber. When a concave mirror is used as mirror 4417 so that the light reflected from mirror 4417 is condensed on window 7a, removal of the deposit can be carried out more efficiently.

Figure 91:
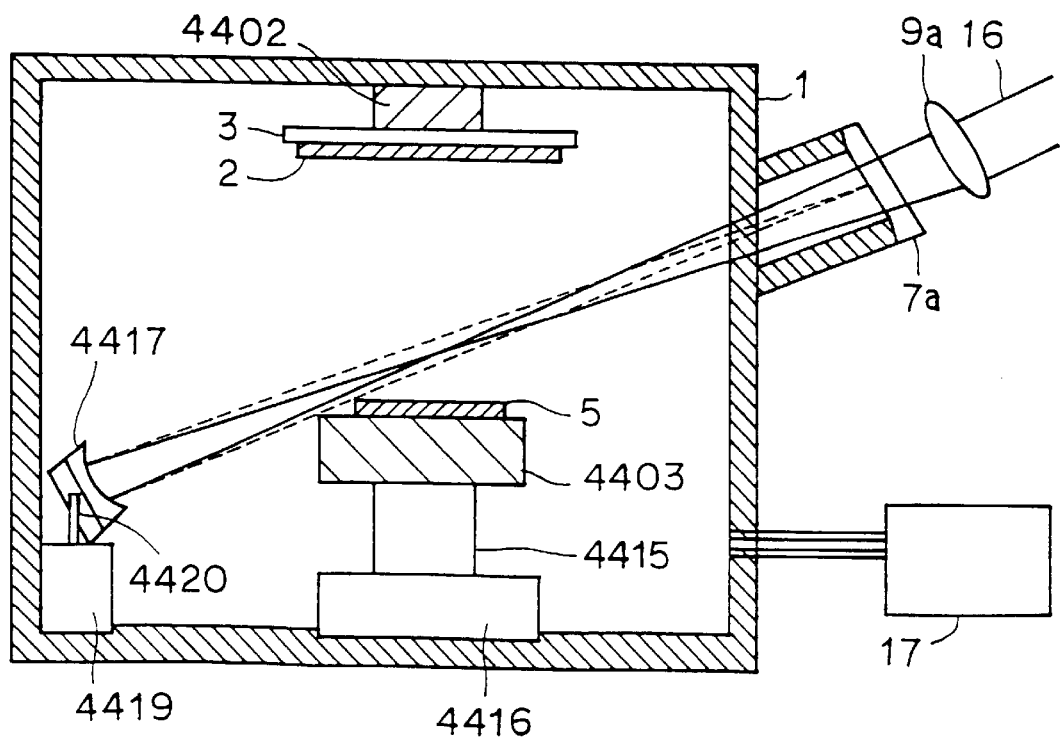
FIG. 91 is a cross sectional view showing a schematic structure of the thin film forming apparatus using laser in accordance with the fifty-fourth embodiment of the present invention.

A fifty-fourth embodiment of the present invention will be described with reference to FIG. 91. In this embodiment, referring to FIG. 91, a mirror angle adjusting portion 4420 for adjusting the angle of mirror 4117 is provided. In the fifty-third embodiment described above, mirror 4417 is fixed on mirror attaching plate 4418. Therefore, the laser beam reflected by mirror 4417 will be incident on the same position on inner surface of window 7a constantly. If the size of the beam of the reflected light incident on the inner surface of window 7a is large enough to cover the size of the laser beam incident on window 7a, there is no problem. However, if the size of the beam of the reflected light which is incident on the inner surface of window 7a is not large enough to cover the size of the incident laser beam on window 7a, or when the reflected light is condensed small on the inner surface of window 7a in order to improve the effect of removal, the deposit on the window 7a cannot be fully removed from the entire portion through which incident laser beam 16 passes, by the structure of the above embodiment.

The present embodiment is to solve this problem, and it includes a mechanism for changing the position of irradiation of the window with the reflected beam of the laser beam introduced to the chamber. Referring to FIG. 91, mirror 4417 is attached on mirror angle adjusting portion 4420. By this mirror angle adjusting portion 4420, the angle of mirror 4417 with respect to the incident angle of laser beam 16 can be changed. Consequently, the position of irradiation of the inner surface of window 7a with the reflected beam from mirror 4417 can be changed, and therefore deposit can be fully removed from the entire portion of window 7a through which incident laser beam 16 passes. A control system may be provided at mirror angle adjusting portion 4420 so that an instruction for adjusting the mirror angle is transmitted to mirror angle adjusting portion 4420 from the outside of the chamber.

Figure 92:
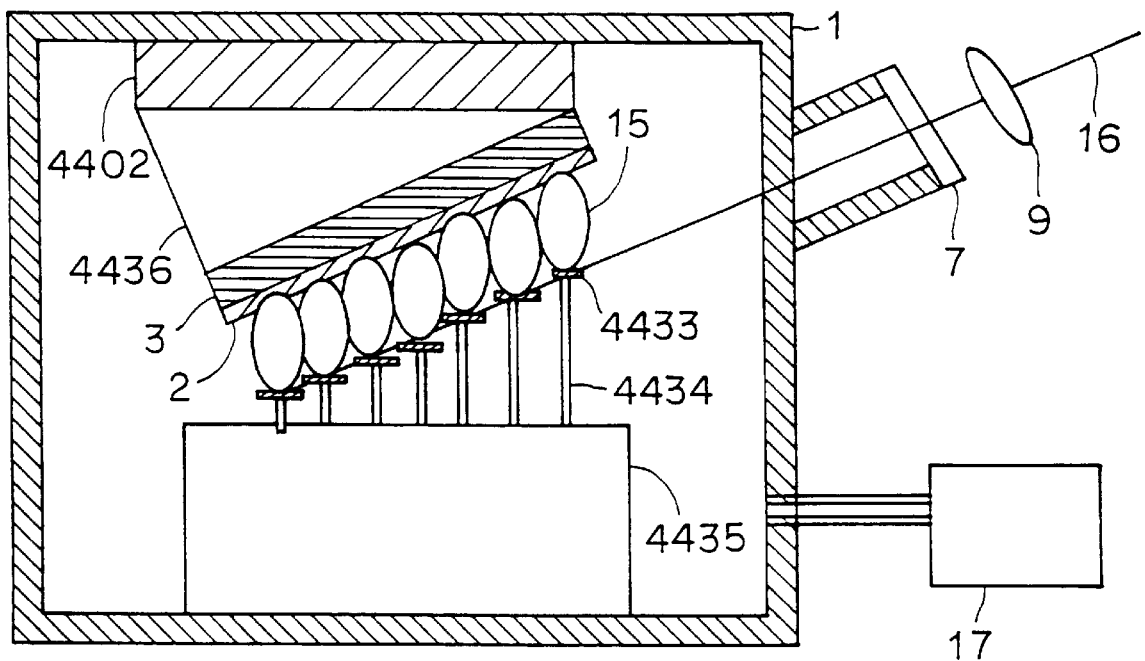
FIG. 92 is a cross sectional view showing a schematic structure of the thin film forming apparatus using laser in accordance with the fifty-fifth embodiment of the present invention.

A fifty-fifth embodiment of the present invention will be described with reference to FIGS. 92, 93A and 93B. The apparatus of this embodiment includes, referring to FIG. 92, a target 4433 having an opening through which laser beam is passed, a target support 4434 for supporting target 4433 having the opening, a target base 4435 for supporting a plurality of target supports 4434, and a spacer 4436 provided between substrate holder 3 and substrate support portion 4402.

The operation is as follows. As described above, laser beam 16 emitted from eraser unit 10 is condensed by condenser lens 9 and passed through laser inlet window 7 of chamber 1 to be incident on raw material target 5 placed in chamber 1. At the portion of raw material target 5 irradiated with laser, a plasma is generated abruptly, and in the process of cooling the plasma in several ten ns, isolated excited atoms and ions are generated. These groups of excited atoms and ions have lives of at least several microseconds, and they are emitted to the space to form a plume 15 which is like a flame of a candle. Substrate 2 is placed fixed on substrate holder 3, opposing to raw material target 5. Excited atoms and ions of the plume 15 reach the substrate 2 and are deposited thereon to form a thin film.

Figure 93A:
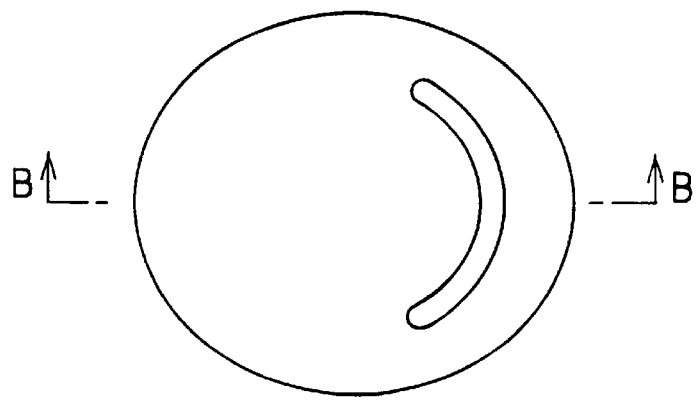
FIG. 93A is a plan showing, in enlargement, a target used in the thin film forming apparatus using laser in the fifty-fifth embodiment of the present invention
Figure 93B:
FIG. 93B is a cross section taken along the line B—B of FIG. 93A.

Now, in this embodiment, a target 4434 having an opening through which the laser beam is transmitted such as shown in FIGS. 93A and 93B is used as the target. A plurality of such targets 4433 having openings are supported by target supports 4434 as shown in FIG. 92. The target supports 4434 are connected to target base 4435 having a driving portion therein. For example, in FIG. 92, target supports 4434 and targets 4433 having openings are adapted to be rotated by the driving portion in target base 4435. These targets 4433 having openings are arranged such that by rotating respective targets, laser beam 16 is directed to another target through the opening of one target.

For example, when laser beam 16 is directed to a portion other than the opening of the first target 4434 having the opening, a plume 15 is generated from the first target 4433 having the hole, and film is formed at that portion of the surface of substrate 2 which is near the plume. When laser beam 16 passes through the opening of the first target 4433 to be directed to a portion other than the opening of the second target 4433 having the opening, a plume 15 is generated from the second target 4433 having the opening and a film is formed at that portion of the surface of substrate 2 which is near the plume. Similarly, when laser beam passes through the openings of first to nth targets 4433 having openings and directed to a portion other than the opening of the n+1th target 4433 having the opening, a plume 15 is generated from the n+1th target 4433, and a film is formed at that portion of the surface of substrate 2 which is near the plume. In this manner, by introducing only one laser beam to chamber 1, plumes 15 can be generated from a plurality of targets, and therefore a film can be formed over wide area on the surface of substrate 2. Although a rotating mechanism is used for changing the position of the targets in the above described embodiment, a mechanism for horizontal movement or vertical movement may be used to provide the same effect.

When the area for forming film on the substrate 2 is very large and a large number of targets 4433 having openings are to be used, the distance between respective targets and the substrate differ from target to target, which may cause unevenness in film thickness and film quality of the film formed on the substrate 2. In order to prevent this problem, a spacer 4436 may be provided so that the distance between each of the targets 4433 having openings and substrate 2 is kept constant, as shown in FIG. 92.

In the above described embodiment, a plurality of targets having openings through which laser beam is transmitted were used as targets for laser sputtering, and the targets are arranged such that laser beam is directed to another target through the opening of one target by changing the positions of the targets. Now, in FIG. 92, when the distance between the target which is closest to the laser beam inlet window 7 to the target which is the farthest from window is long as compared with the focal length of the lens 9, for example, the area of condensation of the laser beam on each target differs from target to target to an extent too large to neglect. At this time, because of the difference in the area of condensation of the laser beam, the laser beam intensity per unit area incident on its target differs, which results in difference in the size of the plume generated at each position. This causes unevenness in film thickness and composition of the thin film formed on the substrate 2. Therefore, the difference in laser beam intensity per unit area incident on these targets must be suppressed to 5% at most.

Figure 98:
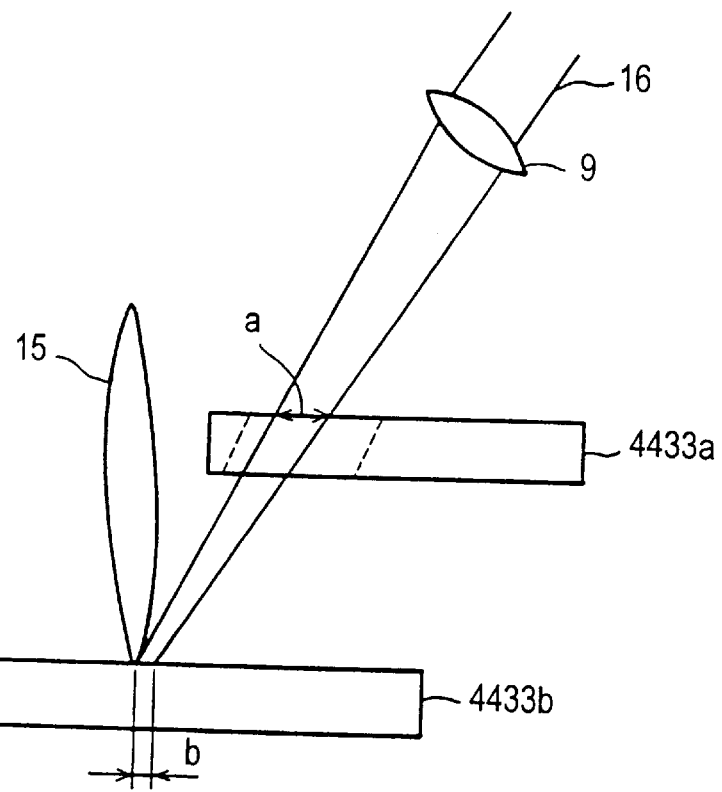
FIG. 98 shows an example in which a condenser lens having long focal length as compared with the distance between two targets is used in the fifty-fifth embodiment of the present invention.

In order to solve this problem, a lens having long focal length is used as the condenser lens for laser beam. For example, as shown in FIG. 98, when a lens having short focal length as compared with the distance between targets 4433a and 4433b is used as condenser lens 9, there will be a large difference between the diameter a of the condensed beam on target 4433a and the diameter b of the condensed beam on target 4433b. Therefore, a lens having such a focal length which suppresses the difference in the area of condensed beam on the targets becomes 5% at most of the area of condensation of the smallest point of condensation, as condenser lens 9. By using such a lens, the square of the difference between diameters a to d of the condensed beams on targets 4433a to 4433d can be suppressed to 5% at most, and the difference in laser beam intensity at respective points of condensation can be suppressed to 5% at most. Thus, the size of plume generated at respective points of condensation can be made uniform.

A fifty-sixth embodiment of the present invention will be described. The apparatus of this embodiment includes, referring to FIGS. 94A to 94D, a polygonal target 4437 and a bar shaped target 4438 provided on target support 4434, respectively.

Figure 94A:
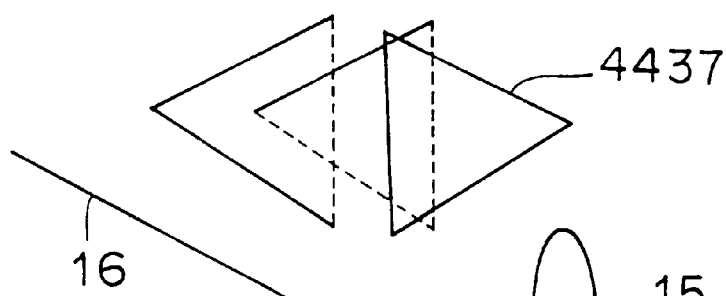
FIG. 94A is a plan view showing layout of target in one state at a main portion of the thin film forming apparatus using laser in accordance with the fifty-sixth embodiment of the present invention.
Figure 94B:
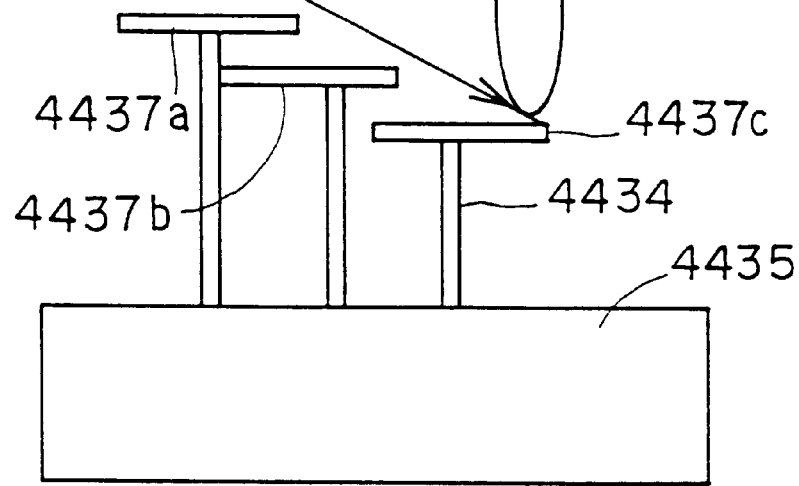
FIG. 94B is a front view showing a schematic structure of the main portion of the apparatus at that state.
Figure 94C:
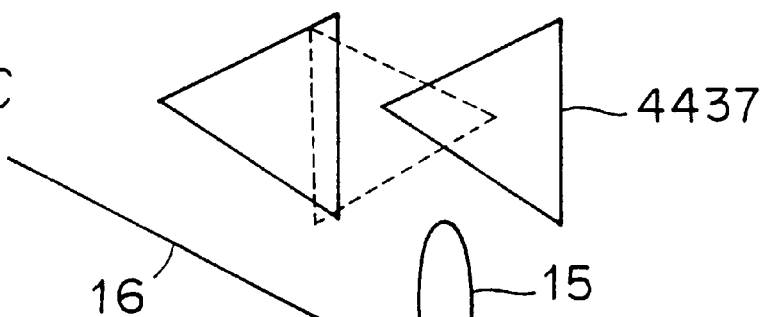
FIG. 94C is a plan view showing layout of the target in another state.
Figure 94D:
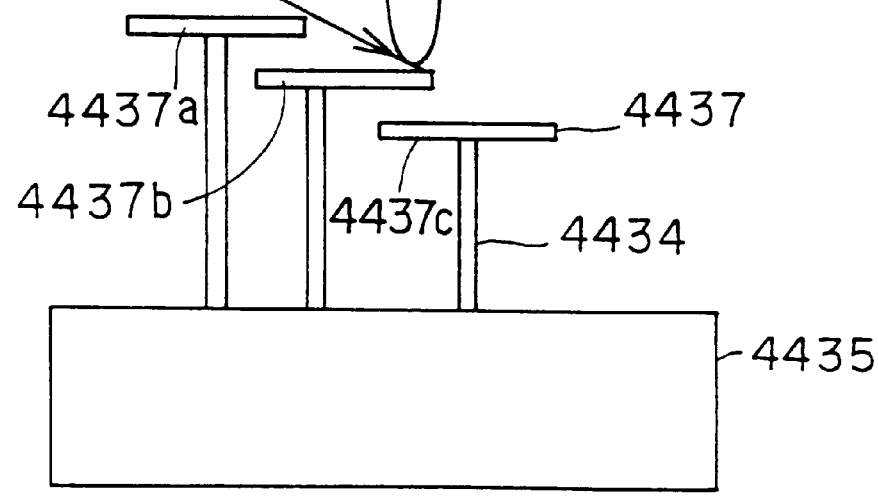
FIG. 94D is a front view showing the schematic structure of the main portion of the apparatus at that state.
Figure 95:
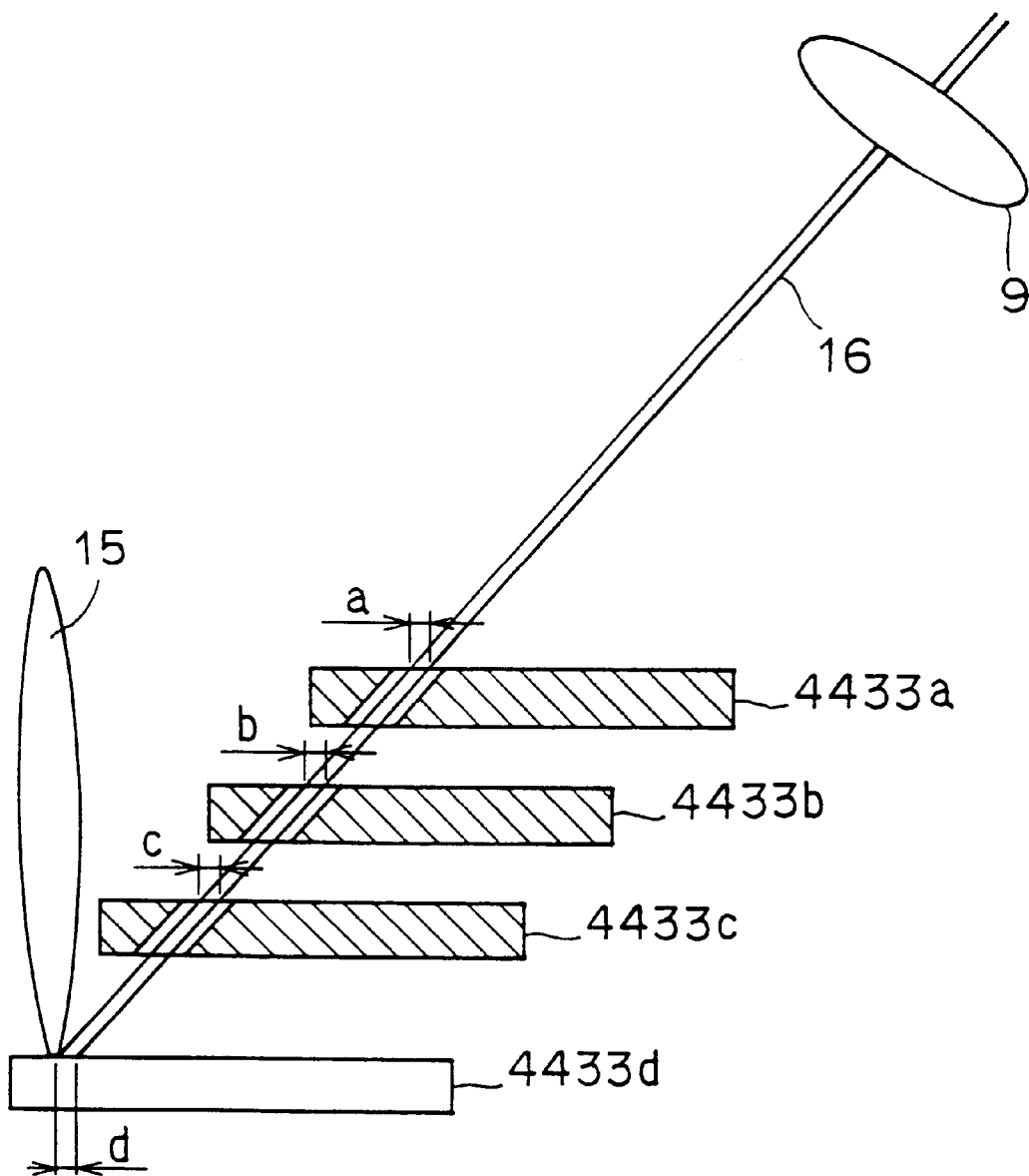
FIG. 95 shows a modification of the fifty-fifth embodiment of the present invention.

The operation will be described. In the above described embodiment, targets 4433 having openings through which laser beam is transmitted such as shown in FIG. 93 were used as the target. In this embodiment, a plurality of targets other than a target having an opening are used, so that plumes are generated from a plurality of portions by using only one laser beam. FIGS. 94A to 94D show an example in which triangular target is used as the polygonal target. The polygonal target is supported by target support 4434 as in the example shown in FIG. 93. The target support 4434 is connected to target base 4435 having a driving portion therein. In FIGS. 94A to 94D, for example, target supports 4434 and triangular targets 4437 are adapted to be rotated by the driving portion in target base 4435. The triangular targets 4437 are arranged such that by rotating each target, the laser beam 16 passes the side of one target to be incident on another target. For example, in FIGS. 94A to 94D, triangular target 4437 is supported by target support 4434 at the point of the center of gravity of the triangle, and rotates with the center of gravity of the triangle being the center. Here, the distance between the center of gravity to a vertex is longer than the distance from the center of gravity to one side, in a triangle. Therefore, when the triangular target is rotated such that the laser beam is incident near the vertex of the triangle, the laser beam is incident on the target when a portion near the vertex of the triangle comes to the position of the laser beam, while the laser beam is not incident on that target when a portion near one side of that target comes to the position of the laser beam, and the laser beam is incident on another target. FIG. 94B is a front view showing one example, and FIG. 94A is the front view thereof. Referring to FIG. 94B, the laser beam 16 is introduced from the upper left side. Though triangular targets 4437a to 4437c are rotated on target support 4434, at the moment shown in FIG. 94B, the portion in each of the triangular targets 4437a to 4437c which is closest to the laser beam 16 is, in triangular target 4437a, a side, in triangular target 4437b, a side, and in triangular target 4437c, a vertex. Therefore, laser beam passes outside of the sides of triangular targets 4437a and 4437b and directed to a portion near the vertex of the triangular target 4437c. Thus, a plume 15 is generated from triangular target 4437c. At the moment shown in FIG. 94C, the portion closest to laser beam 16 of each of triangular targets 4437a to 4437c is, in triangular target 4437a, a side, in triangular target 4437b, a vertex, and in triangular target 4437c, a side. Therefore laser beam 16 passes the outside of the side of triangular target 4437a and directed to the vicinity of vertex of 4437b. Thus plume 15 is generated from triangular target 4437b. By controlling rotation of each target, a plume can be generated from a plurality of portions by one laser beam 16, and a film can be formed over a wide area on substrate 2.

Figure 96A:
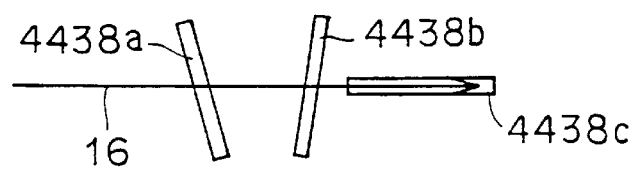
FIG. 96A is a plan view showing layout of the target in accordance with a modification of the fifty-sixth embodiment of the present invention.
Figure 96B:
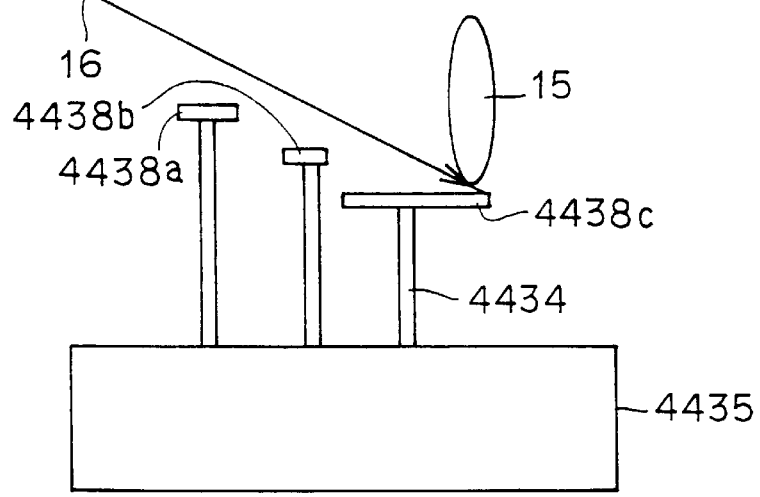
FIG. 96B is a front view showing a schematic structure of the main portion of the apparatus in this modification.

Though polygonal shaped targets are used in the example of FIGS. 94A to 94D, a bar shaped target may be used. FIGS. 96A to 96B show such an example. In FIGS. 96A and 96B, 4438 denote bar shaped targets. The bar shaped targets 4438 are supported by target supports 4434 as in the example shown in FIGS. 94A to 94D. The target supports 4334 are connected to target base 4335 having a driving portion therein. In FIGS. 96A and 96B, for example, target supports 4434 and bar shaped targets 4438 are adapted to be rotated by the driving portion in target base 4435. These bar shaped targets are arranged such that when each of the targets is rotated and the longitudinal direction of a bar shaped target and the direction of the optical path of the laser beam 16 coincide with each other, laser beam 16 is incident on the target 4438, while when the longitudinal direction of the bar shaped target and the direction of the optical path of laser beam 16 do not coincide with each other, the laser beam 16 passes aside the target to be incident on another target. FIG.

96B is a front view showing one example thereof, and FIG. 96A is plan view. Referring to FIG. 96B, laser beam 16 is introduced from upper left side.

Bar shaped targets 4438a to 4438c are rotated on target support 4434. At the moment shown in FIGS. 96A and 96B, as for the longitudinal direction of the bar shaped targets 4438a to 4438c and the optical path direction of laser beam 16, the longitudinal direction and the direction of the optical path of the beam do not coincide in the case of bar shaped target 4438a, the directions do not coincide in the case of bar shaped target 4438b either, but the longitudinal direction of bar shaped target 4438c coincides with the direction of the optical path. Therefore, laser beam 16 does not directed to bar shaped two targets 4438a and 4438b, but it is directed to the bar shaped target 4438c. Thus a plume 15 is generated from bar shaped to target 4438c. By controlling rotation of the targets, plumes can be generated from a plurality of portions by one beam 16, and therefore a film can be formed over wide area on substrate 2.

Figure 97:
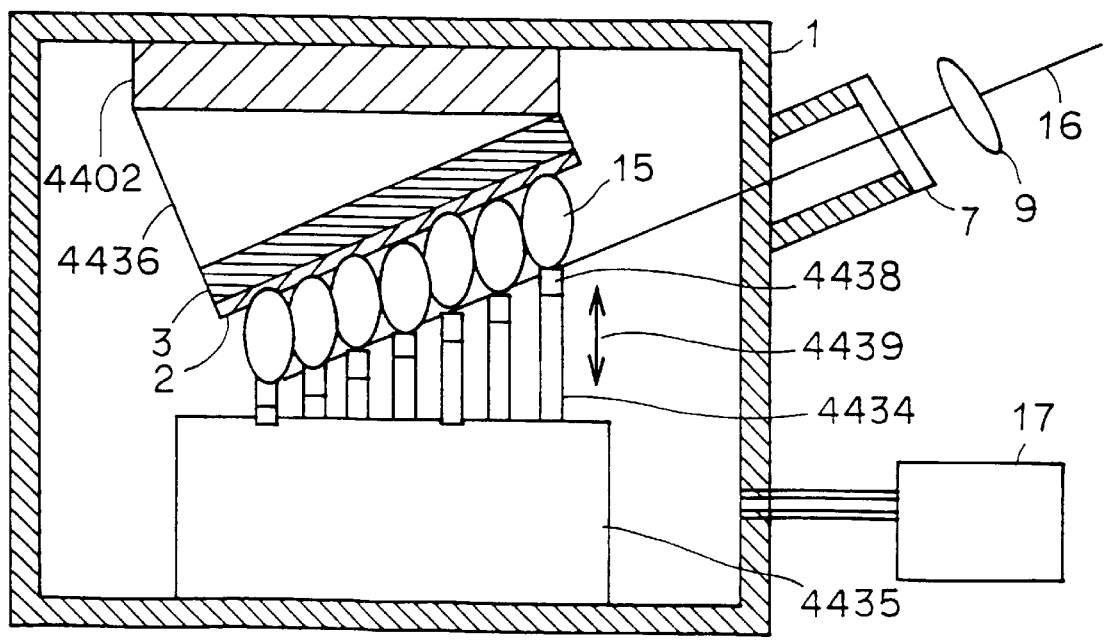
FIG. 97 is a cross section showing a schematic structure of the thin film forming apparatus using laser in accordance with another modification of the fifty-sixth embodiment of the present invention.

Though a mechanism for rotation is used for changing the positions of targets in the above described embodiment, a mechanism for horizontal movement or vertical movement may be used to provide the same effect. FIG. 97 shows an example employing a mechanism for vertical movement. In the example of FIG. 97, bar shaped targets 4438 are attached to bar shaped target support 4434. The target support 4434 are connected to a target base 4435 having a driving portion therein. In FIG. 97, target support 4434 and bar shaped target 4438 are adapted to move in the vertical direction indicated by the arrow 4439 by means of the driving portion in the target base 4435. When a target which is closest to laser inlet window 7 is placed on the optical path of the laser beam 16, the laser beam is incident on the target, and the plume is generated from this target. When the target closest to the laser inlet window 7 is lowered away from the optical path of the laser beam 16 and the target second closest to the laser inlet window 7 is placed on the optical path of the laser 16, laser beam 16 is incident on this target and the plume is generated from this second closest target. Similarly, when all the targets from the closest one to the nth closest target to the laser inlet window 7 are lowered away from the optical path of laser beam 16 and the n+1th closest target from the laser inlet window 7 is placed on the optical path of the laser 16, laser beam 16 is directed to the target n+1th-closest to laser inlet window 7, and the plume is generated from this target. By controlling the positions of these targets in this manner, plumes can be generated from a plurality of portions by one laser beam 16, and a film can be formed over wide range on the surface of substrate 2.

Figure 99:
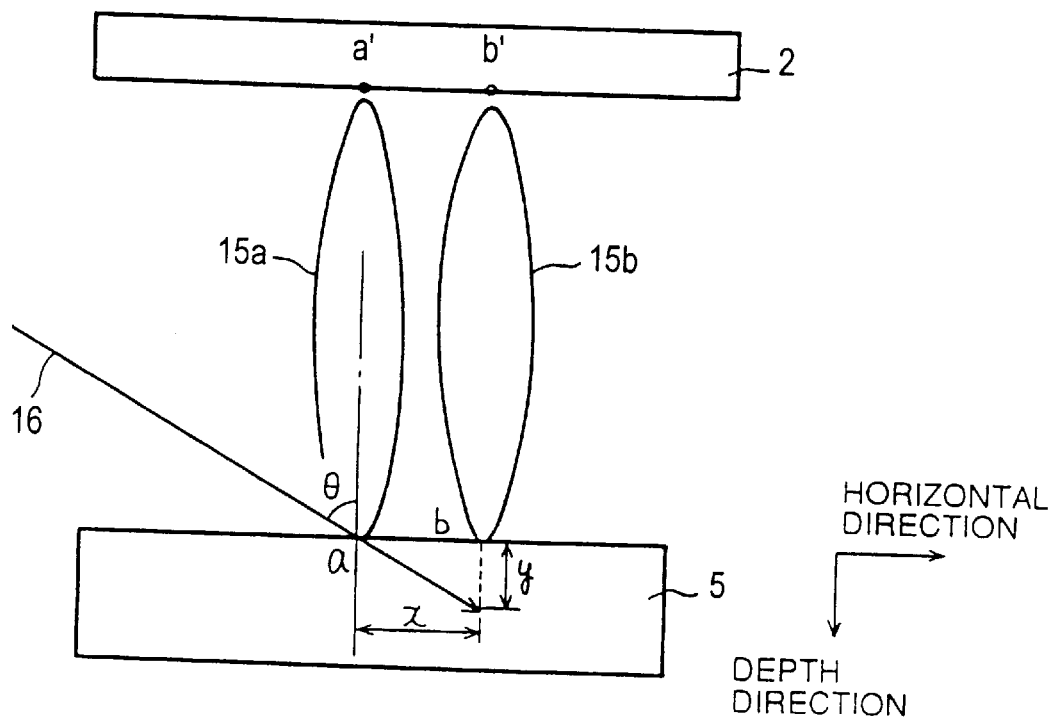
FIG. 99 is an illustration showing the operation in the fifty-seventh embodiment of the present invention.

A fifty-seventh embodiment of the present invention will be described with reference to FIG. 99. FIG. 99 is an illustration showing the operation of this embodiment. Referring to FIG. 99, the laser beam 16 is directed to target 5 with an incident angle of θ. First, a point a of target 5 is irradiated with laser beam 16. At this time, plume 15a is generated from this point a, and a film is formed near a point a' of substrate 2 by this plume 15a. When the laser beam 16 is continuously directed to target 5, the surface of target 5 is removed with time. The rate of removal of target 5 in the depth direction y is represented as dy/dt=b (t).

Assume that a film is formed over a scope having the length of x in a time period t≦t0. Irradiation of point a with laser beam 16 is started at time t=0, and irradiation is continued to time t=t0. At this time, the depth y of removal of target 5 in the depth direction from time t=0 to t=t0 corresponds to the value obtained by time integral of the rate of removal dy/dt=b (t) of target 5 in the direction of the depth y from t=0 to t=t0. As the target 5 is removed, except in the case that the incident angle of laser beam 16 with respect to target 5 is 0, the target is removed also in the horizontal direction, and therefore the position of irradiation on target 5 with laser beam 16 is deviated gradually. The distance x0 of removal of target 5 in horizontal direction from time t=0 to t=t0 is represented as x0=y0/tan (90°−θ) where y0 represents the removal of target 5 in the depth direction y.

When laser beam 16 is continuously emitted to target 5, at time t=0, the beam is incident on point a of target 5, and the position of irradiation changes as time passes and the beam is incident on point b which is apart from point a by the distance x0 at time t=t0. Accordingly, the position of the plume generated on target 5 changes from point a to point b accordingly, so that a film can be formed over point a' to b' on substrate 2 during this period. Therefore, when a film is to be formed over an area having the length x for a time t≦t0, the laser beam 16 should be directed to target 5 with an incident angle θ which is satisfies x≦y0/tan (90°−θ) so that the film can be formed over the prescribed area by the movement of the plume, utilizing the removal of target 5. In this manner, by introducing only one laser beam 16 into chamber 1, the position of plume 15 can be changed, and the film can be formed over a large area on substrate 2. When the area of film formation over substrate 2 is large and the distance between the substrate and the position of generation of each plume differs from plume to plume to an innegligible extent, film thickness and film quality may possibly be made uneven. In order to solve this problem, a spacer 4436 may be provided as shown in FIG. 92 so as to keep constant the distance between target 5 and substrate 2 constant.

Figure 100:
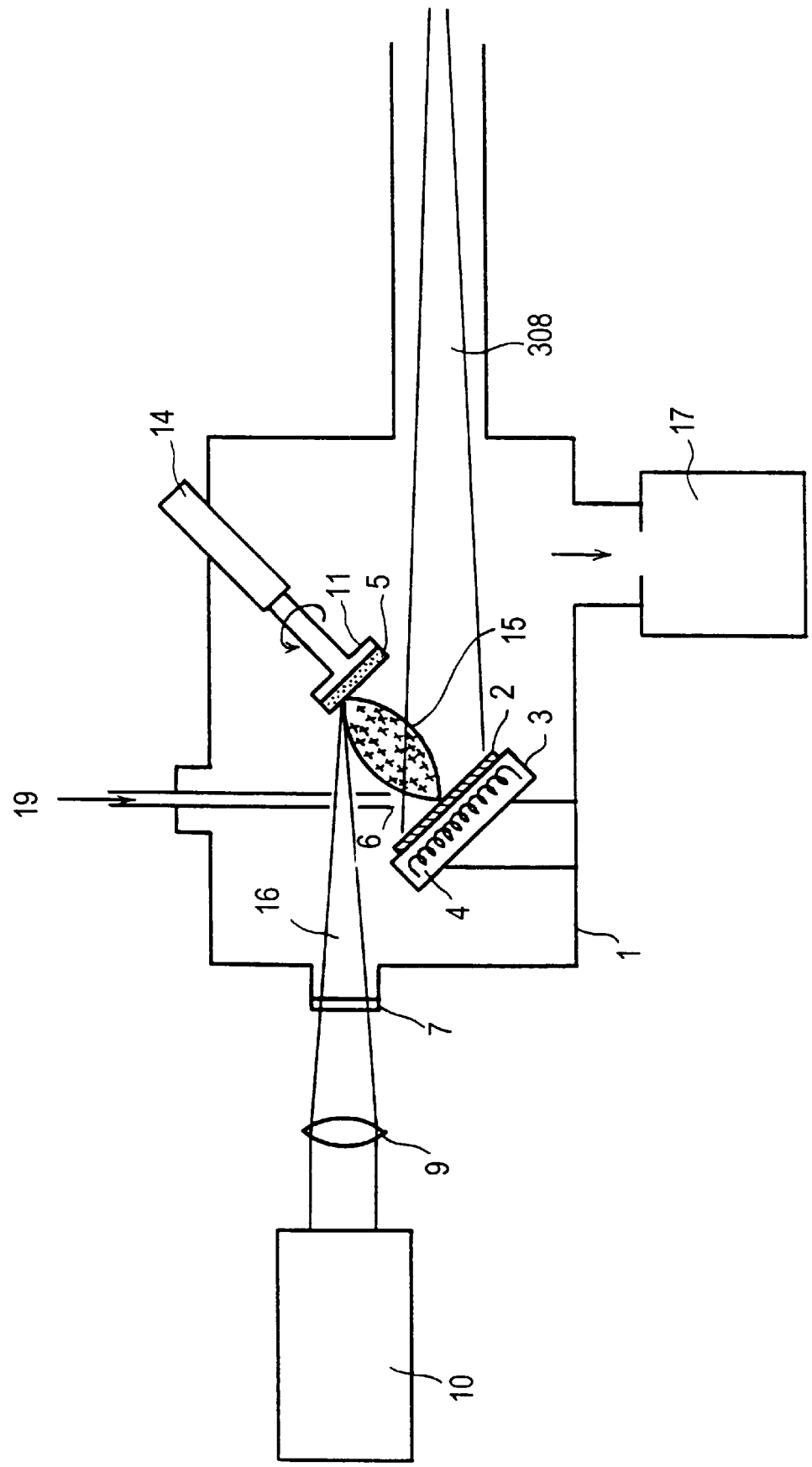
FIG. 100 is a cross sectional view showing a schematic structure of the thin film forming apparatus using laser in accordance with the fifty-eighth embodiment of the present invention.

A fifty-eighth embodiment of the present invention will be described with reference to FIG. 100. In the figure, the same reference characters as in FIGS. 148 and 149 denote the same or corresponding portions.

The operation will be described. The laser beam emitted from laser unit 10 is condensed by condenser lens 9 and passed through laser inlet window 7 of chamber 1 to be incident on raw material target 5 placed on turntable 11 of chamber 1. At the portion of raw material target 5 irradiated with laser, plasma of the target material is generated abruptly at the time of laser irradiation, and in the process of cooling the plasma in several ten ns, isolated groups of excited atoms, molecules and ions are generated. These groups of excited atoms, molecules and ions have lives of several microseconds and they are emitted in the space to form a plume 15 which is like a flame of a candle.

Substrate 2 is placed fixed on substrate holder 3 opposing to raw material target 5. Excited atoms, molecules and ions in the plume and the target material in the shape of clusters which are combinations of these atoms and ions reach the substrate 2 and are deposited and crystallized thereon to form a thin film, as in the prior art.

Meanwhile, radiation beam 308 is directed to the surface of substrate 2 during, during and after, or before, during and after laser beam irradiation of raw material target 5.

When the surface of the substrate 2 is irradiated with the radiation beam 308 during, or during and after irradiation of target 5 with laser beam 16, state of electrons of the atoms at the substrate surface are resonantly excited in non-equilibrium by radiation beam 308 which is a high energy continuous spectrum beam having its peak of light intensity at the range of soft X-ray to vacuum ultraviolet wavelength. In addition, atoms, molecules and clusters of the target raw material which have been generated by the irradiation of target 5 with laser beam 16 and have reached the surface of substrate have their states of electrons resonantly excited in non-equilibrium. Consequently, crystallization of the target material in the form of atoms, molecules and clusters on the substrate surface is promoted in non-thermal equilibrium, and therefore a thin film having high quality can be grown at a low temperature.

When the surface of substrate 2 is irradiated with radiation beam 309 before irradiation of target 5 with laser beam 16, state of electrons of atoms molecules constituting an impurity thin film formed on the surface or impurity particles deposited on the surface are resonantly excited in non-equilibrium, which promotes removal and elimination of the impurity particles or impurity thin film on the surface of the substrate 2. Accordingly, prior to the formation of a film by the target material on the substrate surface, a clear substrate surface is exposed. Therefore, initial nucleus of the thin film of the target material is generated on the pure and clean substrate surface without any impurities, and therefore thin film of the target material has the crystals grown regularly in the subsequent steps, and thus a thin film of high quality can be formed in a pure states with less problem of the interface impurities on the substrate.

A heater 4 for heating the substrate is provided in substrate holder 3. This enables post annealing in which the film deposited at a low temperature is annealed at a temperature higher than the temperature for crystallization to provide a thin film of high quality, and it also enables as-deposition in which the substrate itself is kept at a temperature higher than the temperature for crystallization at the time of deposition so that a crystallized thin film is formed at that site. In as-deposition method, active oxygen atmosphere is utilized as well. For example, when an oxide thin film is to be formed, a nozzle 6 for supplying gas 19 containing oxygen is provided as shown in the figure, so as to provide oxygen atmosphere near substrate 2, so as to promote generation of the oxide on substrate 2, as in the prior art.

In the above described fifty-eighth embodiment, radiation beam is used. However, instead of the radiation beam, vacuum ultraviolet laser beam such as fluorine (F2) laser, argon-fluorine (ArF) laser and the like, vacuum ultraviolet lamp such as xenon (Xe) lamp, deuterium (D$_2$) lamp and the like, or X-ray laser beam may be used to provide the same effect.

Figure 101:
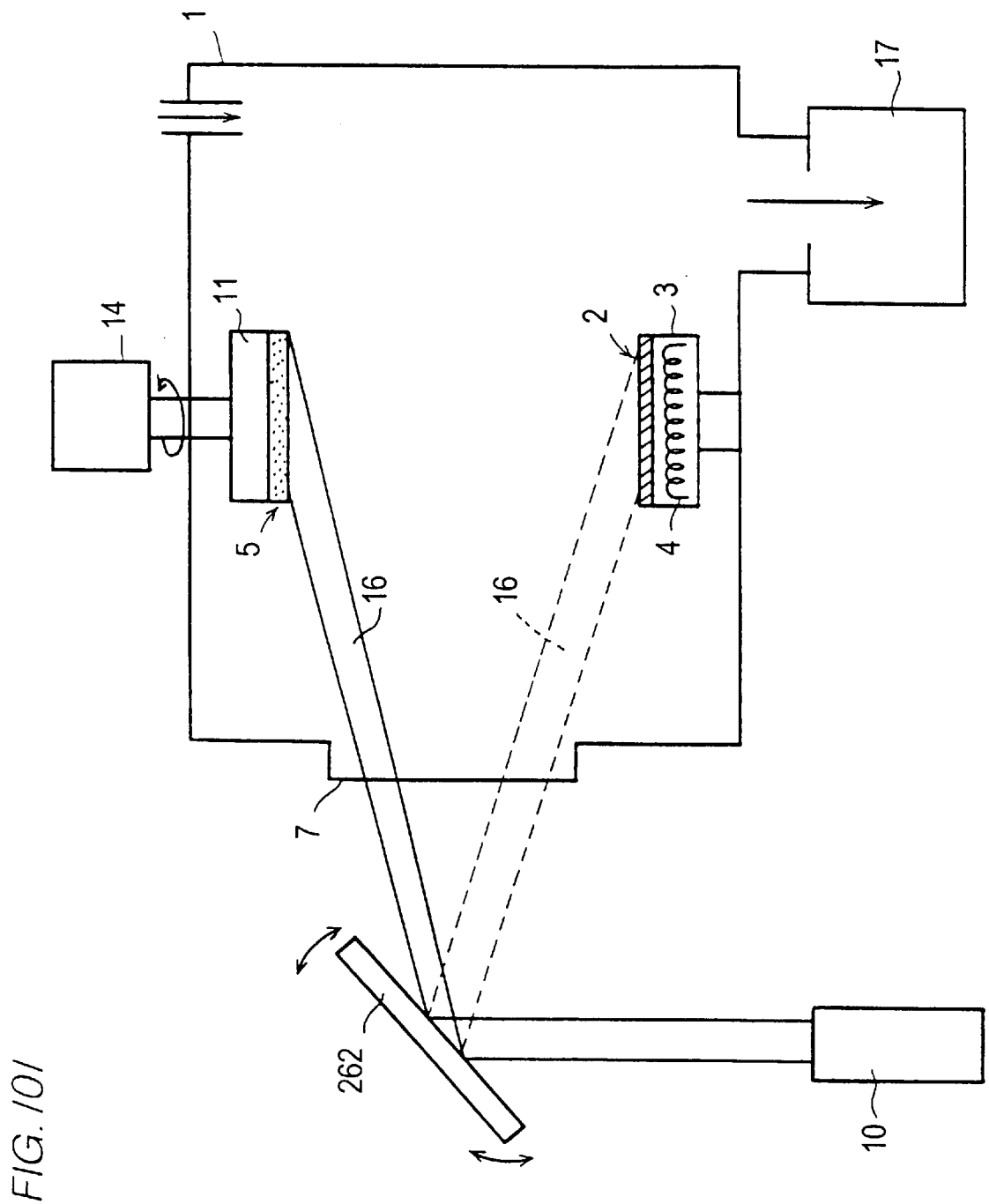
FIG. 101 is a cross sectional view showing a schematic structure of the thin film forming apparatus using laser in accordance with the fifty-ninth embodiment of the present invention.
Figure 111:
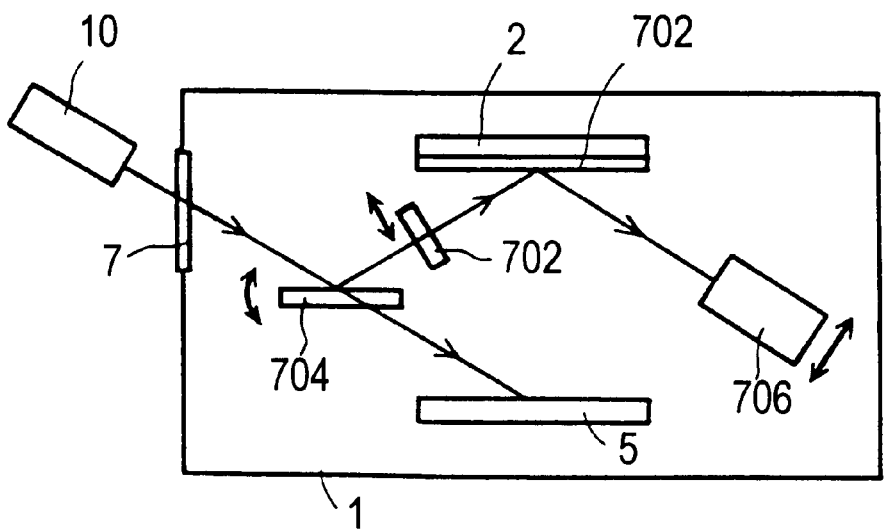
FIG. 111 is a cross sectional view showing a schematic structure of the thin film forming apparatus using laser in accordance with the sixty-ninth embodiment of the present invention.

A fifty-ninth embodiment of the present invention will be described with reference to FIG. 111. In the present embodiment, referring to FIG. 101, prior to film formation on the substrate opposing to the target by laser beam irradiation, a movable concave mirror 262 is rotated so that the substrate is irradiated with the laser beam and the substrate surface is heated, thereby cleaning the substrate surface. Thereafter, the movable concave mirror is rotated again so that the target is irradiated with the laser beam for film formation. Since the substrate is cleaned before film formation, impurity and foreign matters deposited on the substrate surface are removed, and therefore a film having superior property and less impurity can be formed. When a flat mirror is used as the mirror for reflecting the laser beam, a large area can be irradiated by changing the angle of the mirror a little, and therefore large area of the substrate can be cleaned and the film is formed. When a concave mirror is used as the mirror for reflecting the laser beam, irradiation of a large area of the target as well as of the substrate is possible. This time, if the movable concave mirror is positioned at an intermediate position between the target surface and the substrate surface, adjustment of the beam diameter when the destination of the beam is changed become unnecessary.

Figure 102:
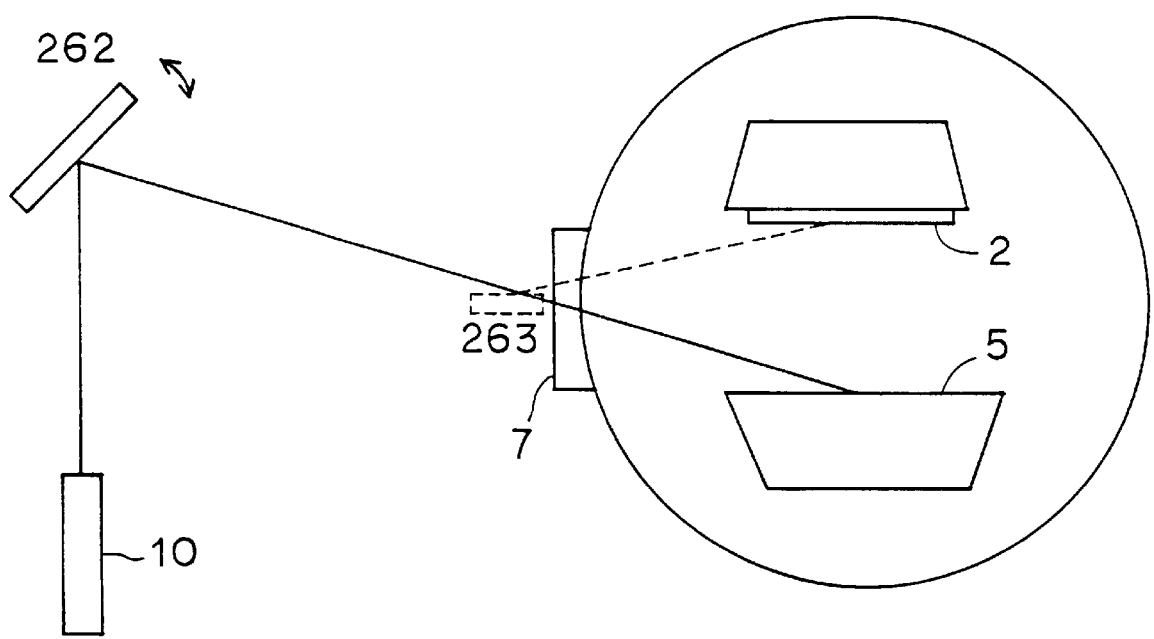
FIG. 102 is a cross sectional view showing a schematic structure of a main portion of the thin film forming apparatus using laser in accordance with the sixtieth embodiment of the present invention.

A sixtieth embodiment of the present invention will be described with reference to FIG. 102. In this embodiment, referring to FIG. 102, prior to film formation on the substrate opposing to the target by laser beam irradiation, a movable mirror 263 is inserted to the optical path of the laser so that the substrate is irradiated with the laser beam, and the substrate surface is heated. Thus the substrate surface is cleaned. Thereafter, the movable mirror 263 is moved again to be out of the optical path of the laser beam, and the target is irradiated with the laser beam and the film is formed. Since the substrate is made clean before film formation, impurities and foreign matters deposited on the surface of the substrate are removed. Consequently, a film having superior properties and less impurities can be formed. As mentioned above, the first concave mirror for laser beam irradiation is movable, so that large area of the target as well as of the substrate can be irradiated.

Figure 103:
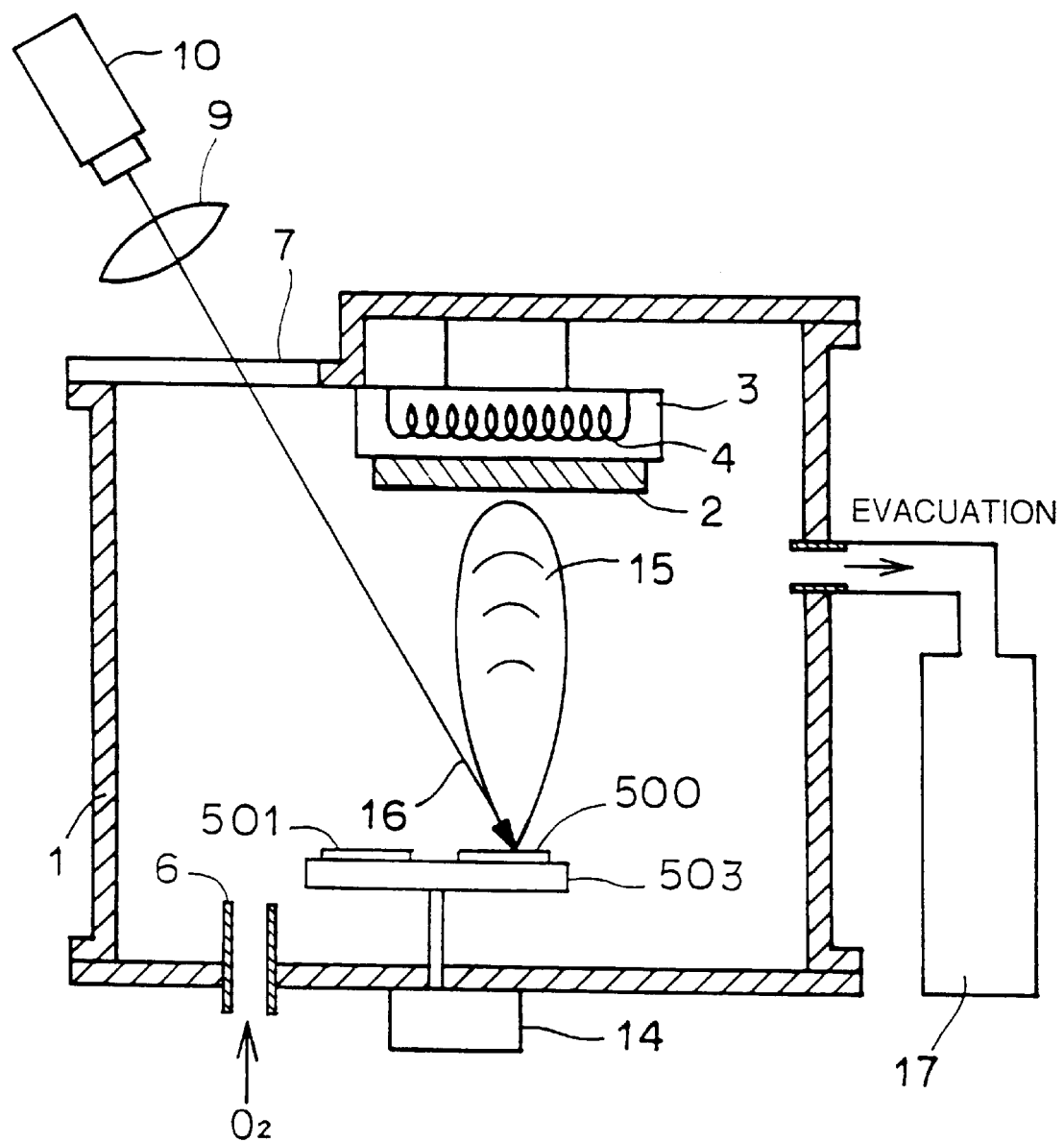
FIG. 103 is a cross sectional view showing a schematic structure of the thin film forming apparatus using laser in accordance with the sixty-first embodiment of the present invention.

A sixty-first embodiment of the present invention will be described with reference to FIG. 103. Referring to FIG. 103, the apparatus of this embodiment includes a first raw material target 500, a second raw material target 501 and a turntable 503 on which the first and second raw material targets 500 and 501 are mounted. In this embodiment, $SrTiO_3$ single crystal substrate is used as substrate 2, $BaTiO_3$ is used as the first material target 500, and $Ba_{0.5}Sr_{0.5}TiO_3$ is used as the second raw material target 501. In the figure, the same reference characters as in FIGS. 148 and 149 denote the same or corresponding portions.

The operation is as follows. First, turntable 503 is rotated so that $Ba_{0.5}Sr_{0.5}TiO_3$ target, which is the second raw material target 501 is moved to a position opposing to $SrTiO_3$ single crystal substrate 2. Second target 501 is irradiated only once with pulse laser beam, so that a (Ba, Sr) $TiO_3$ the composition of which is very close to that of the target, is deposited to about 10 nm on the substrate 2. Thereafter, turntable 503 is rotated again to select $BaTiO_3$, which is the first raw material target 500. Irradiation with pulse laser beam is repeated, and a $BaTiO_3$ film of a desired thickness is deposited on the (Ba, Sr) $TiO_3$ film. The above described steps were carried out under reduced pressure in an oxygen atmosphere, and a $BaTiO_3$ epitaxial film with less defect can be obtained even when the substrate temperature is decreased to as low as about 500° C.

As described above, in this embodiment, a plurality of raw material targets are placed on a disk, and by rotating the disk, an arbitrary raw material target can be irradiated with the pulse laser beam. Since movement of the raw material target is in synchronization with the pulse laser beam, the raw material target can be changed for every irradiation. Since the raw material target can be arbitrarily changed in the process of film formation in this manner, when a film having different lattice constant from the underlayer is to be formed, a buffer layer having an intermediate lattice constant may be formed by using a different raw material target, and thereafter a desired film can be formed continuously. Further, it is expected that the thin film deposited by the thin film forming apparatus using laser has its composition changed quite a little from the composition of the target. Therefore, the lattice constant can be delicately controlled. Accordingly, through the above described steps, a film having superior property of crystals can be obtained at low substrate temperature. Accordingly, degradation of the substrate and degradation of the function of the thin film caused by undesirable side reaction derived from high temperature for forming the film on the substrate can be prevented.

Provision of a film having superior crystal property at low substrate temperature by continuously forming the buffer layer and the thin film which is the original object, realized by the present embodiment, is especially useful in fabricating a perovskite type single crystal thin film which is mainly consisting of titanate such as $BaTiO_3$ which is used as a dielectric film of a thin film capacitor of highly dielectric body.

For example, conventionally, a $BaTiO_3$ thin film capacitor or the like has been in most cases formed by using $SrTiO_3$ or Pt used as a lower electrode. However, in that case, there is lattice mismatch of about 2 to 3% between $BaTiO_3$ and the lower electrode. Therefore, if deposition is carried out in this state, an epitaxial film having superior crystal property cannot be obtained unless the substrate temperature is increased to as high as about 900° C.

Figure 104:
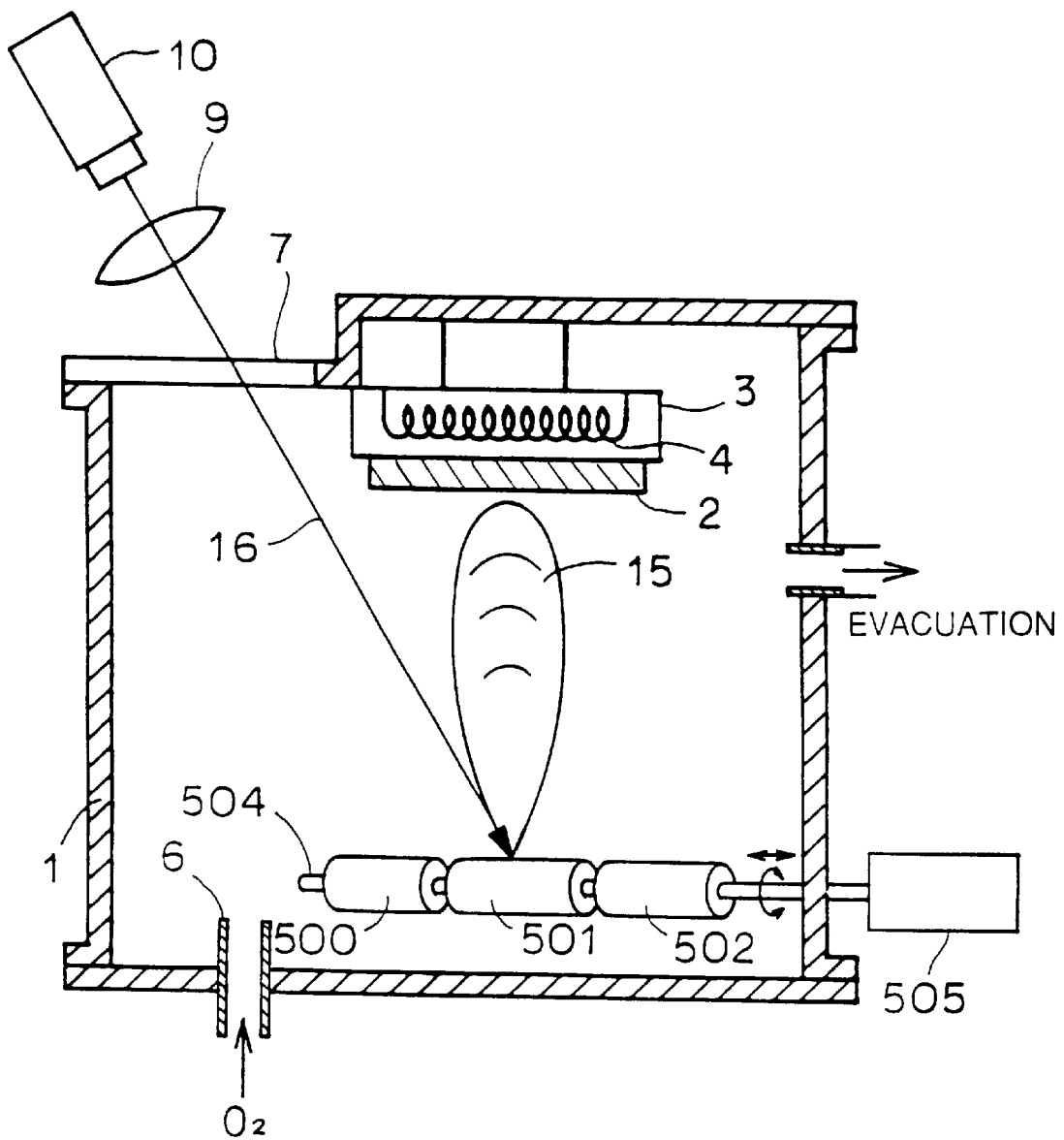
FIG. 104 is a cross sectional view showing a schematic structure of the thin film forming apparatus using laser in accordance with the sixty-second embodiment of the present invention.

A sixty-second embodiment of the present invention will be described with reference to FIG. 104. The apparatus of this embodiment includes, referring to FIG. 104, a first raw material target 500, a second raw material target 501, a third raw material target 502, a shaft 504 mounting the raw material targets, and a shaft controlling apparatus 505 for controlling rotation and parallel movement of the shaft. In this embodiment, a Si wafer is used as the substrate 2, $BaTiO_3$ is used as the first raw material target 500, $Ba_{0.5}Sr_{0.5}TiO_3$ is used as the second raw material target 501, and Pt is used as the third raw material target 502. In the figure, the same reference characters as in FIGS. 418 and 149 denote the same or corresponding portions.

The operation will be described. First, the shaft 504 is moved in the axial direction and Pt, which is the third raw material target 502, is moved to a position opposing to substrate 2. Pulse laser irradiation is repeated so that a Pt film is deposited on an upper portion of Si wafer. Thereafter, shaft 504 is again moved in the axial direction, and $Ba_{0.5}Sr_{0.5}TiO_3$ target, which is the second raw material target 501, is irradiated only once by the pulse laser beam. Consequently, a (Ba, Sr) $TiO_3$ film having the composition very close to that of the target is deposited on substrate 2 to the thickness of about 10 nm. Thereafter, shaft 504 is again moved in the axial direction so as to select $BaTiO_3$, which is the first raw material target 500. By pulse laser irradiation, a $BaTiO_3$ film having a desired thickness is deposited on the (Ba, Sr) $TiO_3$ film. The above described steps were carried out under reduced pressure in an oxygen atmosphere, and a $BaTiO_3$ epitaxial film having less defect could be formed as in the above described embodiment, even when the substrate temperature is decreased to as low as about 500° C.

Though only one layer of (Ba, Sr) $TiO_3$ is used as the buffer layer enabling epitaxial growth of the $BaTiO_3$ film in the above described embodiment, the property of crystal of the $BaTiO_3$ can be further improved by using a plurality of layers having lattice constants slightly different from each other. This can be realized by arranging a desired number of raw material targets in the thin film forming apparatus using laser, and operating these in synchronization with the laser, so that a desired raw material target can be selected. In the foregoing, means to obtain a $BaTiO_3$ film having superior crystal property has been described. However, such means is also effective in forming other films of crystal property at a low temperature.

Figure 105:
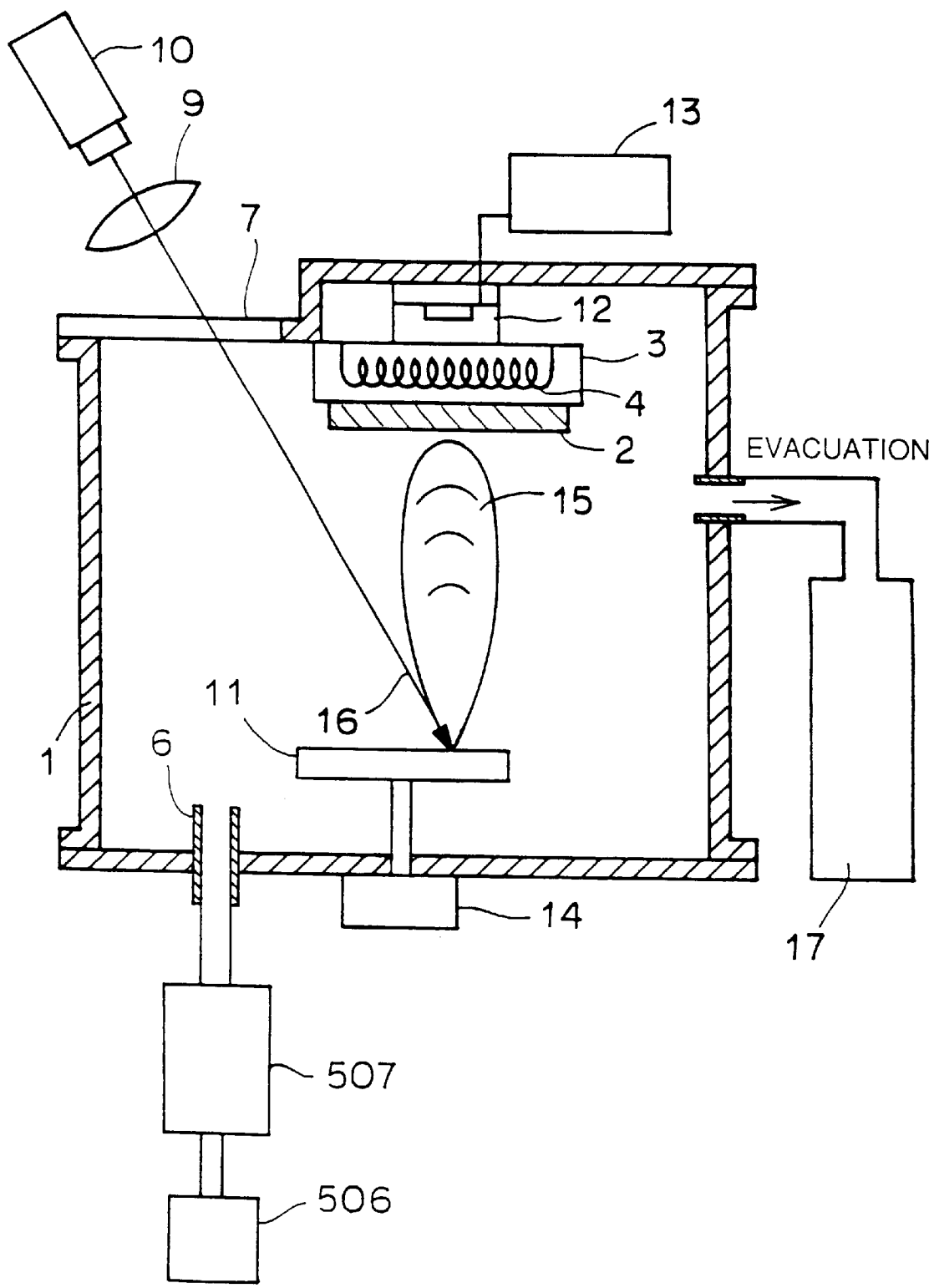
FIG. 105 is a cross sectional view showing a schematic structure of the thin film forming apparatus using laser in accordance with the sixty-third embodiment of the present invention.

A sixty-third embodiment of the present invention will be described with reference to FIG. 105. The apparatus of this embodiment includes, referring to FIG. 105, an oxygen gas supply source 506 and an ECR plasma chamber 507. In this embodiment, a silicon substrate coated with platinum is used as the substrate 2, and $BaTiO_3$ is used as raw material target 5. In the figure, the same reference characters as in FIGS. 148 and 149 denote the same or corresponding portions.

The operation will be described. The oxygen gas supplied from the oxygen gas supply source first enters the ECR plasma chamber. There is an electrostatic field in the ECR plasma chamber, and microwave power is applied to this chamber. By the functions of these, a so-called ECR plasma derived from cyclotron movement of the oxygen gas is generated, and therefore active oxygen ions are generated. The oxygen gas activated in this manner is introduced to a film forming chamber. Under such a film forming atmosphere, $BaTiO_3$, as the raw material target was irradiated with the laser, and a thin film was formed. A $BaTiO_3$ thin film having smaller defects could be formed even when the substrate temperature was decreased to as low as about 500° C.

Though ECR plasma was used for ionizing the oxygen gas, similar effect is expected when RF plasma is used. Similar effect is also expected when oxygen gas is excited by irradiation with UV light. Though oxygen was used for oxidizing gas in this embodiment, an organic substance such as alcohol including oxygen may be used. Nitrogen gas may be used for oxidization in its broader meaning. Further, such effect is obtained not only in forming $BaTiO_3$ film but also in forming other oxide thin film.

As described above, the oxidizing gas in this embodiment is supplied from an oxidizing gas supply source and ionized in a preceding chamber provided for the purpose of activating the oxidizing gas such as an ECR plasma chamber, and then introduced to the thin film forming chamber. An oxide film is deposited by using laser in such an active oxidizing gas atmosphere. Since such active oxidizing gas is supplied to the film forming chamber, the oxygen defect generated during film deposition can be immediately repaired by the oxygen ions supplied from the active oxidizing atmosphere. Therefore, an oxide film having superior crystal properties with smaller oxygen defect can be obtained even at a low temperature. Accordingly, degradation of the substrate and degradation of the function of the thin film caused by undesirable side reaction derived from high temperature for film formation of the substrate can be prevented. The ionized oxidizing gas introduced to the film forming chamber do not have such high kinetic energy as the ion beam, and therefore the damage to the substrate is negligible.

Provision of an oxide film having superior quality at a low substrate temperature by introducing the oxidizing gas to the film forming chamber after the gas is activated, such as realized by the present embodiment, is especially advantageous in fabricating a perovskite type thin film mainly consisting of titanate such as $BaTiO_3$ used as a dielectric film of a thin film capacitor of highly dielectric body. Conventionally, it has been difficult to form a highly insulative $BaTiO_3$ thin film at a low temperature. This is because the oxygen defects generated during deposition of the film cannot be easily repaired when the film is deposited at a low temperature. When the film is formed at a high temperature, there have been problems of mutual diffusion of composition elements at the interface between the formed film and a platinum film which is mainly used as the lower electrode, and degradation of insulation derived therefrom.

Figure 106:
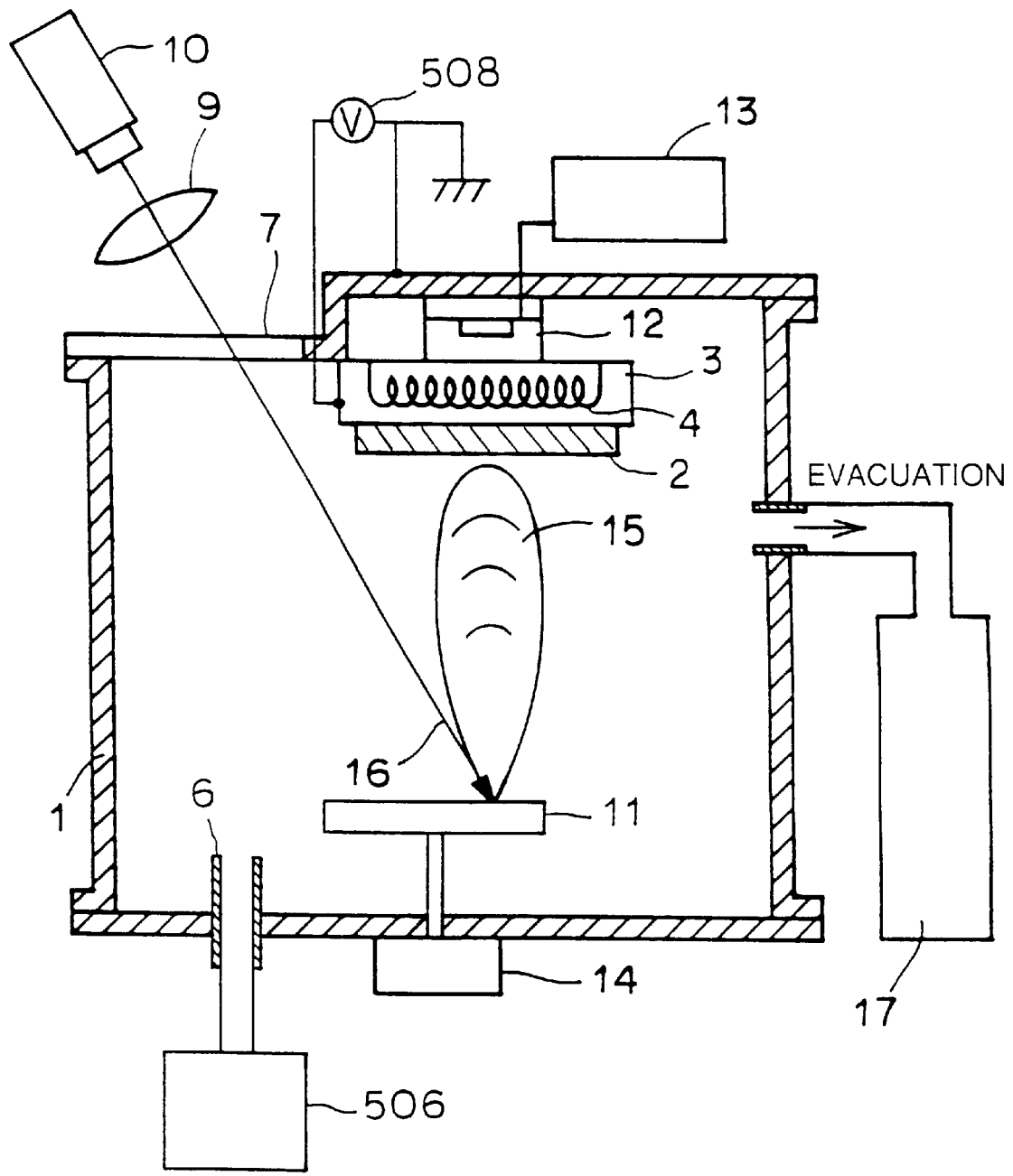
FIG. 106 is a cross sectional view showing a schematic structure of the thin film forming apparatus using laser in accordance with the sixty-fourth embodiment of the present invention.

A sixty-fourth embodiment of the present invention will be described with reference to FIG. 106. The apparatus of this embodiment includes, referring to FIG. 106, an oxygen gas supplying source 506 and a DC power supply 508 for applying a DC voltage to the substrate. In this embodiment, a silicon substrate coated with platinum is used as substrate 2, and $BaTiO_3$ is used as raw material target 5. In the figure, the same reference characters as in FIGS. 148 and 149 denote the same or corresponding portions.

The operation will be described. First, while a prescribed positive bias is being applied to the substrate, the raw material target is irradiated with the laser beam, thus a plume is generated, and the film is deposited on the substrate placed near the plume. At this time, oxygen ions generated by the reaction with the plume are collected near the substrate as they are attracted by the positive potential of the substrate and these ions contribute to repair oxygen defect during film formation. By such an operation, a $BaTiO_3$ thin film could be obtained with smaller defects even when the substrate temperature was decreased to as low about 500° C.

Though a DC potential is applied to the substrate in this embodiment, an AC potential such RF may be applied. Similar effect can be expected by excitation of the oxygen gas by UV irradiation. Though oxygen was used as oxidizing gas in this embodiment, an organic substance containing oxygen such as alcohol may be used. Nitrogen gas may be used for oxidation in its broader meaning. Further, such effect is provided not only in forming the $BaTiO_3$ film but also in forming other oxide thin films.

As described above, the thin film forming apparatus using laser in accordance with this embodiment is structured such that at the time of depositing an oxide film, an oxidizing gas is introduced to the film forming chamber, and when the raw material target is irradiated with the laser beam and there is generated a plume between the raw material target and the substrate, a DC or RF potential is applied between the substrate and the ground potential or between the substrate and the raw material target. When a DC positive potential or the like is applied to the substrate, for example, the oxidizing gas which has been ionized by the reaction with the radical seeds and the like in the plume near the substrate will be incident on the substrate surface with an appropriate energy. Such ion seeds repair the oxygen defects which are caused during film deposition. Therefore, an oxide film having superior crystal property with smaller oxygen defects can be obtained even when the substrate temperature is low. Accordingly, degradation of the substrate and the degradation of the function of the thin film caused by undesirable side reaction derived from high temperature for film formation of the substrate can be prevented. In addition, the kinetic energy of the oxidizing gas which has been ionized and guided near to the substrate can be made small enough not to damage the substrate, by appropriately adjusting the substrate potential.

Provision of an oxide film having superior quality at low substrate temperature by applying a DC or RF potential to the substrate and by guiding ion seeds generated in the reaction with the plume to the substrate surface, such as realized by the present invention, is especially useful in fabricating perovskite type thin film may be consisting of titanate such as $BaTiO_3$ which is used as a dielectric film of a thin film capacitor of a highly dielectric body. Generally, it has been difficult to form a highly insulative $BaTiO_3$ thin film at a low temperature. The reason for this is that the oxygen defects generated during film deposition is hardly repaired if the film is deposited at a low temperature. When the film is formed at a high temperature, there have been problems of mutual diffusion of composition elements at the interface between the film and the platinum film mainly used as the lower electrode, and degradation of insulation derived therefrom.

Figure 107:
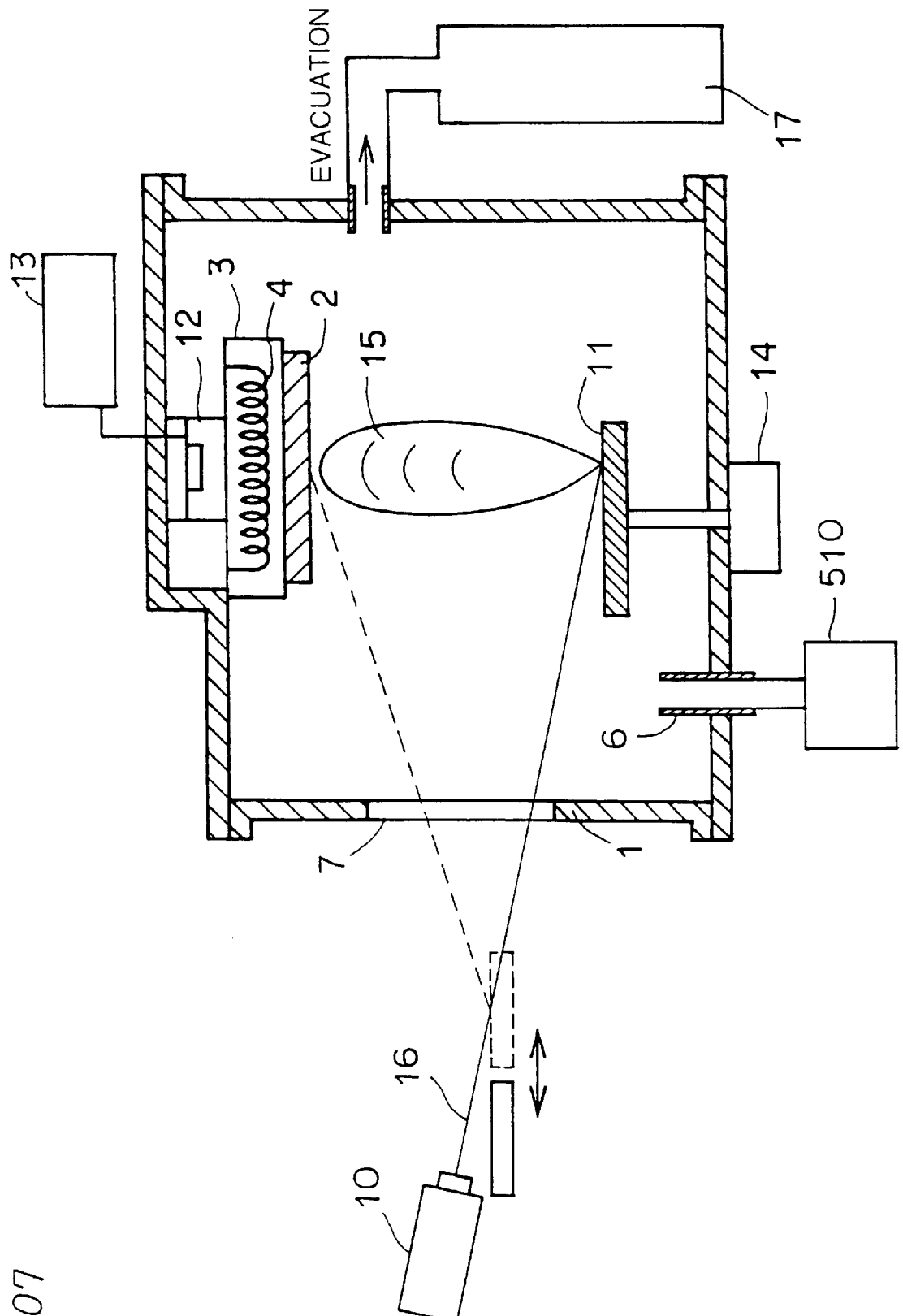
FIG. 107 is a cross sectional view showing a schematic structure of the thin film forming apparatus using laser in accordance with the sixty-fifth embodiment of the present invention.

A sixty-fifth embodiment of the present invention will be described with reference to FIG. 107. The apparatus of this embodiment includes, referring to FIG. 107, a mirror 509 for excimer laser, and an etching gas supply source 510. In this embodiment, a silicon wafer is used as substrate 2, a phosphorus doped silicon is used as raw material target, excimer laser is used as laser beam 16, and hydrofluoric acid vapor is used as etching gas. In the figure, the same reference characters as in FIGS. 148 and 149 denote the same or corresponding portions.

The operation will be described. In order to clean the surface of the silicon wafer prior to film formation, etching gas is introduced to the film forming chamber, the laser beam has its optical path changed by a mirror inserted to the optical path, and the substrate surface is irradiated with the laser beam. By the heat caused by the laser beam, organic contamination is removed by combustion. At the same time, natural oxide is removed by hydrofluoric acid, and thus a clear surface is obtained. Thereafter, the film forming chamber is evacuated to high vacuum, the mirror is removed so that the optical path of the laser is changed to the side of the target. By laser irradiation of raw material target, a polycrystalline silicon thin film is deposited. After the film deposition, in order to reduce resistance value by improving crystal property, the optical path of the laser is again changed, and the film surface is irradiated with the laser. By forming a polycrystalline silicon film in this manner, contact resistance and the wiring resistance could be reduced.

Though etching gas is introduced in the above described embodiment, similar effect of cleaning the substrate surface can be obtained by laser irradiation in vacuum. Although a mirror is used for changing the optical path of the laser, the optical path may be changed by moving the laser, moving the film forming chamber or by rotation of a lens.

As described above, in the thin film forming apparatus using laser in accordance with this embodiment, a excimer laser beam having high energy density is used, and the apparatus is structured such that the substrate surface can be irradiated with laser by switching the laser optical system. Consequently, by irradiating the substrate surface with laser before film deposition, clear substrate surface can be obtained without increasing the substrate temperature. By forming a desired film thereafter, the interface with less impurities can be obtained. By irradiating the film surface with the laser beam after the film is formed at a low temperature, the crystal property of the deposited film can be improved without degrading the substrate.

Cleaning of the substrate surface before deposition and improvement of the crystal property of the deposited film by irradiation of substrate surface with the laser beam such as realized by the present invention is especially useful in fabricating a polycrystalline silicon thin film for semiconductor memory devices. Conventionally, when in forming polycrystalline silicon wiring formed at the contact portion with the silicon substrate, light etching of the surface by hydrofluoric acid contained solution or a so-called in-situ cleaning in the film forming apparatus have been carried out in order to reduce impurities at the interface in order to reduce contact resistance, light etching is not so effective against contamination caused by the combination of organic deposition and natural oxide film. Further, a new natural oxide film may be grown until the substrate is set to the film forming apparatus. As for the in-situ cleaning, a temperature as high about 1000° C. is necessary. In order to reduce film resistance of the polycrystalline silicon film for wiring, dopant is introduced after film formation and then heated to a high temperature of about 900° C. However, provision of polycrystalline silicon film having low film resistance at lower temperature has been strongly in demand.

Figure 108:
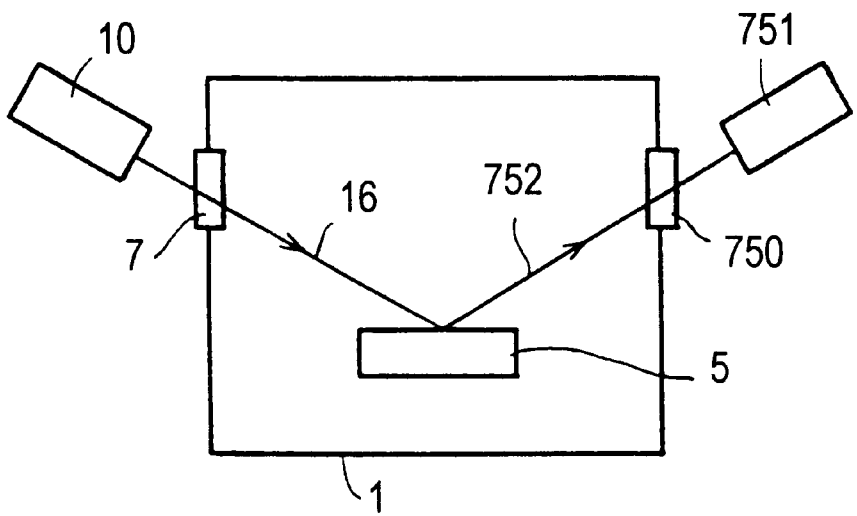
FIG. 108 is a cross sectional view showing a schematic structure of the thin film forming apparatus using laser in accordance with the sixty-sixth embodiment of the present invention.

Sixty-sixth embodiment of the invention will be described with reference to FIG. 108. In FIG. 108, the same portions as in the prior art example of FIG. 148 are denoted by the same reference characters and description thereof will not be repeated.

In this embodiment, referring to FIG. 108, the laser beam emitted from laser unit 10 and sputtering target 5 is reflected from the surface of the target to be turned to scattered laser beam 752, and detected by a detector 751 through an outlet window 750. At that time, as the unevenness on the target surface becomes larger, the detection intensity of the scattered laser beam decreases. Therefore, in-situ, that is, at the site of forming the laser thin film, the state of erosion of the target surface can be known, and therefore formation of uneven film caused by surface roughness of the target can be prevented.

Figure 109:
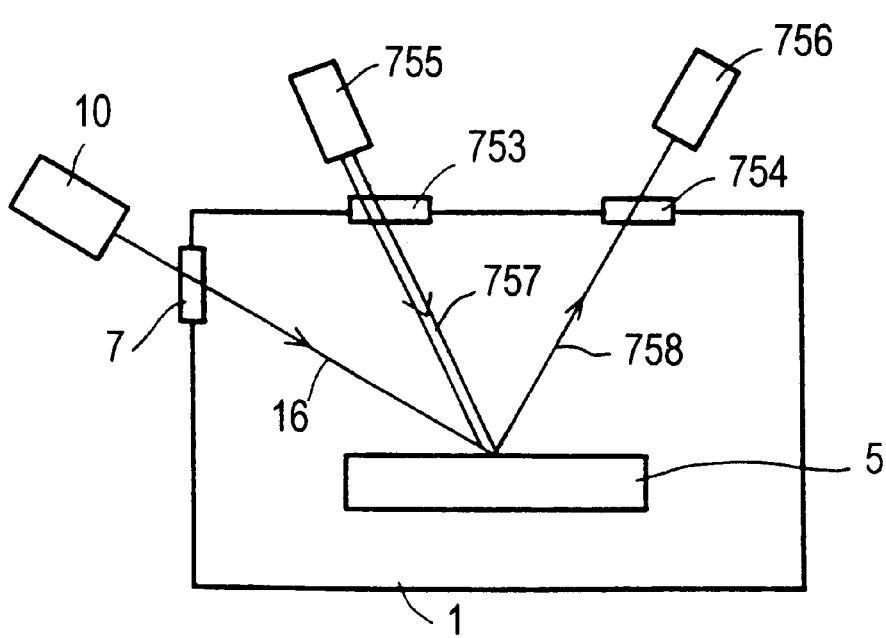
FIG. 109 is a cross sectional view showing a schematic structure of the thin film forming apparatus using laser in accordance with the sixty-seventh embodiment of the present invention.

A sixty-seventh embodiment of the present invention will be described with reference to FIG. 109. In FIG. 109, the same components as in the prior art example of FIG. 148 are denoted by the same reference characters and description thereof is not repeated. The apparatus of this embodiment includes, referring to FIG. 109, an inlet window 753 of x-ray or electron beam, an outlet window 754 of characteristic x-ray, an apparatus for generating the x-ray or electronic beam, and a spectroscope 756 for the characteristic x-ray.

The operation is as follows. In synchronization with the laser beam 16 emitted from the laser unit and sputtering the target 5, a characteristic x-ray 758 inherent to the atoms constituting the target is generated by x-ray or electronic beam 757 emitted ram a x-ray or electronic beam generating apparatus 754. The characteristic x-ray 758 passes through outlet window 754 and is divided and detected by x-ray spectroscope 756, whereby qualitative and quantitative analysis of the target composition is carried out. Therefore, during the process of forming a thin film by using laser, the composition of the region of the target which is being sputtered can be known at that site. Therefore, formation of an uneven film caused by the change in composition of the target can be prevented.

Figure 110:
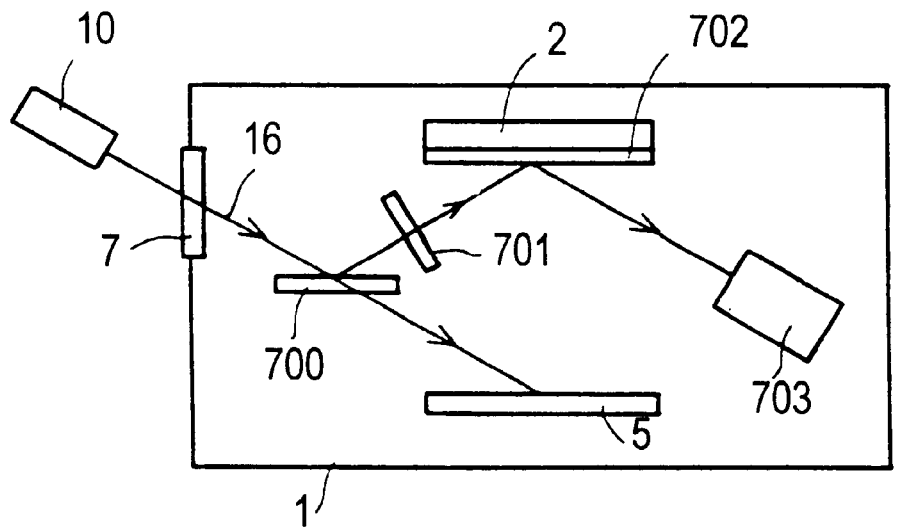
FIG. 110 is a cross sectional view showing a schematic structure of the thin film forming apparatus using laser in accordance with the sixty-eighth embodiment of the present invention.

A sixty-eighth embodiment of the present invention will be described with reference to FIG. 110. In FIG. 110, the same portions as in the prior art example of FIG. 148 are denoted by the same reference characters and description thereof will not be repeated. The apparatus of this embodiment includes, referring to FIG. 110, a half mirror 700 for dividing the laser beam, a polarizer 701 for polarizing the divided laser beam, and a detector 702 for ellipsometer.

The operation is as follows. The laser beam 16 emitted from laser unit 10 and sputtering target 5 has its part divided by half mirror 700 and passed through polarizer 701 so that the beam has polarization characteristics and then it is directed to a film 702 formed on substrate 2. The laser beam reflected from the film surface is detected by detector 703 for the ellipsometer. By the polarization analysis of the detected laser beam, the thickness of the film which is being formed can be monitored at that site during the process of forming a thin film using laser. In addition, the result of analysis can be fedback to the sputtering conditions, whereby the film thickness can be controlled.

A sixty-ninth embodiment of the present invention will be described with reference to FIG. 111. In FIG. 111, the same components as in the prior art example of FIG. 148 are denoted by the same reference characters and description thereof will not be repeated. The apparatus of this embodiment includes, referring to FIG. 111, a rotatable half mirror 704 for dividing the laser beam, a polarizer 705 which moves in synchronization with the rotation of the half mirror for polarizing the divided laser beam, a film formed by the thin film forming apparatus by using laser, and a detector 306 for an ellipsometer which moves in synchronization with the rotation of half mirror 704.

The operation is as follows. The laser beam 16 emitted from laser unit 10 and sputtering target 5 is partially divided by a rotating half mirror 704, and the divided beam is passed through a polarizer 705 which moves in synchronization with the rotation of the half mirror so that it has polarization characteristics. The film 702 formed on the substrate 2 is scanned and irradiated by this beam by the rotation of the half mirror. The laser beam reflected from the surface of this film is detected by detector 706 for the ellipsometer which also moves in synchronization with the rotation of half mirror. By polarization analysis of the detected laser beam, the film thickness distribution of the film being formed can be monitored at the site during the process of forming the thin film by using laser. In addition, the result of analysis can be fedback to the sputtering conditions, so that the film thickness and film thickness distribution can be controlled.

Figure 112:
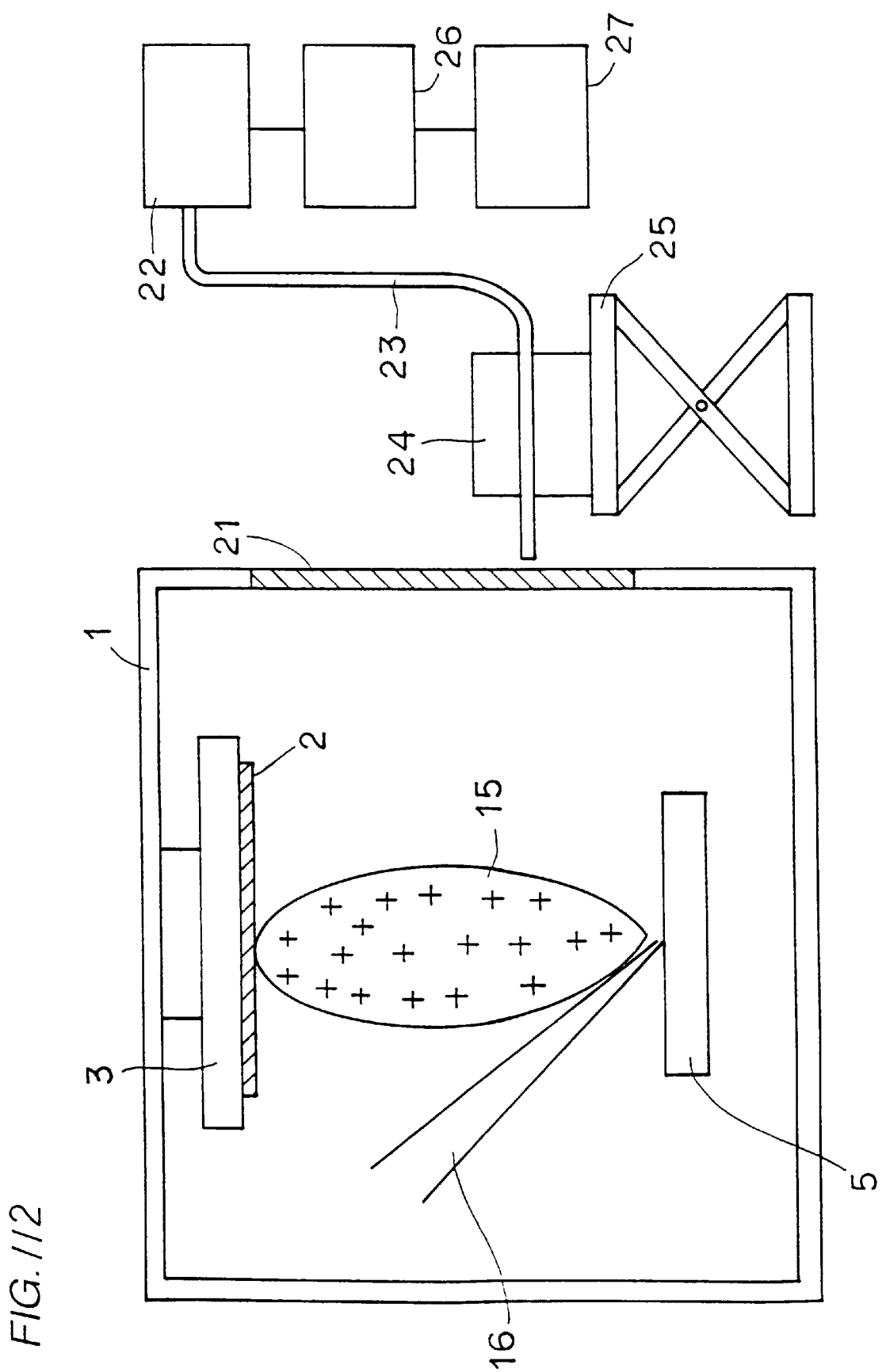
FIG. 112 is a cross sectional view showing a schematic structure of the thin film forming apparatus using laser in accordance with the seventieth embodiment of the present invention.

A seventieth embodiment of the present invention will be described with reference to FIG. 112. In FIG. 112, the same component as in the prior art example shown in FIG. 148 are denoted by the same reference characters and description thereof will not be repeated. Referring to FIG. 112, the apparatus of this embodiment includes a window 21 for monitoring generation of the plume, a spectroscope 22 for dividing and measuring the light generated from the plume, an optical fiber 23 for guiding the light generated from the plume to the spectroscope 22; an optical fiber support portion 24 for supporting one end of optical fiber 23 so that if faces window 21, a position adjusting mechanism 25 for moving optical fiber support portion 24, an analyzing apparatus 26 for analyzing the information obtained from spectroscope 22, and a controlling apparatus 27 for controlling film parameters based on the result of analysis obtained from analyzing apparatus 26.

The operation is as follows. In the thin film forming apparatus using laser structured as described above, optical fiber 23 supported by optical fiber support portion 24 is moved by adjusting position adjusting mechanism 25, light from various portions of the plume 15 is taken out from the chamber 1 through window 21, and the light is directed to spectroscope 22 through optical fiber 23. By analyzing light emission spectrum of the plume obtained from the spectroscope 22, types and ratio of particles playing important roles in forming the thin film such as activated neutral seeds and ion seeds at the state of high excitation in plume 15 can be recognized. By controlling parameters for film formation by using controlling apparatus 27 based on the result of analysis obtained from analyzing apparatus 26, the state of the plume 15 can be kept constant. Accordingly, a film having superior quality with uniform composition and smaller impurities or proper orientation can be formed.

Figure 113:
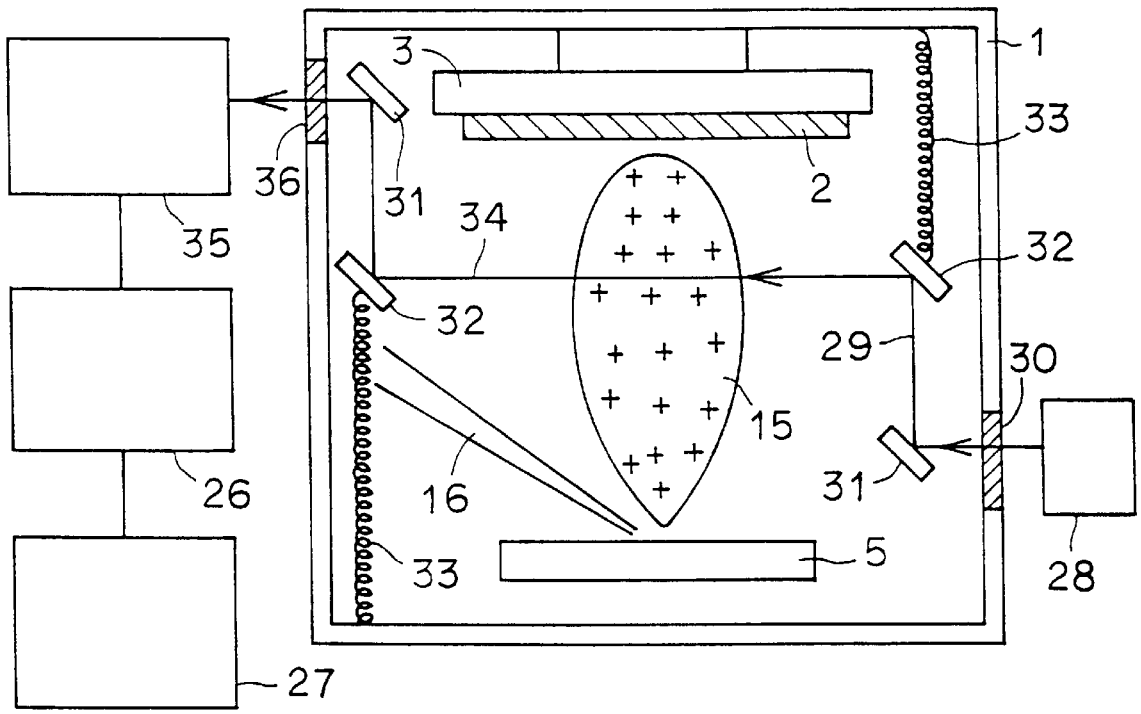
FIG. 113 is a cross sectional view showing a schematic structure of the thin film forming apparatus using laser in accordance with the seventy-first embodiment of the present invention.

A seventy-first embodiment of the present invention will be described with reference to FIG. 113. In the figure, the same components as in the prior art shown in FIG. 148 or the seventieth embodiment shown in FIG. 112 are denoted by the same reference characters and description thereof will not be repeated. The apparatus of this embodiment includes, referring to FIG. 113, an analyzing apparatus 26 for analyzing infrared absorption spectrum, an infrared light source 28, an inlet window 30 for introducing the infrared ray 29 to the inside of the film forming apparatus using laser, a fixed mirror 31 for changing the direction of the infrared ray 29, a movable mirror 32 for providing optical paths so that the infrared ray (incident light) 29 passes through various portions of plume 15, a moving apparatus 33 for changing position of the movable mirror 32, a time division Fourier transform infrared spectrometer 35 for spectroscopic measurement of the infrared ray (transmitted light) transmitted through plume 15, and an outlet window 36 for guiding the infrared ray (transmitted light) 34 to the infrared spectrometer 35.

The operation is as follows. In the thin film forming apparatus using laser structured as described above, the infrared ray (incident light) 29 emitted from infrared light source 28 enter through inlet window 30 and passes through the optical path of infrared ray (incident light) 29 formed by fixed mirror 31 and movable mirror 32 which is made movable by means of moving apparatus 33, to be incident on plume 15. The infrared ray (transmitted light) 34 which has transmitted through plume 15 passes through outlet window 36 by means of fixed mirror 31 and movable mirror 32, and enters time division Fourier transform infrared spectroscope 35. By analyzing the information obtained by infrared spectrometer 35 by analyzing apparatus 25, types and ratio and molecule seeds playing important role in forming the thin film and having absorption band in the infrared range at various portions of the plume 15 can be recognized. By controlling parameters for film formation by using the control apparatus 27 based on the result of analysis obtained from analyzing apparatus 26, the state of the plume 15 can be kept constant. Therefore, a film of high quality having uniform composition and smaller deposition or proper orientation can be formed.

Figure 114:
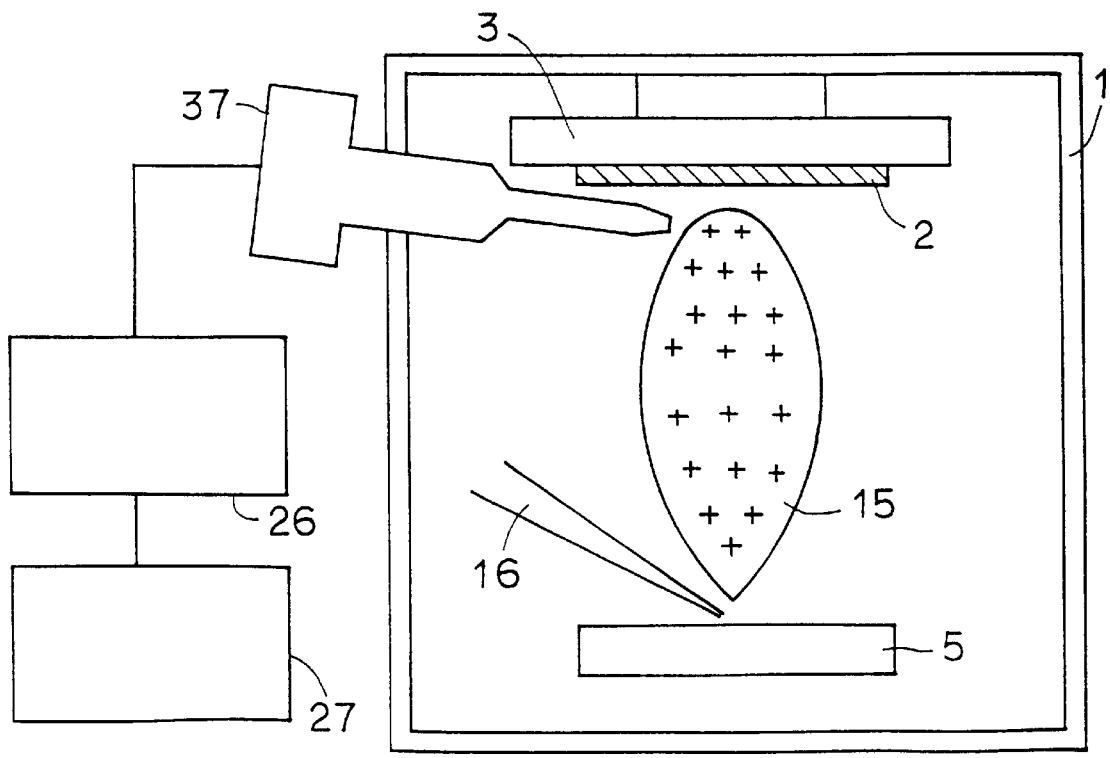
FIG. 114 is a cross sectional view showing a schematic structure of the thin film forming apparatus using laser in accordance with the seventy-second embodiment of the present invention.

A seventy-second embodiment of the present invention will be described with reference to FIG. 114. The apparatus of this embodiment includes, referring to FIG. 114, an analyzing apparatus 26 for analyzing mass spectrum, a controlling apparatus 27 which is the same as controlling apparatus 27 shown in FIG. 112, and a mass spectrometer 37 for measuring ions generated from the vicinity of substrate 2.

The operation is as follows. In the thin film forming apparatus using laser structured as described above, ions in the plume emitted from the vicinity of substrate 2 are measured by mass spectrometer 37. By analyzing the measured information by analyzing apparatus 26, types, energies and ratio of ions playing important roles in forming the thin film such as metal ions, oxide ions, cluster ions and the like can be recognized. Based on the result of analysis obtained from analyzing apparatus 26, by controlling parameters for film formation by using controlling apparatus 27, the state of plume 15 can be kept constant. Therefore, a film of high quality having uniform composition and less impurities or superior orientation can be formed.

Figure 115:
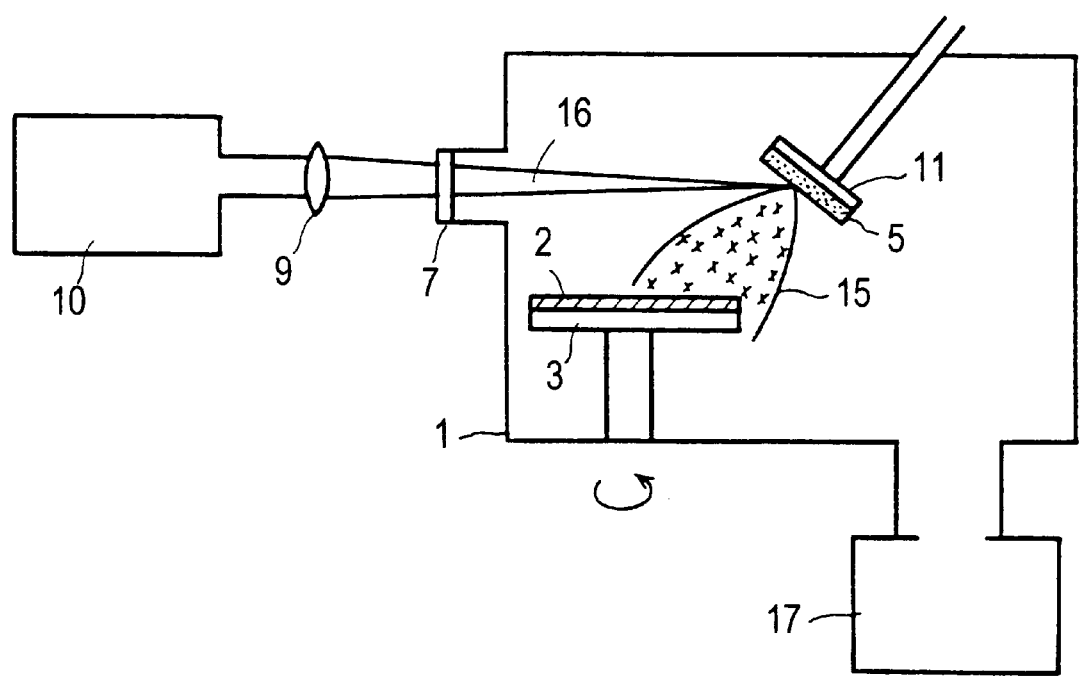
FIG. 115 is a cross sectional view showing a schematic structure of the thin film forming apparatus using laser in accordance with the seventy-third embodiment of the present invention.

A seventy-third embodiment of the present invention will be described with reference to FIG. 115. The basic structure of the apparatus shown in FIG. 115 is approximately the same as that of FIG. 148 except that controlling apparatus 13 is not provided.

The operation will be described. The basic mechanism for film formation is the same as in the prior art example. Laser beam 16 emitted from laser unit 10 is condensed by condenser lens 9 and passed through laser inlet window 7 of chamber 1 to be incident on raw material target 5 placed on turntable 11 in chamber 1. Substrate holder 3 is positioned inclined by a prescribed angle from the central axis of the generated plume 15. The central axis thereof passes in front of the center of substrate 2. Therefore, excited atoms and ions included in a wide section on the side of the plume 15 reaches substrate 2 and are deposited thereon to form a thin film. In order to make uniform the film thickness, the thin film is formed while the substrate holder 3 is rotated.

As described above, in accordance with this invention, parallel movement is not necessary during film formation, and therefore controlling apparatus 13 can be dispensed with. Accordingly, a thin film having uniform thickness can be formed over a large area relatively easily.

Figure 116:
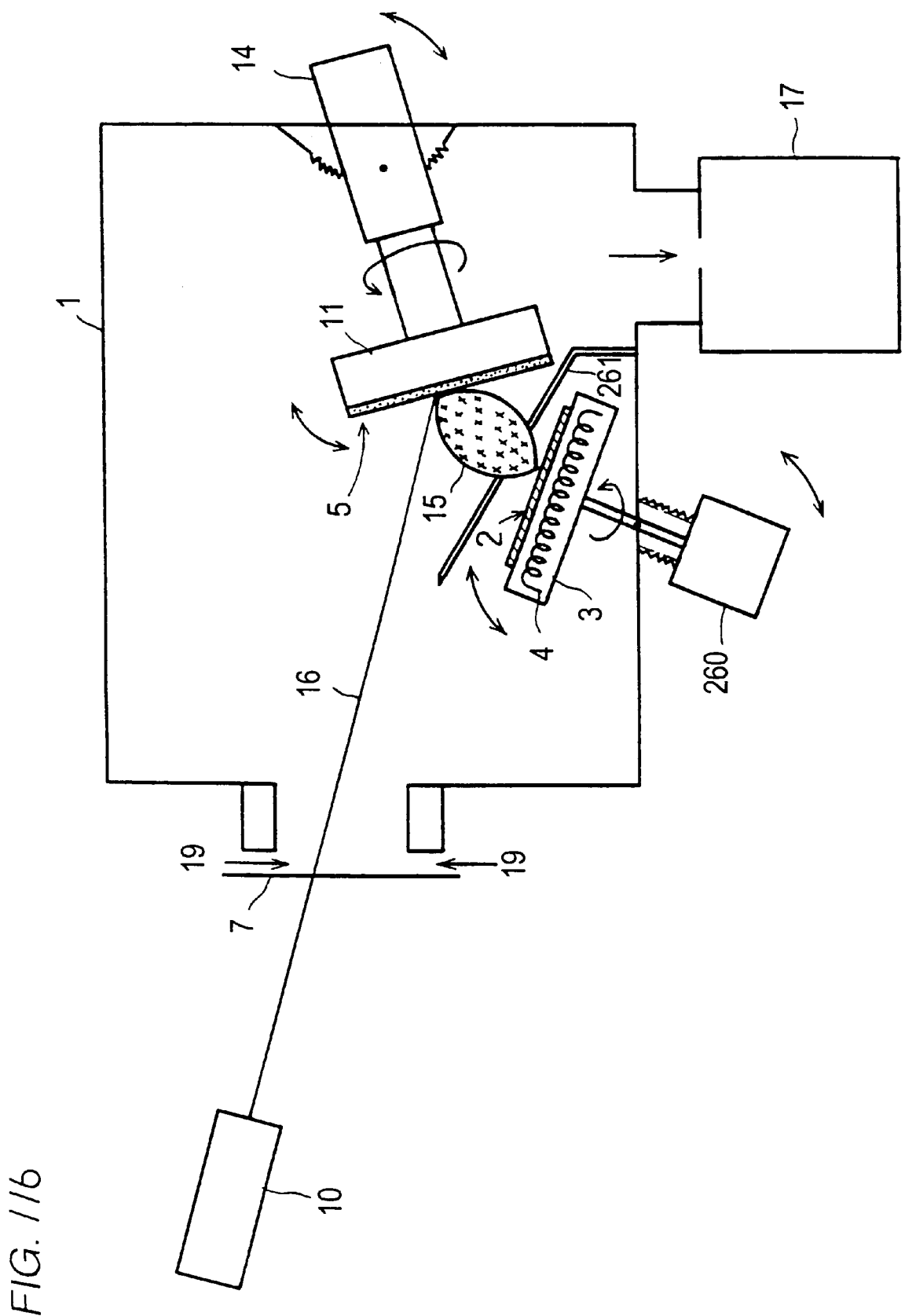
FIG. 116 is a cross sectional view showing a schematic structure of the thin film forming apparatus using laser in accordance with the seventy-fourth embodiment of the present invention.

A seventy-fourth embodiment of the present invention will be described with reference to FIG. 116. Referring to FIG. 116, in this embodiment, when target is irradiated with laser, a plume is generated from the surface of the target. Since the target and the substrate are both erected vertical to the ground, all the generated foreign matters fall downward. Therefore, foreign matters are not deposited on the substrate surface. Substrate holder 3 is rotatable by a rotary mechanism 260, allowing film formation to uniform film thickness. By dividing the target into left and right two and by rotating target holder 11, multiple targets can be provided. There is provided an oxygen inlet on the side of laser beam inlet window 7, and by introducing oxygen gas, frost on the inlet window can be prevented. By closing shutter 261, atoms reaching the surface of the substrate can be controlled, and hence start and end of film formation can be controlled.

As described above, according to this embodiment, the substrate surface is not contaminated by foreign matters, a film having uniform thickness and uniform quality can be formed, and therefore a thin film forming apparatus using laser allowing formation of superior film characteristics than in the prior art can be obtained.

Figure 117:
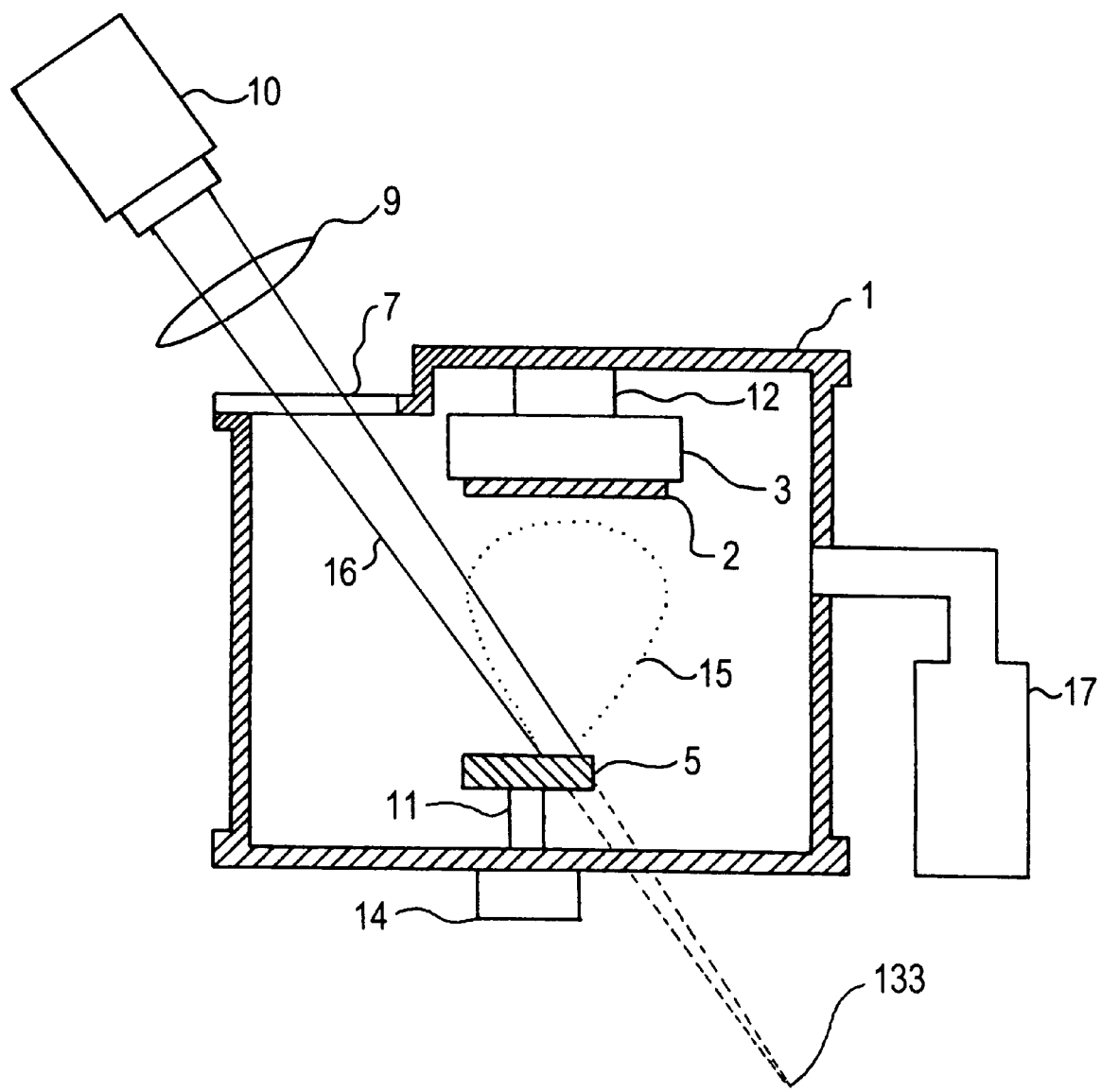
FIG. 117 is a cross sectional view showing a schematic structure of the thin film forming apparatus using laser in accordance with the seventy-fifth embodiment of the present invention.

A seventy-fifth embodiment of the present invention will be described with reference to FIG. 117. FIG. 117 is a schematic diagram showing the thin film forming apparatus using laser in accordance with one embodiment of the present invention. In the figure, the same reference characters as in the prior art shown in FIG. 148 denote the same or corresponding portions.

The operation will be described. The laser beam 16 emitted from laser unit 10 is condensed by condenser lens 9 and passed through laser inlet window 7 of chamber 1 to be incident on raw material target 5 placed on turntable 11 in chamber 1. Consequently, a plume is generated and the thin film is formed on substrate 2, through the same steps as in the prior art example. However, different from the prior art, in this embodiment, the point of focus 133 of laser beam 13 is set deeper than the surface of target 5. By such a structure, laser beam is not focused in chamber 1, so that breakdown of the introduced gas such as oxygen does not occur at the point of focus. Therefore, the thin film is not damaged by undesirable ions or the like. This enables formation of a thin film having higher quality than in the prior art.

Figure 118:
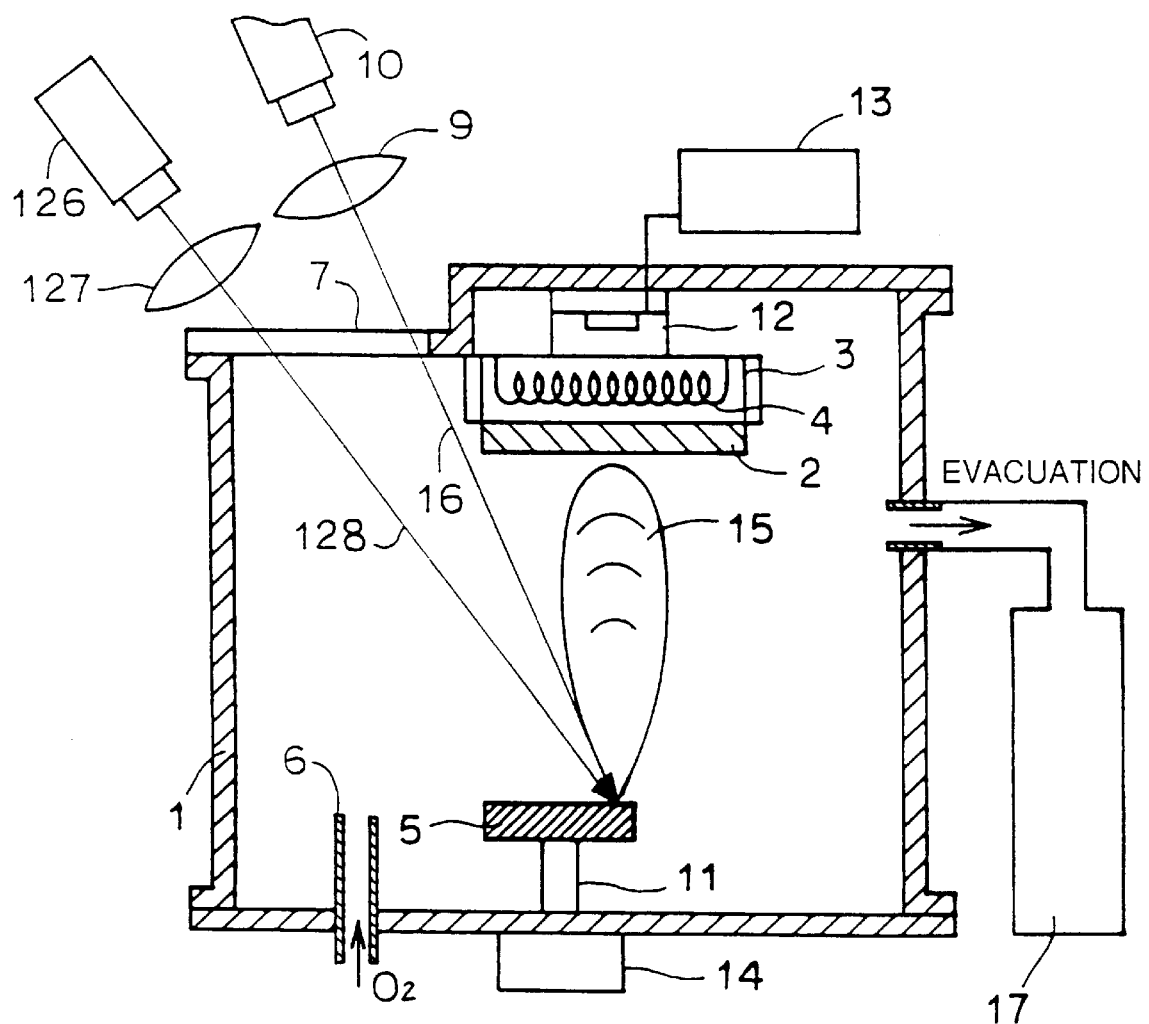
FIG. 118 is a cross sectional view showing a schematic structure of the thin film forming apparatus using laser in accordance with the seventy-sixth embodiment of the present invention.

A seventy-sixth embodiment of the present invention will be described with reference to FIG. 118. The apparatus of this embodiment includes, referring to FIG. 118, a laser unit 128 having laser beam of longer wavelength than laser unit 10, and a condenser lens 127.

The operation is as follows. The process for forming a thin is the same as the prior art. However, during thin film formation, laser beam 128 is directed to the surface of target 5 by using lens 127, from laser unit 126. The wavelength of laser beam 128 is sufficiently long to prevent evaporation of the material from the target surface, and its intensity is weak enough to prevent evaporation of the material from the target surface. However, it is adapted such that the target surface is set to melted state or immediately below the melting point. Since the target surface is such a condition, at the time of laser abrasion of the surface of target 5, the surface is not made rough. This prevents generation of foreign matters on the surface of substrate 2. Laser beam 128 may be applied continuously, or it may be applied in the shape of pulses. This laser beam may be or may not be in synchronization with laser beam 16. The surface roughness of the target causes uneven irradiation of laser beam 16 and causes scatters of drops from the target. Such drops may cause foreign matters on the surface of substrate 2.

Figure 119:
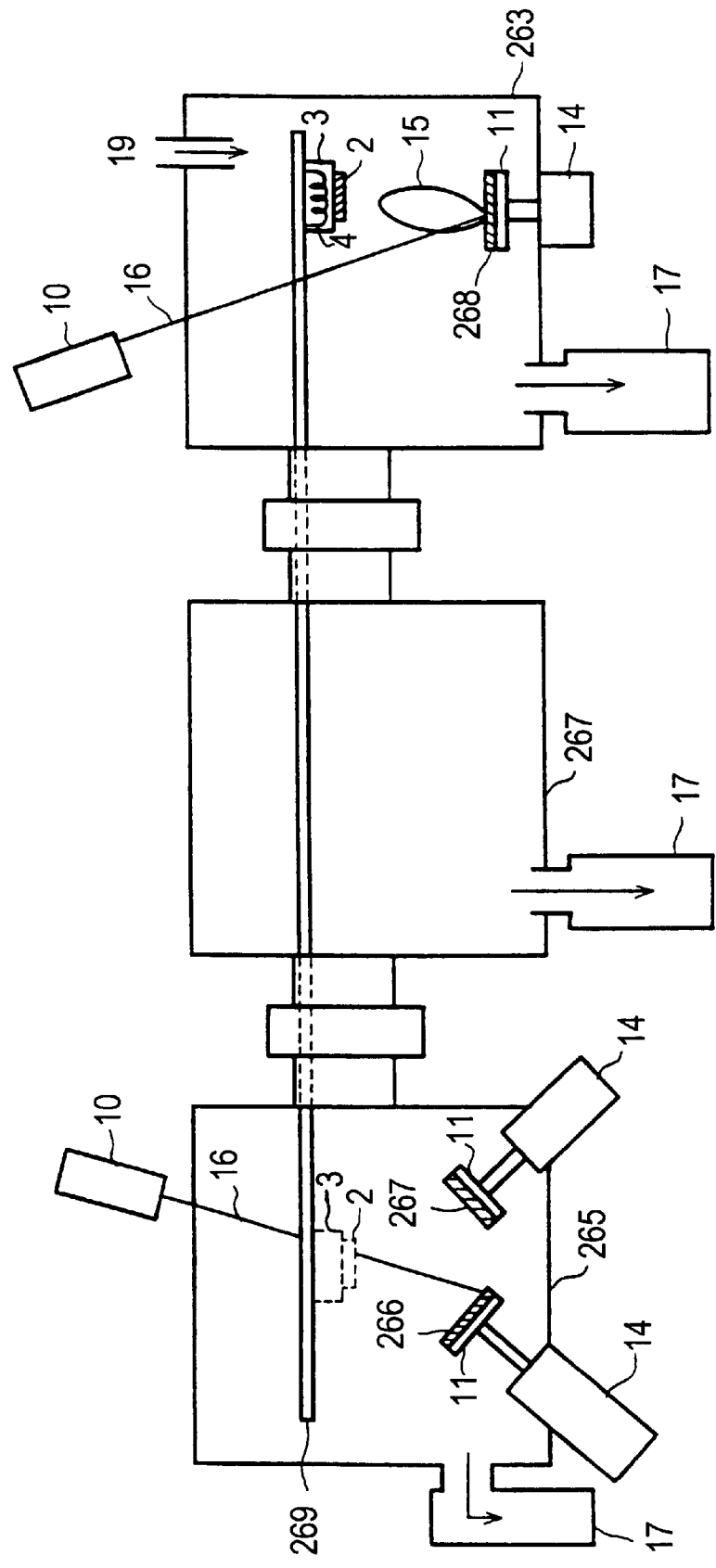
FIG. 119 is a cross sectional view showing a schematic structure of the thin film forming apparatus using laser in accordance with a seventy-seventh embodiment of the present invention.

A seventy-seventh embodiment of the present invention will be described with reference to FIG. 119. This embodiment includes, referring to FIG. 119, a main film forming chamber 263, a load lock chamber 264, a preliminary film forming chamber 265, platinum (Pt) target 266, a titanium (Ti) target 267, a target 268 including copper oxide (PbO) and $PbTiO_3$ divided and juxtaposed in two lines, and a conveyer system 269.

The operation is as follows.

In the preliminary film forming chamber, an underlying film of metal (Pt or the like) is formed by laser sputtering. Then, in the preliminary film forming chamber, Ti film is formed. Thereafter, the substrate is moved to the main film forming chamber in vacuum by using conveying system 269. Then, in the main film forming chamber, PbO film is formed by sputtering in oxygen ($O_2$) atmosphere. At this time, Ti and PbO at about 500 to about 600° C. react with each other, forming a $PbTiO_3$ perovskite layer at a low temperature as an underlayer. Since titanium oxide ($TiO_2$) is formed at the lower most layer, good adhesion with the underlayer is provided. After the formation of the underlying perovskite layer, by sputtering the target portion of $PbTiO_3$, a film having superior crystal properties can be formed at a low temperature. When $PbTiO_3$ is to be sputtered from the start, the substrate temperature must be increased to about 700° C. or higher, since various crystal layers are unavoidably formed at a low temperature. Finally, annealing is carried out in $O_2N_2O$ or $O_3$ atmosphere in the sputtering chamber. To this step, the substrate can be moved without exposure to the atmosphere at all. Therefore, film can be formed with less introduction of impurities, and the perovskite layer can be formed stably at a low temperature.

Though the film is formed by sputtering PbO in oxygen atmosphere in the above described embodiment, it is not limited thereto. A $TiO_2$ film may be temporarily formed by carrying out annealing at 500° C. to 800° C. in oxygen atmosphere after formation of Ti, and by sputtering PbO, a crystal of $PbTiO_3$ can be obtained.

Though $PbTiO_3$ is formed as the sputter target on the underlying crystal of $PbTiO_3$ in the above described embodiment, it is not limited thereto. Two targets of PbO and $TiO_2$ may be sputtered and by applying mixture to the substrate, a thin film of $PbTiO_3$ may be formed.

At the time of sputtering Ti in the preliminary film forming chamber, when nitrogen ($N_2$) atmosphere is used, titanium nitride is formed on Pt. This serves as a barrier layer for preventing diffusion of Pt into $PbTiO_3$ during film formation, annealing and, in addition, heating of the substrate in the subsequent steps, so that it is effective to reduce leak current or the like.

As described above, in this embodiment, since the first oxide film is formed in oxygen atmosphere after the formation of an underlying metal film, a underlaying crystal of high quality can be formed at a low temperature, and therefore a thin film forming apparatus using laser allowing formation of a thin film having superior film characteristic than in the prior art can be obtained.

A seventy-eighth embodiment of the present invention will be described with reference to FIG. 120. This embodiment was made to solve the problem of degraded function of the thin film among the above described problems of the prior art. Its object is to provide a thin film forming apparatus using laser for forming a thin film of high quality by connecting a plurality of film chambers.

In order to make clear the feature of this embodiment, the problem of the conventional thin film forming apparatus using laser will be described in greater detail. In the conventional film forming apparatus using laser, even when a number of thin films are to be formed, film formation is done in one chamber. If thin films which act to degrade characteristics of each other when mixed are formed in one chamber, the characteristics of the resulting thin films are naturally not so good. For example, assume that a silicon is formed on the substrate and then gallium arsenide is formed thereon. An operation of silicon used for forming the silicon thin film existing the chamber at a certain vapor pressure. Therefore, during formation of gallium arsenide, the vapor of silicon is mixed in the thin film of gallium arsenide. Since silicon serves as dopant to gallium arsenide, this much affects the characteristics of the gallium arsenide, even if the amount of silicon is very small. Accordingly, it is difficult to form a number of thin films of such combination as silicon and gallium arsenide. In view of this, in this embodiment, a plurality of chambers are connected.

Figure 120:
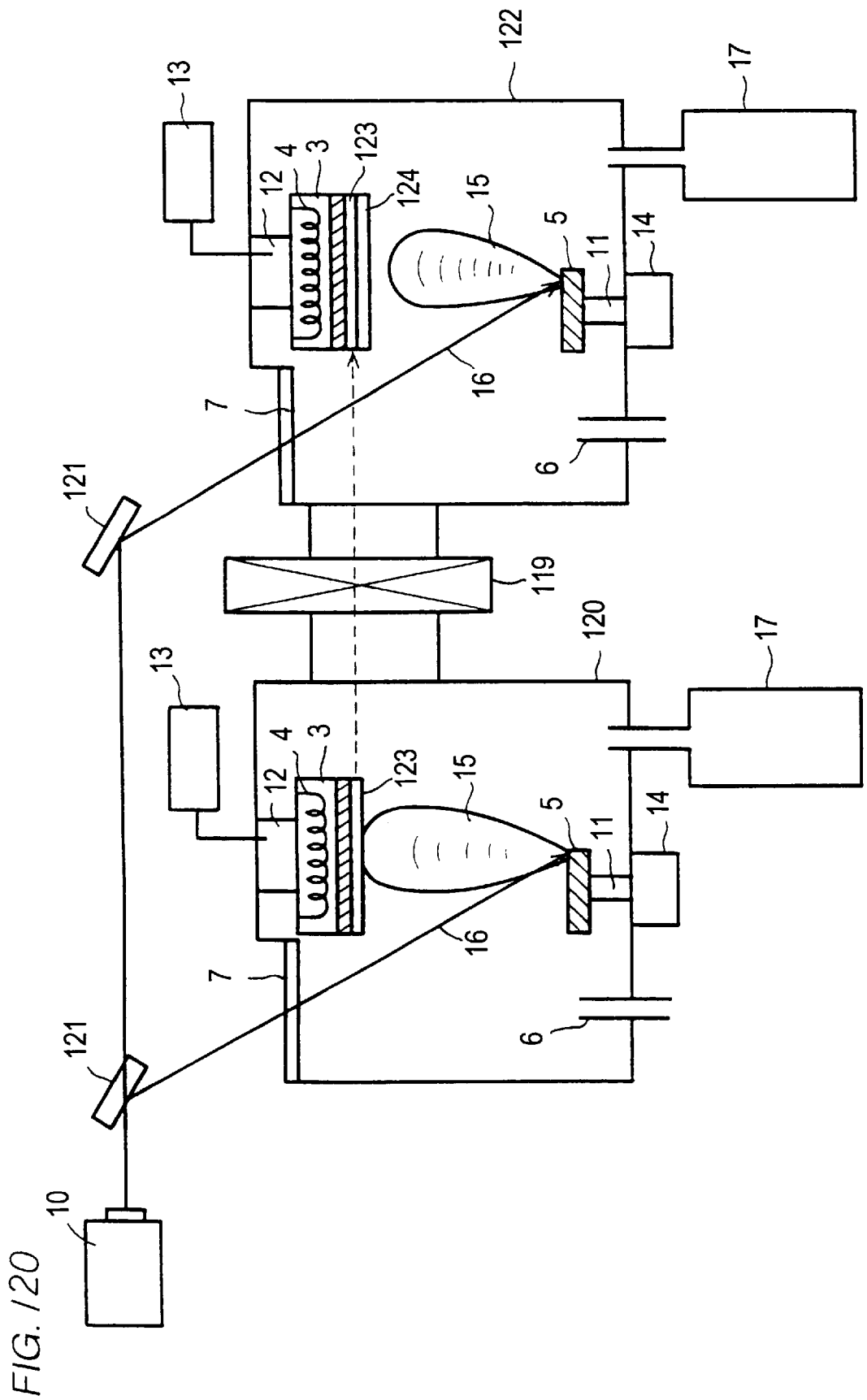

Referring to FIG. 120, the thin film forming apparatus using laser of this embodiment includes a gate valve 119, a chamber 120 having a function of forming a thin film, a partial reflection mirror 121 provided for directing the laser beam to respective chambers, and a chamber 122.

The operation will be described. The process for forming the thin film is the same as in the prior art. First, a substrate is placed in chamber 120, and a thin film 123 is formed. Then, the substrate is moved to chamber 122. At this time, since chambers 122 and 120 are connected to each other with a gate valve 119 interposed, the substrate is not exposed to the atmosphere during movement. When the substrate is moved to chamber 122, a thin film 124 which is not compatible with thin film 123 is formed. Since chambers 120 and 122 are partitioned by gate valve 119, the vapor existing in chamber 120 do not enter chamber 122, and therefore a thin film 124 of high quality can be formed. Since the substrate is not exposed to the atmosphere when it is transferred between chambers 120 and 122, the film quality is not degraded by oxygen entering the interface between thin films 123 and 124. Gate valve 119 of this embodiment may be replaced by an O ring. Though the O ring has such disadvantages that it cannot be used under high vacuum and that it is weak against heat, it is inexpensive and convenient for use.

Figure 121:
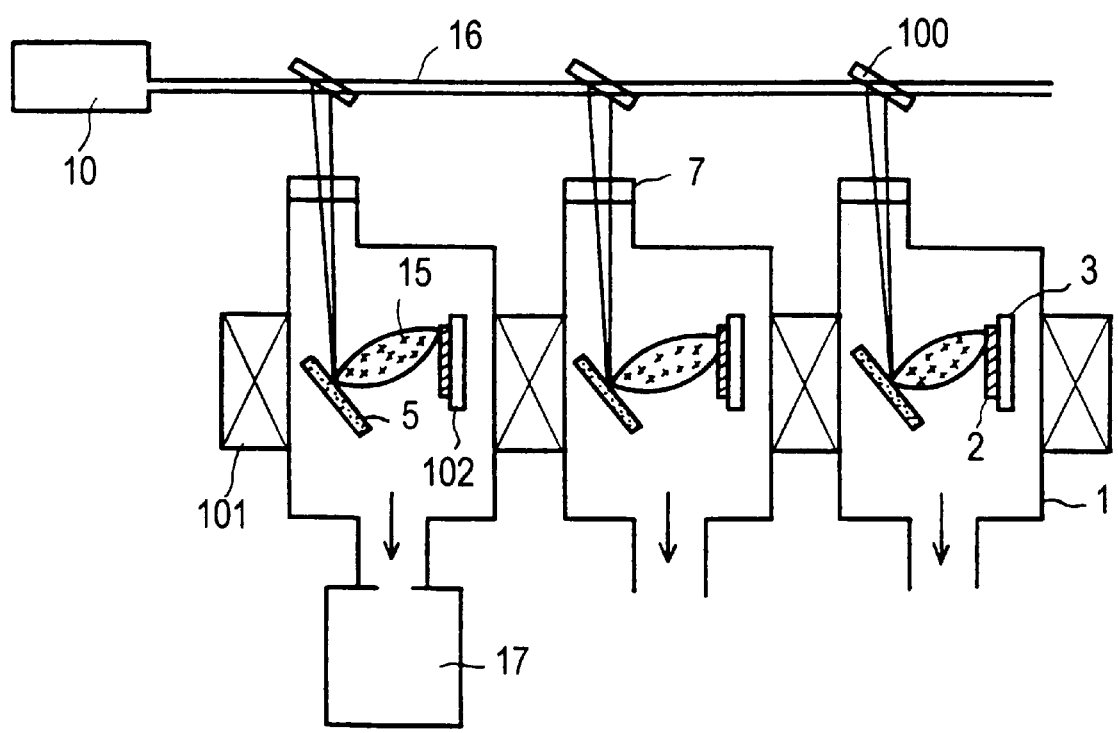

A seventy-ninth embodiment of the present invention will be described with reference to FIG. 121. In the thin film forming apparatus using laser of this embodiment, a plurality of film forming chambers are connected with a plurality of gate valves interposed, and by using a sample conveying mechanism, a number of thin films are formed and processed.

In the conventional apparatus, when thin films of different groups, such as superconductive films requiring much oxygen and semiconductor films not requiring oxygen are to be vapor-deposited on the same substrate, it is necessary to form the film by taking the substrate once to the atmosphere and put the substrate to a different chamber. In this embodiment, the chambers are connected by using gate valve, thin films of high quality can be formed without exposing these to the atmosphere, and the process can be carried out at high efficiency. When a number of targets are used to form a number of thin films in the same chamber, foreign matters are inevitably mixed. However, since the chambers are divided as described above for materials to which entrance of foreign matters are highly undesirable, thin films of superior quality can be formed. The thin film forming apparatus using laser in accordance with the present invention includes, in addition to the basic structure which is approximately the same as the prior art example of FIG. 148, a reflection mirror 100, a gate valve 101 and a sample conveyer mechanism 102.

The operation is as follows. The mechanism for film formation is basically the same as the prior art. Laser beam 16 emitted from laser unit 10 is condensed by condenser lens 9 and passed through laser inlet window 7 of chamber 1 to be incident on raw material target 5 placed on turntable 11 in chamber 1. Excited atoms and ions included in plume 15 reach the substrate 2 and are deposited thereon to form a thin film. In order to make uniform the film thickness, substrate holder 3 is rotated while the thin is formed. When one thin film is formed, the sample for thin film formation is moved to the next film forming chamber 1 by using sample conveying mechanism 102, and film formation using laser is carried out in the similar manner. For improving efficiency, metal films and insulating films are formed by using a deposition apparatus or the like other than the film forming apparatus using laser.

As described above, in accordance with this embodiment, entrance of foreign matters into the film forming sample can be avoided, laminated films can be formed without exposing the sample to the atmosphere, and the efficiency in thin film formation can be improved.

Figure 122:
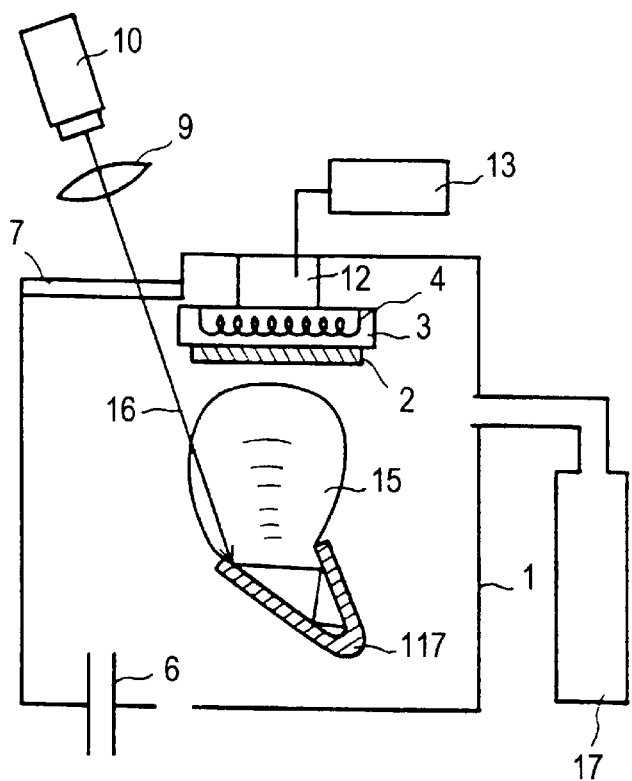
Figure 123:
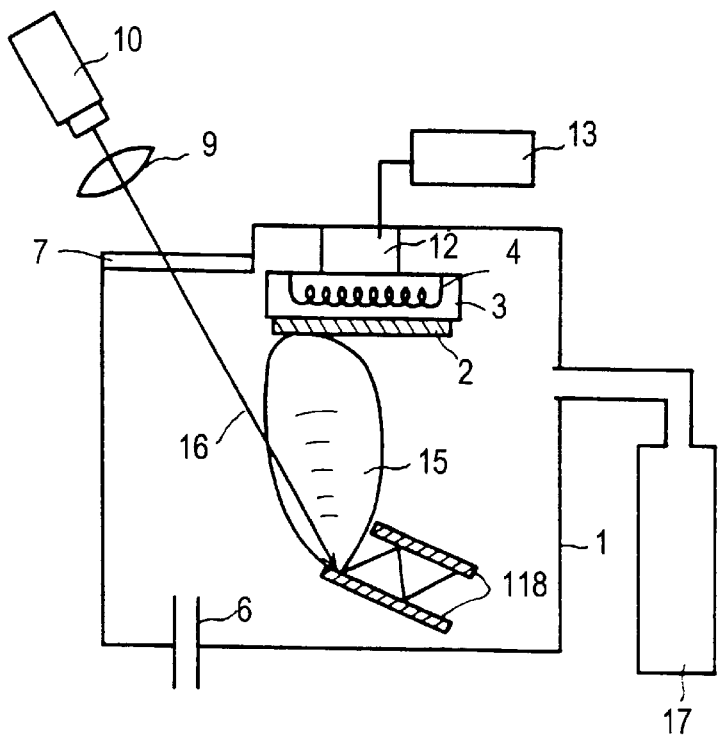

An eightieth embodiment of the present invention and its modification will be described with reference to FIGS. 122 and 123. The embodiment was made to solve the problem of degraded function of the thin film among the problems of the prior art. Its object is to provide a thin film forming apparatus using laser in which degradation of the thin film properties can be prevented by directing the laser beam reflected from the target again to the target.

In order to make clear the features of this embodiment, the problem of the thin film forming apparatus using laser of the prior art will be discussed in greater detail. In the conventional thin film forming apparatus using laser, the laser beam is directed to the target only once. Since the target has some reflectance with respect to the laser beam, part of the laser which has been impinged on the target is reflected and goes away from the target. The laser beam reflected from the target impinges on the chamber or the substrate. This reflected beam may evaporate impurities deposited on the chamber, or it may change the characteristics of the thin film formed on the substrate, causing degraded function of the thin film. The thin film forming apparatus using laser in accordance with the present embodiment is basically the same as the prior art example shown in FIG. 148 except that a target 17 having the shape of a crucible such as shown in FIG. 122 is used.

The operation is as follows. The process for forming a thin film is the same as in the prior art. In the prior art, laser beam 16 is directed to the target 5 and reflected therefrom, to be directed to the chamber, the substrate or the like. In this embodiment, the target has a shape of a crucible. The laser beam is directed to the inside of this crucible shaped target 117. Consequently, the laser beam incident and reflected from the wall of target 117 is again directed to target 117, and evaporates the target material. The evaporated target material generates a plume, which forms a thin film on substrate. laser beam 16 is repeatedly reflected and goes out from the bottom of crucible, returns to the upper part of crucible, and then goes out of the crucible shaped target 117. The laser beam may done be directed to the chamber or substrate, causing some degradation of the thin film function. However, since the laser beam is repeatedly reflected in the crucible, the beam when going out of the crucible, has low intensity. Therefore, such adverse effect of the beam may be negligible. For example, let us assume that the reflectance of the target with respect to the laser beam is 50%. In the prior art example, the laser beam which is reflected from the target and directed to the chamber or the substrate has half the intensity of the original beam. In this embodiment, the laser beam is reflected a number of times in the crucible and goes out from the crucible. Assuming that the laser beam is reflected ten times in the target, the intensity of the laser beam would be ten times 0.5, which is 0.1%. This is 1/500 of the prior art example, and since it is so small, it can be neglected.

A modification of this embodiment will be described. The process for forming the thin film in this embodiment is the same as the prior art, and the function of this embodiment is the same as the embodiment above. Referring to FIG. 123, in this modification, laser beam is directed to two opposing targets 118, and therefore laser beam will be incident on the upper and lower targets alternately. Consequently, the intensity of the laser beam going out from the target has its intensity made very weak, and therefore it does not degrade the function of the finished thin film. Since the laser beam impinges on the target a number of times, the amount of plume is increased, and hence the rate of thin film formation can be improved.

As described above, in accordance with this embodiment, the laser beam reflected from the target is again directed to the target. Therefore, the laser beam is not directed to the chamber or the substrate, so that the thin film can be formed with its function not degraded.

Figure 124:
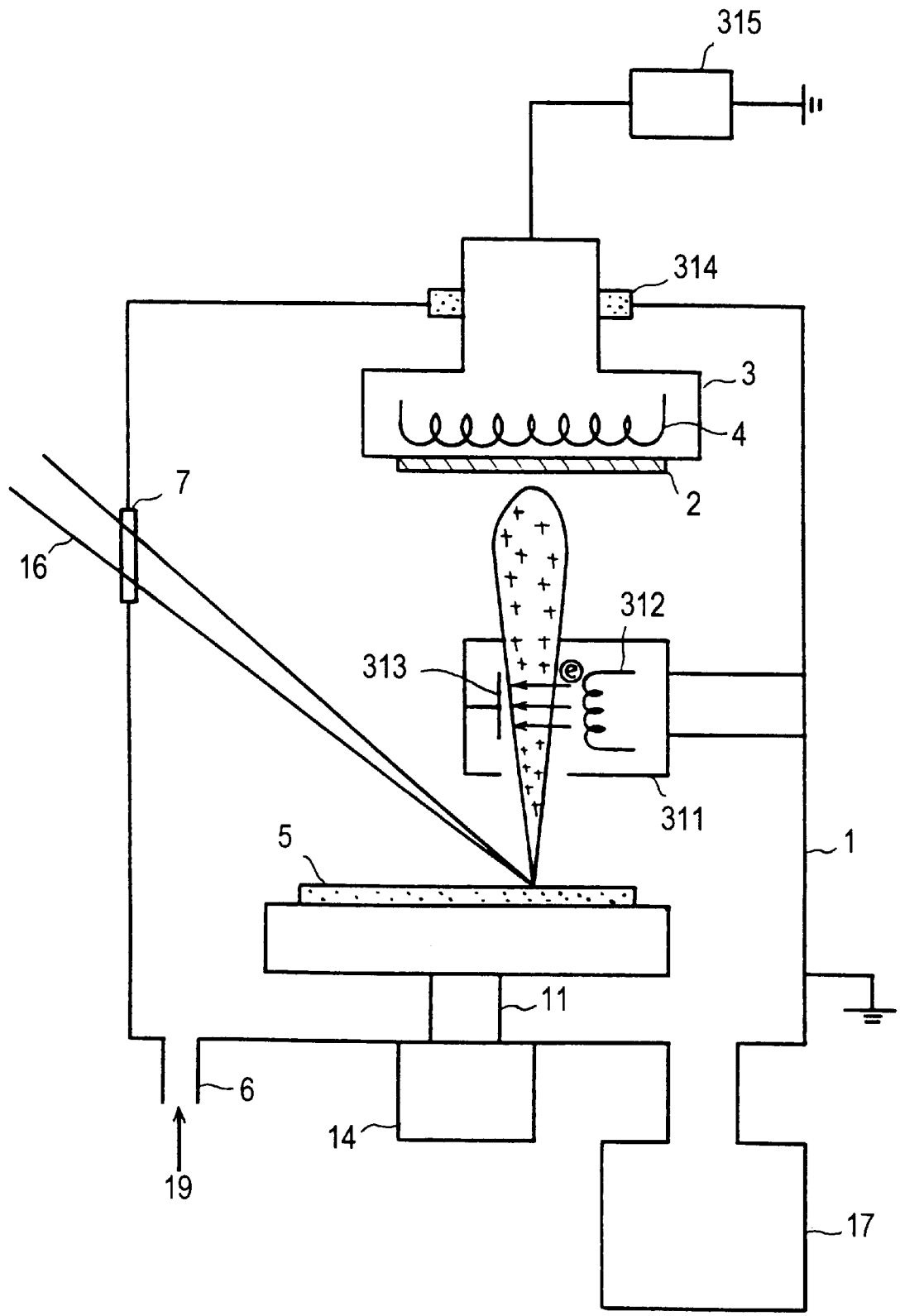

An eighty-first embodiment of the present invention will be described with reference to FIG. 124. FIG. 124 is a schematic diagram showing the thin film forming apparatus using laser in accordance with one embodiment of the present invention. In the figure, the same reference characters as in the prior art example shown in FIGS. 148 and 149 denote the same or corresponding portions, and description thereof will not be repeated.

The apparatus of this embodiment includes, referring to FIG. 124, an ionizing chamber 311 placed between target 5 and substrate 2, in which a hot cathode 312 emitting thermoelectrons and an anode 313 are placed spaced apart by a prescribed distance. The apparatus of this embodiment further includes an insulator 314 for electrically insulating the substrate holder 3 and vacuum chamber 1, and a DC power source 315 connected to the substrate holder.

The operation is as follows. When target surface 5 is irradiated by laser beam 16, a high density plasma is locally generated at the irradiated portion, generating a plume 15 which is like a flame of a candle toward substrate 2. Excited neutral particles, electrons-ions in the form of atoms, molecules or clusters constituting the target exist in the plume. When these particles pass through ionizing chamber 311 placed between the target and the substrate, neutral particles in the plume are ionized by accelerated electron beams emitted from hot cathode 312 and proceeding straight to anode 313. Thus, after passage through ionizing chamber, ion beams consisting of the target material are formed and directed to the substrate. Since the substrate holder is electrically insulated from the vacuum chamber by means of insulator 314 and is connected to DC power source 315, potential can be freely applied to the substrate holder, that is, to the surface of the substrate. When a negative potential is applied to the substrate, ion beams of the target material generated by the ionizing chamber can be accelerated toward the substrate, enhancing kinetic energy at the time of irradiation of the substrate.

In the conventional apparatus, crystallization of the thin film is promoted by increasing the substrate temperature when a thin film is to be formed on the substrate. In this embodiment, kinetic energy can be applied to the particles of the material of the thin film, and by appropriately selecting the value of the kinetic energy, the substrate temperature necessary for crystallizing the thin film can be decreased without any damage to the substrate.

Though the neutral particles in the plume are ionized by electron beams in this embodiment, these particles may be ionized by optical function, for example by directing a second laser beam, a vacuum ultraviolet lamp or SR light to the plume between the target and the substrate, to provide similar effect.

Figure 125:
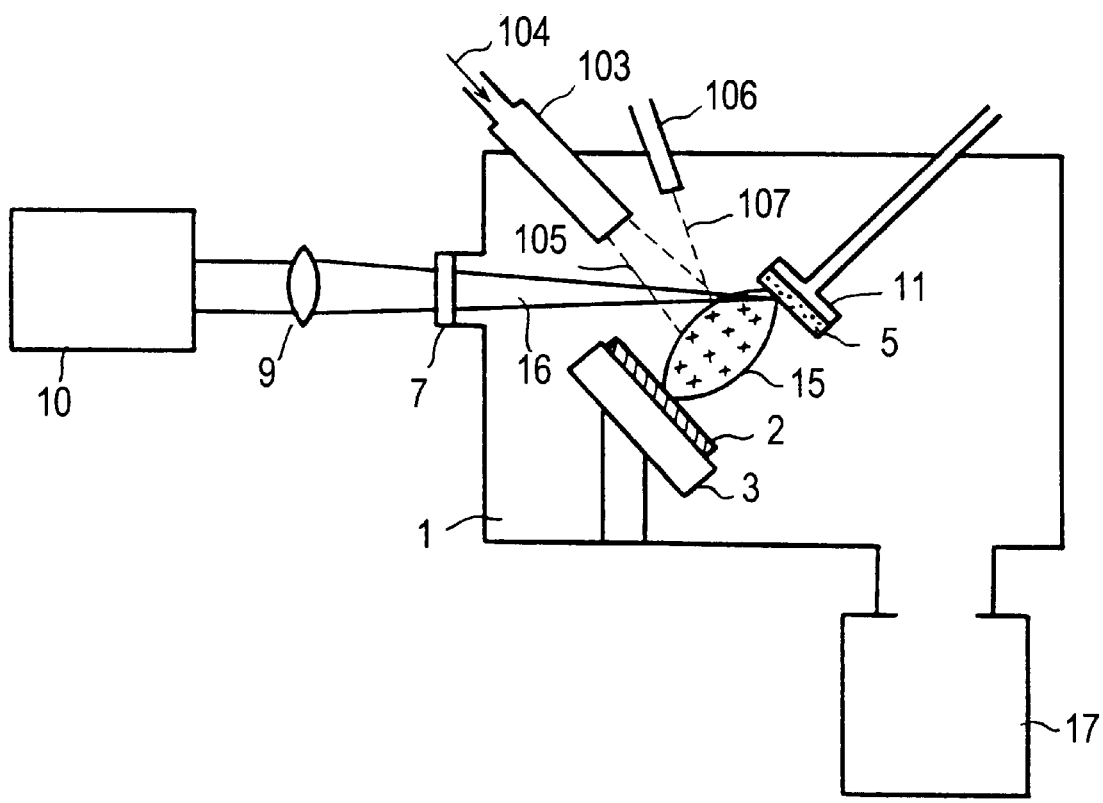

An eighty-second embodiment of this invention will be described with reference to FIG. 125. The basic structure of FIG. 125 is similar to that of FIG. 149. In this embodiment, referring to FIG. 125, the laser beam 16 emitted from laser 10 is condensed by condenser lens 9 and passed through laser inlet window 7 of chamber 1 to be incident on raw material target 5 placed on turntable 11 in chamber 1. To plume 15 generated by this irradiation, hydrogen radicals and hydrogen ions 105 are directed from a hydrogen radical source and hydrogen ion source 103. Electron beam 107 is emitted from electron gun 106. Consequently, groups of atoms can be removed or dissolved, and therefore steep interface structure of a very thin laminated layer can be formed. Ions included in the plume are changed to neutral atoms and particles. Substrate 2 is placed fixed on substrate holder 3, opposing to material target 5, and thus excited atoms and neutral atoms in plume 15 reach substrate 2 and are deposited thereon to form a thin film.

Figure 126:
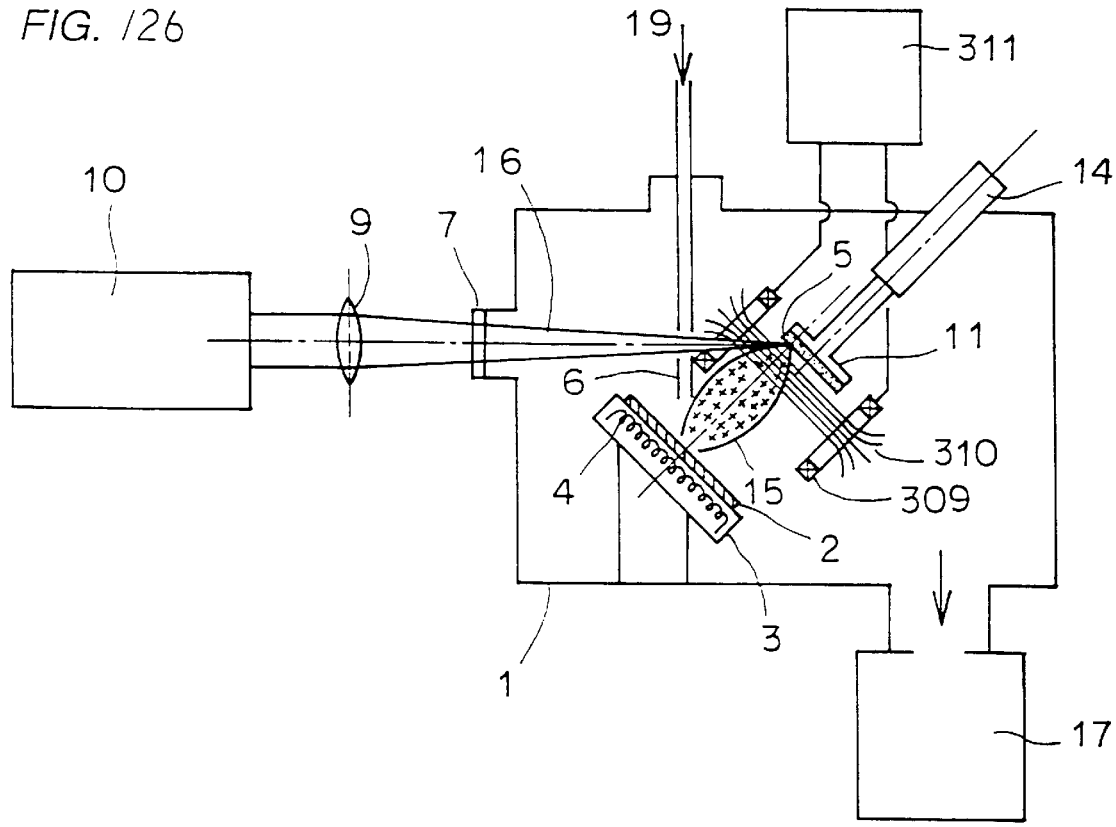

An eighty-third embodiment of this invention will be described with reference to FIG. 126. In the figure, the same reference characters as in FIGS. 148 and 149 denote the same or corresponding portions.

The operation is as follows. Laser beam 16 emitted from laser unit 10 is condensed by condenser lens 9 and passed through laser inlet window 7 of chamber 1 to be incident on raw material target 5 placed on turntable 11 in chamber 1. At the portion of raw material target 5 which is irradiated with laser beam, a plasma of the target material is generated abruptly at the time of laser irradiation, and in the process of cooling the plasma in several ten ns, isolated excited atoms, molecules and ions are generated. These groups of excited atoms, molecules and ions have lives of several microseconds, and they are emitted in the space to form a plume 15 which is like a flame of a candle.

Meanwhile, substrate 2 is placed fixed on substrate holder 3, opposing to raw material target 5. Excited atoms, molecules and ions and the target material in the form of clusters in which these atoms and ions and the like are combined in plume 15 reach the substrate 2, and are deposited and crystallized to form a thin film, in the similar manner as in the prior art.

Here, power is supplied to an electromagnetic coil 309 from a power source 311 for the electromagnetic coil and a magnetic field having magnetic lines of force 310 and the intensity of up to 1 kG is applied to and near raw material target 5, movement of charge particles such as ions and electrons in plume 15 are influenced by the magnetic field and these charged particles drift in the direction of the magnetic lines of force 310. Therefore, when the magnetic field is formed such that the magnetic lines of force 310 are parallel to the surface of target 5 and not passing through the surface of substrate 2, ions in plume 15 do not reach substrate 2, suppressing impingement and deposition of ions on the surface of substrate 2. Meanwhile, non-charged particles such as neutral atoms, molecules and clusters in plume 15 are not influenced by the magnetic field so that they reach and are deposited on the surface of substrate 2 as in the prior art. Therefore, a thin film of high quality, in which the problem of degradation of the substrate and degraded functions of the thin film caused by undesirable side reaction derived from impingement and deposition of ions are eliminated, can be obtained.

At the initial stage of irradiation of raw material target 5 with laser beam 16, that is, at the initial stage of deposition and thin film formation of target material on substrate surface 2, preferable effects can be often obtained with respect to the quality of the completed film if ions in plume 15 reach the surface of the substrate 2. This is because the ions excite, in non-equilibrium, the state of electrons of impurity particles deposited on the surface of substrate 2 for atoms and molecules constituting the impurity thin film formed on the surface, which leads to removal and separation of the impurity particles or impurity thin film from the surface of substrate 2. Thus clear substrate surface is exposed at the initial stage of film formation on the surface of substrate 2, using the target material, and initial nucleus of the thin film of the target material can be generated at a pure state on the surface of the substrate 2 without impurities. Consequently, crystal of the thin film of the target material grows regularly, enabling formation of a thin film of high quality in a clean condition, relatively free from the problem of the impurities at the interface. Therefore, in such a case, in the initial stage of irradiation of raw material target 5 with laser beam 16, that is, in the initial stage of deposition and thin film formation of target material on the surface of substrate 2, the switch of power source 311 for supplying power to electromagnetic coil 309 should be turned off so that there is not a magnetic field generated. In the later step of film formation, power source 311 is turned on to supply power to electromagnetic coil 309, whereby a magnetic field having the magnetic lines of force 310 and having the intensity of up to about 1 kG is applied to and near target 5, suppressing impingement of ions in plume 15 to substrate 2.

In order to suppress impingement and deposition of ions on the surface of substrate 2 by preventing ions in plume 15 from reaching substrate 2, conventionally, a metal mesh is placed parallel to the surface of substrate 2 in the vicinity of substrate 2 and a negative potential is applied to the metal mesh, so that ions are trapped by the mesh. However, in that case, metal impurities are emitted due to mutual function of the mesh and the ions in the plume 15. Passage of non-charge particles such as neutral atoms and molecules as well as clusters in plume 15 is suppressed by the mesh, causing metal contamination of the thin film and lower rate of thin film deposition. By contrast, in the present embodiment employing magnetic field, such problems of metal contamination and lower rate of thin film deposition can be solved.

A heater 4 for heating the substrate is provided in substrate holder 3, and therefore, post annealing in which a film deposited at a low temperature is annealed at a temperature higher than the crystallizing temperature to form a thin film of superior quality, and as-deposition in which substrate itself is kept at a temperature higher than the temperature for crystallization at the time of deposition so that a crystallized thin film is formed at the site can be carried out. In the as-deposition method, active oxygen atmosphere is used as well, and, a nozzle 6 for supplying gas 19 containing oxygen during formation of an oxide thin film is provided as shown in the figure for example, so that oxygen atmosphere is provided near substrate 2 so as to promote generation of oxide on substrate 2, as in the prior art example.

Figure 127:
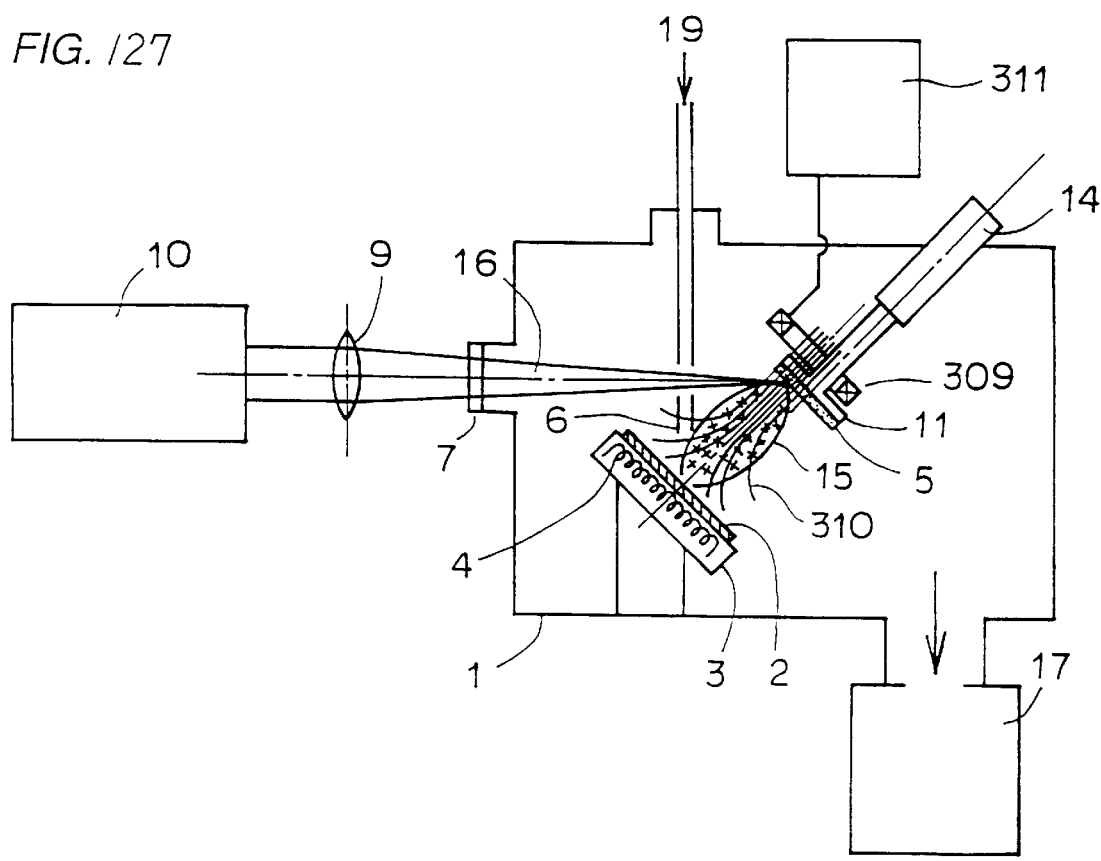

An eighty-fourth embodiment of the present invention will be described with reference to FIG. 127. In the figure, the same reference characters as in FIG. 126 denote the same or corresponding portions.

This embodiment is adapted such that a magnetic field having magnetic lines of force 310 and intensity of up to about 1 kG or higher caused by electromagnetic coil 309 extend vertical to the surface of raw material target 5 and expanding toward the surface of substrate 2. Movement of charged particles such as ions and electrons in plume 15 are influenced by the magnetic field formed at target 5 and substrate 2 as well as in the vicinity thereof, so that the charged particles drift in the direction of the magnetic lines of force 310. Therefore, if the magnetic lines of force 310 is formed vertical to the surface of target 5 and expanding toward the surface of substrate 2, ion flux in plume 15 decreased toward substrate 2, suppressing impingement and deposition of ions on the surface of substrate 2. Meanwhile, non-charged particles such as neutral atoms, molecules and clusters and the like in plume 15 are not influenced by the magnetic field, so that they impinge and are deposited on the surface of substrate 2 as in the prior art. Therefore, a thin film of high quality can be formed in which degradation of the substrate and degradation of thin film function caused by undesirable side reaction derived from impingement•deposition of ions can be eliminated.

In the eighty-third and eighty-fourth embodiments described above, magnetic field is applied by using electromagnetic coils. However, a permanent magnet may be used instead of the electromagnetic coil, to provide the same effect. If a permanent magnet is used, power supply for supplying power necessary for electromagnetic coils can be dispensed of, making compact the whole apparatus. However, the effects obtained by turning on/off the magnetic field so as to control movement of charged particles such as ions and electrons in the plume cannot be expected.

Figure 128:
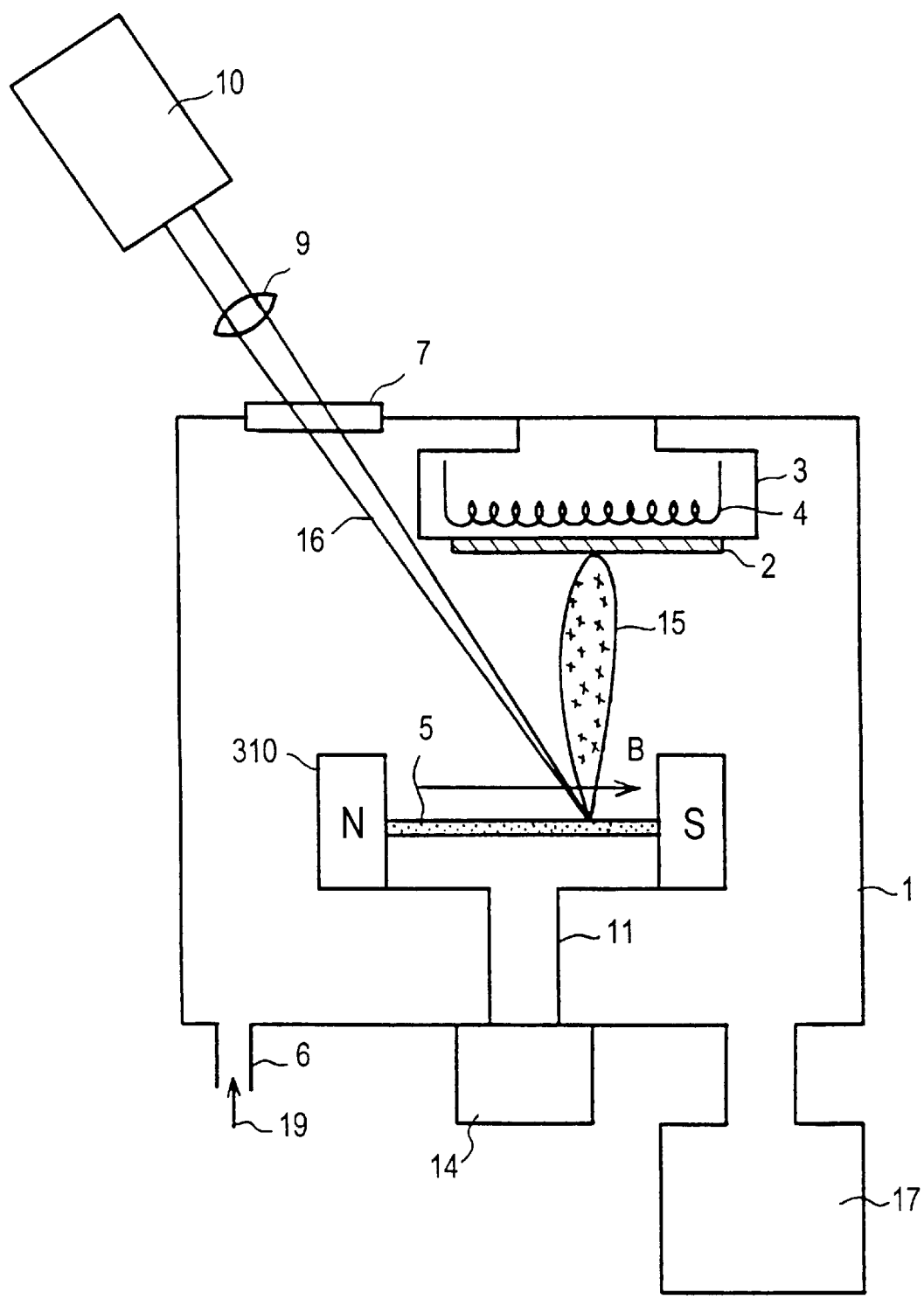
Figure 129:
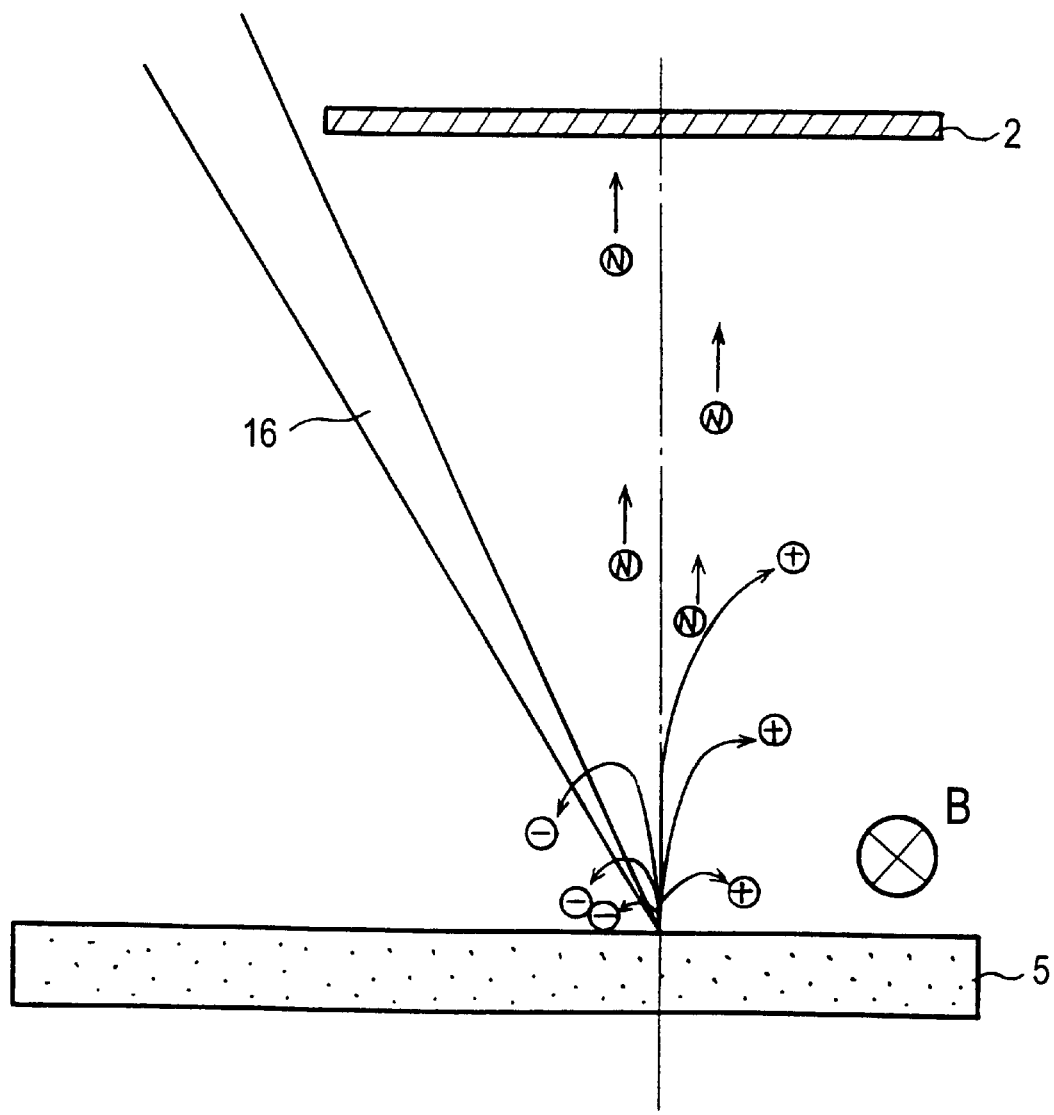

An eighty-fifth embodiment of the present invention will be described with reference to FIGS. 128 and 129. FIG. 128 is a schematic diagram showing the thin film forming apparatus using laser in accordance with one embodiment of the present invention, and FIG. 129 is an illustration showing movement of charged particles in the plume near the surface of the target. In these figures, the same reference characters as in the prior art example of FIGS. 148 and 149 denote the same or corresponding portions, and description thereof will not be repeated.

Referring to FIGS. 128 and 129, the apparatus of this embodiment includes a ring-shaped permanent magnet provided along target 5, which generates magnetic field parallel to the surface of target 5, near the surface of target 5.

The operation is as follows. When the target surface is irradiated with laser beam 16, a high density plasma is generated locally at the irradiated portion, generating a plume 15 which is like a flame of a candle toward substrate 2. Excited neutral particles in the form of atoms, molecules or clusters constituting the target as well as electrons and ions exist in the plume. Since there is a magnetic field parallel to the target surface, near the target surface, electrons and ions in the plume emitted from the target move spirally along the magnetic lines of force as shown in FIG. 129. At this time, radius of rotation of the electrons and ions at this time are determined by the speed of the particles when they exit the target and by the intensity of the applied magnetic field. Thus, by selecting an appropriate intensity of the magnetic field, the loci of the electrons and ions emitted from the target can be bent significantly so as to prevent these charged particles from reaching the surface of the substrate. Meanwhile, neutral particles in the plume are transmitted to the substrate without influenced by the magnetic field, so that they are adhered and deposited on the surface of the substrate, forming a thin film. Thus, damage to the substrate caused by electrons and ions reaching the substrate can be prevented.

In the conventional apparatus, in order to prevent charged particles in the plume from reaching the substrate, front surface of the substrate is covered by a grid electrode, and electric field is put in the plume so as to repel electrons and ions to the target so that the electrons and ions can be prevented from reaching the substrate. However, in this method, the electrode is directly in contact with the plume so that the surface of the electrode is sputtered by ion impingement. Therefore, there is a problem of contamination of the substrate by the material of the electrode. In this embodiment, the movement of charged particles is controlled by a magnetic field and the plume does not touch any metal such as an electrode. Therefore, this problem of contamination can be prevented.

Though a ring-shaped permanent magnet is provided around the target, what is important is to generate a magnetic field parallel to the surface of the target, and therefore various shapes and methods of providing the permanent magnet are possible. The same effect can be expected when a magnetic coil is used.

As described above, in accordance with this embodiment, since a magnetic field parallel to the surface of the target is generated, charged particles in the plume generated by laser beam irradiation of the target surface have their loci bent, so that these particles are prevented from reaching the substrate. Thus a thin film can be formed over the substrate surface by using excited neutral particles in the plume only, which allows formation of a thin film of high quality without any damage.

Figure 130:
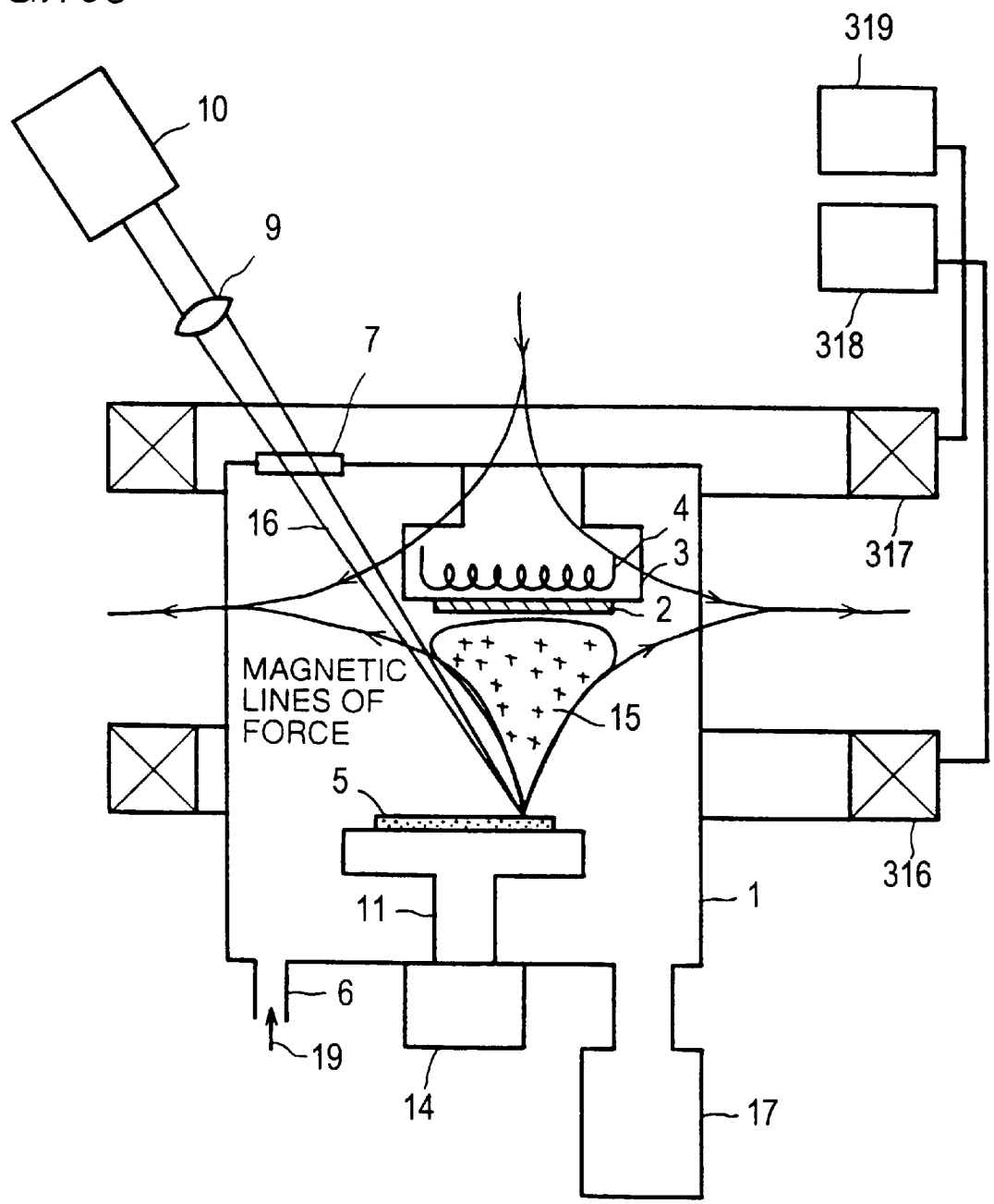

An eighty-sixth embodiment of this invention will be described with reference to FIG. 130. FIG. 130 is a schematic diagram showing the thin film forming apparatus using laser in accordance with one embodiment of the present invention. In the figure, the same reference characters as in the prior art example of FIGS. 148 and 149 denote the same or corresponding portions, and description thereof will not be repeated.

Referring to FIG. 130, the apparatus of this embodiment includes a set of magnetic coils 316 and 317 provided around a vacuum chamber 1, which are respectively connected to independent coil power supplies 318 and 319 feeding current.

The operation is as follows. When the target surface is irradiated with laser beam 16, a high density plasma is generated locally at the irradiated portion, generating a plume 15, which is like a flame of a candle toward substrate 2. Excited neutral particles in the form of atoms, molecules or clusters as well as electrons and ions constituting the target exist in the plume. These particles reach the substrate surface and are adhered and deposited on the surface to form a thin film. The direction of scattering of the particles emitted from the target surface tends to be approximately vertical to the target surface. Therefore, the extent of the plume reaching the substrate surface is very small compared with the area of the substrate having the diameter of about 6 to 8 inches used in the semiconductor industry. Therefore, in this embodiment, to a set of magnetic coils juxtaposed with an appropriate space, currents of opposite directions are applied by two coil power supplies connected thereto. Consequently, a cusp magnetic field having such a distribution of magnetic lines of force as shown in FIG. 130, in the space between the target and the substrate by these magnetic coils. The electrons and ions in the plume emitted from the target move spirally along the magnetic lines of force, so as to expand along the magnetic lines of force. Thus the plume mentioned above can be expanded in the radial direction by the function of the cusp magnetic field, and therefore a thin film can be formed uniform in the radial direction of a substrate having larger diameter, by a single plume.

Though the cusp magnetic field is generated by providing a set of magnetic coils around the vacuum container in this embodiment, what is important is to generate a cusp magnetic field in the space between the target and the substrate. Therefore, similar cusp magnetic field can be generated by providing a magnetic coil or a permanent magnet in the vacuum container to provide the same effect.

An eighty-seventh embodiment of this invention will be described with reference to FIGS. 131 and 132. In this embodiment, an apparatus for forming a thin film of high quality in which, when a thin film is formed by deposition on a substrate placed opposing to the target by laser beam irradiation of the target, the substrate is moved so that a portion on which the thin film is mainly deposited of the substrate is changed, characterized in that a shielding plate for shielding a portion of the plume is provided between the target and the substrate, is provided.

The main feature of this embodiment is that it includes a shielding plate for partially shielding the plume between the target and the substrate, when a film is formed by moving the substrate in the film forming chamber so that the portion on which the thin film is mainly deposited on the substrate is changed. At a position of the target which is irradiated with the laser beam, a plasma which is called a plume which is a collection of active particles for forming thin film is generated. The plume is generally constituted by excited atoms, ions and clusters having the same composition as the target. The particles constituting the plume have spatial distribution of the same composition ratio as the target near the target immediately after the generation of the plume. However, by the time it reaches the substrate after diffusion in the chamber, spatial distribution of the particles constituting the plume changes due to the difference of diffusion coefficients of the particles. More specifically, the density distribution of heavier particles comes to be higher at the central portion of the plume, and distribution density of lighter particles comes to be higher at peripheral portions. Therefore, difference of distribution of the film quality of the thin film deposited on the substrate becomes significant, making it difficult to form a thin film of uniform quality over a large area. In this embodiment, a plume shielding plate having an opening at the center is provided between the target and the substrate, so that only the central portion of the plume is directed to the substrate. Thus difference in spatial distribution of the density of particles constituting the plume in contact with the substrate can be reduced.

It is known that ions in the plume degrade the quality of the thin film deposited on the surface of the substrate. Therefore, by applying positive or negative potential with respect to the target to the plume shielding plate having the opening so as to prevent ions from reaching the substrate, the quality of the deposited thin film can be improved.

Figure 131:
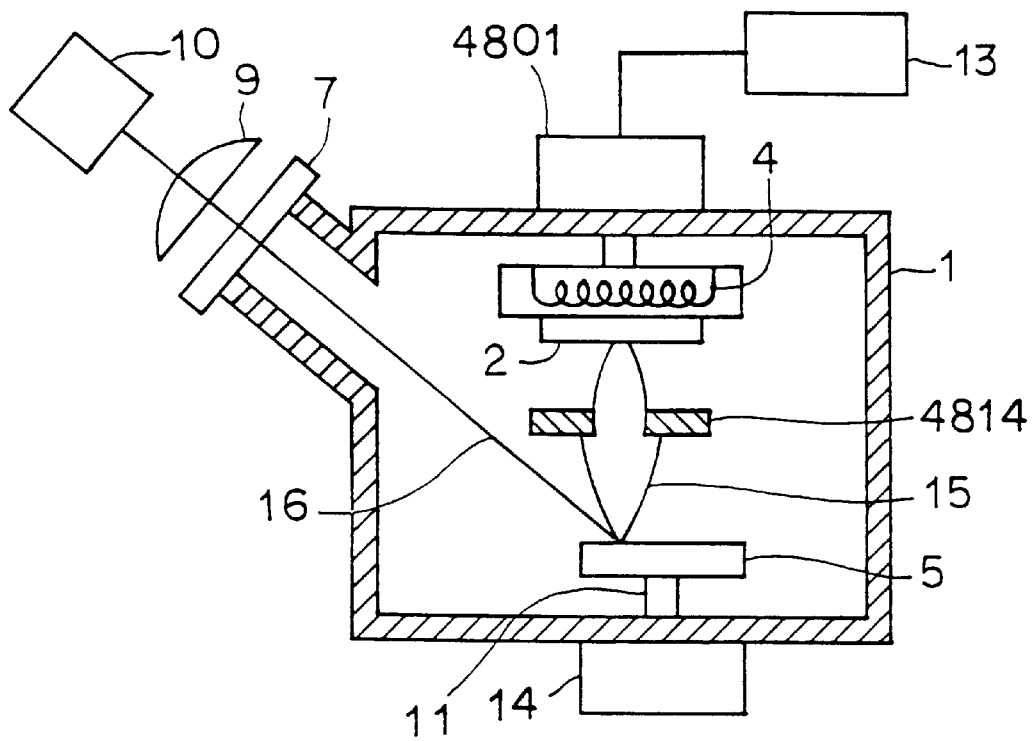

FIG. 131 is a schematic diagram of one example of the thin film forming apparatus using laser in accordance with this embodiment. In the thin film forming apparatus using laser shown in FIG. 131, laser beam 16 emitted from laser unit 10 and passed through condenser lens 9 enters the laser inlet window 7 of chamber 1 to be incident on raw material target 5 placed on turntable 11 of chamber 1. Turntable 11 can be rotated at an arbitrary rate of rotation by means of motor 14. Chamber 1 can be evacuated to a high vacuum. Substrate 2 is placed opposing to target 5, and a plume shielding plate 4814 is placed between the substrate 2 and target 5. Plume shielding plate 4814 has an opening of 10 mm in diameter at the center. Positions of substrate 2 and plume shielding plate 4814 may be changed in synchronization with the pulse frequency of the laser beam.

By using the thin film forming apparatus using laser described above, a $Y_1Ba_2Cu_3O_{7-x}$ oxide superconductive thin film was fabricated in accordance with the method of the present invention. An $SrTiO_3$ single crystal substrate was used as substrate 2, and a substrate temperature was set to 700° C. A $Y_1Ba_2Cu_3O_{7-x}$ sintered body having the diameter of 2 cm was used as target 5. The distance between the center of substrate 2 and the position of laser beam irradiation of target 5 was set to 5 cm. The inside of chamber 1 was evacuated to $1\times10^{-4}$ Torr, and then oxygen gas is introduced to 200 m Torr.

An excimer laser having the wavelength of 193 nm was used, the laser output was set to 3 $J/cm^2$, the area of laser beam irradiation was set to $2\times3.5$ $mm^2$, and the pulse frequency was 2 Hz. The target was rotated at 120 rpm.

Film formation was carried out for 35 minutes under the abode described conditions, and variation in film thickness distribution and superconductive characteristics of the obtained oxide superconductive thin film were measured. Consequently, variation of film thickness distribution of the oxide superconductive thin film fabricated in accordance with the method of the present invention was ±10% in a circle having the diameter of 20 mm, and the critical temperature was 93 K. Meanwhile, the variation of film thickness distribution formed under the same conditions except that the plume shielding plate is removed was ±10% in a circle having the diameter of 20 mm, and the critical temperature was 88 K. The average film thickness of the oxide superconductive thin film formed in accordance with the present invention was 3000 Å.

FIG. 132 is a schematic diagram of one modification of the thin film forming apparatus using laser of this embodiment. In the thin film forming apparatus using laser shown in FIG. 132, laser beam 16 emitted from laser unit 10 and passed through condenser lens 9 enters laser inlet window 9 of chamber 1 to be incident on raw material target 5 placed on turntable 11 of chamber 1. Turntable 11 can be rotated at an arbitrary rate of rotation by means of motor 14. Chamber 1 can be evacuated to a high vacuum. Substrate 2 is placed opposing to a target 5, and a plume shielding plate 4814b is positioned between the substrate 2 and target 5. Plume shielding plate 4814b has an opening of 10 mm in diameter at the central portion thereof. A potential of +100V is applied to the target. Substrate 2 can be moved in synchronization with pulse frequency of the laser beam.

By using the thin film forming apparatus using laser described above, a $Y_1Ba_2Cu_3O_{7-x}$ oxide superconductive thin film was fabricated in accordance with the method of the present invention. $SrTiO_3$ single crystal substrate was used as the substrate 2, and the substrate temperature was set to 700° C. A sintered body of $Y_1Ba_2Cu_3O_{7-x}$ of the diameter of 2 cm was used as target 5. The distance between the center of substrate 2 and the point of laser beam irradiation of the target was set to 5 cm. The inside of chamber 1 was evacuated to $1\times10^{-4}$ Torr, and then oxygen gas was introduced to 200 m Torr.

An excimer laser having the wavelength of 193 nm was used as the laser, the laser output was set to 3 $J/cm^2$, the area of laser beam irradiation was set to $2\times3.5$ $mm^2$, and the pulse frequency was set to 2 Hz. The target was rotated at 120 rpm.

Film formation was carried out for 35 minutes under the above described conditions, and film thickness distribution and superconductive characteristics of the obtained oxide superconductive thin film were measured. Consequently, variation in film thickness distribution of the superconductive thin film fabricated in accordance with the method of the present invention was ±10% in a circle having the diameter of 20 mm, and the critical temperature was 93 K. Meanwhile, variation of film thickness distribution of a film formed under the same condition with the plume shielding plate removed was ±10% in a circle having the diameter of 20 mm, and the critical temperature was 88 K. Average film thickness of the oxide superconductive thin film fabricated in accordance with the method of the present invention was about 3000 Å.

An eighty-eighth embodiment of the present invention will be described with reference to FIG. 133. Referring to FIG. 133, the apparatus of this embodiment includes an atom trapper 285 having a through hole 286 through which laser beam 16 passes and a heater 287. In the figure, the same reference characters as in FIG. 148 denote the same or corresponding portions.

The operation will be described. When a film is formed on substrate 2 by irradiating opposing target 5 with laser beam 16, a plume 15 is generated. However, atoms emitted at an angle not reaching the wafer 2 inherently are adhered and deposited on the surface of the trapper. At this time, since the trapper 285 is placed near the point of generation of plume 15, the time of free flight of the atoms is short. Therefore, the possibility of the atoms in the plume 15 being combined in the gas phase to be particles is very low. Further, since trapper 285 is heated by means of a heater, deposited atoms are turned to a stable smooth film 288. At this time, a material having the same coefficient of linear expansion as the material of target 5 should be selected as the material of trapper 285, in order to prevent separation of the deposited film.

When film forming process is carried out continuously and a film exceeding some thickness is deposited on trapper 285, it can be taken out for cleaning and used again.

In accordance with this embodiment, generation of gas in the reaction chamber can be suppressed, and therefore a thin film forming apparatus using laser allowing continuous thin film formation with the films having less particle defects can be obtained.

An eighty-ninth embodiment of the present invention will be described with reference to FIGS. 134A to 140. The present embodiment is to solve the following problems of the above described embodiment.

Generally, when external atmosphere is introduced to the film forming apparatus, the quality of the film is degraded, and therefore various means are taken to keep clean the inside of the apparatus. However, in a film forming apparatus using laser beam, a window 7 provided at chamber 1 for introducing the beam is frosted by materials scattered from target 5, so that the intensity of the laser beam reaching target 5 decreases. Therefore, it becomes necessary to change the window periodically.

The apparatus of this embodiment eliminating such a conventional problem includes, typically, a number of apertures 4230 having such a shape as shown in FIG. 134B provided between the window 7 and the sidewall of chamber 1 as shown in FIG. 134A.

The operation is as follows. When target 5 provided in chamber 1 is irradiated with laser beam 16, molecules constituting the target are evaporated, generating a plume 15 which is like a flame of a candle. At that time, part of the materials scattered from target 5 are turned to dust. The dust may be deposited on the window 7 provided for introducing laser beam 16 into chamber 1. Therefore, a plurality of apertures 4230 are positioned between the window and target 5 so that solid angle of the window viewed from the target 5 is made smaller. At this time, it is more effective to make the value of solid angle $\Omega=S/L$ smaller, where S represents the size of the aperture and L represents the distance between the window and the target.

Further, by connecting a pipe 6 to a portion between window 7 and target 5 in the chamber 1 and by introducing clean gas such as oxygen or alternatively, by evacuating through the pipe, the dust floating in the chamber can be removed, so that the effect of making clean the window 7 can be enhanced.

In place of the aperture 4230a, a mesh grid 4230b such as shown in FIG. 134c or an elongate grid such as shown in FIG. 134D may be used, to provide similar effect.

FIG. 135 shows a modification of this embodiment in which a second window 4231 is provided between window 7 and target 5. The second window 4231 passes laser beam, and intercepts dusts scattered from the target to prevent contamination of window 7. A thin window may be used as window 4231 since it is not necessary to keep chamber 1 airtight by this window. Quartz, $CaF_2$, $MgF_2$ or a Teflon sheet may be used as the material of the window. Further, by providing an aperture 4230 between the second window 4231 and the target so as to limit the area of contamination of the second window and by making the second window movable, the laser beam can pass through the clear area of the second window constantly. Though a second window is included in this example, a reflecting mirror may be used. In that case, by changing the direction of progress of laser beam 16 by using the reflection mirror, the dust emitted from target 5 is prevented from directly reaching the window 7. However, even in this case, the reflection mirror is contaminated gradually by the dust. Therefore, the surface of the reflection mirror which is exposed to the laser beam should be made changeable.

FIG. 136 shows a modification in which a nozzle 4232 is used in place of the aperture. Generally, in order to increase light intensity on the target, the laser beam is condensed. Therefore, when a nozzle 4232 is provided along the condensed beam, the solid angle of the dust toward the window can be limited and, in addition, the floating dust cannot reach the window 7. Therefore, deposition on window 7 can be reduced. By supplying clean material gas such as oxygen by connecting a pipe 6 to a nozzle, the window 7 and the vicinity thereof can be kept clean and, in addition, the material gas can be directly supplied to the periphery of target 5. FIG. 137 shows a modification in which a rotary chopper 4233 is provided between the window 7 and the target 5. The chopper has a portion notched, and it is rotated along the arrow. The number of rotation of the chopper and the frequency of laser generation are adjusted such that the laser beam reaches the target through the notch of the rotating chopper only during laser generation, with the laser beam used for film formation being in the form of pulses. Since the dust scattered from the target are generated little later than the laser irradiation, the dust can be intercepted by the chopper before reaching the window. Though a rotary chopper is shown in this example, any means having the function of a shutter which is opened only during the passage of the laser beam can be used to provide the same effect.

FIG. 138 shows a modification employing a gate 4234. Though the deposition on the window 7 can be reduced by various means, the window must be changed sooner or later. In that case, if the external atmosphere is reached into the chamber 1, the inner side of the chamber 1 is contaminated, degrading the function of the form film. Therefore, in this example, a gate 4234 is provided and a pipe 6 for evacuating or supplying air to the window 7 and the gate 4234 are provided. After the gate is closed, the window is changed. Then, by repeating supply and evacuation of air by means of pipe 6, the vicinity of the window is made sufficiently clean, and then gate is opened again. By this series of operations, the window can be changed without exposing most part of the chamber 1 to the atmosphere.

FIG. 139 shows an embodiment in which the window 4235 is made large enough with respect to the size of laser beam 16, and a mechanism for changing the area of laser beam transmission of the window is provided. When a portion of the window 4235 is tarnished, the window is moved in parallel or rotated so that the laser beam passes through a clear surface of the window. Consequently, the chamber can be used continuously without exposure to the atmosphere until the window is entirely contaminated. Though a large window is used in this embodiment, a plurality of windows may be mounted on one window holder so that the window can be changed every time a window is tarnished.

FIG. 140 shows a modification including means for keeping clean the atmosphere side of window 7, different from other examples. Outer side of the window is also gradually contaminated by the influence of dust floating in the atmosphere or organic solvent. Therefore, there is provided an optical transmission path between window and laser unit 10. Though dependent on the wavelength of the laser beam, the transmission path is filled with dry nitrogen, dry air or rare gas which do not absorb laser beam. The inner walls of the transmission path are formed by a metal, which do not generate any gas even when it is irradiated with the scattered laser beam, for example, aluminum. If the laser beam is transmitted through such an optical transmission path, it does not attenuate on the way, and in addition, contamination of window 7 can be suppressed since the transmission path is kept clean. Condenser lens 9, a mirror for changing the direction of laser beam and so on may be arranged in the optical transmission path. Though the optical transmission path is filled with gas in this example, similar effect is effected by keeping this path near vacuum.

Though various embodiments with respect to the window 7 have been described, further effects can be obtained by combining these examples.

A ninetieth embodiment of the present invention will be described with reference to FIG. 141. In FIG. 141, the reference character $\theta$ represents an angle made by laser beam 16 and the normal of the surface of the target 5.

Referring to FIG. 141, in the present embodiment, the direction of generation of the evaporated materials from the target when plume 15 is generated by laser beam irradiation of target 5 has cosine or similar spatial distribution. Therefore, largest amount of evaporated materials are emitted to the direction of the normal of the surface of target 5. As the incident angle $\theta$ increases, scatter of the evaporated materials in the direction of the incident laser beam becomes smaller. As a result of experiment in which the incident angle $\theta$ is changed variously, it is found that deposition of the evaporated materials on laser inlet window 7 can be significantly reduced when the angle $\theta$ is set to 30°. Consequently, contamination of laser inlet window 7 can be significantly reduced.

Ninety-first embodiment of the present invention will be described with reference to FIG. 142. The apparatus of the present embodiment includes, referring to FIG. 142, a laser 21 for monitoring, a detector 22, a control valve 23 of which opening/closing is controlled by a signal from the detector, and a barrier wall 24 for preventing disturbance of the field by purge gas.

The operation is as follows. When a film is to be formed on a substrate by irradiating opposing target with the laser, laser 21 for monitoring is passed through inlet window 7 and its intensity is monitored by detector 22. When reduction in light intensity caused by frost on the window is detected, the valve is opened by the control apparatus and the purge gas is blown to the inlet window. Thus the frost on the window can be removed. Therefore, film formation can be carried out with the laser intensity not attenuated by the frost on the window. Since there is barrier wall 24, the purge gas do not disturb the field of film formation.

As described above, by this embodiment, the intensity of the laser beam is not reduced by the frost on the window, and therefore a thin film forming apparatus using laser allowing formation of a thin film having superior film characteristics than in the prior art with uniform film quality in the thickness direction can be provided.

A ninety-second of the present invention will be described with reference to FIGS. 143 and 144. The apparatus of this embodiment includes, referring to FIG. 143, laser unit 10, lens 9 for condensing laser beam from laser unit 10 to the surface of the target, a vacuum chamber 1, substrate 2, substrate holder 3, target 5, a light transmitting window 7, a mirror 374 and a driving apparatus 375.

The operation is as follows. The laser beam emitted from laser unit 10 is condensed by the lens and focused on target 5 to provide necessary light intensity. The laser beam passed through lens 9 is transmitted through mirror 374 and light transmitting window 7 of chamber 1 to be incident on target 5. Since the target 5 is irradiated with high density laser beam, a plasma is abruptly generated, and in the process of cooling the plasma rapidly, isolated excited atoms and ions are generated. These excited atoms and ions have lives of several microseconds, and generate a plume 15 which is like a flame. Meanwhile, substrate 2 is placed fixed on substrate holder 3 opposing to target 5. Excited atoms and ions in plume 15 reach the substrate 2 and are deposited thereon, forming a thin film.

In this case, it is known that the thin film composition is approximately the same as the target composition. In this embodiment, target 5 is divided into concentrical two portions as shown in FIG. 144, and the laser beam is directed bridging the two target compositions shown in the figure. Therefore, a thin film having such a composition which corresponds to the area of laser beam irradiation with respect to the two compositions is formed on the substrate. When the composition of the thin film formed on the substrate is to be changed or adjusted, mirror driving apparatus 375 is driven to delicately adjust the optical path of the laser beam so as to change the area of laser beam irradiation of two target compositions. Thus the composition of the thin film can be easily changed.

A ninety-third embodiment of this invention will be described with reference to FIGS. 145 and 146. The apparatus of this embodiment includes, in addition to the ninety-second embodiment shown in FIG. 143, a lens driving apparatus 376.

In this apparatus, referring to FIG. 145, the laser beam emitted from laser unit 10 is condensed by lens 9 and focused on target 5 to provide necessary light intensity. The laser beam which has passed through the lens 9 passes through mirror 372 and light transmitting window 7 of chamber 1 to be incident on target 5. As the target 5 is irradiated with high density laser beam, a plasma is generated abruptly. In the process of cooling the plasma rapidly, isolated excited atoms and ions are generated. These excited atoms and ions have lives of several microseconds, generating a plume 15 which is like a flame. A substrate 2 is placed fixed on substrate holder 3, opposing to target 5. Excited atoms and ions in plume 15 reach substrate 2 and are deposited thereon, forming a thin film.

In this case, it is known that the composition of the thin film is approximately the same as that target composition. In this embodiment, target 5 is divided into concentrical three portions as shown in FIG. 146, and the laser beam is directed bridging three target compositions as shown in the figure. Therefore, a thin film having a composition which corresponds to the area of laser beam irradiation corresponding to the three components is formed on the substrate. If the composition of the thin film formed on the substrate is to be changed or adjusted, mirror driving apparatus 375 is driven to delicately adjust the optical path of the laser beam and the lens driving apparatus 376 is driven to delicately adjust the area of irradiation of the target with the laser beam, so that the area of laser beam irradiation of three target components can be changed, and thus the composition of the thin film can be easily changed.

A ninety-fourth embodiment of this invention will be described with reference to FIG. 147. FIG. 147 is a cross section of a raw material target 580 and a banking plate 582 used in the thin film forming apparatus using laser in accordance with this embodiment. Raw material target 580 is a sintered body provided by mixing oxide ceramic fine powder including barium oxide, strontium oxide, titanium oxide and so on, molding and compressing by hot press method and sintering the compressed body at about 1000° C. On the surface of raw material target 580, there is provided a depressed portion 581. At the time of hot pressing raw material target 580, a metal mold having a protruding portion corresponding to the desired shape of the depressed portion 581 is used, so that a desired depressed portion 581 is formed at the raw material target.

The operation is as follows. When raw material target 580 is irradiated with laser beam 583, temperature of the surface of raw material target 580 is increased rapidly, causing internal stress due to the difference in thermal expansion coefficients between raw material target 580 and a backing plate supporting the target. The depressed portion 581 provided at the surface of raw material target 580 prevents concentration of the internal stress and prevents generation of cracks. In addition, since the shock at the time of pulse laser irradiation can be distributed, generation and development of cracks can be suppressed. In addition, since the surface area of the raw material target 580 is increased, the efficiency in absorbing laser energy can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film forming apparatus using a laser, comprising:
   a chamber having evacuating means;
   a target placed in said chamber;
   laser beam irradiating means for irradiating said target with a laser beam; and
   substrate holding means for holding a substrate on which a material included in a plume generated from said target by laser beam irradiation is deposited; wherein
   said target includes a plurality of targets each having an aperture through which laser beam is passed;

said apparatus further comprising
means for changing positions of said plurality of targets, allowing irradiation of one said target with the laser beam passed through said aperture of another said target.

2. The thin film forming apparatus using a laser according to claim 1, wherein
said means for changing position of said target includes means for rotating said target.

3. The thin film forming apparatus using a laser according to claim 1, wherein
each said target and the substrate are arranged such that distance between a position of laser beam irradiation of said target and said substrate is equal for every said target.

* * * * *

UNITED STATES PATENT AND TRADEMARK OFFICE
CERTIFICATE OF CORRECTION

PATENT NO. : 6,110,291
DATED : August 29, 2000
INVENTOR(S) : Kenyu HARUTA, et al.

It is certified that error appears in the above-identified patent and that said Letter Patent is hereby corrected as shown below:

On the Title page:

Section [75], change the 23rd inventor's name from "Tetsuo Makita" to --Tetsuro Makita--.

Signed and Sealed this

Fifteenth Day of May, 2001

*Attest:*

NICHOLAS P. GODICI

*Attesting Officer*   *Acting Director of the United States Patent and Trademark Office*